US010985169B2

(12) United States Patent
Kai et al.

(10) Patent No.: US 10,985,169 B2
(45) Date of Patent: Apr. 20, 2021

(54) THREE-DIMENSIONAL DEVICE WITH BONDED STRUCTURES INCLUDING A SUPPORT DIE AND METHODS OF MAKING THE SAME

(71) Applicant: SANDISK TECHNOLOGIES LLC, Addison, TX (US)

(72) Inventors: James Kai, Santa Clara, CA (US); Murshed Chowdhury, Fremont, CA (US); Koichi Matsuno, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/291,577

(22) Filed: Mar. 4, 2019

(65) Prior Publication Data

US 2020/0286905 A1 Sep. 10, 2020

(51) Int. Cl.
*H01L 27/11556* (2017.01)
*H01L 23/538* (2006.01)
(Continued)

(52) U.S. Cl.
CPC .. *H01L 27/11556* (2013.01); *H01L 23/49816* (2013.01); *H01L 23/5384* (2013.01);
(Continued)

(58) Field of Classification Search
None
See application file for complete search history.

(56) References Cited

U.S. PATENT DOCUMENTS 5,915,167 A 6/1999 Leedy
9,472,472 B2 10/2016 Matsugai et al.
(Continued)

OTHER PUBLICATIONS

Notification of Transmittal of the International Search Report and Written Opinion of the International Search Authority for International Patent Application No. PCT/US2019/063075, dated Mar. 17, 2020, 13 pages.

(Continued)

*Primary Examiner* — Long Pham
(74) *Attorney, Agent, or Firm* — The Marbury Law Group PLLC

(57) ABSTRACT

A memory die including a three-dimensional array of memory elements and a logic die including a peripheral circuitry that support operation of the three-dimensional array of memory elements can be bonded by die-to-die bonding to provide a bonded assembly. External bonding pads for the bonded assembly can be provided by forming recess regions through the memory die or through the logic die to physically expose metal interconnect structures within interconnect-level dielectric layers. The external bonding pads can include, or can be formed upon, a physically exposed subset of the metal interconnect structures. Alternatively or additionally, laterally-insulated external connection via structures can be formed through the bonded assembly to multiple levels of the metal interconnect structures. Further, through-dielectric external connection via structures extending through a stepped dielectric material portion of the memory die can be physically exposed, and external bonding pads can be formed thereupon.

15 Claims, 99 Drawing Sheets

(51) Int. Cl.

| | |
|---|---|
| ***H01L 27/11582*** | (2017.01) |
| ***H01L 23/532*** | (2006.01) |
| ***H01L 27/1157*** | (2017.01) |
| ***H01L 23/00*** | (2006.01) |
| ***H01L 25/18*** | (2006.01) |
| ***H01L 23/498*** | (2006.01) |
| ***H01L 27/11524*** | (2017.01) |

(52) U.S. Cl.

CPC ...... *H01L 23/5385* (2013.01); *H01L 23/5386* (2013.01); *H01L 23/53228* (2013.01); *H01L 24/14* (2013.01); *H01L 24/95* (2013.01); *H01L 25/18* (2013.01); *H01L 27/1157* (2013.01); *H01L 27/11524* (2013.01); *H01L 27/11582* (2013.01)

(56) References Cited

U.S. PATENT DOCUMENTS

| | | | | |
|---|---|---|---|---|
| 9,935,037 | B2 | 4/2018 | Kang et al. | |
| 10,115,681 | B1 * | 10/2018 | Ariyoshi | H01L 27/11524 |
| 10,847,443 | B2 | 11/2020 | Lin | |
| 2009/0310425 | A1 | 12/2009 | Sim et al. | |
| 2015/0021789 | A1 | 1/2015 | Lin | |
| 2016/0079164 | A1 * | 3/2016 | Fukuzumi | H01L 24/80 257/324 |
| 2016/0225664 | A1 | 8/2016 | Huang et al. | |
| 2016/0247815 | A1 | 8/2016 | Oori | |
| 2016/0260487 | A1 | 9/2016 | Maejima | |
| 2016/0267991 | A1 | 9/2016 | Hashimoto et al. | |
| 2016/0268230 | A1 | 9/2016 | Lin et al. | |
| 2016/0268264 | A1 | 9/2016 | Hwang et al. | |
| 2016/0268278 | A1 | 9/2016 | Kono et al. | |
| 2016/0268279 | A1 | 9/2016 | Uchiyama et al. | |
| 2016/0268280 | A1 | 9/2016 | Tanazawa | |
| 2017/0053902 | A1 | 2/2017 | Yu et al. | |
| 2018/0012863 | A1 | 1/2018 | Yu et al. | |
| 2018/0012868 | A1 * | 1/2018 | Huang | H01L 24/80 |
| 2018/0138189 | A1 | 5/2018 | Kai et al. | |

OTHER PUBLICATIONS

USPTO Office Communication, Notice of Allowance and Fee(s) Due for U.S. Appl. No. 16/291,457, dated Mar. 26, 2020, 11 pages.
Endoh, T. et al., "Novel Ultra High Density Flash Memory with a Stacked-Surrounding Gate Transistor (S-GT) Structured Cell," IEDM Proc., pp. 33-36, (2001).
U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/248,923, filed Jan. 16, 2019, SanDisk Technologies LLC.
U.S. Appl. No. 16/274,687, filed Feb. 13, 2019, SanDisk Technologies LLC.
U.S. Appl. No. 16/284,502, filed Feb. 25, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
USPTO Office Communication, Non-Final Office Action for U.S. Appl. No. 16/291,504, dated Dec. 2, 2020, 21 pages.

* cited by examiner

THREE-DIMENSIONAL DEVICE WITH BONDED STRUCTURES INCLUDING A SUPPORT DIE AND METHODS OF MAKING THE SAME

FIELD

The present disclosure relates generally to the field of semiconductor devices, and particularly to three-dimensional memory devices with bonded structures including a support die and methods of manufacturing the same.

BACKGROUND

Three-dimensional memory devices including a three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a bonded assembly is provided, which comprises: a first semiconductor die comprising a first substrate including a first distal planar surface and a first proximal planar surface, first semiconductor devices located on, or over, the first proximal planar surface of the first substrate, first interconnect-level dielectric layers including first metal interconnect structures that are electrically connected to the first semiconductor devices, and first die-to-die bonding pads located at a surface portion of the first interconnect-level dielectric layers and electrically connected to the first metal interconnect structures; and a second semiconductor die comprising a second substrate including a second distal planar surface and a second proximal planar surface, second semiconductor devices located on, or over, the second proximal planar surface of the second substrate, second interconnect-level dielectric layers including second metal interconnect structures that are electrically connected to the second semiconductor devices, and second die-to-die bonding pads located at a surface portion of the second interconnect-level dielectric layers and electrically connected to the second metal interconnect structures, wherein: the second die-to-die bonding pads are bonded to the first die-to-die bonding pads to provide die-to-die bonding between the first semiconductor die and the second semiconductor die; an external bonding pad located on, or in, one of the first interconnect-level dielectric layers and the second interconnect-level dielectric layers that has a physically exposed horizontal surface; and the external bonding pad is located entirely within a first horizontal plane including the first proximal planar surface of the first substrate and a second horizontal plane including the second proximal planar surface of the second substrate.

According to another aspect of the present disclosure, a method of forming a bonded assembly is provided, which comprises: providing a first semiconductor die, wherein the first semiconductor die comprises a first substrate including a first distal planar surface and a first proximal planar surface, first semiconductor devices located on, or over, the first proximal planar surface of the first substrate, first interconnect-level dielectric layers including first metal interconnect structures that are electrically connected to the first semiconductor devices, and first die-to-die bonding pads located at a surface portion of the first interconnect-level dielectric layers and electrically connected to the first metal interconnect structures; providing a second semiconductor die, wherein the second semiconductor die comprises a second substrate including a second distal planar surface and a second proximal planar surface, second semiconductor devices located on, or over, the second proximal planar surface of the second substrate, second interconnect-level dielectric layers including second metal interconnect structures that are electrically connected to the second semiconductor devices, and second die-to-die bonding pads located at a surface portion of the second interconnect-level dielectric layers and electrically connected to the second metal interconnect structures; bonding the second die-to-die bonding pads to the first die-to-die bonding pads to provide die-to-die bonding between the first semiconductor die and the second semiconductor die; forming a recess region by removing material portions within volumes vertically extending from the second distal planar surface through the second substrate and to the second proximal planar surface, to provide a physically exposed horizontal surface of one of the first interconnect-level dielectric layers and the second interconnect-level dielectric layers; and providing an external bonding pad located on, or in, the one of the first interconnect-level dielectric layers and the second interconnect-level dielectric layers.

According to yet another aspect of the present disclosure, a bonded assembly is provided, which comprises: a first semiconductor die comprising a first substrate including a first distal planar surface and a first proximal planar surface, first semiconductor devices located on, or over, the first proximal planar surface of the first substrate, first interconnect-level dielectric layers including first metal interconnect structures that are electrically connected to the first semiconductor devices, and first die-to-die bonding pads located at a surface portion of the first interconnect-level dielectric layers and electrically connected to the first metal interconnect structures; and a second semiconductor die comprising a second substrate including a second distal planar surface and a second proximal planar surface, second semiconductor devices located on, or over, the second proximal planar surface of the second substrate, second interconnect-level dielectric layers including second metal interconnect structures that are electrically connected to the second semiconductor devices, and second die-to-die bonding pads located at a surface portion of the second interconnect-level dielectric layers and electrically connected to the second metal interconnect structures, wherein: the second die-to-die bonding pads are bonded to the first die-to-die bonding pads to provide die-to-die bonding between the first semiconductor die and the second semiconductor die; a first external bonding pad is located on, or over, the second distal planar surface of the second substrate; and a first laterally-insulated external connection via structure vertically extends at least from the second distal planar surface of the second substrate, through the second substrate, the second interconnect-level dielectric layers, a horizontal plane including an interface between the first semiconductor die and the second semiconductor die, and a subset of layers within the first interconnect-level dielectric layers, and to one of the first metal interconnect structures and contacts the first bonding pad.

According to still another aspect of the present disclosure, a method of forming a bonded assembly is provided, which comprises: providing a first semiconductor die, wherein the first semiconductor die comprises a first substrate including a first distal planar surface and a first proximal planar surface, first semiconductor devices located on, or over, the first proximal planar surface of the first substrate, first interconnect-level dielectric layers including first metal interconnect structures that are electrically connected to the first semiconductor devices, and first die-to-die bonding pads located at a surface portion of the first interconnect-level dielectric layers and electrically connected to the first metal interconnect structures; providing a second semiconductor die, wherein the second semiconductor die comprises a second substrate including a second distal planar surface and a second proximal planar surface, second semiconductor devices located on, or over, the second proximal planar surface of the second substrate, second interconnect-level dielectric layers including second metal interconnect structures that are electrically connected to the second semiconductor devices, and second die-to-die bonding pads located at a surface portion of the second interconnect-level dielectric layers and electrically connected to the second metal interconnect structures; bonding the second die-to-die bonding pads to the first die-to-die bonding pads to provide die-to-die bonding between the first semiconductor die and the second semiconductor die; forming a first connection via cavity through the second substrate, the second interconnect-level dielectric layers, a horizontal plane including an interface between the first semiconductor die and the second semiconductor die, and a subset of layers within the first interconnect-level dielectric layers, wherein one of the first metal interconnect structures is physically exposed at a bottom of the first connection via cavity; forming a first laterally-insulated external connection via structure in the first connection via cavity on the one of the first metal interconnect structures; and forming a first external bonding pad on the first laterally-insulated external connection via structure.

According to even another aspect of the present disclosure, a bonded assembly is provided, which comprises: a memory die comprising an alternating stack of insulating layers and electrically conductive layers that has stepped surfaces, memory stack structures vertically extending through the alternating stack, a stepped dielectric material portion contacting the stepped surface of the alternating stack, a through-dielectric external connection via structure vertically extending through the stepped dielectric material portion; memory-side metal interconnect structures included in memory-side interconnect-level dielectric layers, and memory-side bonding pads; a logic die comprising a semiconductor substrate, semiconductor devices located on the semiconductor substrate and including a peripheral circuitry configurated to control operation of the memory stack structures within the memory die, logic-side metal interconnect structures included in logic-side interconnect-level dielectric layers, and logic-side bonding pads that are bonded to the memory-side bonding pads of the memory die at a die-to-die bonding interface; and an external bonding pad located on a surface of the stepped dielectric material portion and contacting a distal planar surface of the through-dielectric external connection via structure.

According to further another aspect of the present disclosure, a method of forming a bonded assembly is provided, which comprises: providing a memory die comprising a memory-side substrate, an alternating stack of insulating layers and electrically conductive layers that has stepped surfaces and is located on the memory-side substrate, memory stack structures vertically extending through the alternating stack, a stepped dielectric material portion contacting the stepped surface of the alternating stack, a through-dielectric external connection via structure vertically extending through the stepped dielectric material portion, memory-side metal interconnect structures included in memory-side interconnect-level dielectric layers, and memory-side bonding pads; providing a logic die comprising a semiconductor substrate, semiconductor devices located on the semiconductor substrate and including a peripheral circuitry configurated to control operation of the memory stack structures within the memory die, logic-side metal interconnect structures included in logic-side interconnect-level dielectric layers, and logic-side bonding pads; bonding the memory-side bonding pads to the logic-side bonding pads, wherein a die-to-die bonding interface is formed; physically exposing a distal planar surface of the through-dielectric external connection via structure by removing at least a portion of the memory-side substrate; and forming an external bonding pad on the distal planar surface of the through-dielectric external connection via structure.

9A. The hinged vertical plane A-A' corresponds to the plane of the vertical cross-sectional view of FIG. 9A.

Figure 10A:
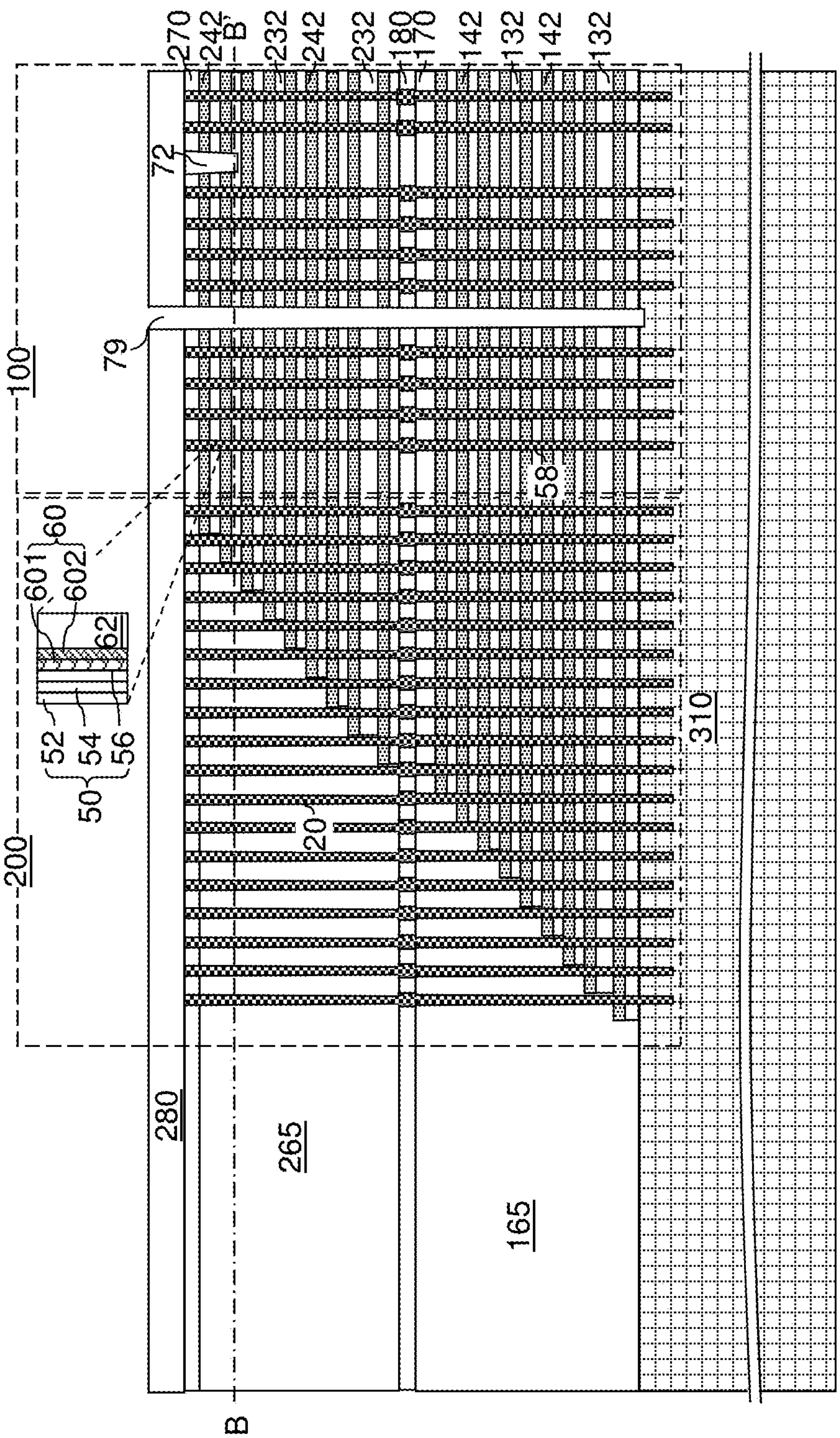

FIG. 10A is a vertical cross-sectional view of the first exemplary structure after formation of a first contact level dielectric layer and backside trenches according to an embodiment of the present disclosure.

Figure 10B:
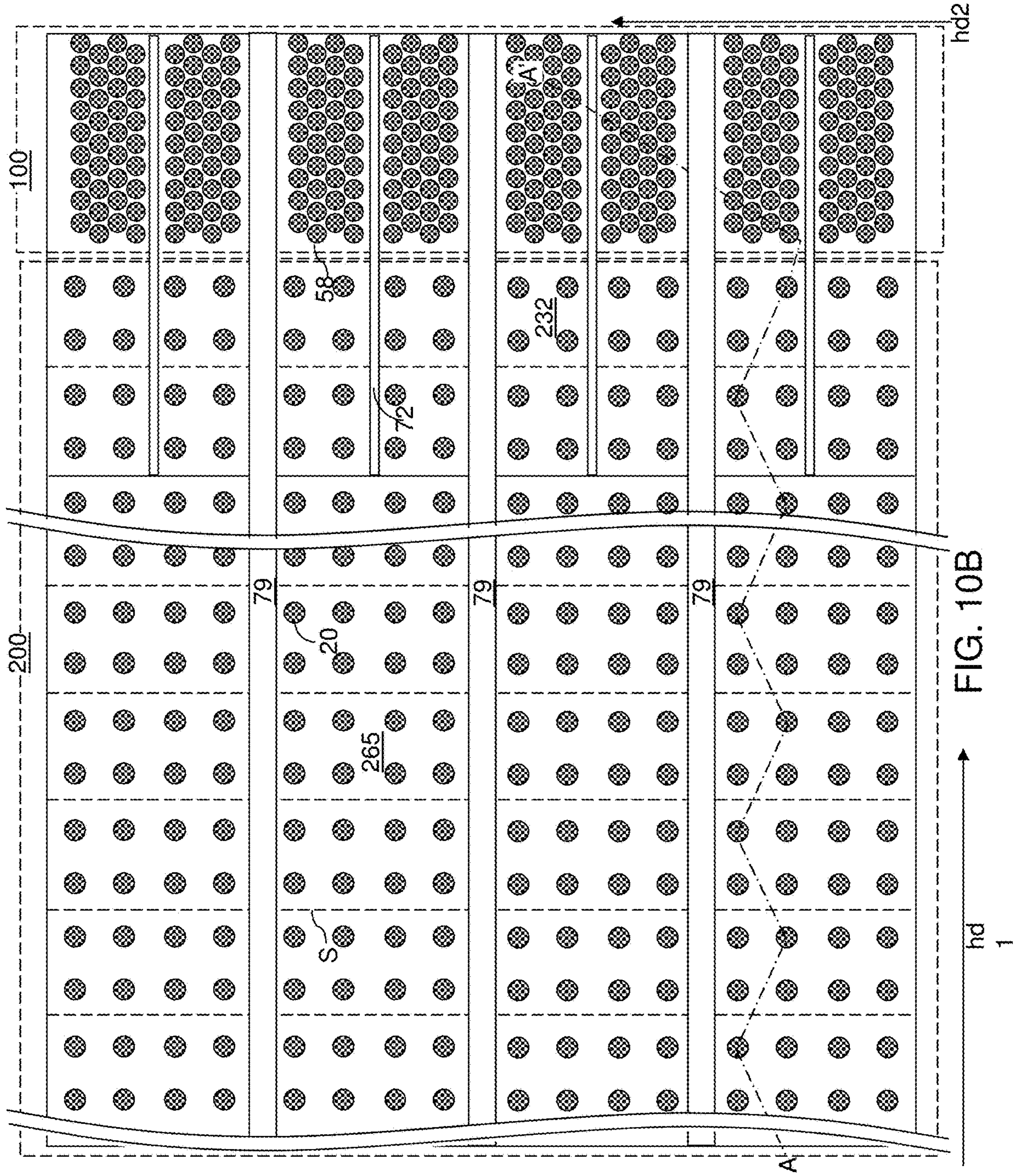

FIG. 10B is a horizontal cross-sectional view of the first exemplary structure along the horizontal plane B-B' of FIG. 10A. The hinged vertical plane A-A' corresponds to the plane of the vertical cross-sectional view of FIG. 10A.

Figure 11:
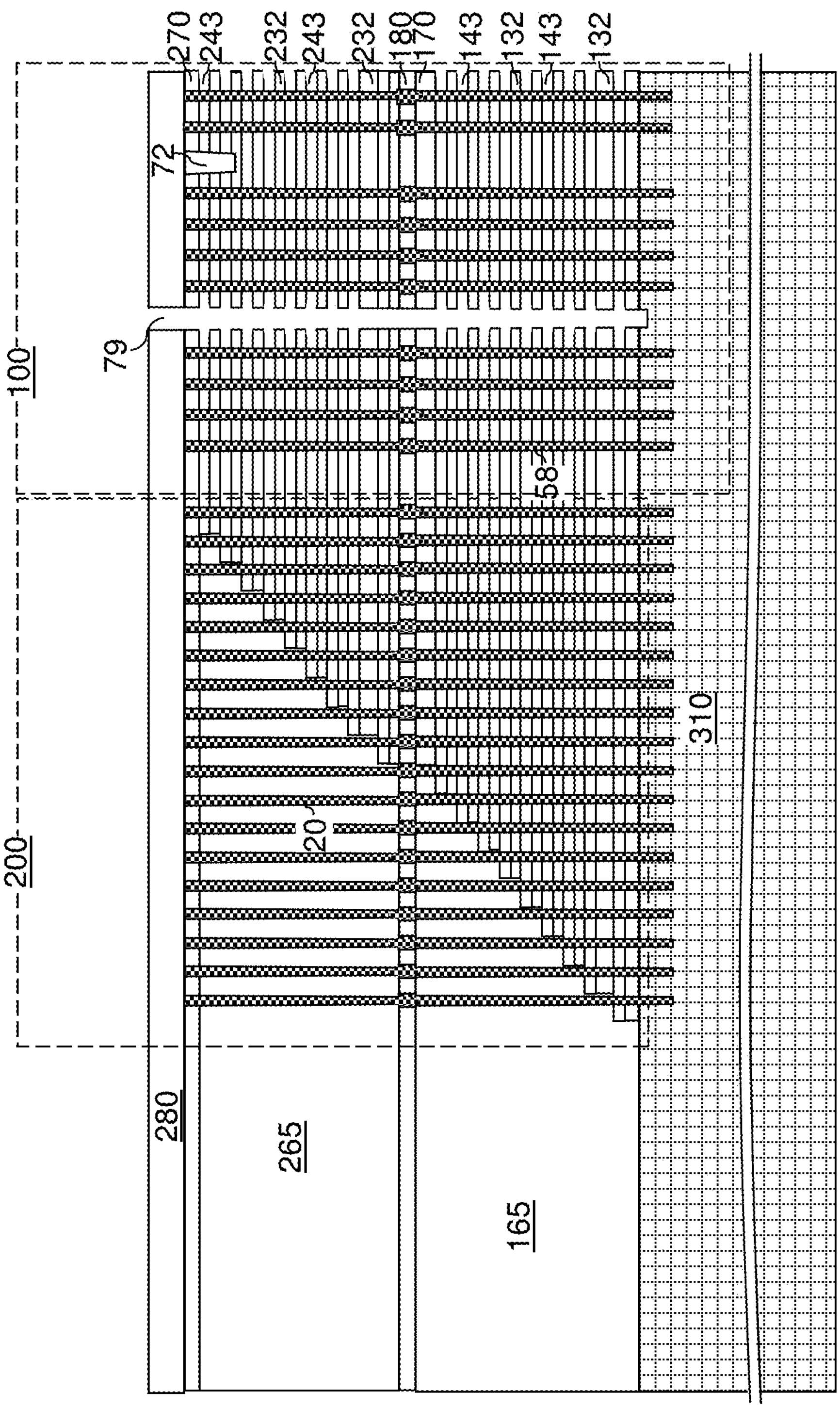

FIG. 11 is a vertical cross-sectional view of the first exemplary structure after formation of backside trenches according to an embodiment of the present disclosure.

FIGS. 12A-12E illustrate sequential vertical cross-sectional views of memory opening fill structures and a backside trench during formation of electrically conductive layers in the backside recesses according to an embodiment of the present disclosure.

Figure 13:
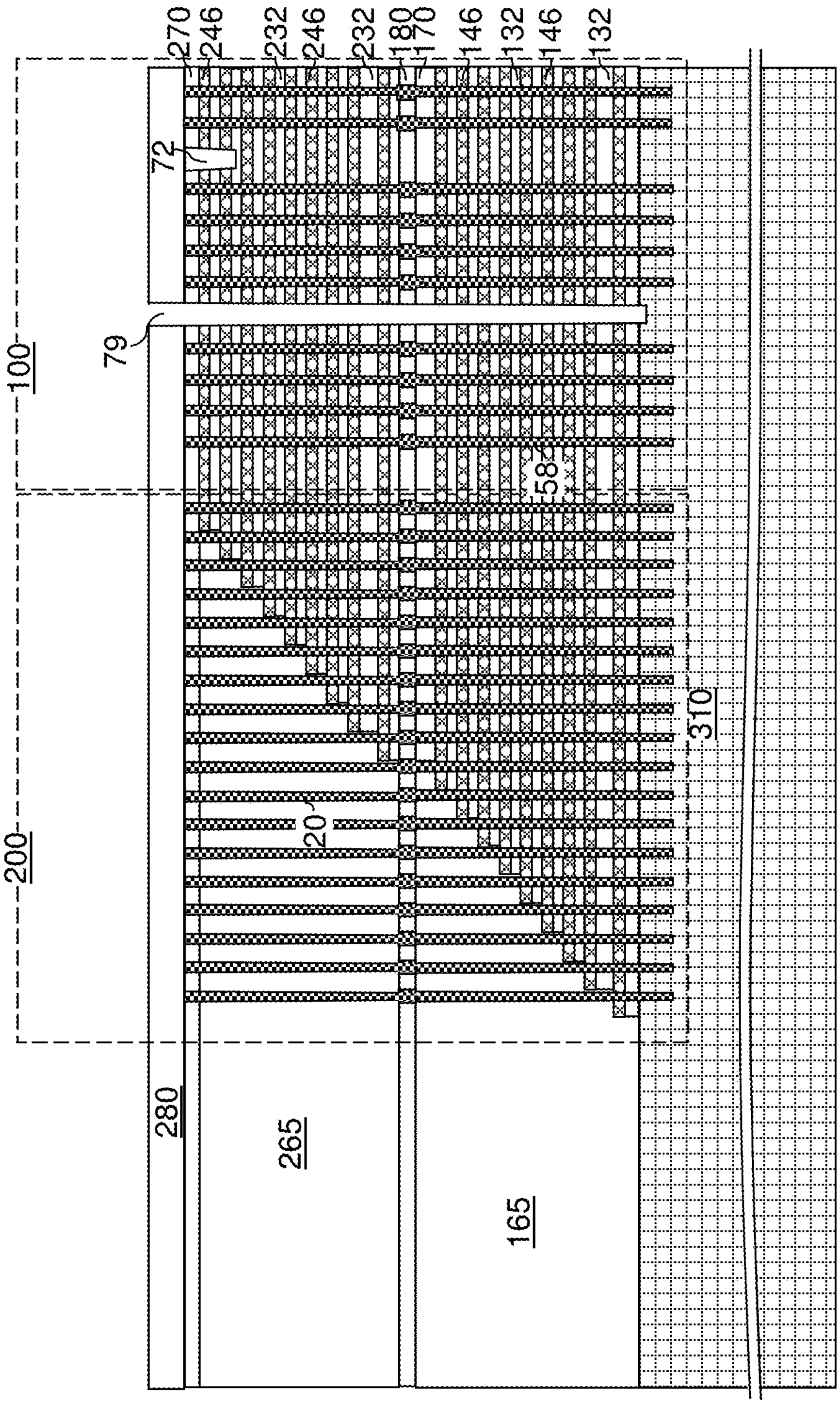

FIG. 13 is a vertical cross-sectional view of the first exemplary structure after formation of electrically conductive layers according to an embodiment of the present disclosure.

Figure 14A:
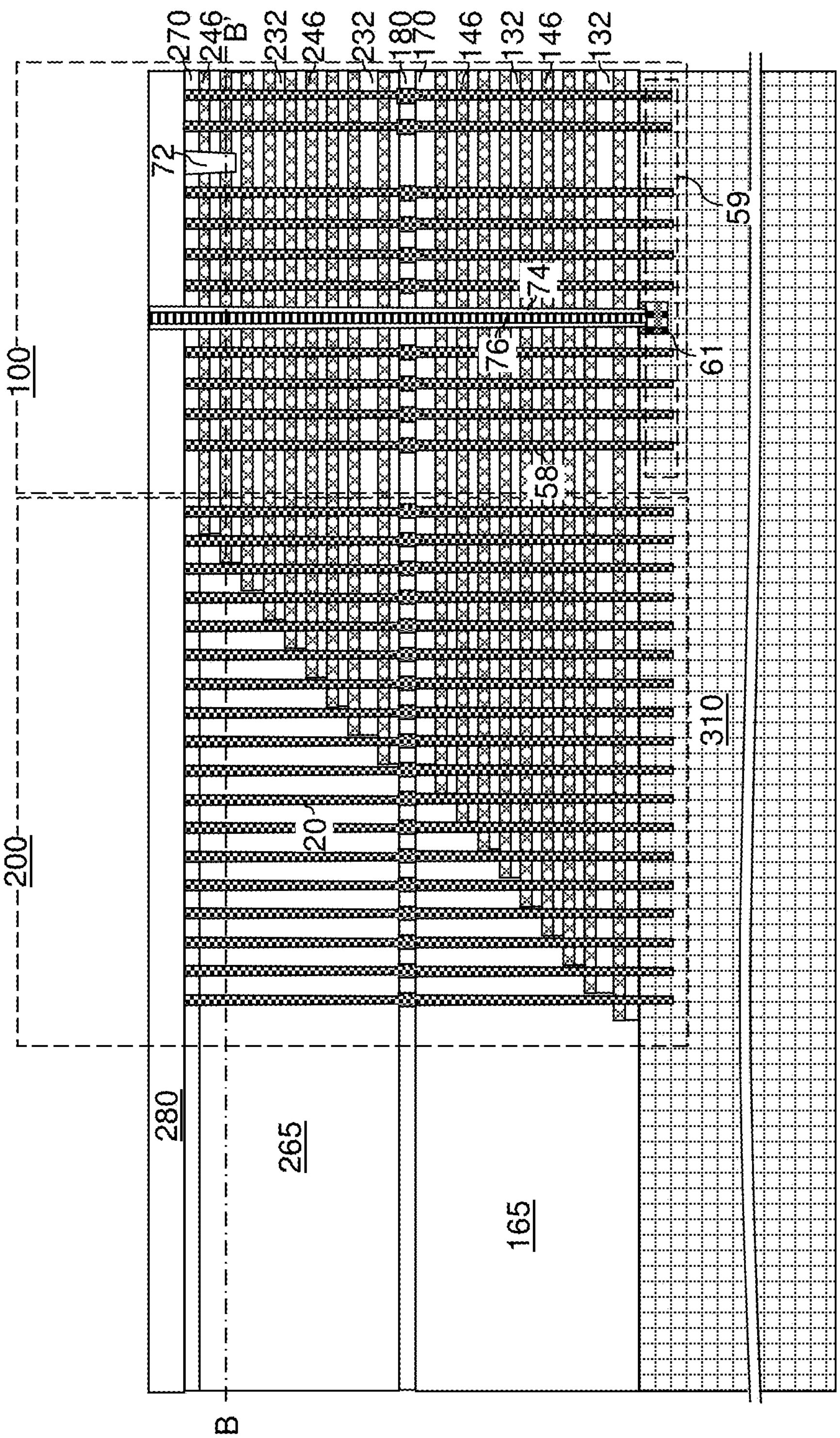

FIG. 14A is a vertical cross-sectional view of the first exemplary structure after formation of dielectric wall structures in the backside trenches according to an embodiment of the present disclosure.

Figure 14B:
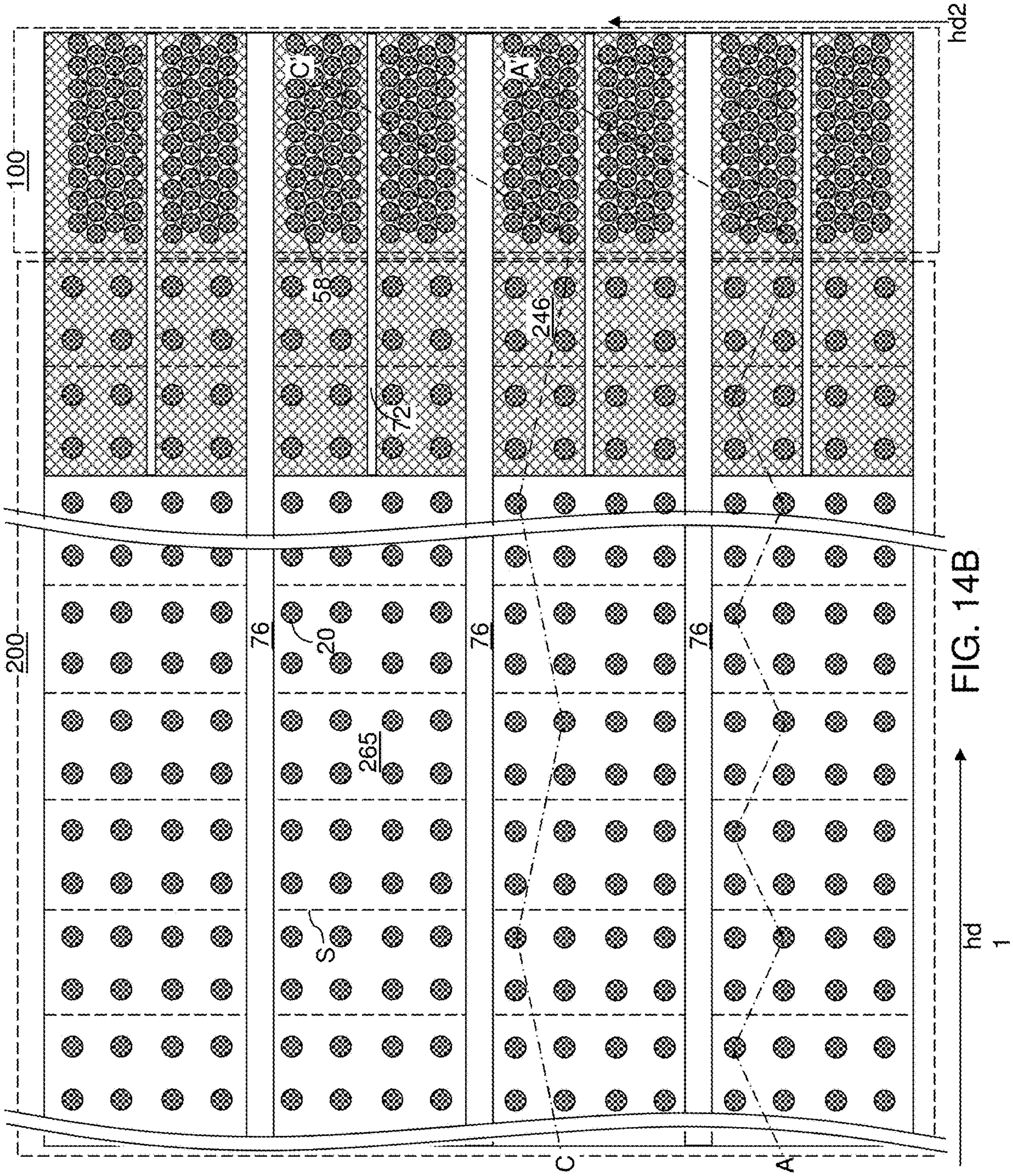

FIG. 14B is a horizontal cross-sectional view of the first exemplary structure along the horizontal plane B-B' of FIG. 14A. The hinged vertical plane A-A' corresponds to the plane of the vertical cross-sectional view of FIG. 14A.

Figure 14C:
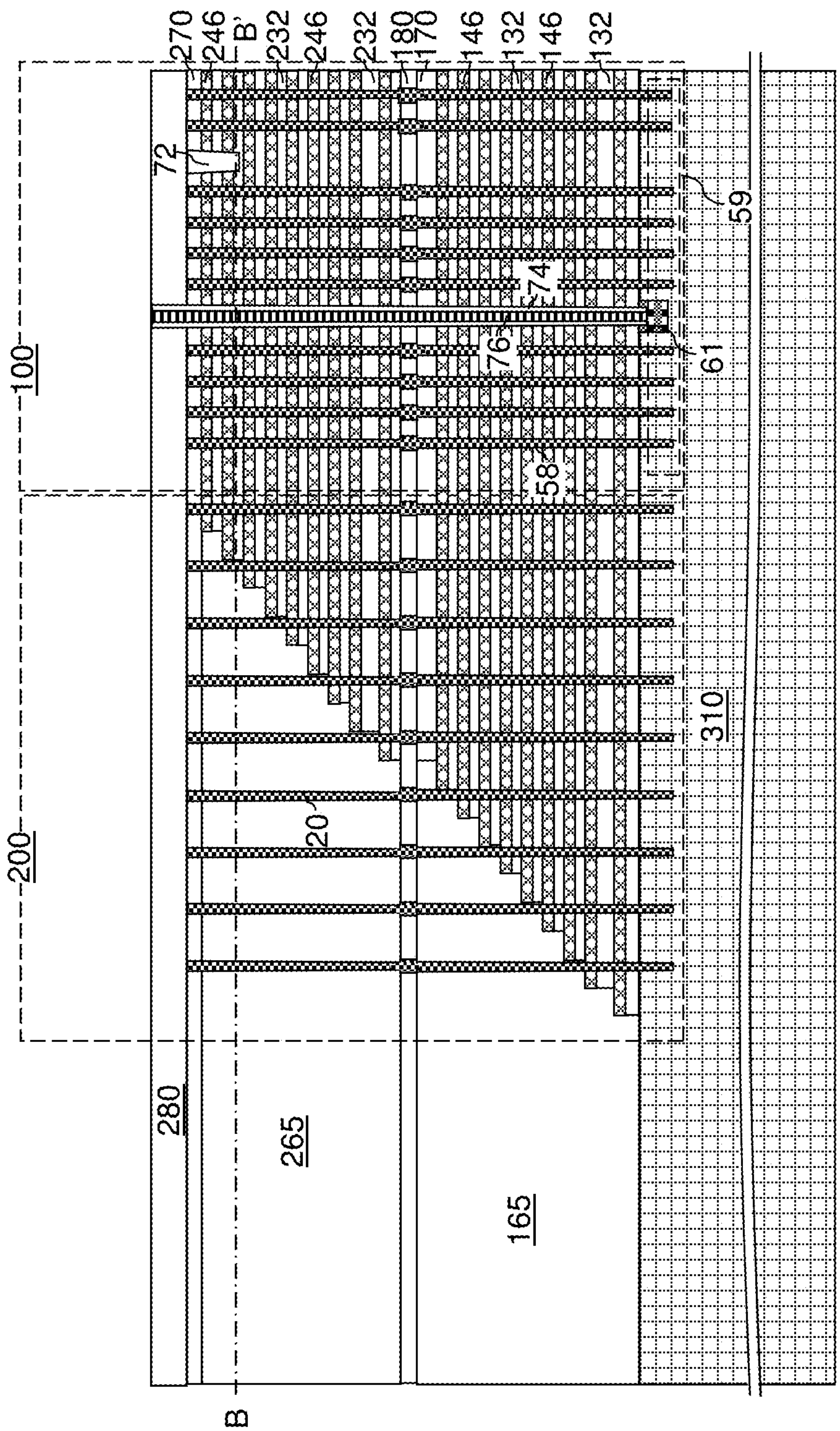

FIG. 14C is a vertical cross-sectional view of the first exemplary structure along the vertical plane C-C' of FIG. 14B.

Figure 15A:
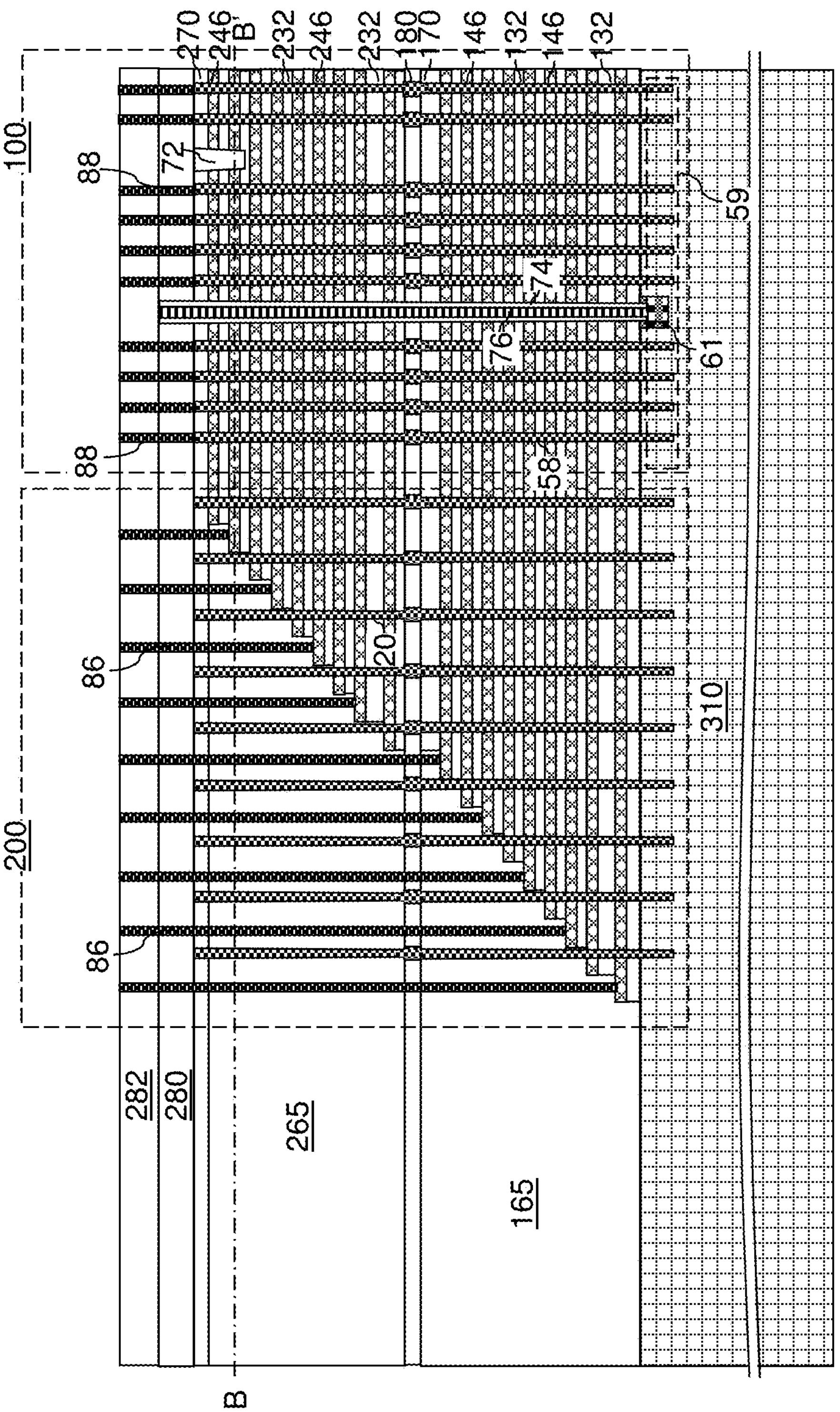

FIG. 15A is a vertical cross-sectional view of the first exemplary structure after formation of a second contact level dielectric layer and various contact via structures according to an embodiment of the present disclosure.

Figure 15B:
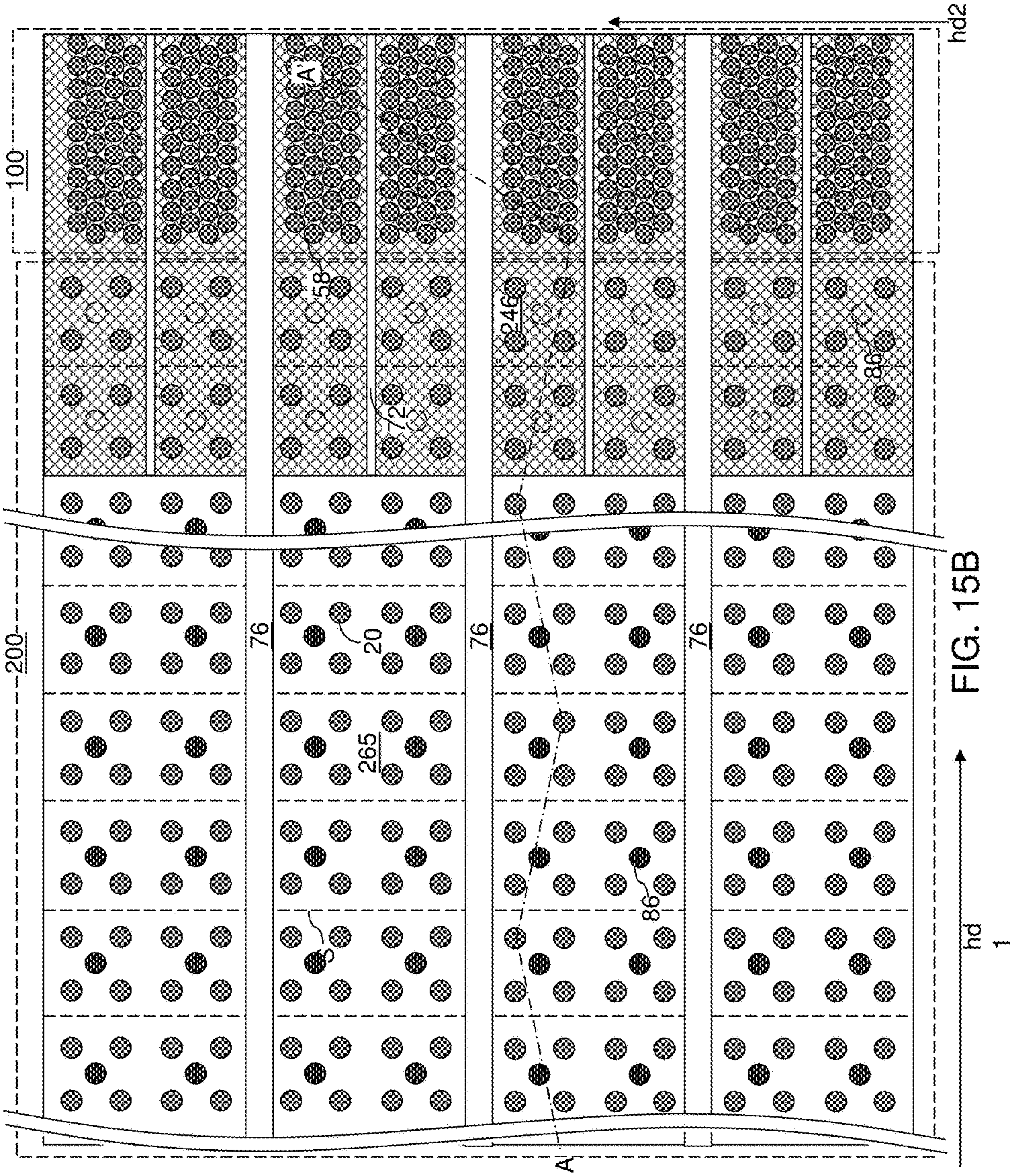

FIG. 15B is a horizontal cross-sectional view of the first exemplary structure along the vertical plane B-B' of FIG. 15A. The hinged vertical plane A-A' corresponds to the plane of the vertical cross-sectional view of FIG. 15A.

Figure 16:
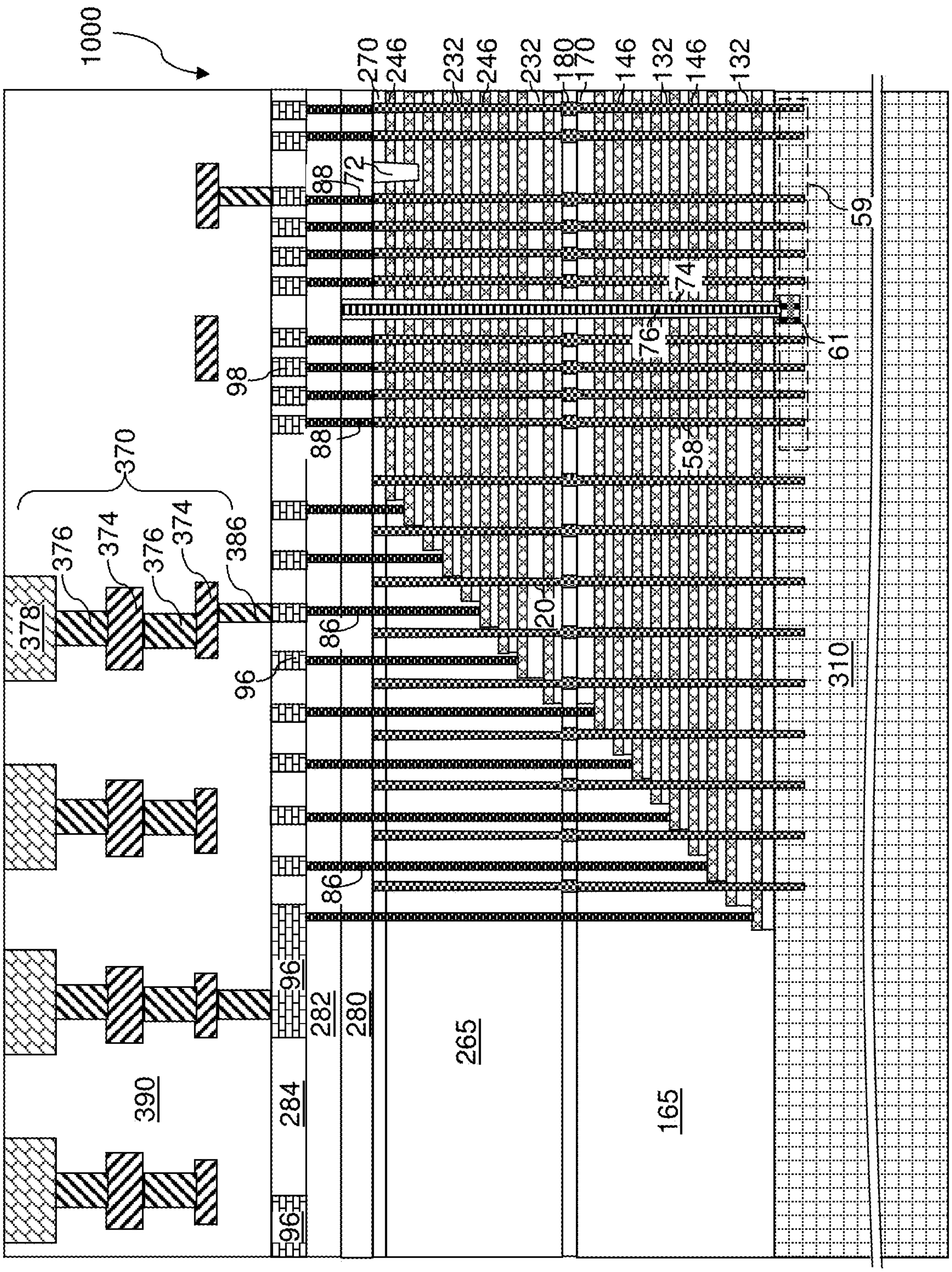

FIG. 16 is a vertical cross-sectional view of the first exemplary structure after formation of a memory die that includes interconnect-level dielectric layers and metal interconnect structures according to an embodiment of the present disclosure.

Figure 17:
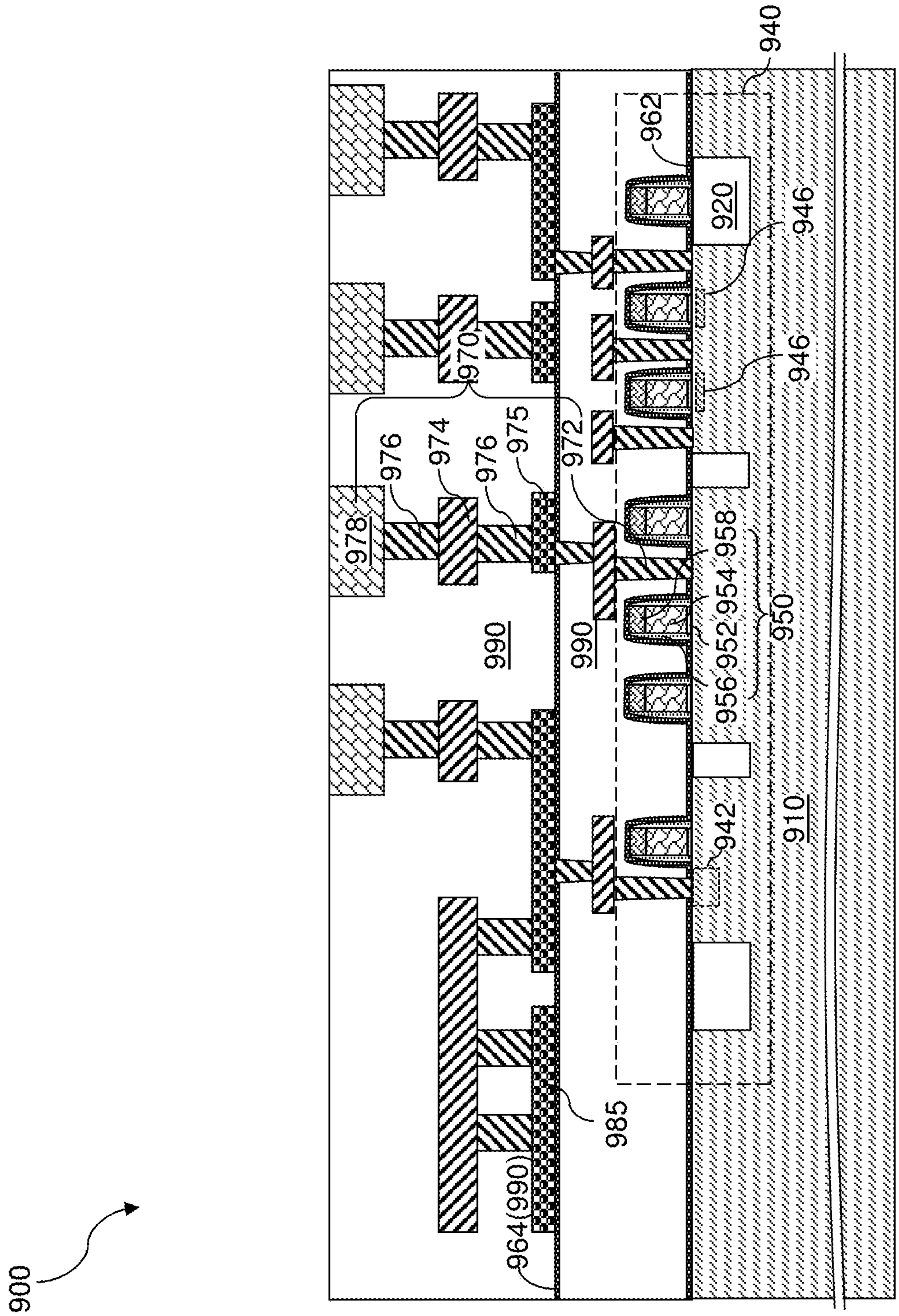

FIG. 17 is a vertical cross-sectional view of a logic die to be subsequently incorporated into the first exemplary structure according to an embodiment of the present disclosure.

FIGS. 18A-18D are sequential vertical cross-sectional views of a first configuration of the first exemplary structure during formation of a bonded assembly including recess regions containing external bonding pads, solder balls, and bonding wires according to an embodiment of the present disclosure.

Figure 18A:
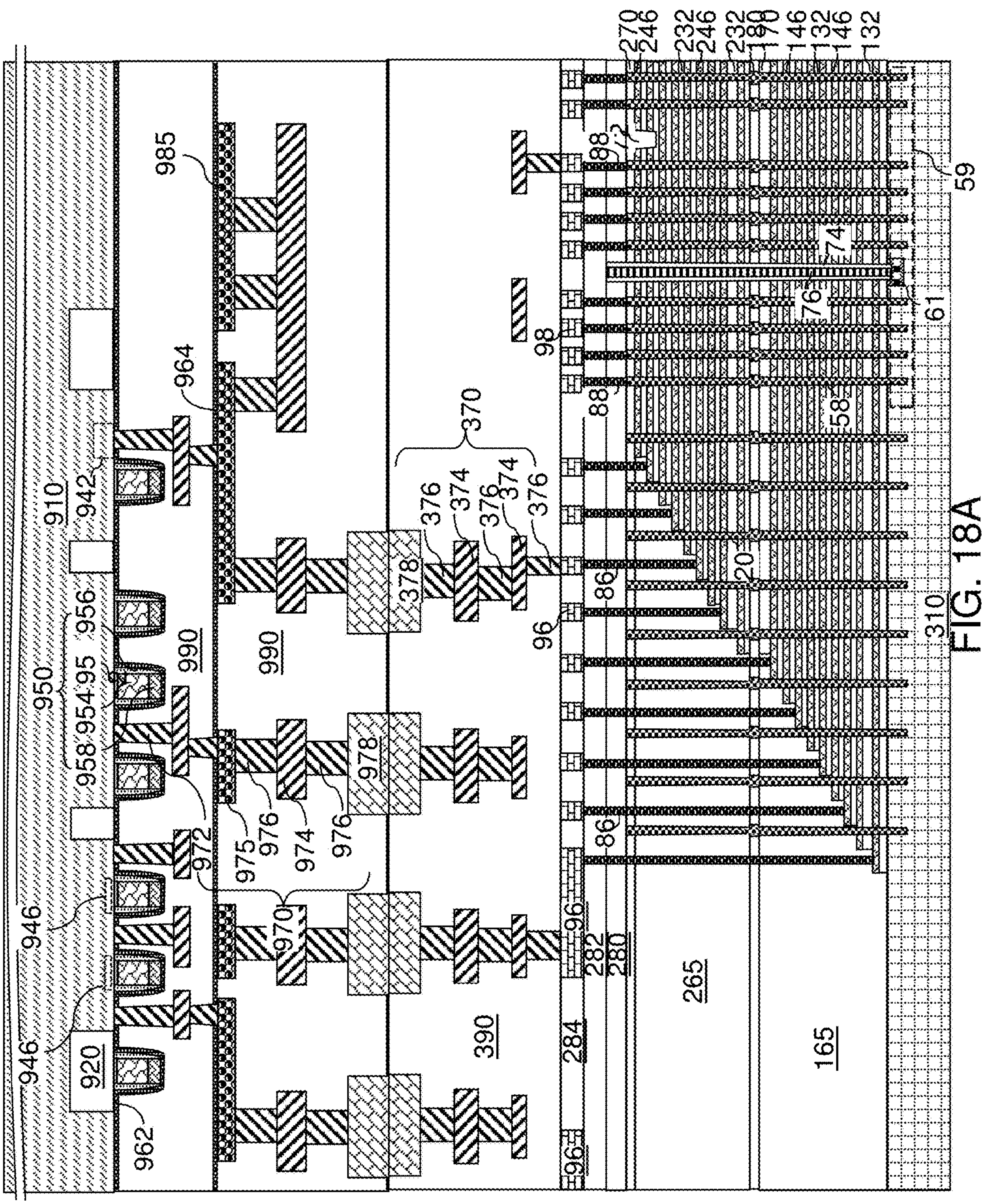
Figure 18B:
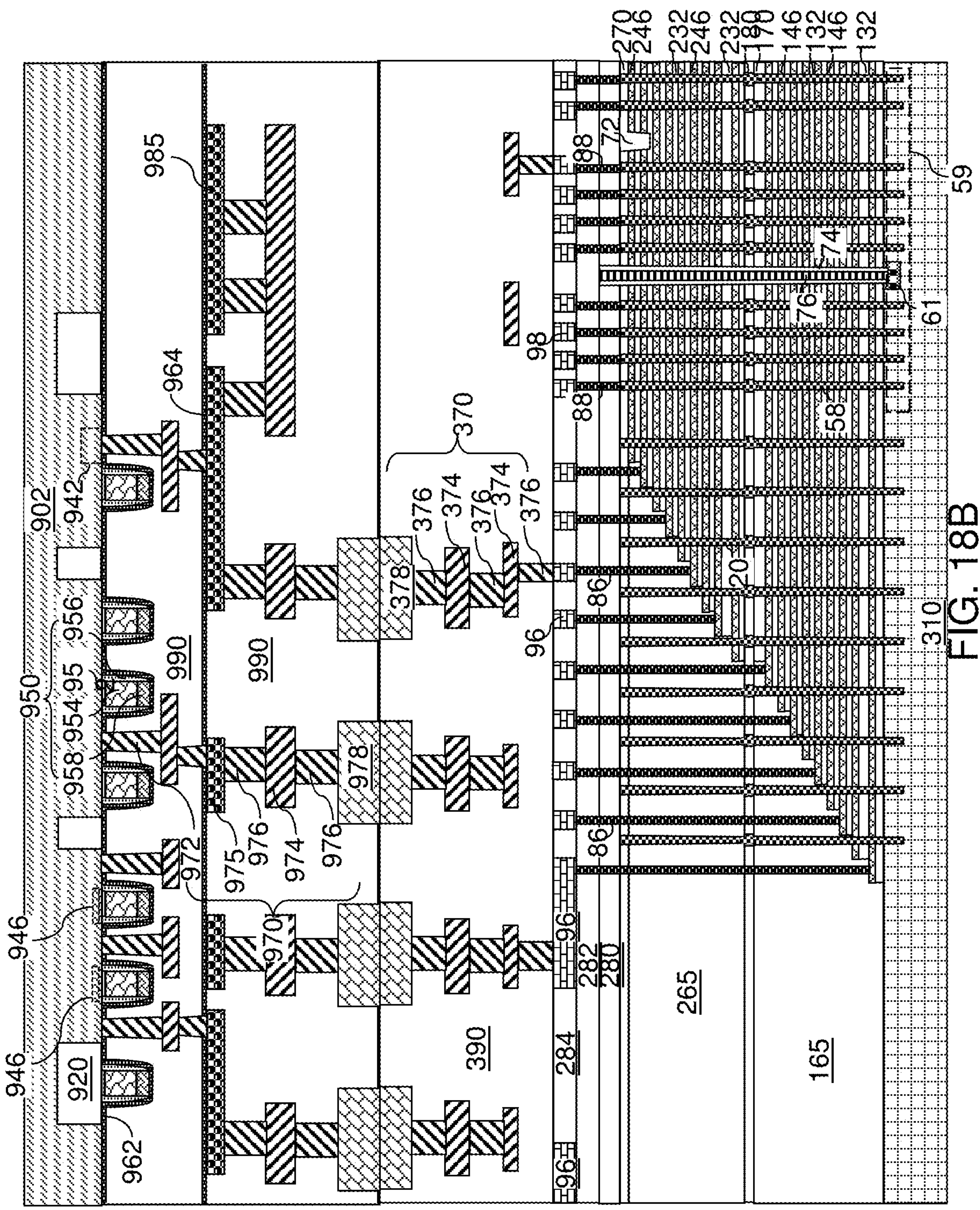
Figure 18C:
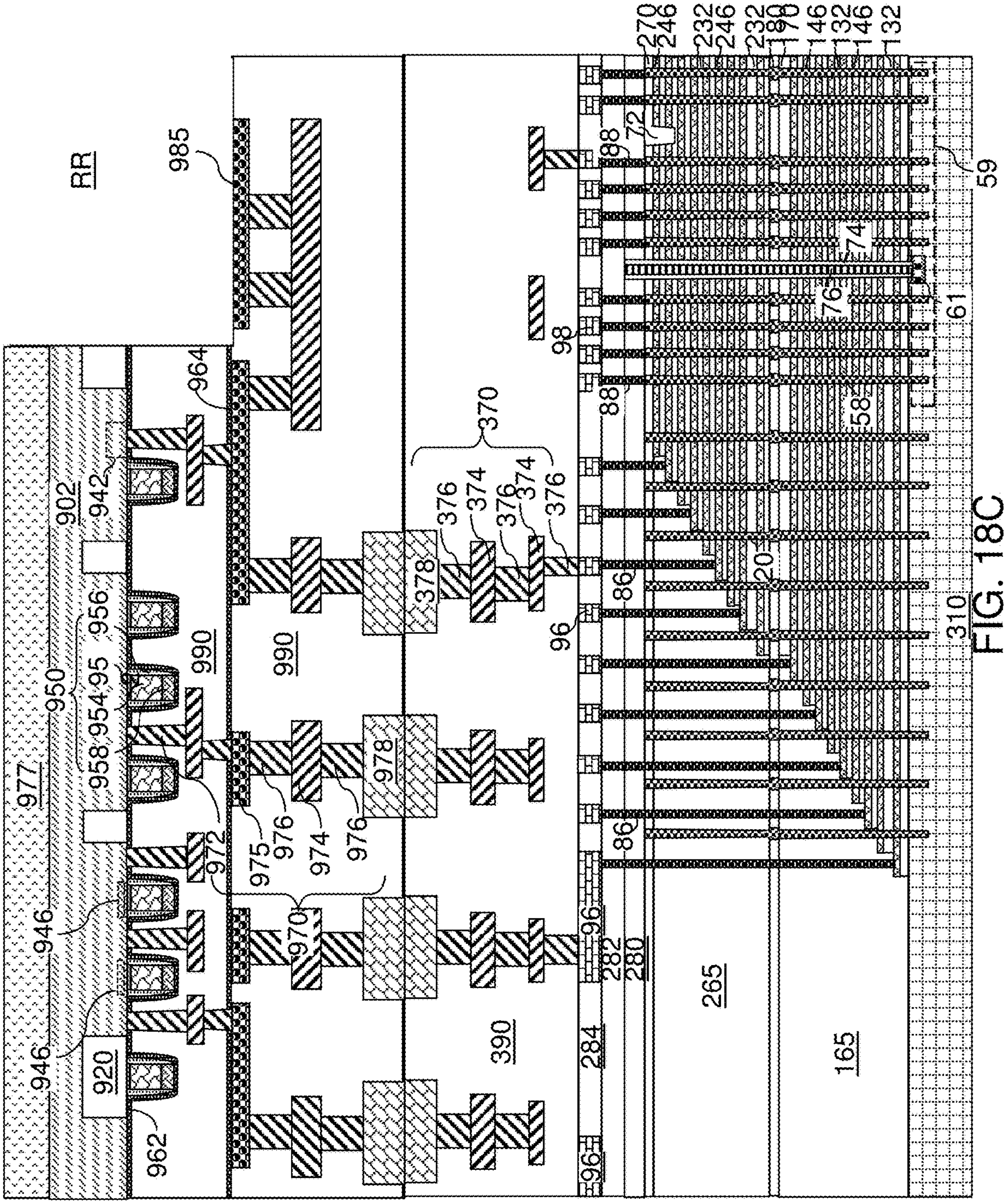
Figure 18D:
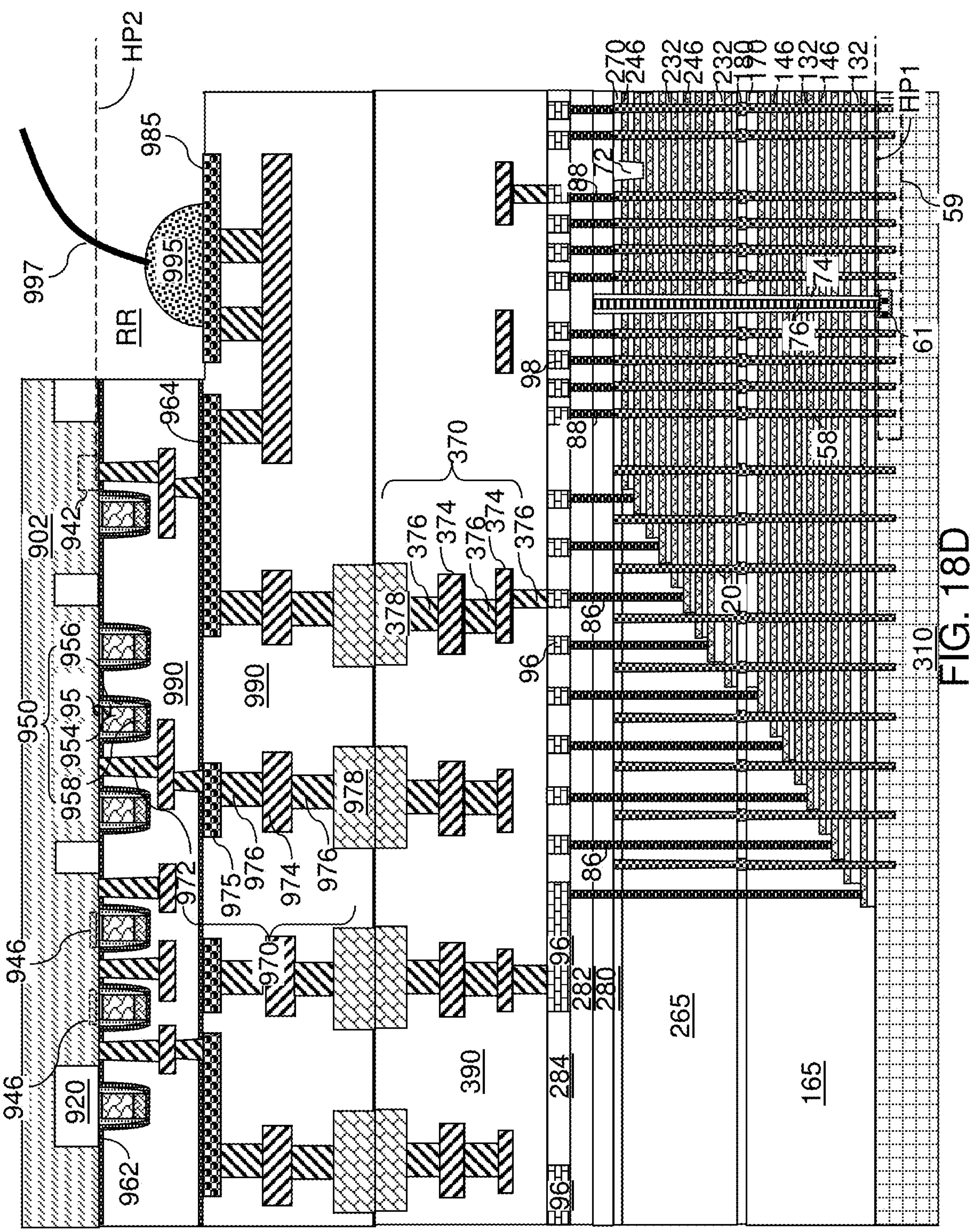
Figure 18E:
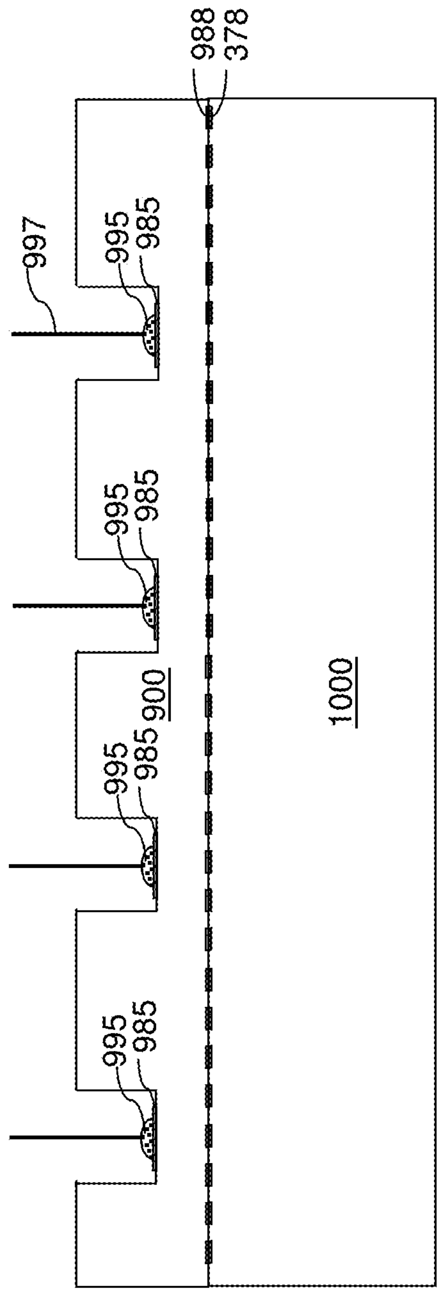

FIG. 18E is another vertical cross-sectional view of the first configuration of the first exemplary structure of FIG. 18D.

Figure 18F:
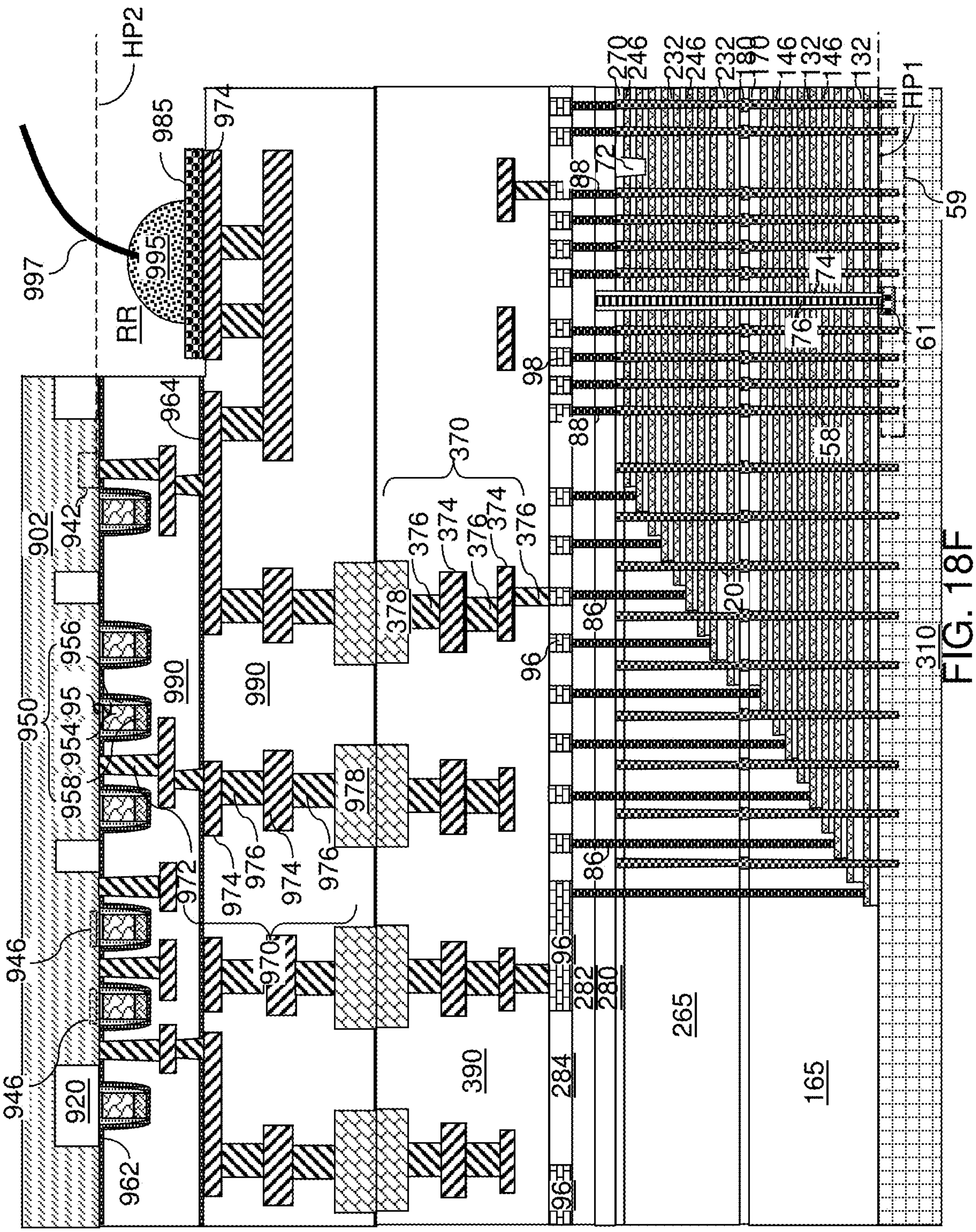

FIG. 18F is a vertical cross-sectional view of a first alternative configuration of the first exemplary structure at the processing step of FIG. 18D.

Figure 18G:
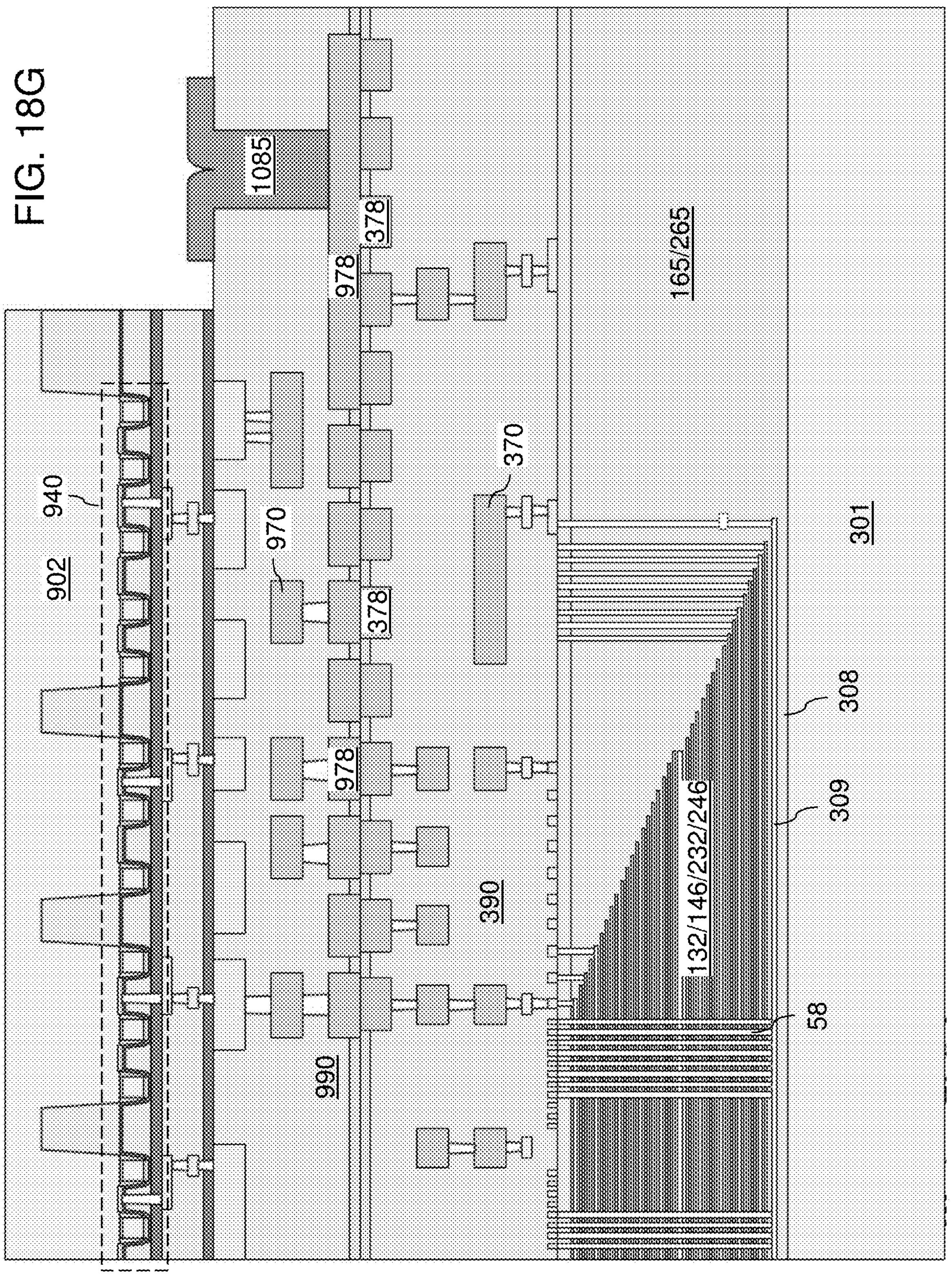

FIG. 18G is a vertical cross-sectional view of a second alternative embodiment of the first configuration of the first exemplary structure of FIG. 18D.

Figure 19A:
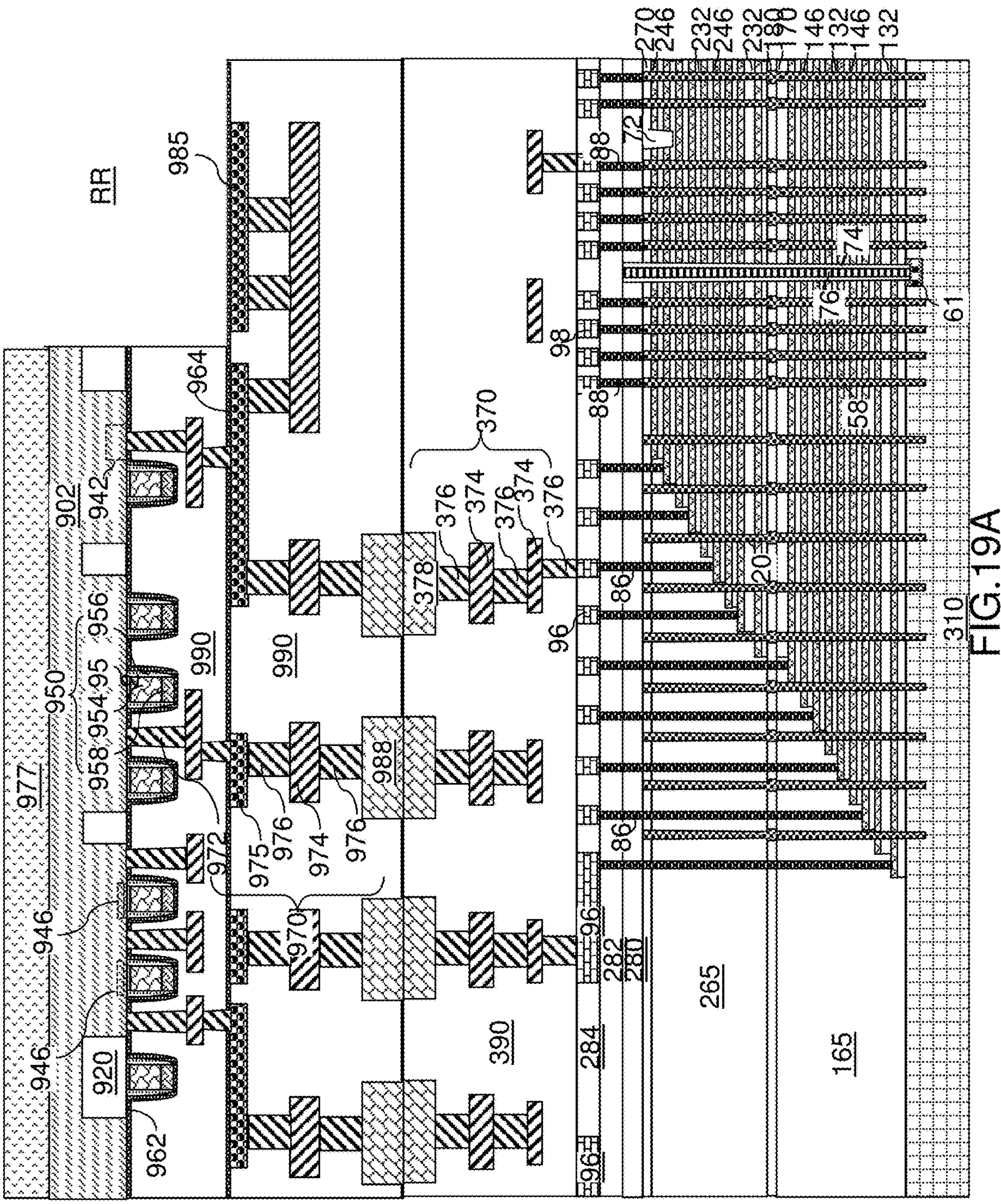
Figure 19B:
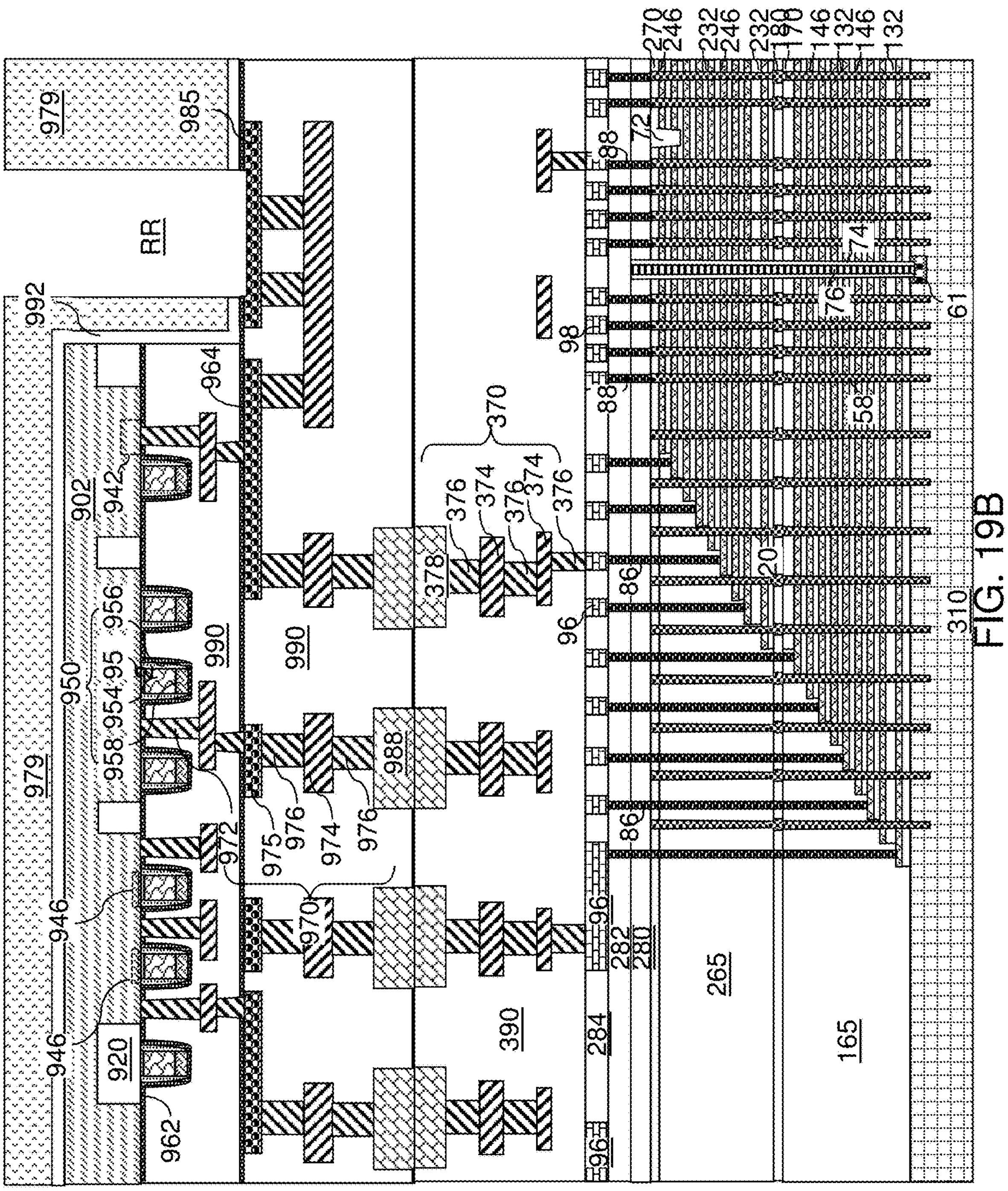
Figure 19C:
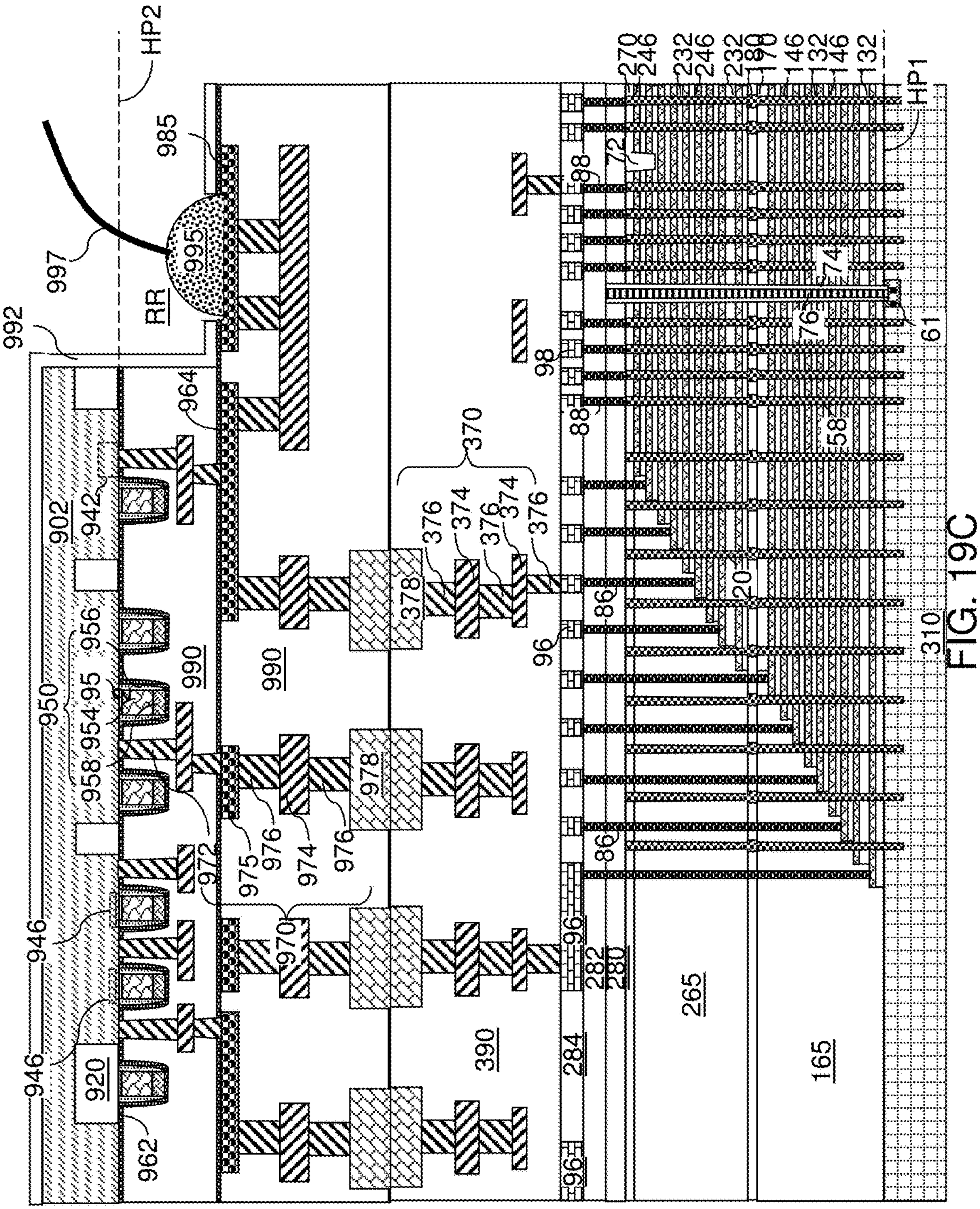

FIGS. 19A-19C are sequential vertical cross-sectional views of a second configuration of the first exemplary structure during formation of a bonded assembly including recess regions containing external bonding pads, solder balls, and bonding wires according to an embodiment of the present disclosure.

Figure 20A:
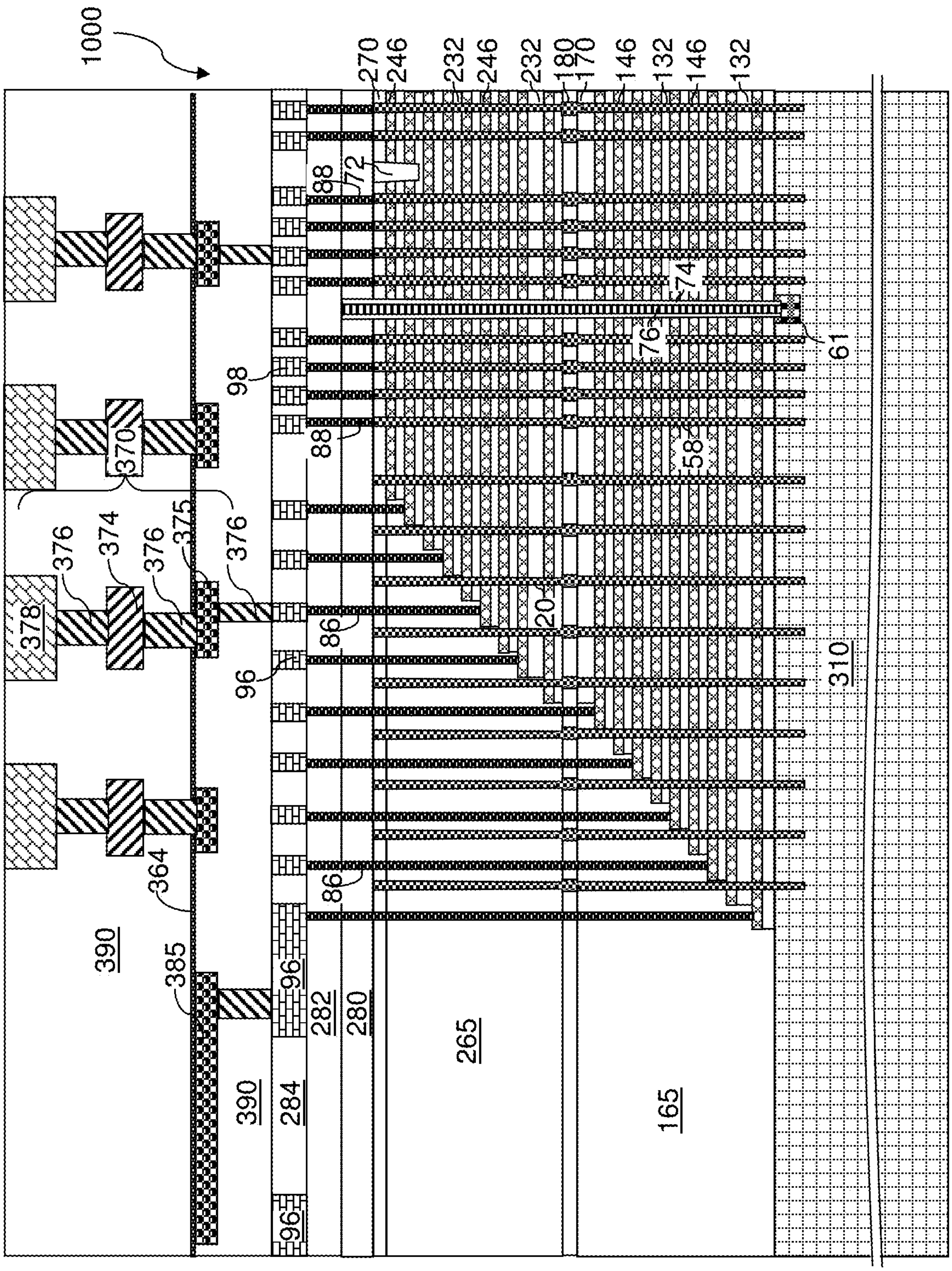

FIG. 20A is a vertical cross-sectional view of a configuration of the first exemplary structure after formation of a memory die that includes interconnect-level dielectric layers and metal interconnect structures according to an embodiment of the present disclosure.

Figure 20B:
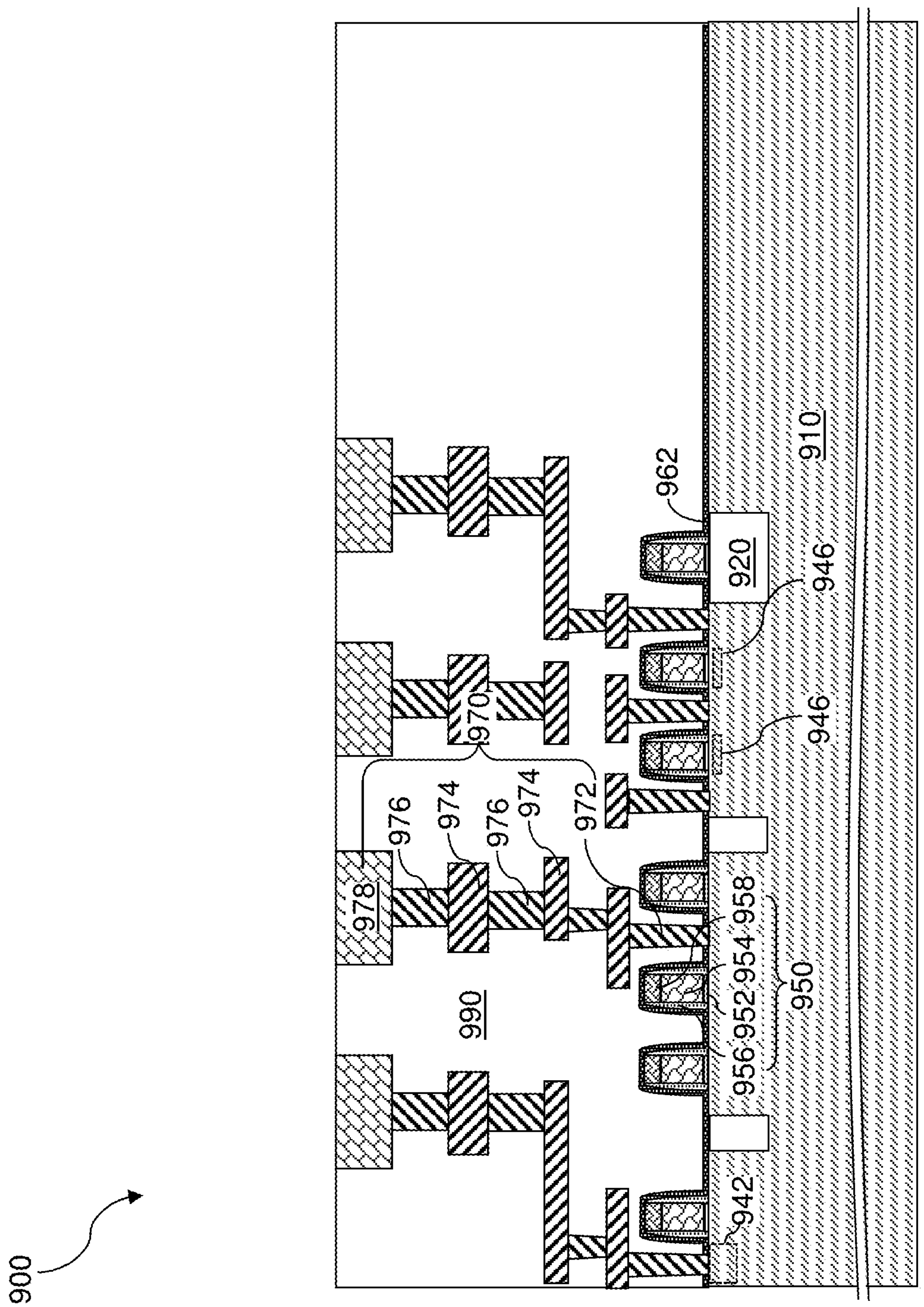

FIG. 20B is a vertical cross-sectional view of a configuration of a logic die to be subsequently incorporated into the first exemplary structure of FIG. 20A according to an embodiment of the present disclosure.

FIGS. 20C-20F are sequential vertical cross-sectional views of a third configuration of the first exemplary structure during formation of a bonded assembly including recess regions containing external bonding pads, solder balls, and bonding wires according to an embodiment of the present disclosure.

Figure 20C:
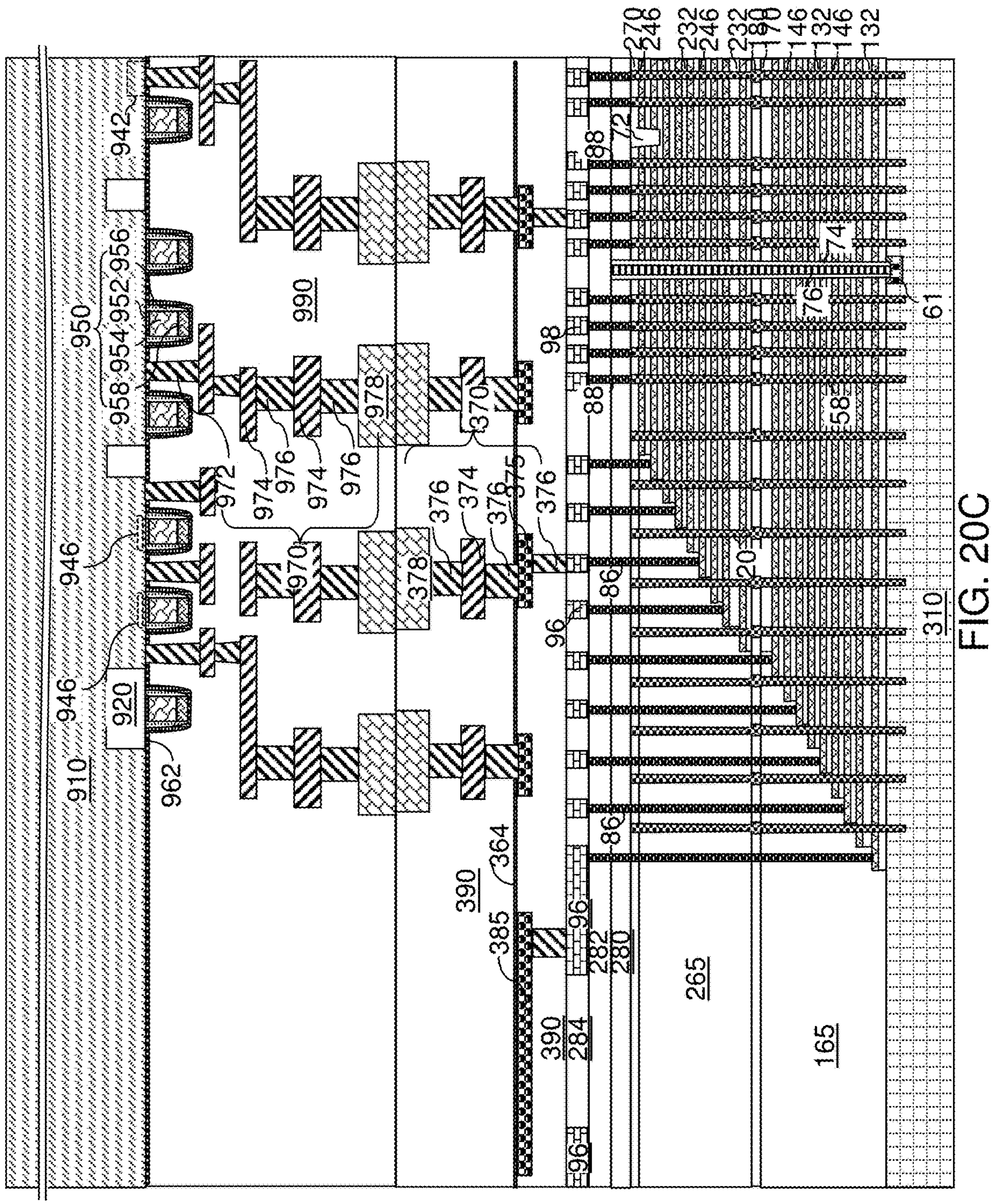
Figure 20D:
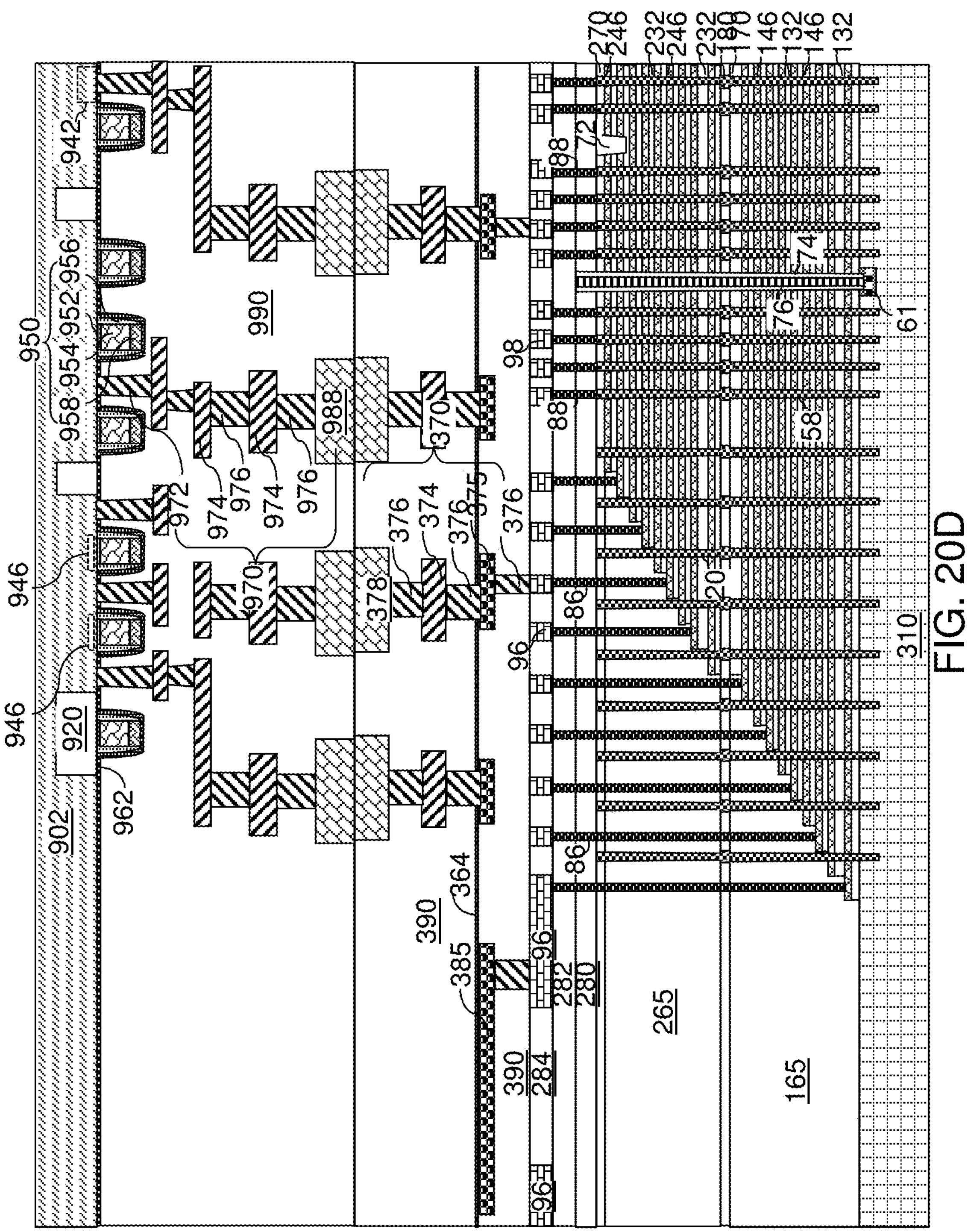
Figure 20E:
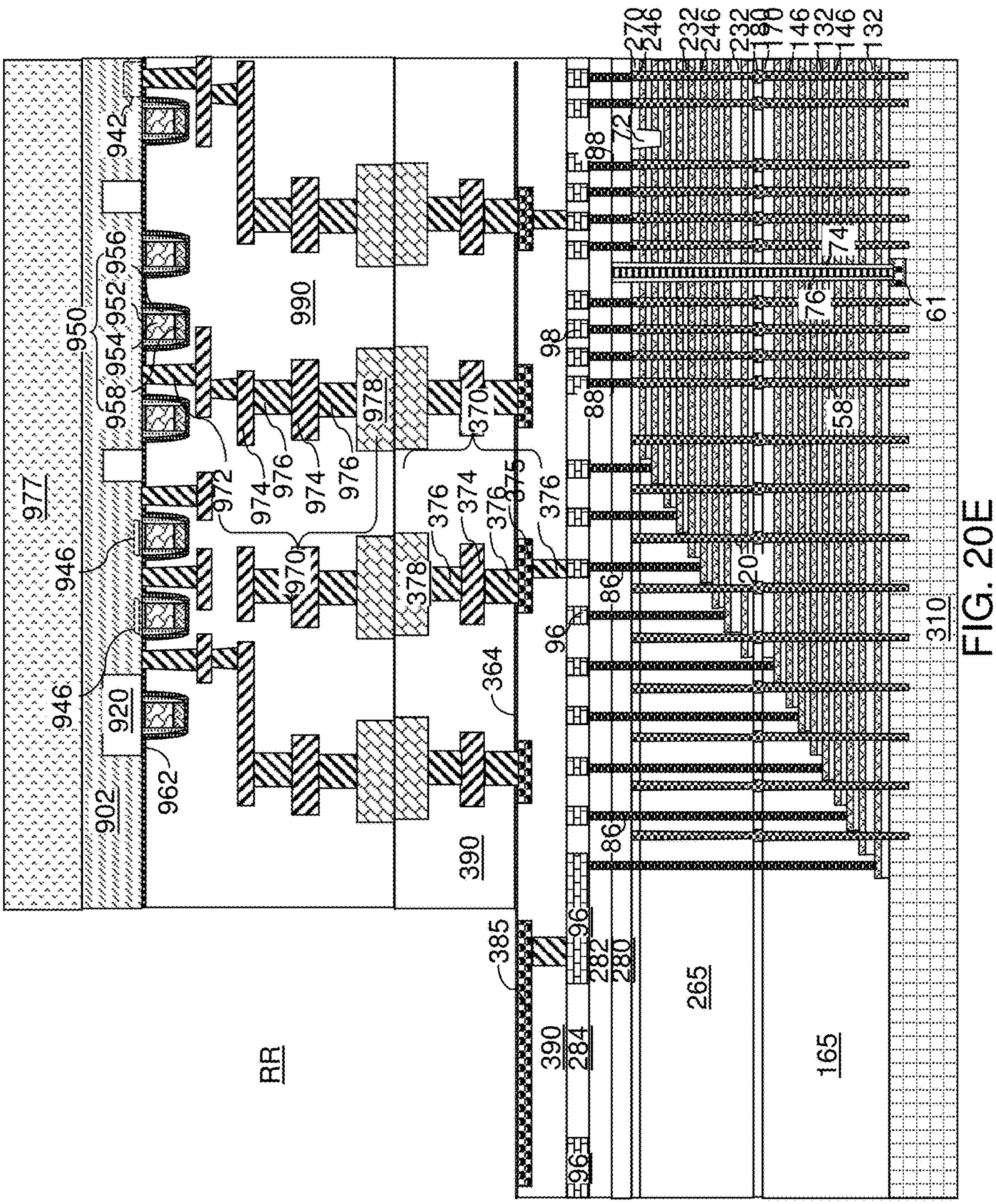
Figure 20F:
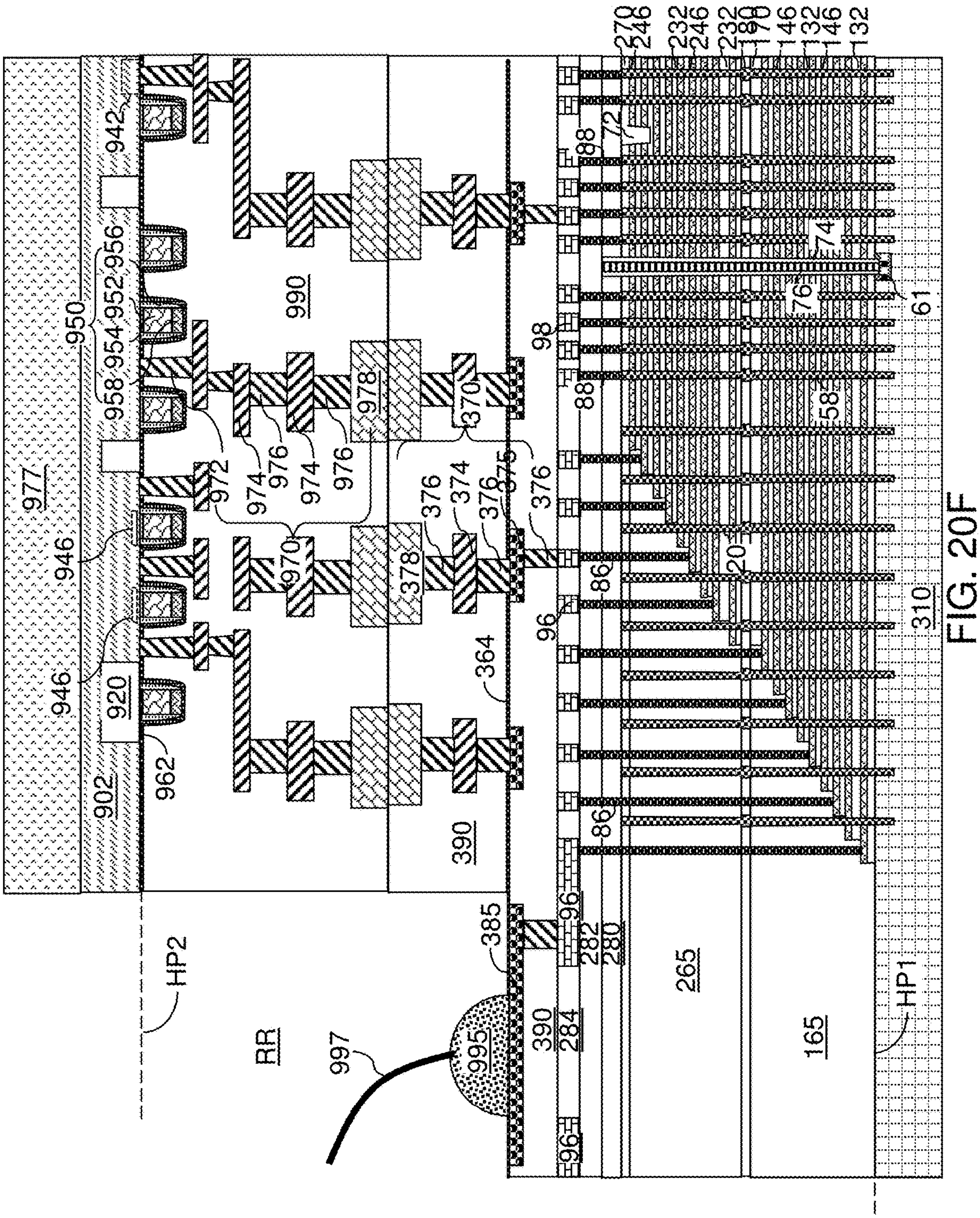
Figure 20G:
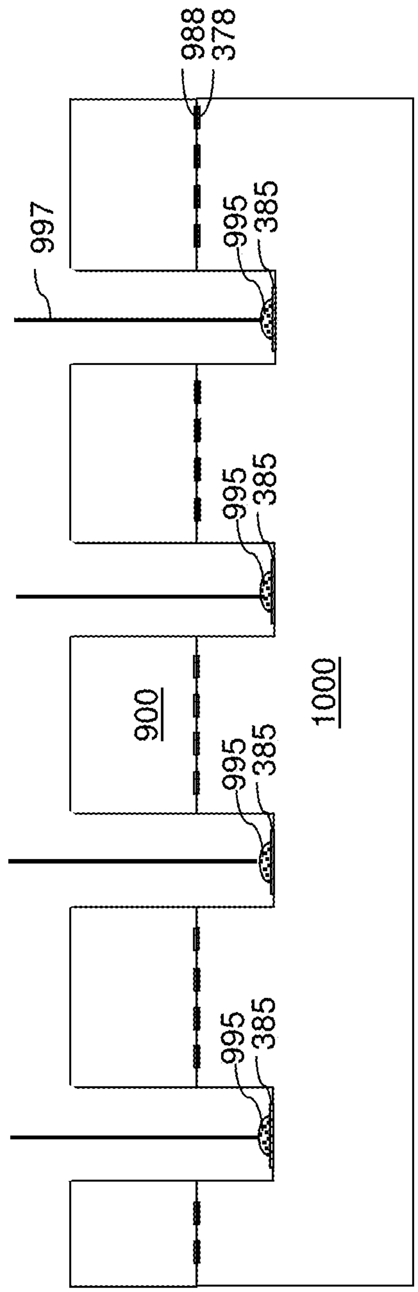

FIG. 20G is another vertical cross-sectional view of the third configuration of the first exemplary structure.

Figure 20H:
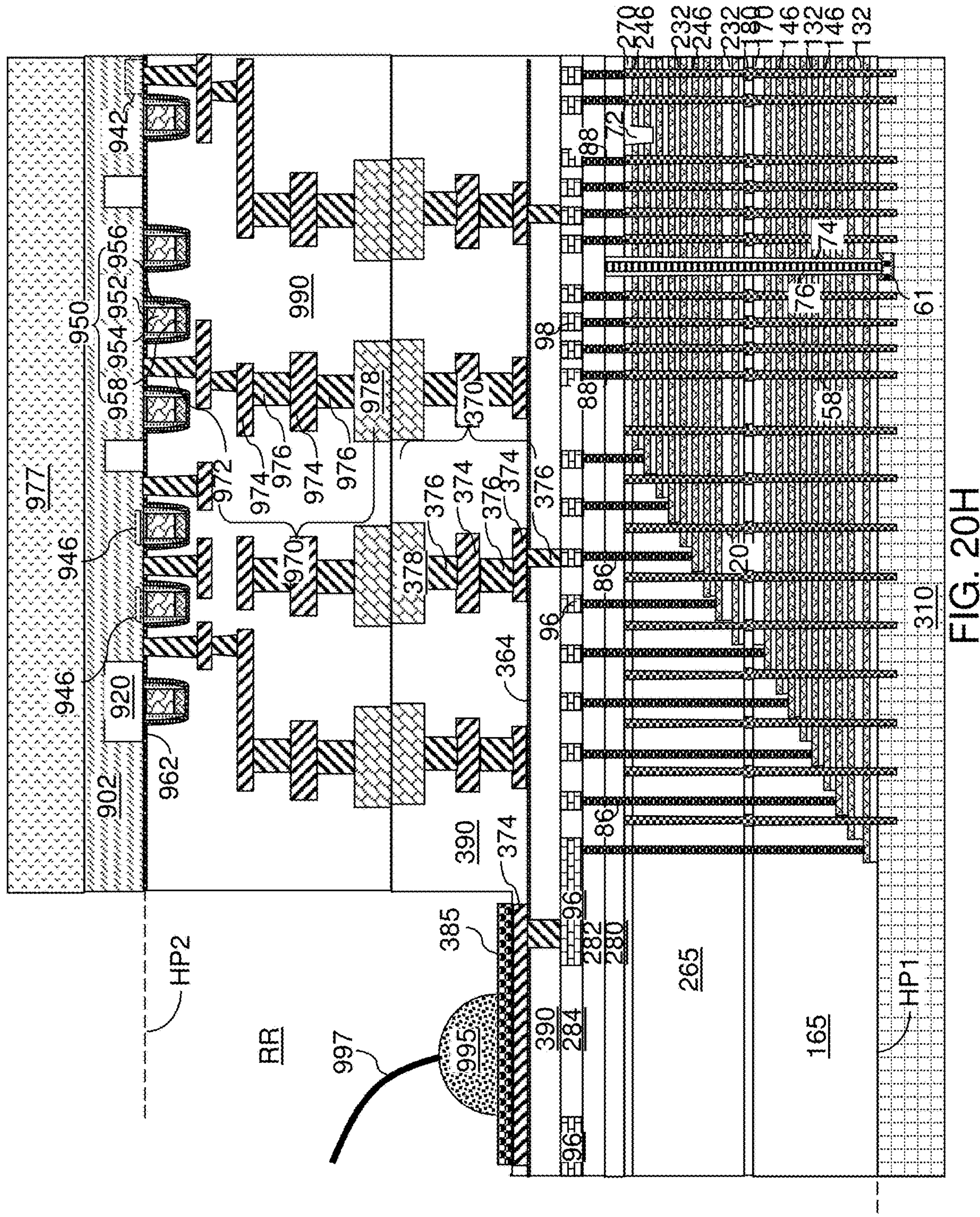

FIG. 20H is a vertical cross-sectional view of a fourth configuration of the first exemplary structure according to an embodiment of the present disclosure.

Figure 21A:
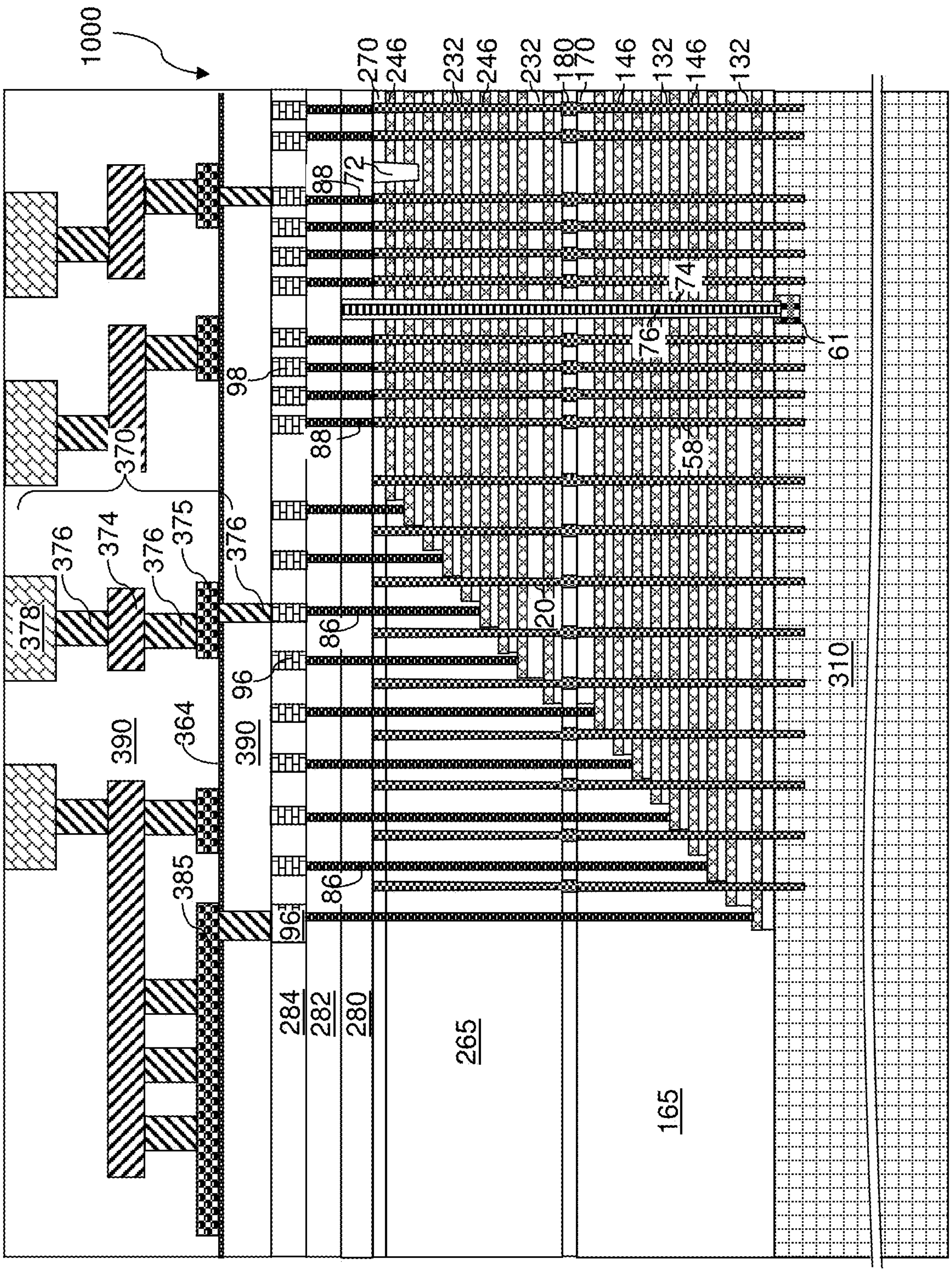

FIG. 21A is a vertical cross-sectional view of a configuration of the first exemplary structure after formation of a memory die that includes interconnect-level dielectric layers and metal interconnect structures according to an embodiment of the present disclosure.

Figure 21B:
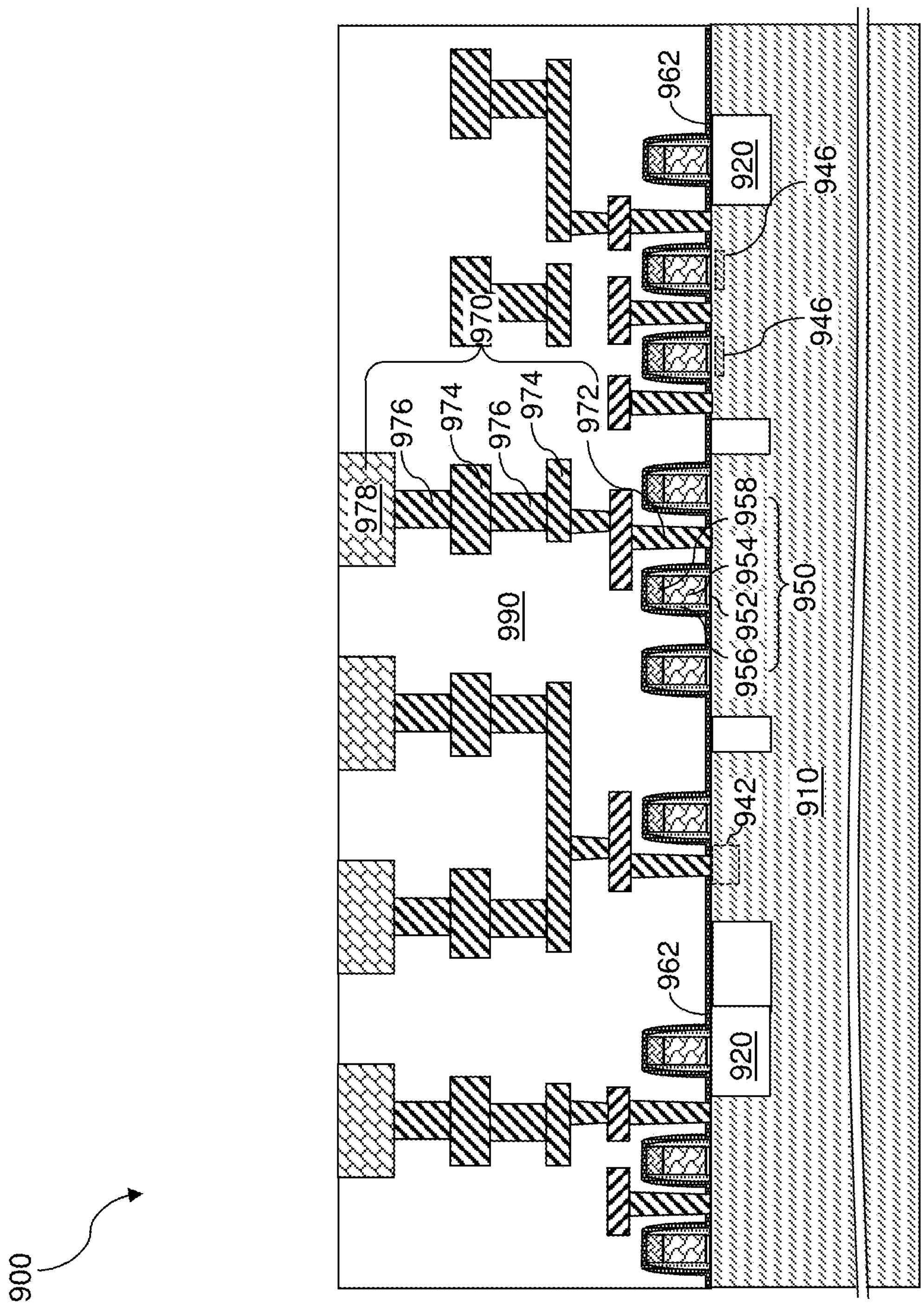

FIG. 21B is a vertical cross-sectional view of a configuration of a logic die to be subsequently incorporated into the first exemplary structure of FIG. 21A according to an embodiment of the present disclosure.

FIGS. 21C-21F are sequential vertical cross-sectional views of a fifth configuration of the first exemplary structure during formation of a bonded assembly including recess regions containing external bonding pads, solder balls, and bonding wires according to an embodiment of the present disclosure.

Figure 21C:
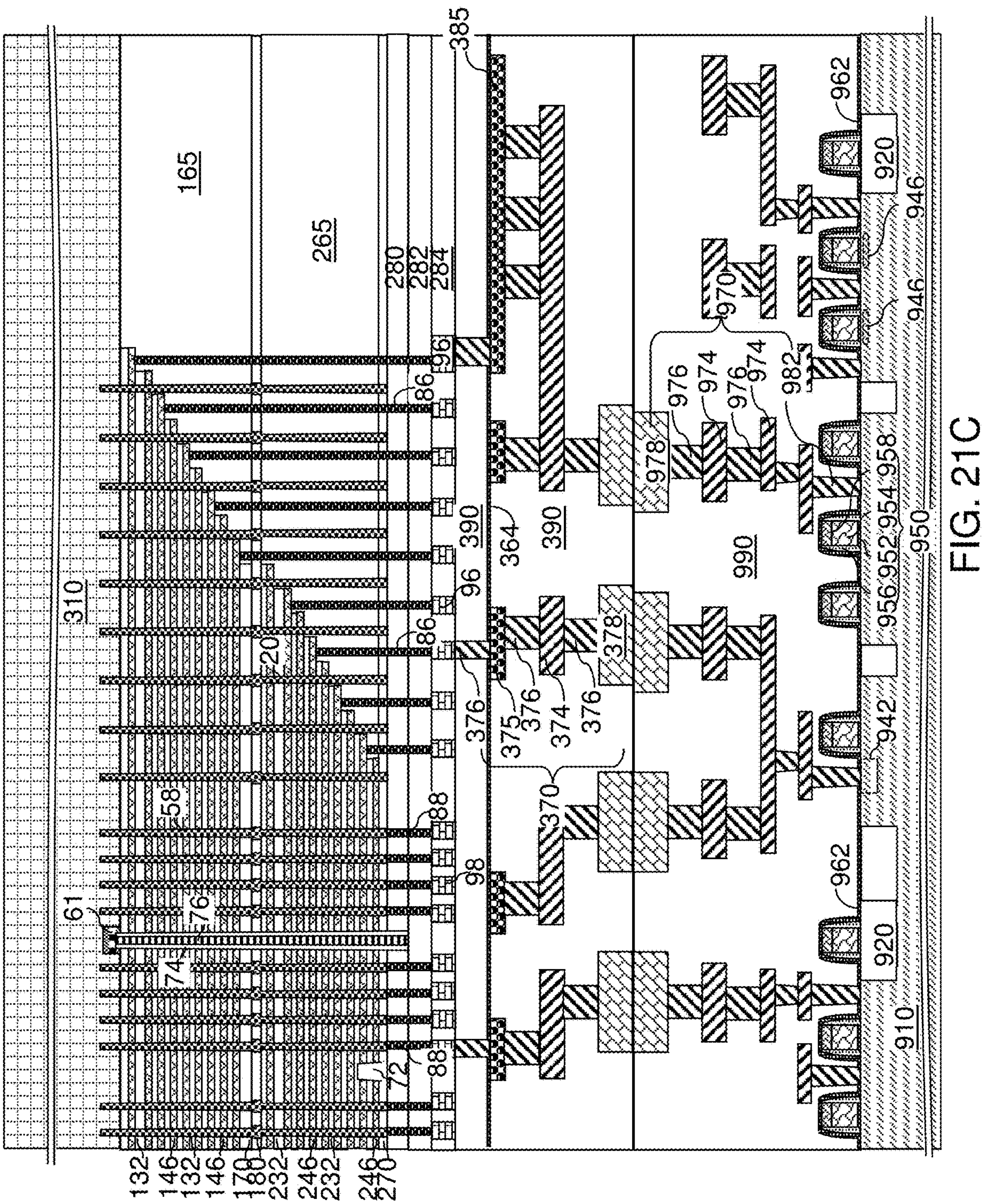
Figure 21D:
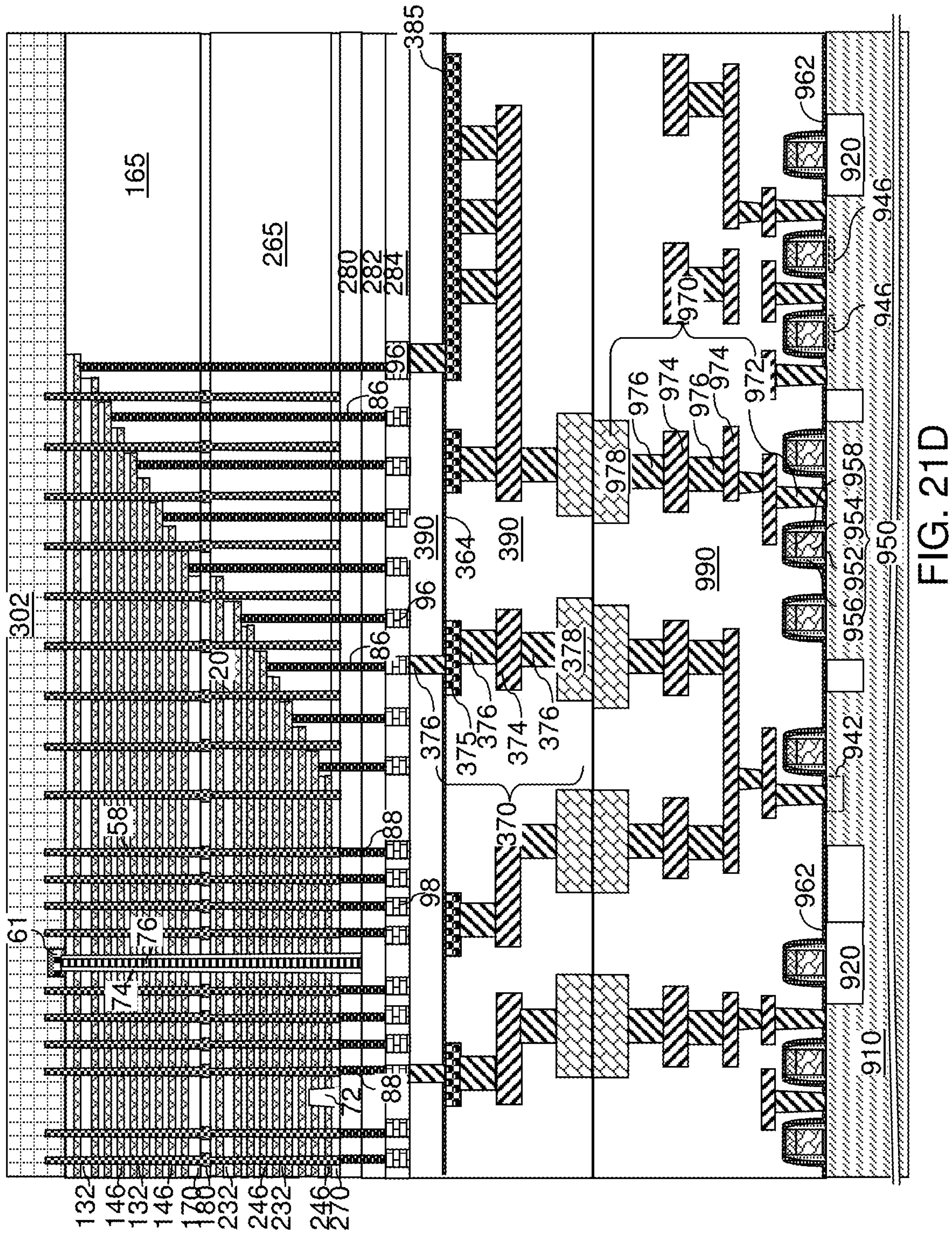
Figure 21E:
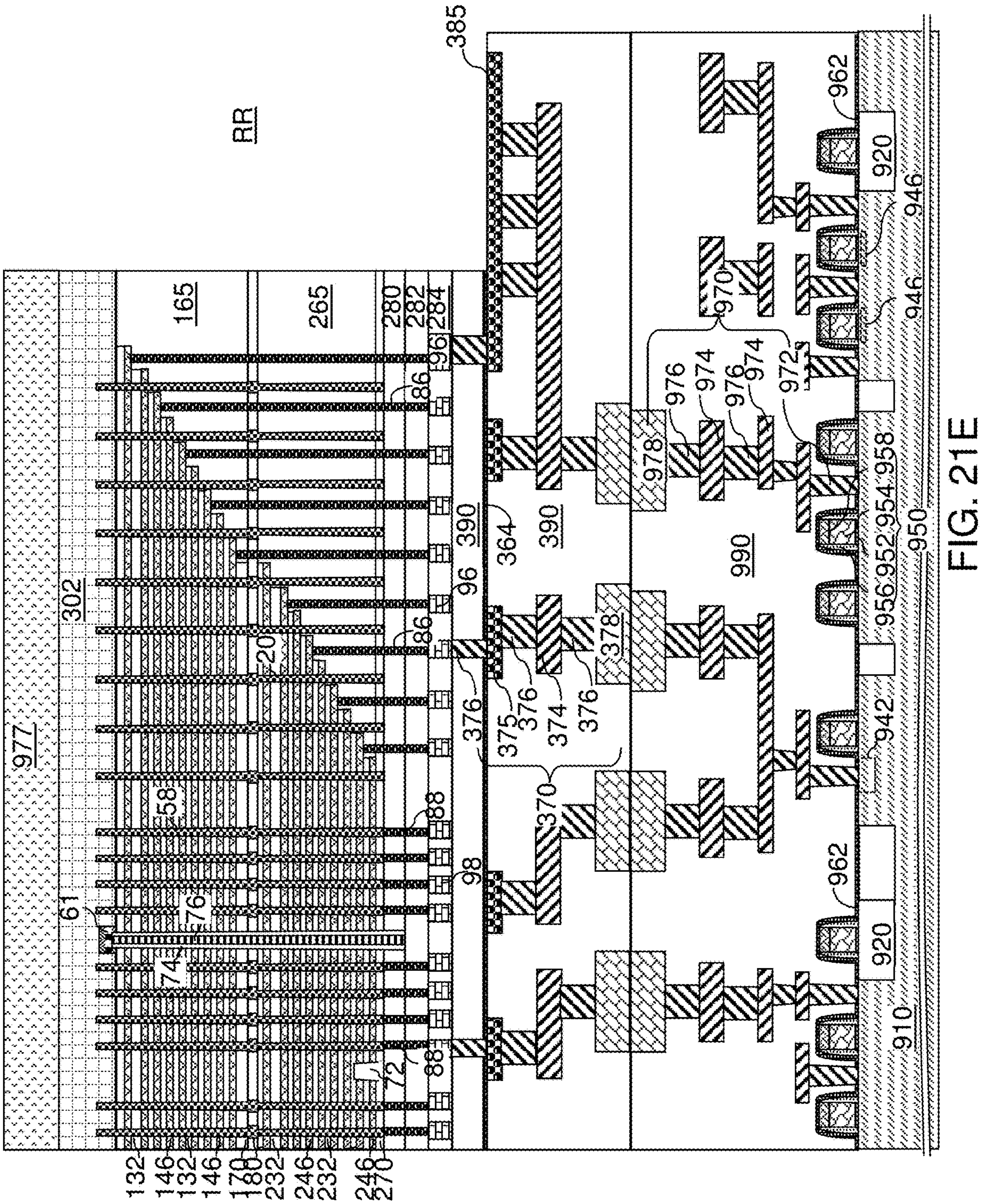
Figure 21F:
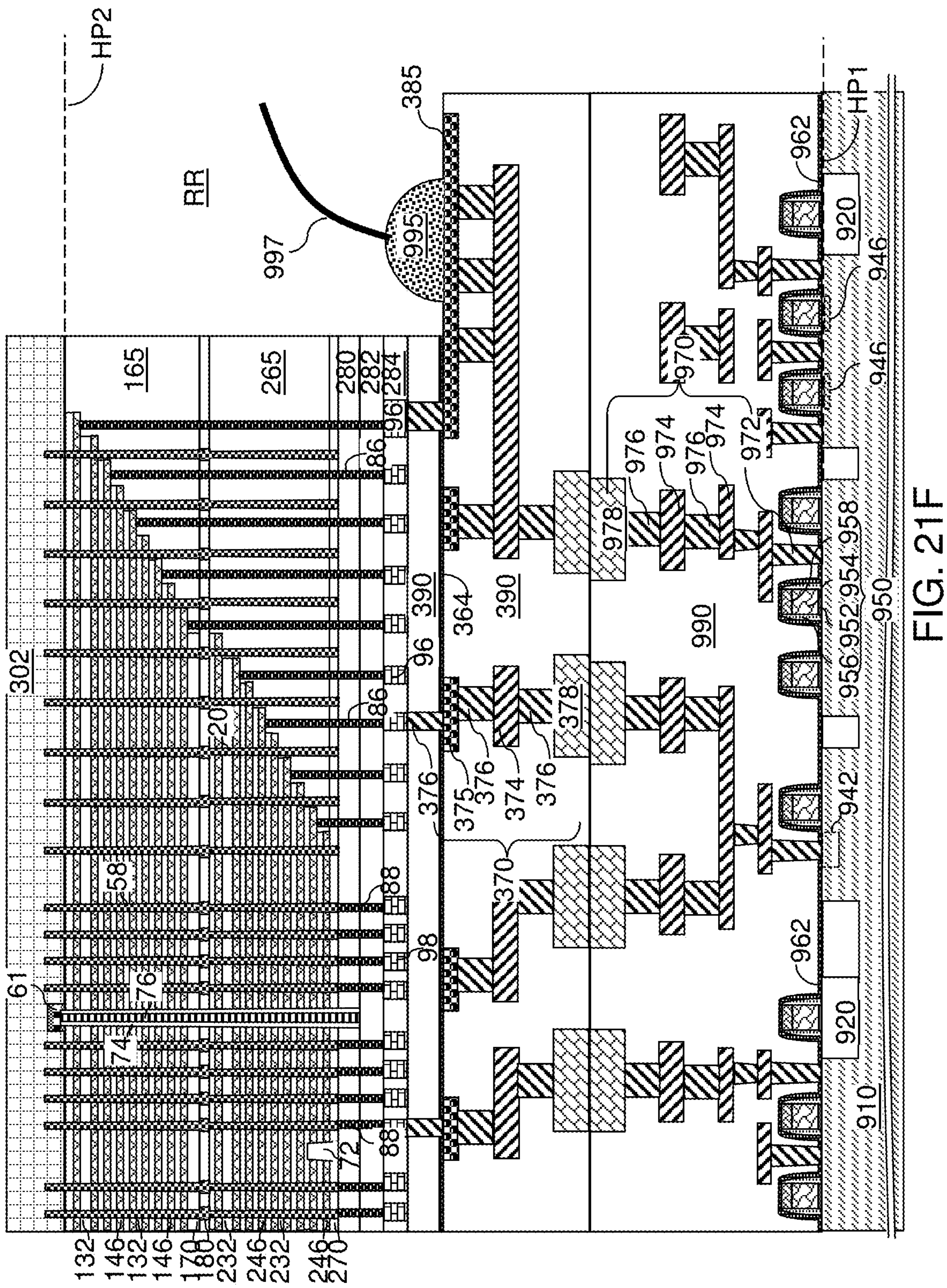
Figure 21G:
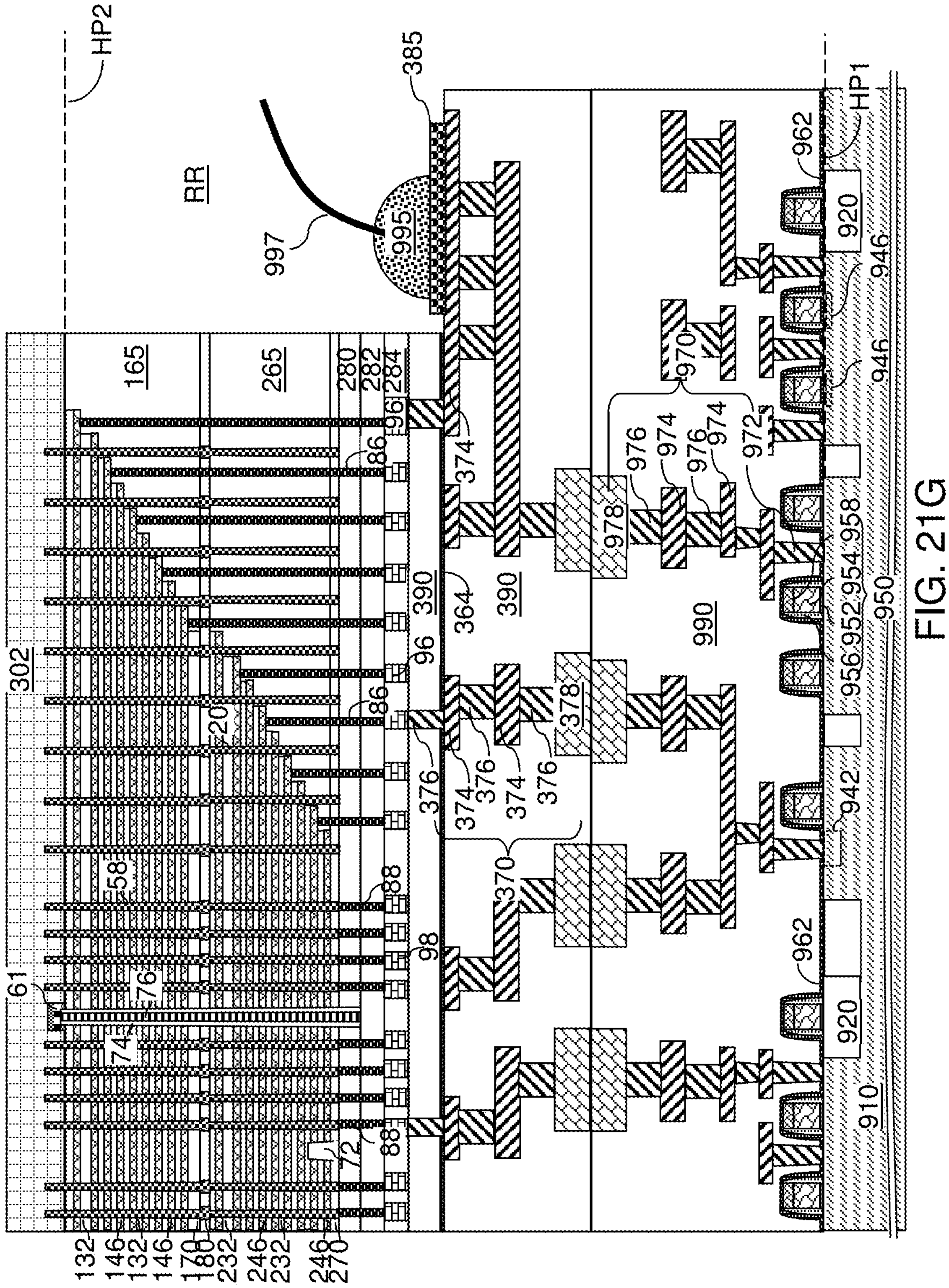

FIG. 21G is a vertical cross-sectional view of an alternative embodiment of the fifth configuration of the first exemplary structure.

Figure 21H:
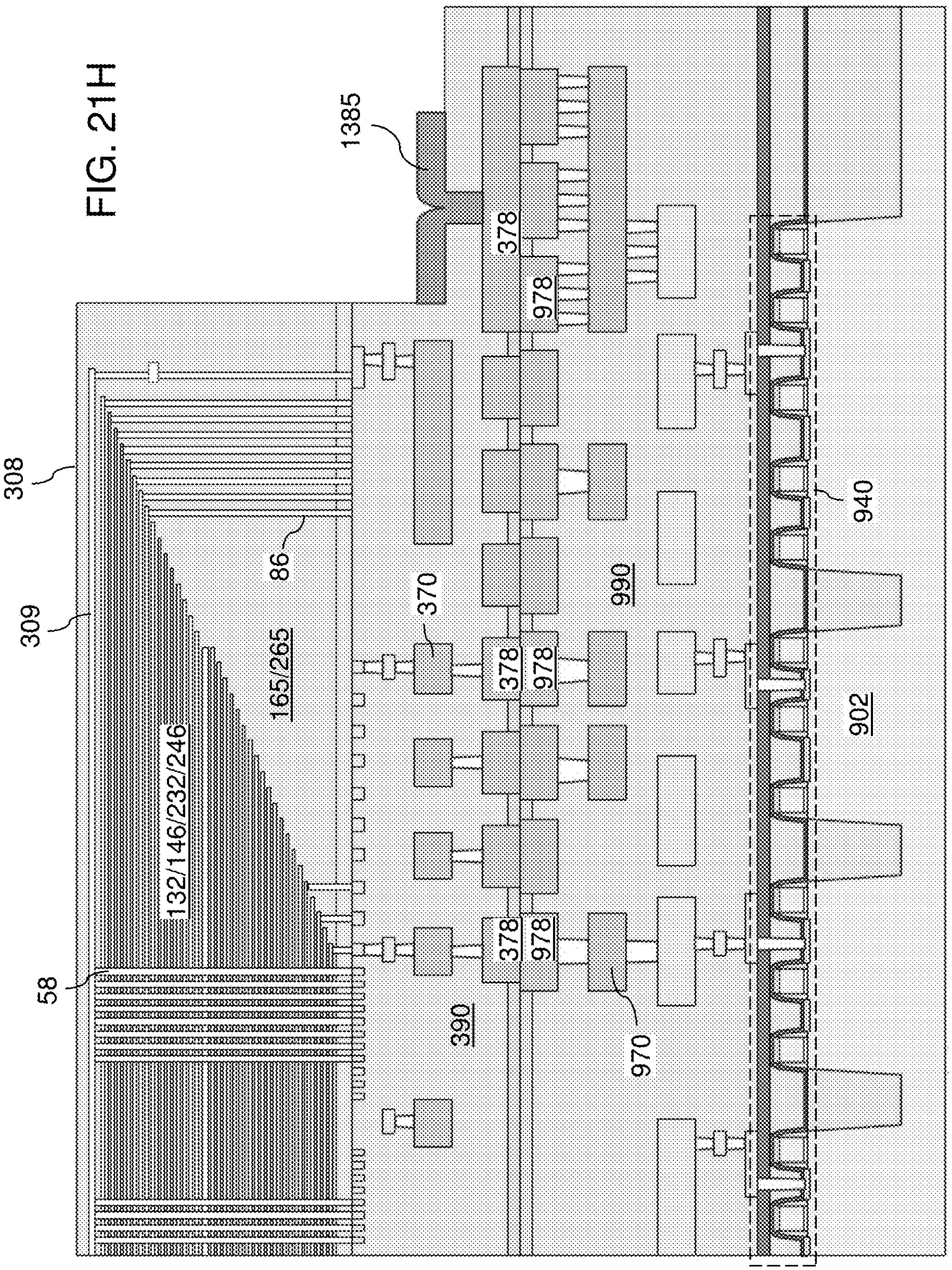

FIG. 21H is a vertical cross-sectional view of a sixth configuration of the first exemplary structure.

Figure 22A:
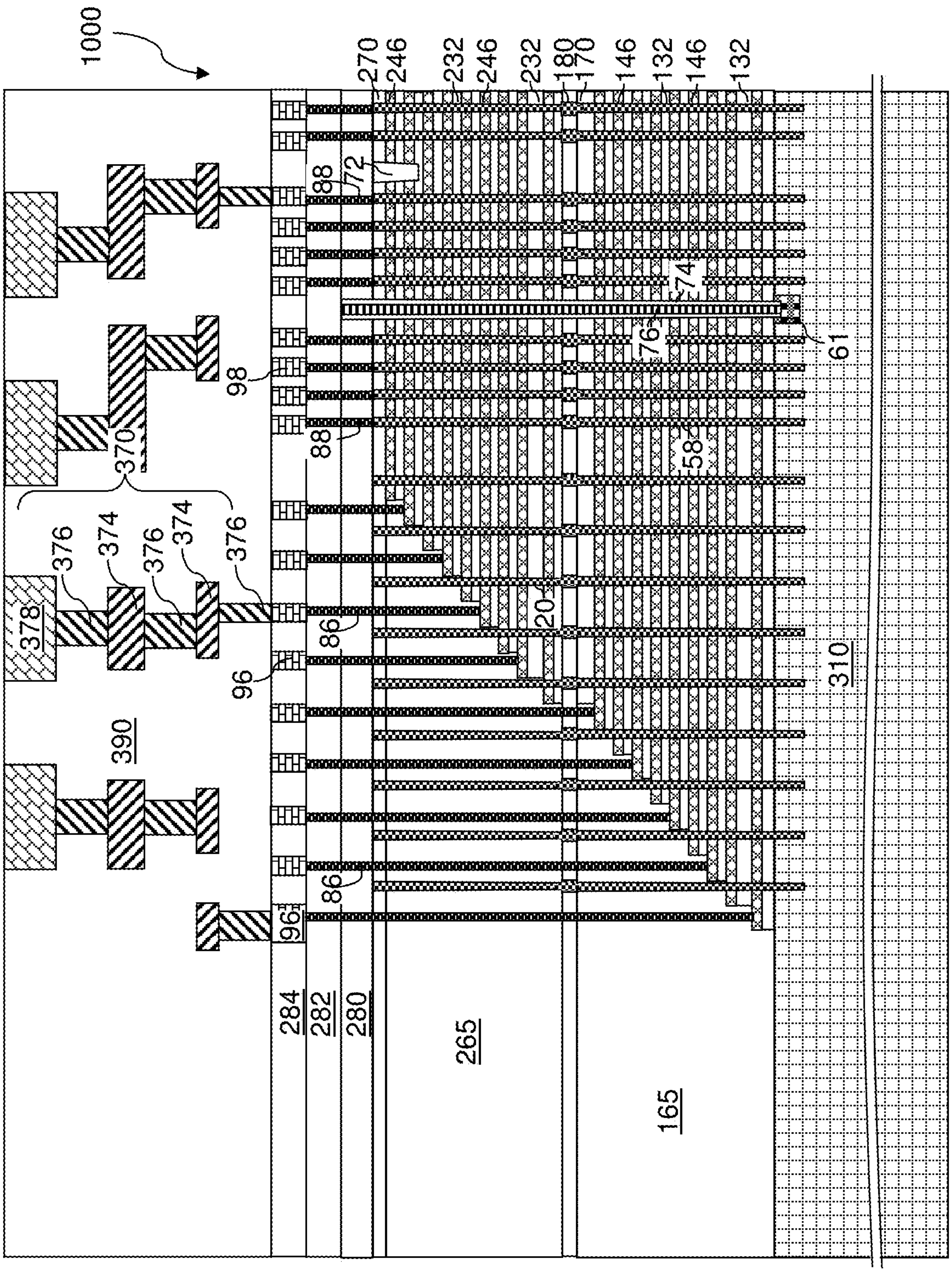

FIG. 22A is a vertical cross-sectional view of a configuration of the first exemplary structure after formation of a memory die that includes interconnect-level dielectric layers and metal interconnect structures according to an embodiment of the present disclosure.

Figure 22B:
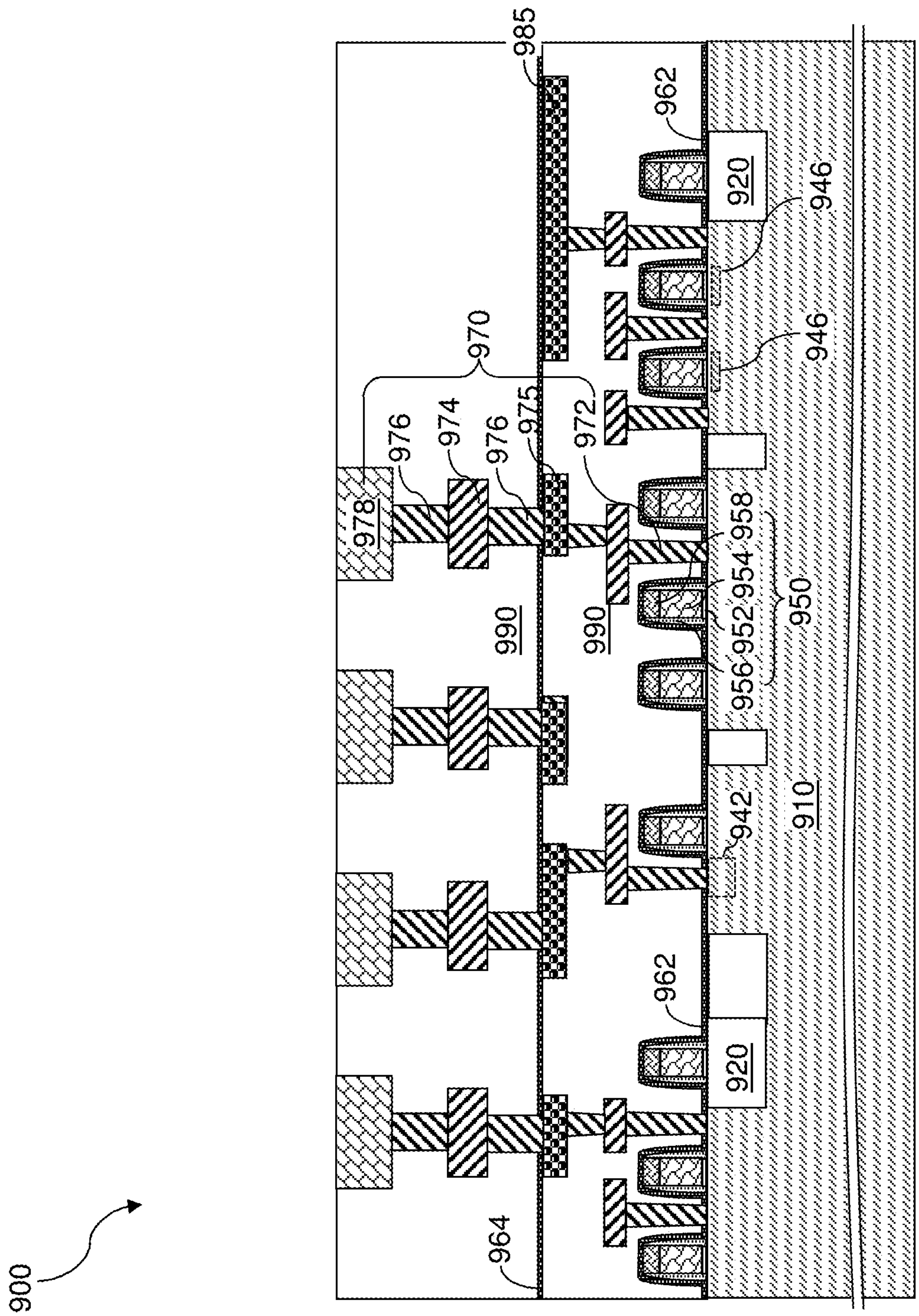

FIG. 22B is a vertical cross-sectional view of a configuration of a logic die to be subsequently incorporated into the first exemplary structure of FIG. 22A according to an embodiment of the present disclosure.

FIGS. 22C-22F are sequential vertical cross-sectional views of a seventh configuration of the first exemplary structure during formation of a bonded assembly including recess regions containing external bonding pads, solder balls, and bonding wires according to an embodiment of the present disclosure.

Figure 22C:
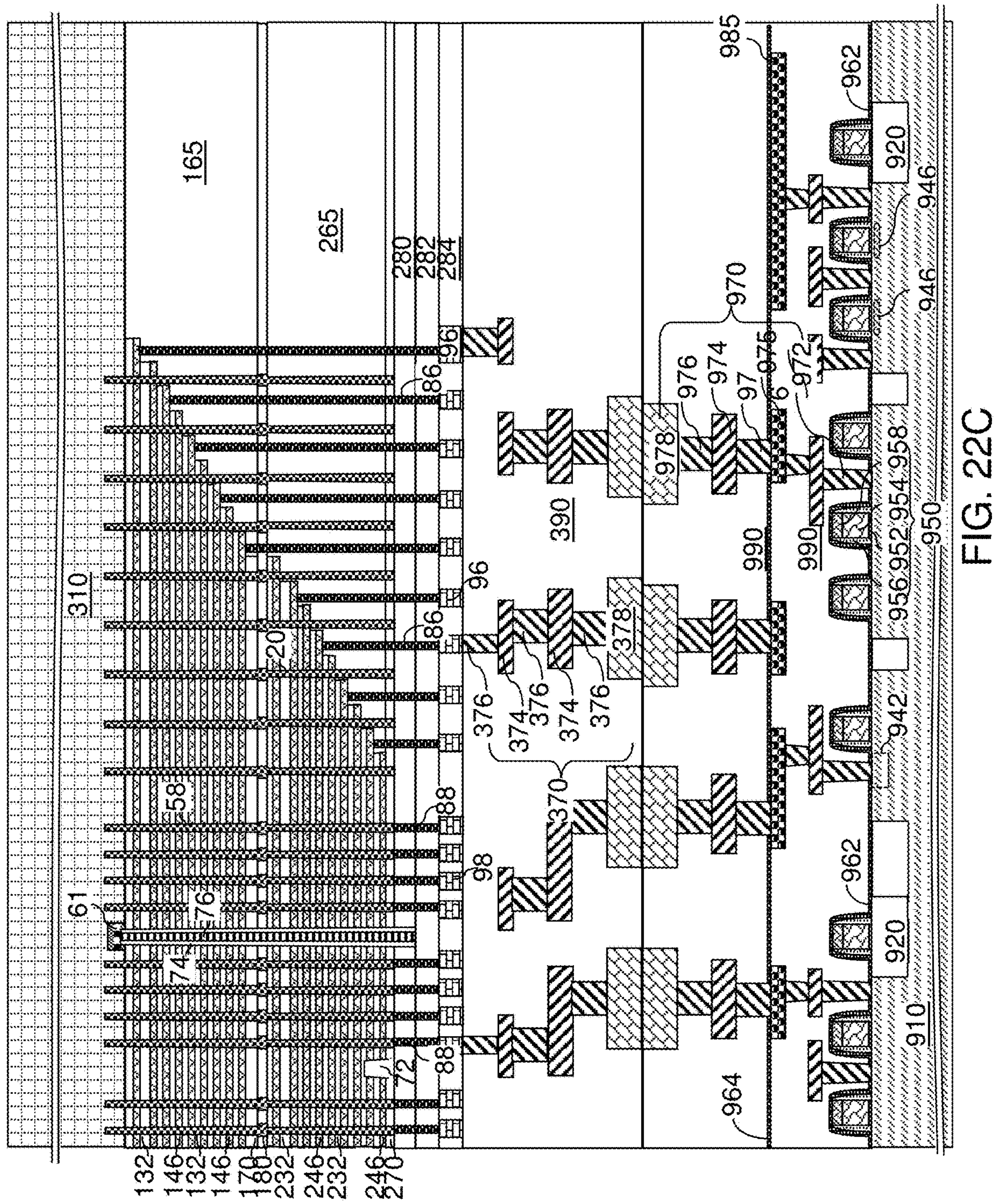
Figure 22D:
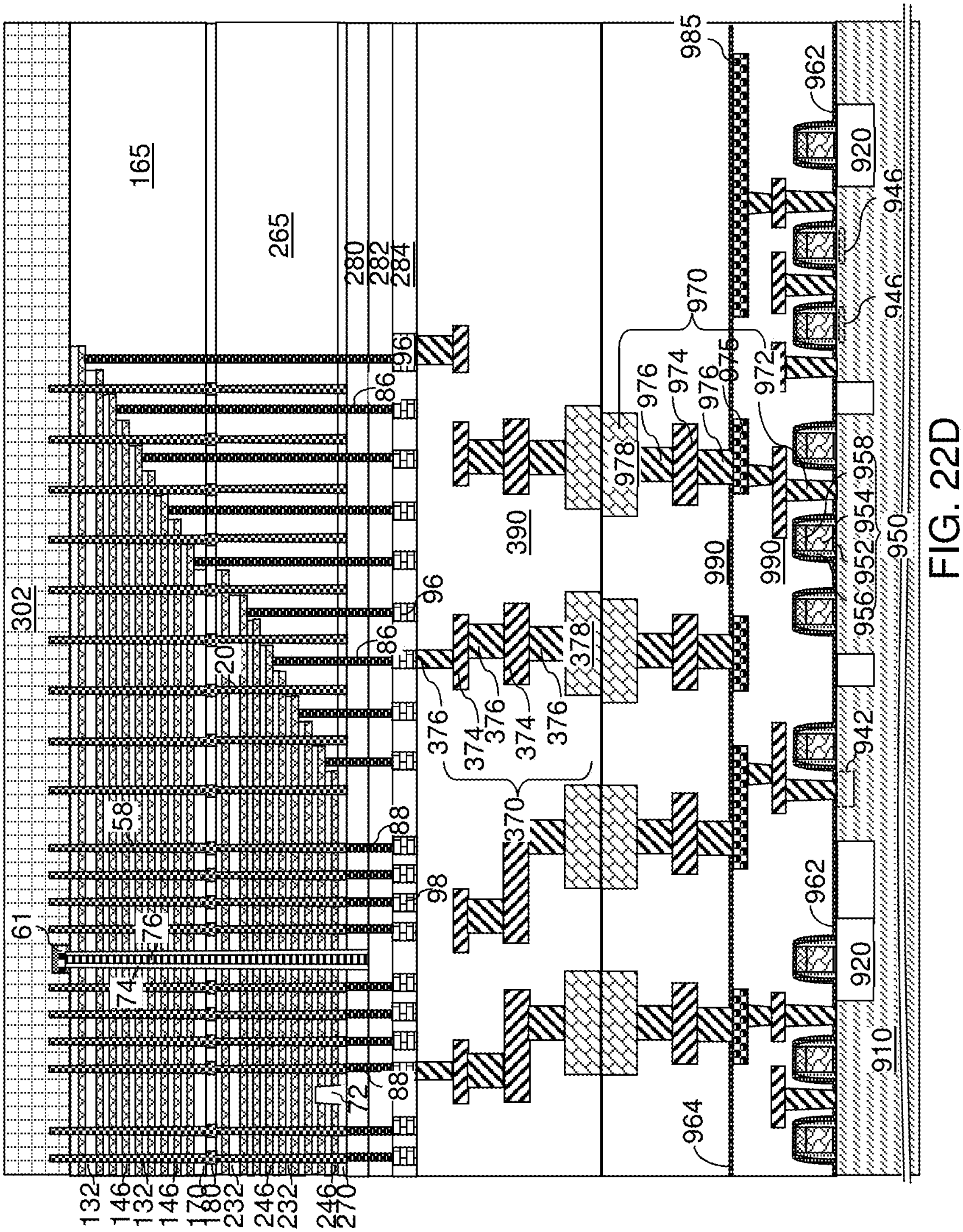
Figure 22E:
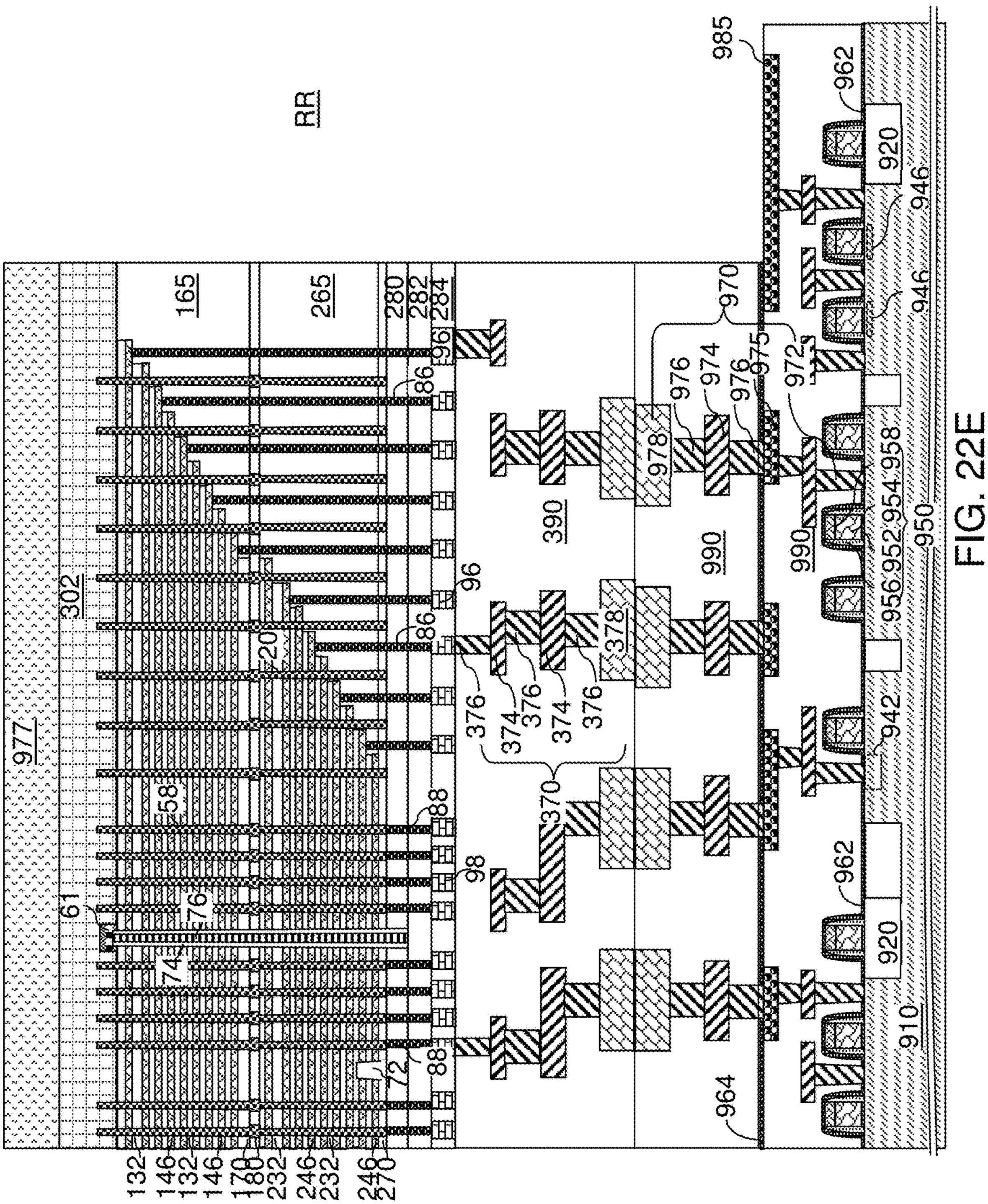
Figure 22F:
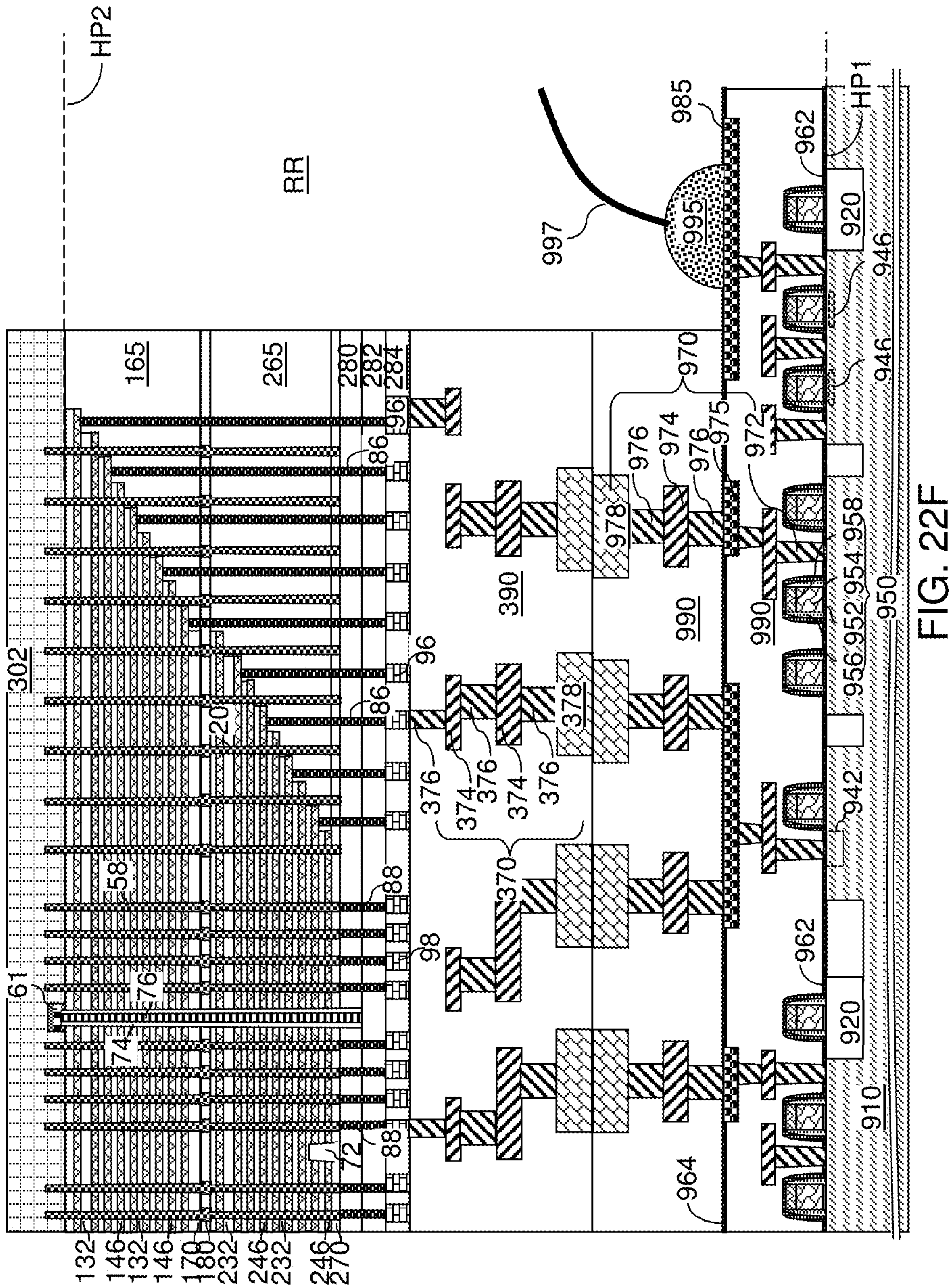
Figure 22G:
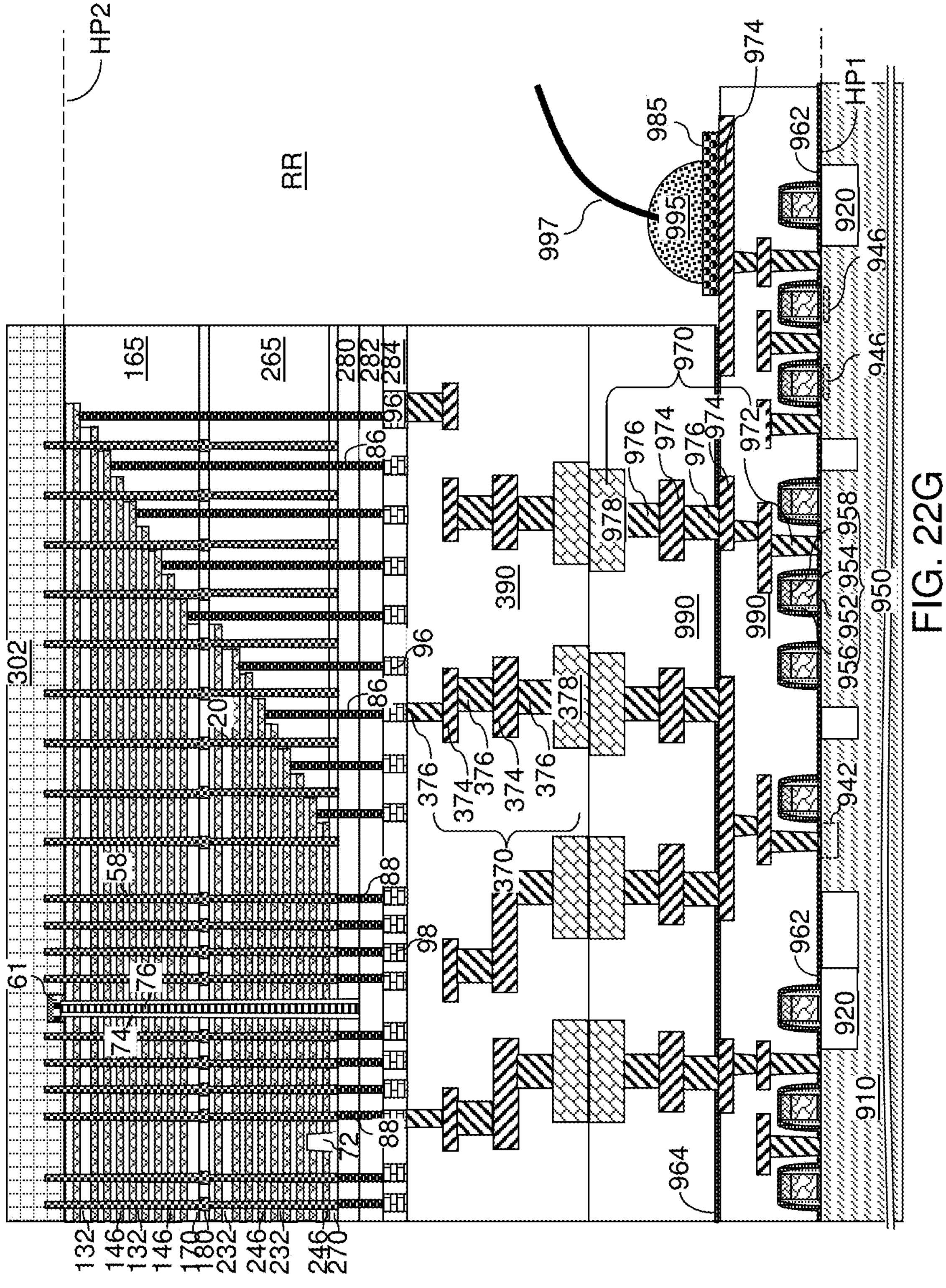

FIG. 22G is a vertical cross-sectional view of an eighth configuration of the first exemplary structure according to an embodiment of the present disclosure.

Figure 23A:
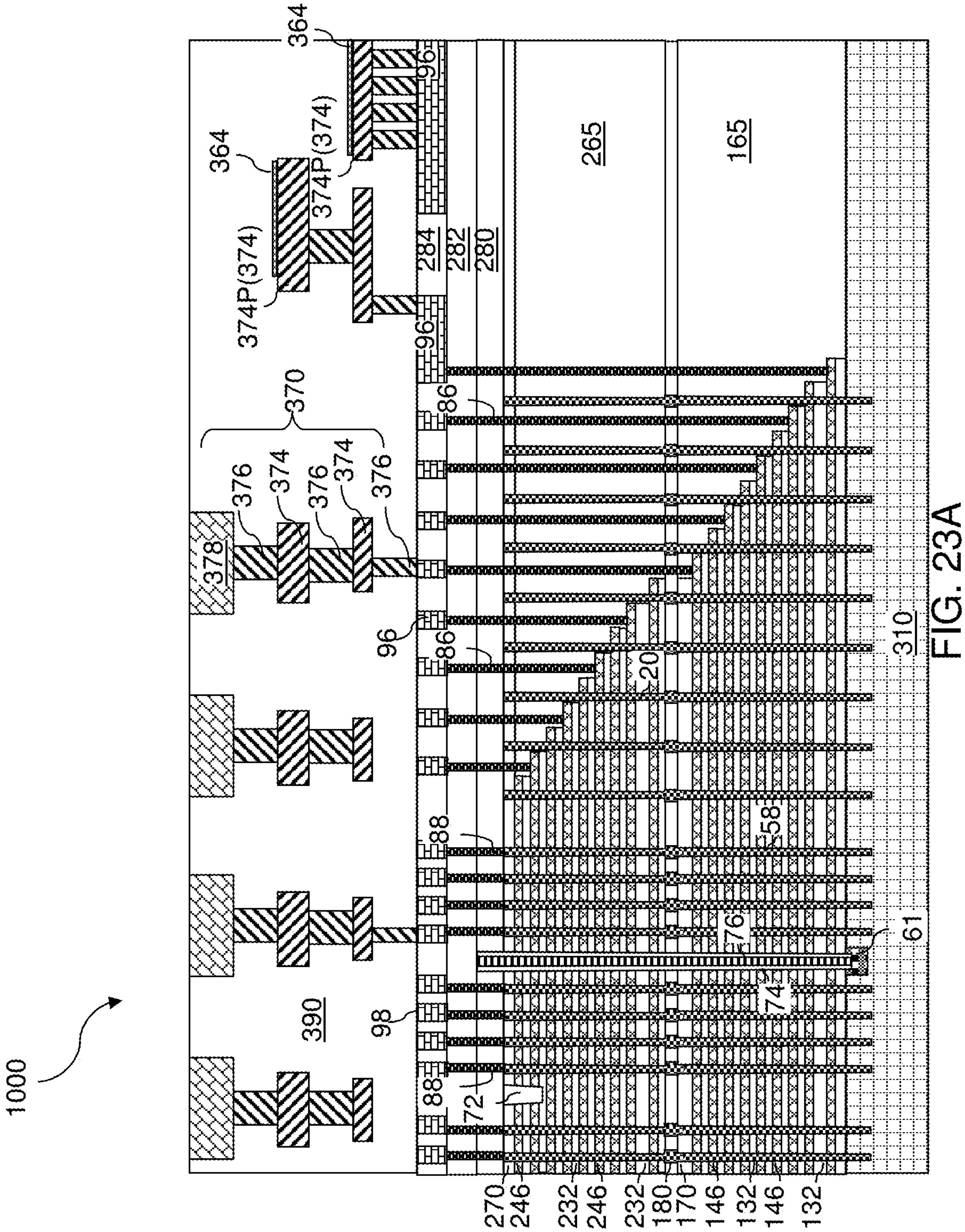

FIG. 23A is a vertical cross-sectional view of a configuration of a memory die that includes interconnect-level dielectric layers and metal interconnect structures according to an embodiment of the present disclosure.

Figure 23B:
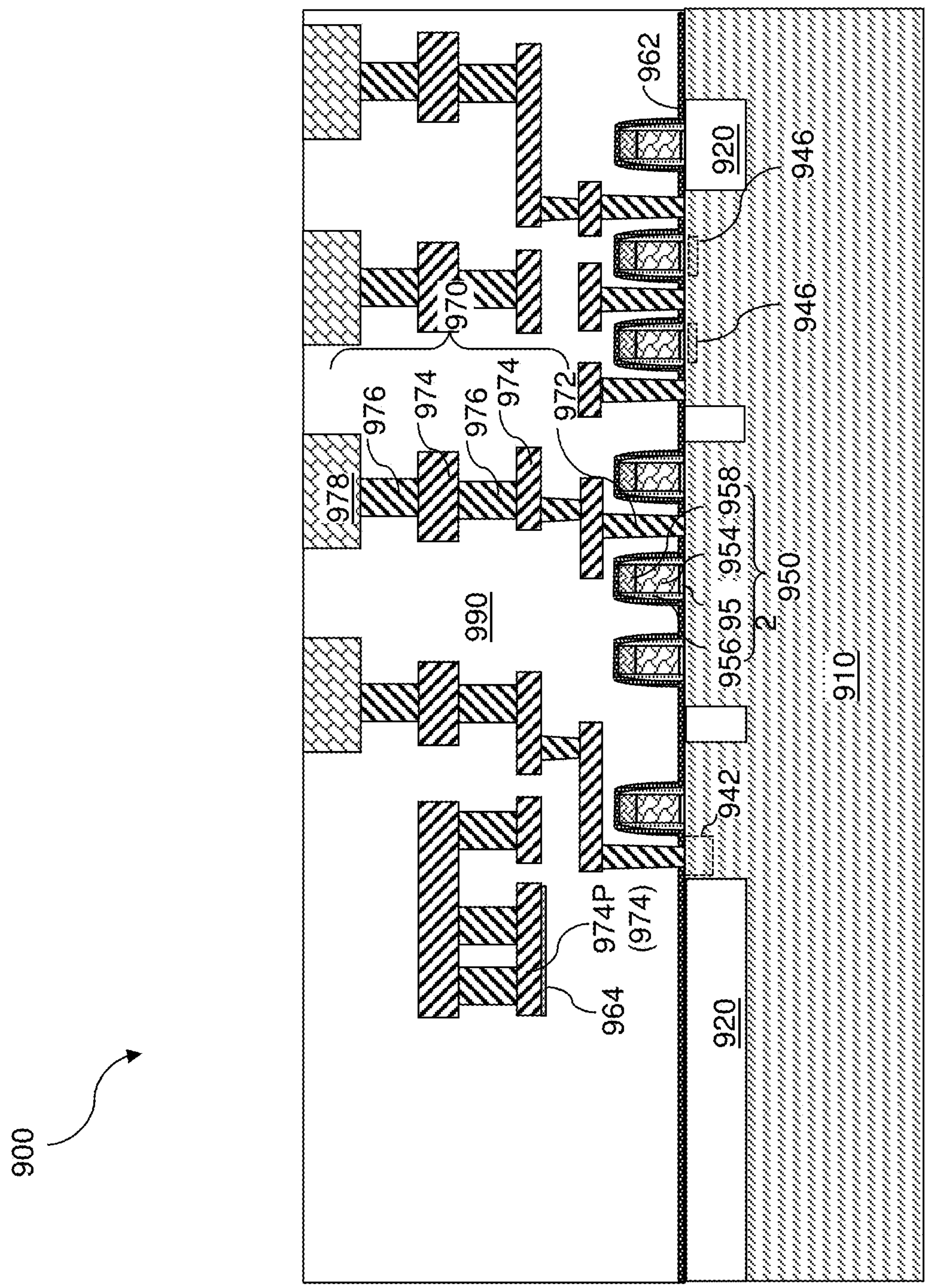

FIG. 23B is a vertical cross-sectional view of a configuration of a logic die to be subsequently incorporated into the first exemplary structure of FIG. 21A according to an embodiment of the present disclosure.

Figure 23C:
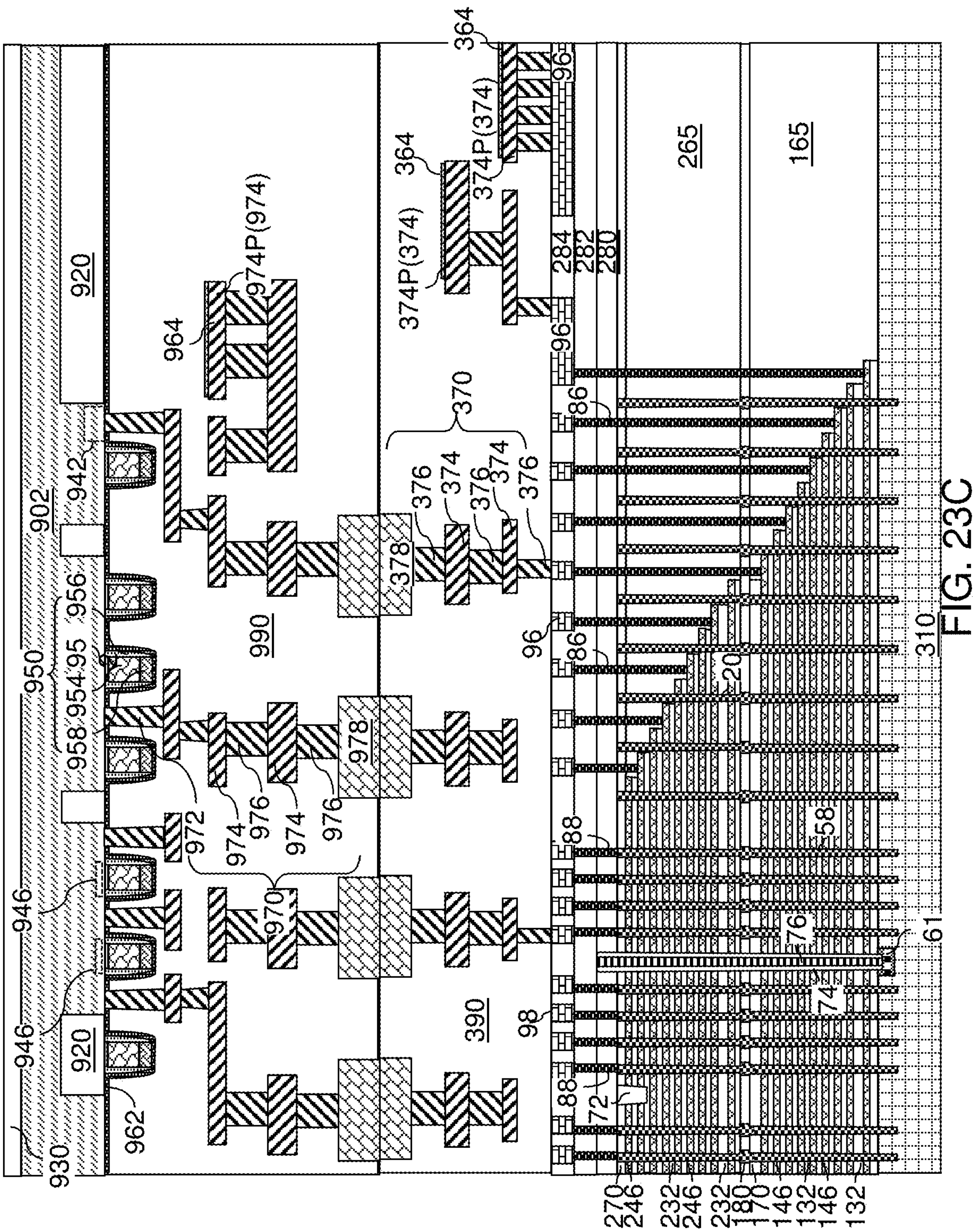
Figure 23D:
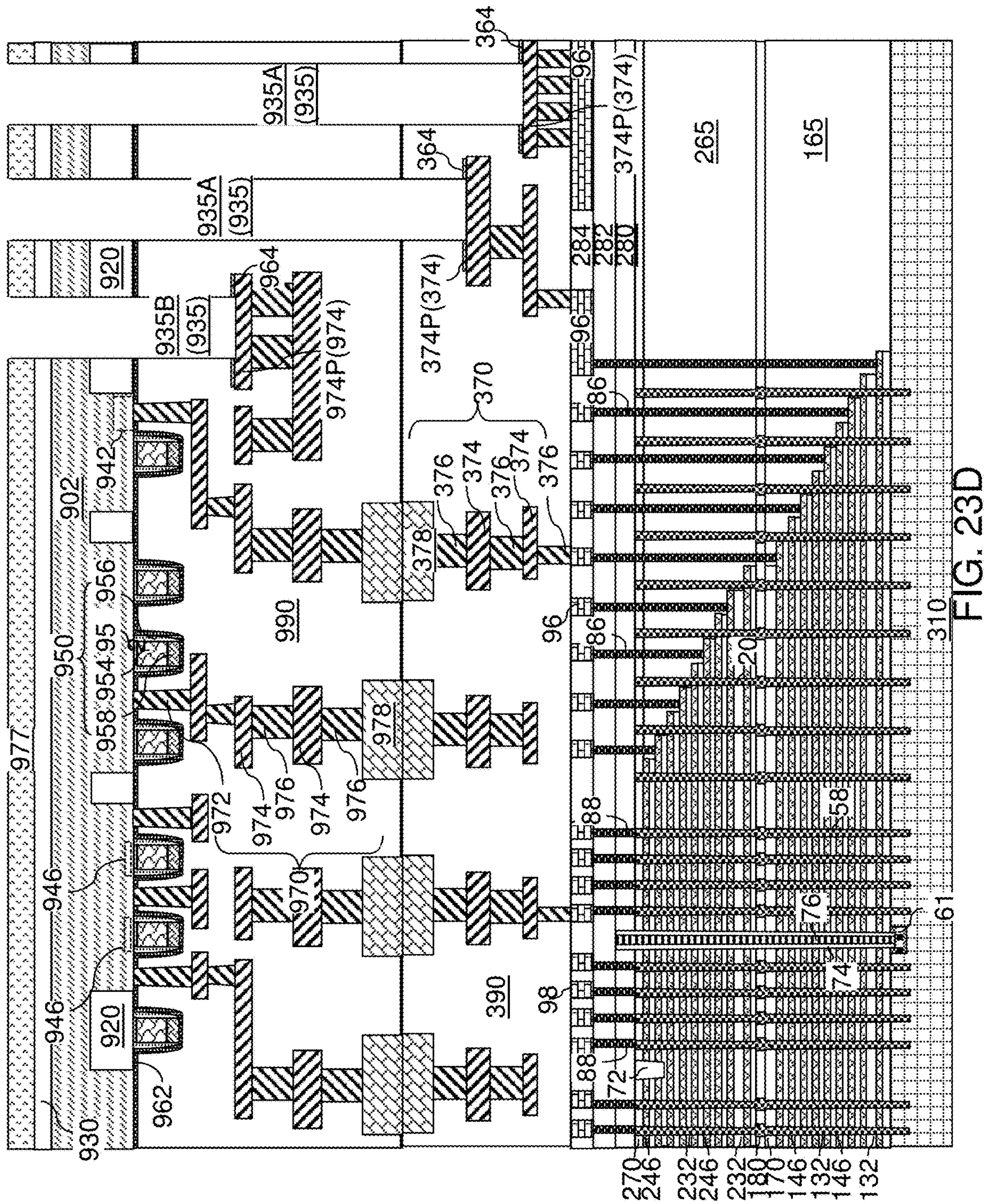
Figure 23E:
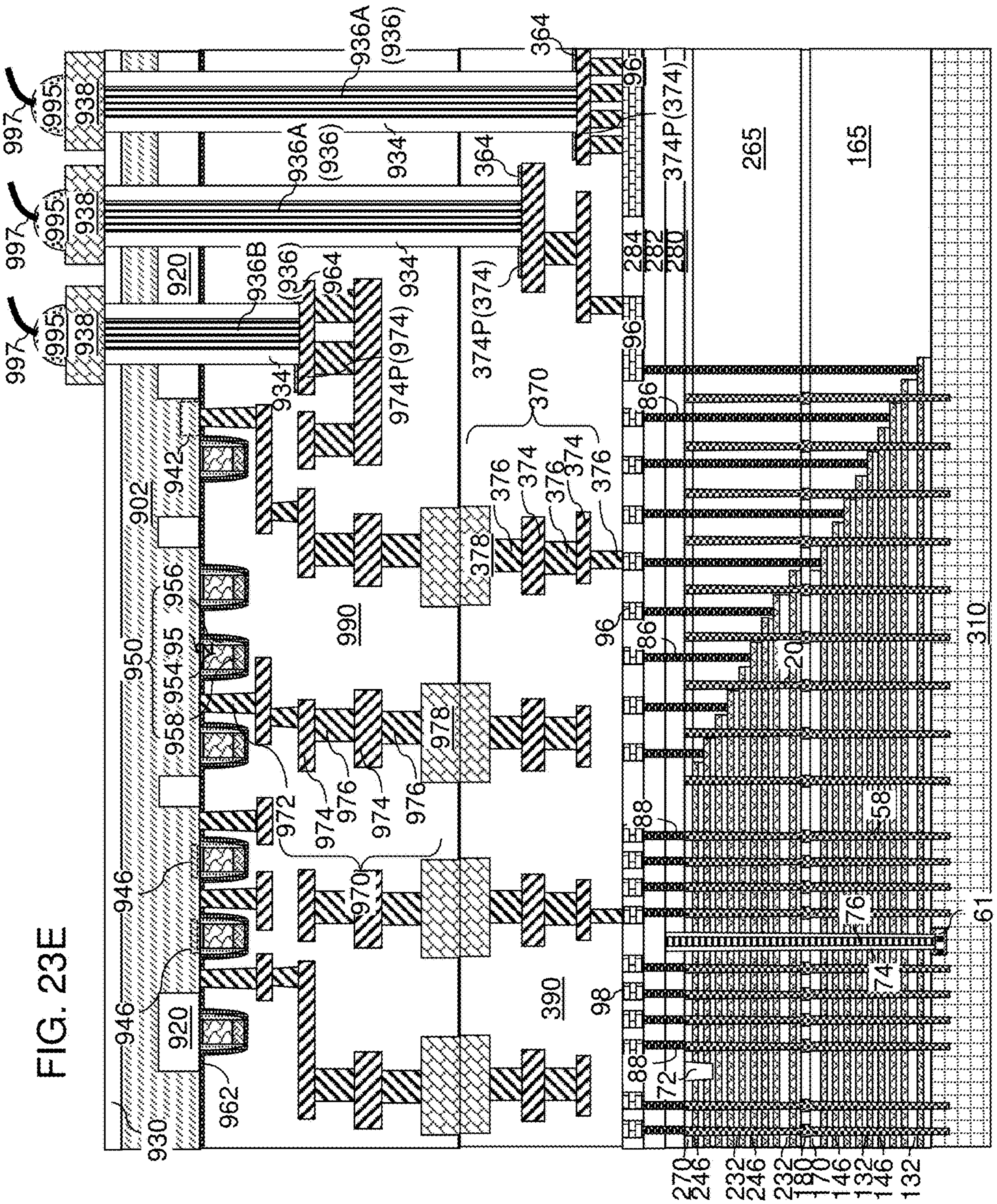

FIGS. 23C-23E are sequential vertical cross-sectional views of a first configuration of the second exemplary structure during formation of a bonded assembly including laterally-insulated external connection via structures, external bonding pads, solder balls, and bonding wires according to an embodiment of the present disclosure.

Figure 23F:
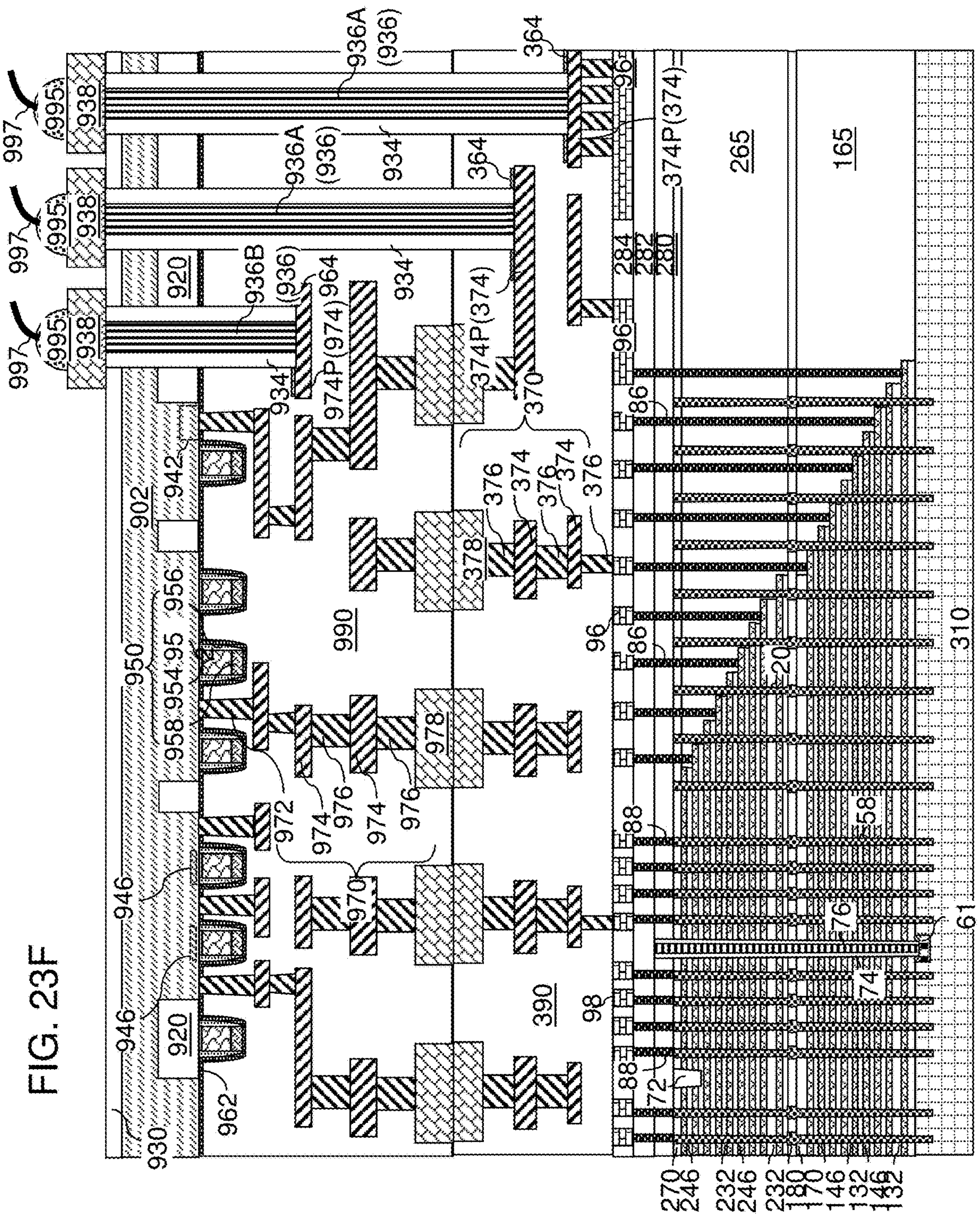

FIG. 23F is a vertical cross-sectional view of a second configuration of the second exemplary structure according to an embodiment of the present disclosure.

Figure 23G:
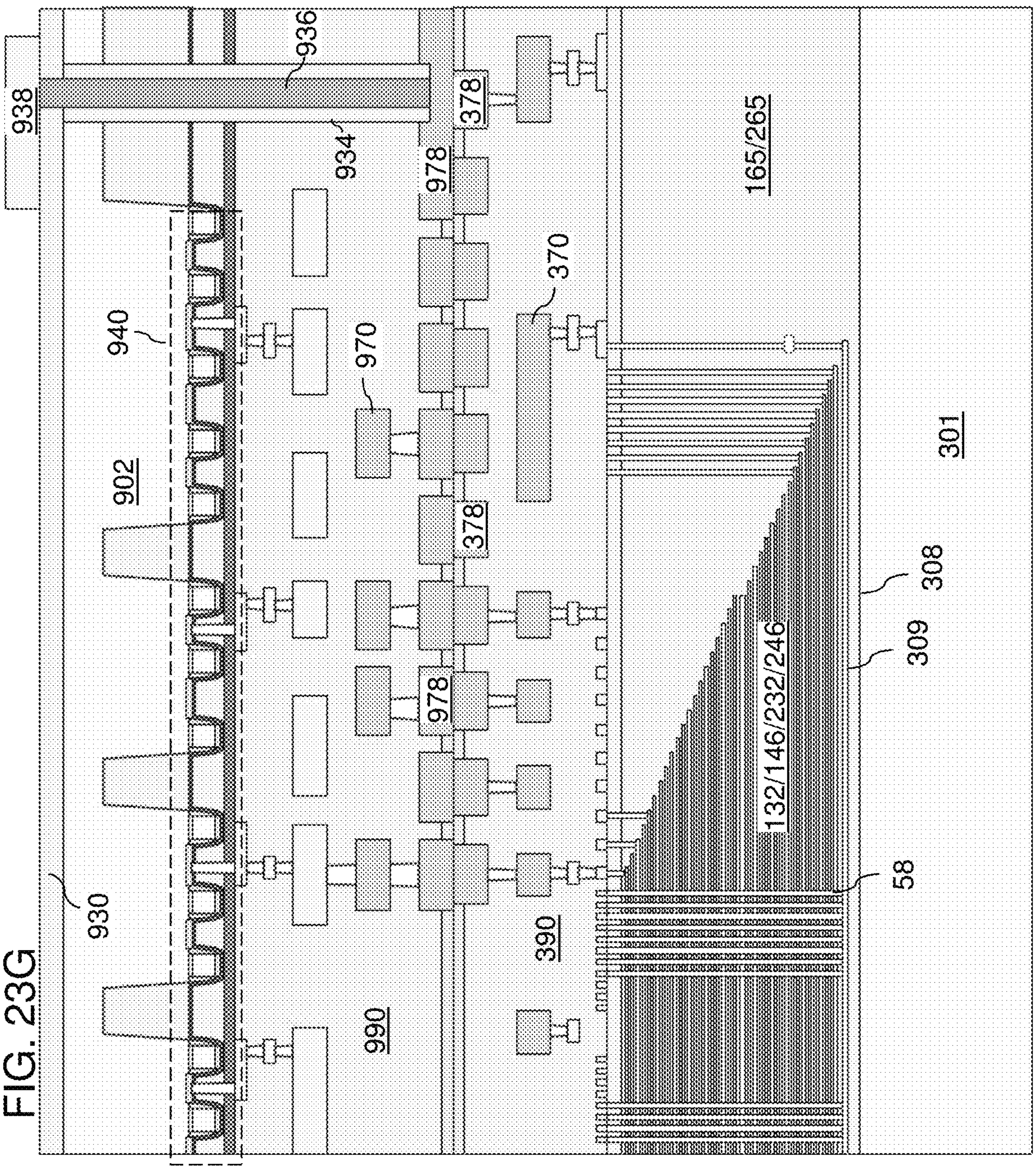

FIG. 23G is a vertical cross-sectional view of an alternative second configuration of the second exemplary structure according to an embodiment of the present disclosure.

Figure 24A:
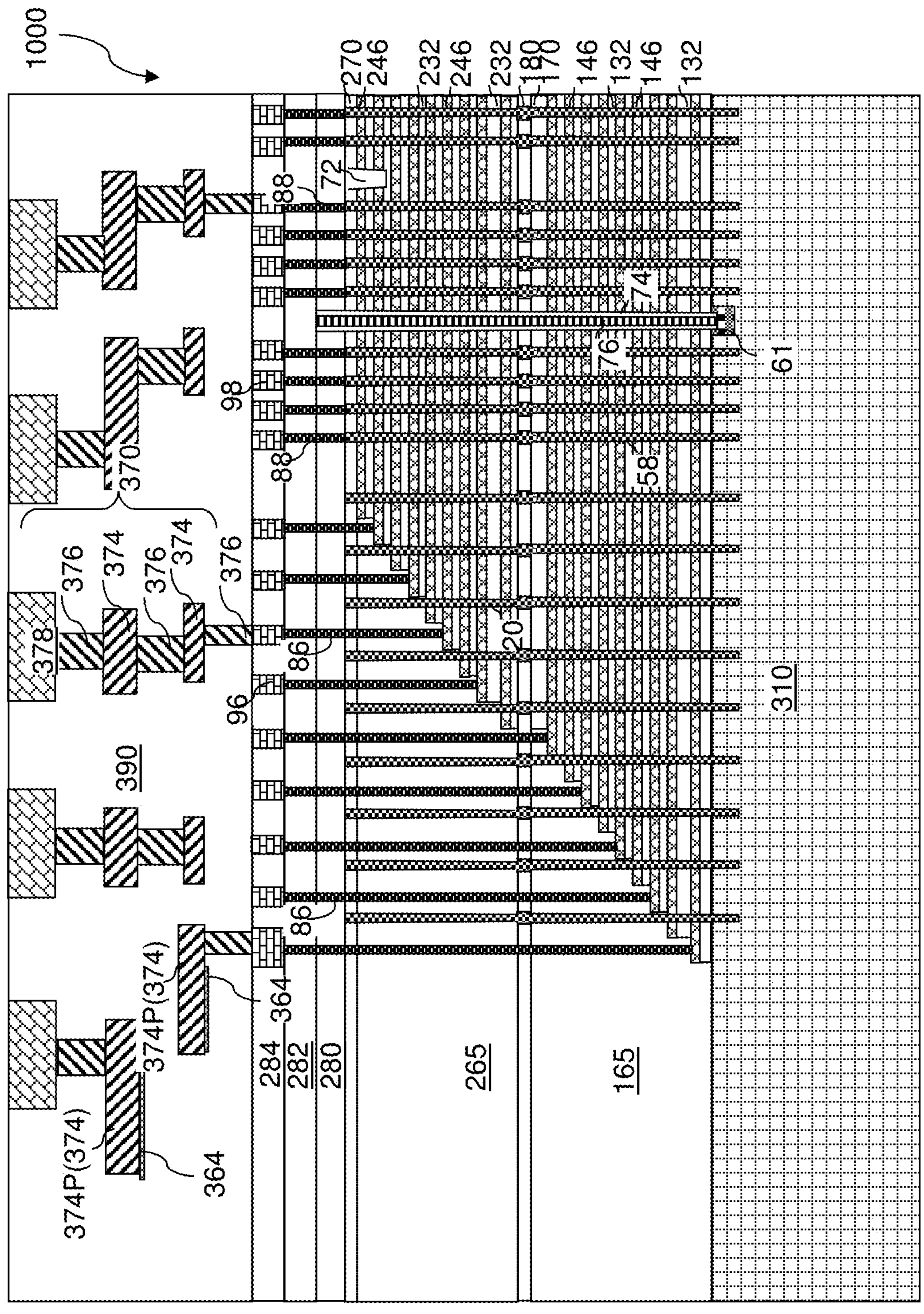

FIG. 24A is a vertical cross-sectional view of a configuration of a memory die that includes interconnect-level dielectric layers and metal interconnect structures according to an embodiment of the present disclosure.

Figure 24B:
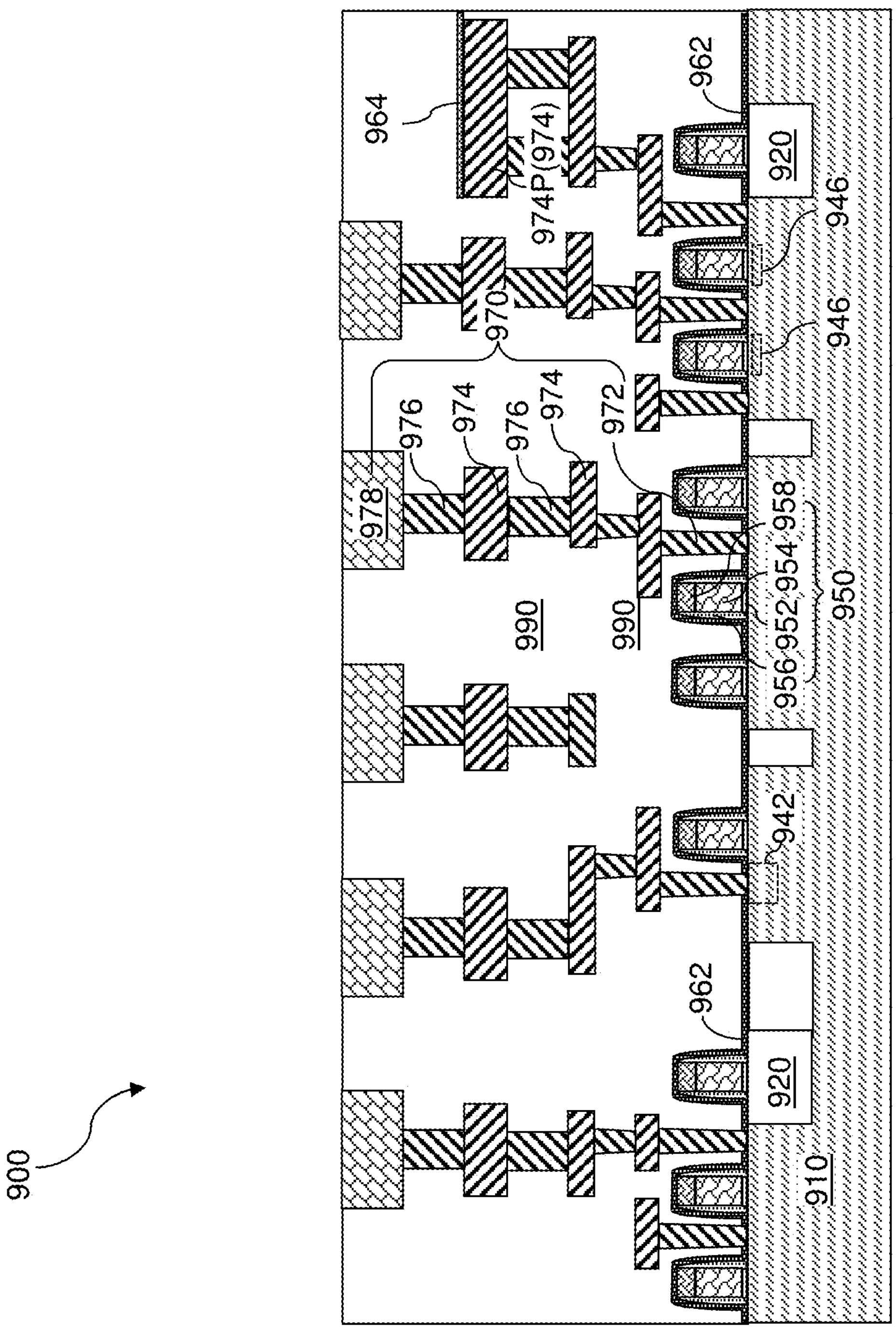

FIG. 24B is a vertical cross-sectional view of a configuration of a logic die to be subsequently incorporated into the first exemplary structure of FIG. 24A according to an embodiment of the present disclosure.

Figure 24C:
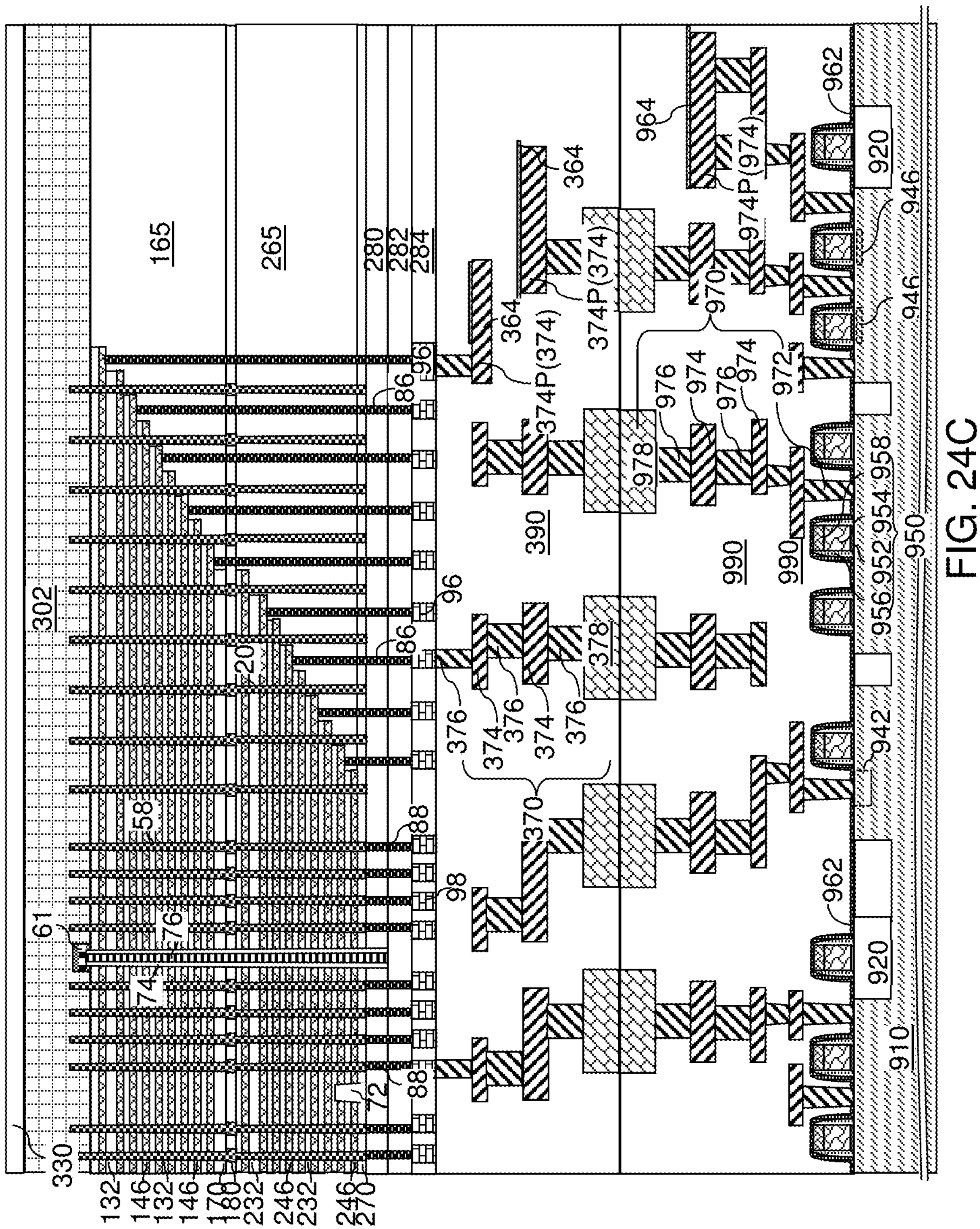
Figure 24D:
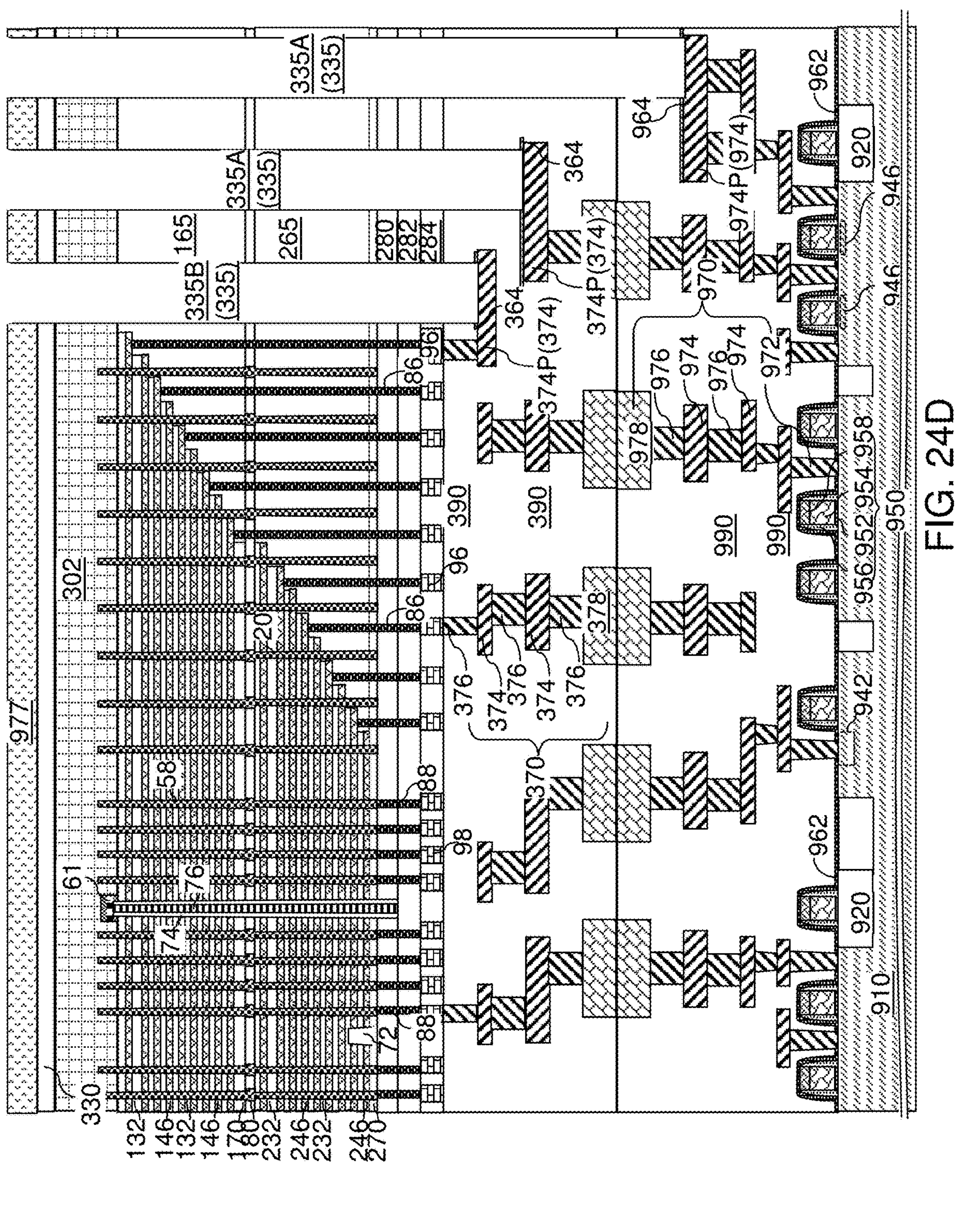
Figure 24E:
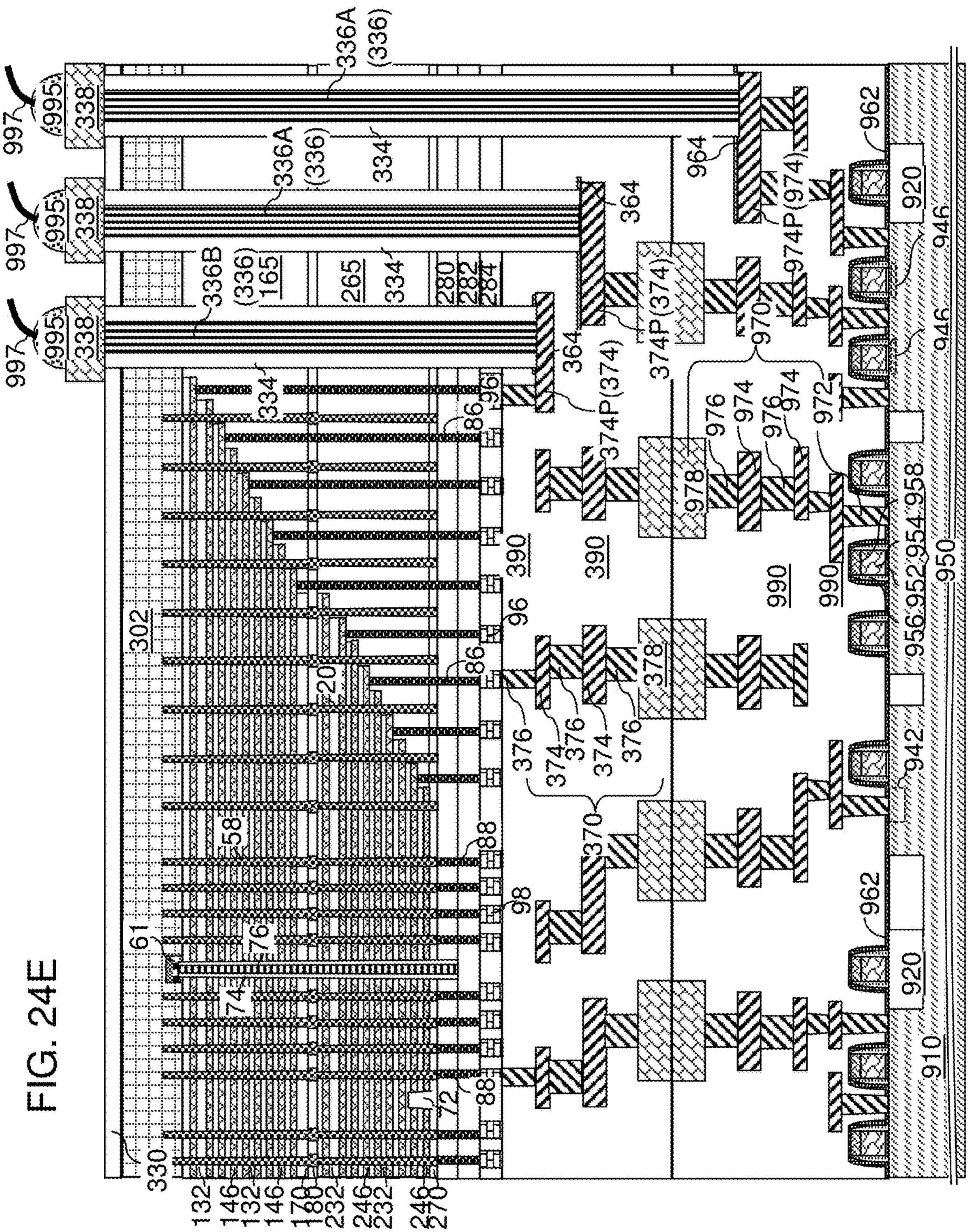

FIGS. 24C-24E are sequential vertical cross-sectional views of a third configuration of the second exemplary structure during formation of a bonded assembly including laterally-insulated external connection via structures, external bonding pads, solder balls, and bonding wires according to an embodiment of the present disclosure.

Figure 24F:
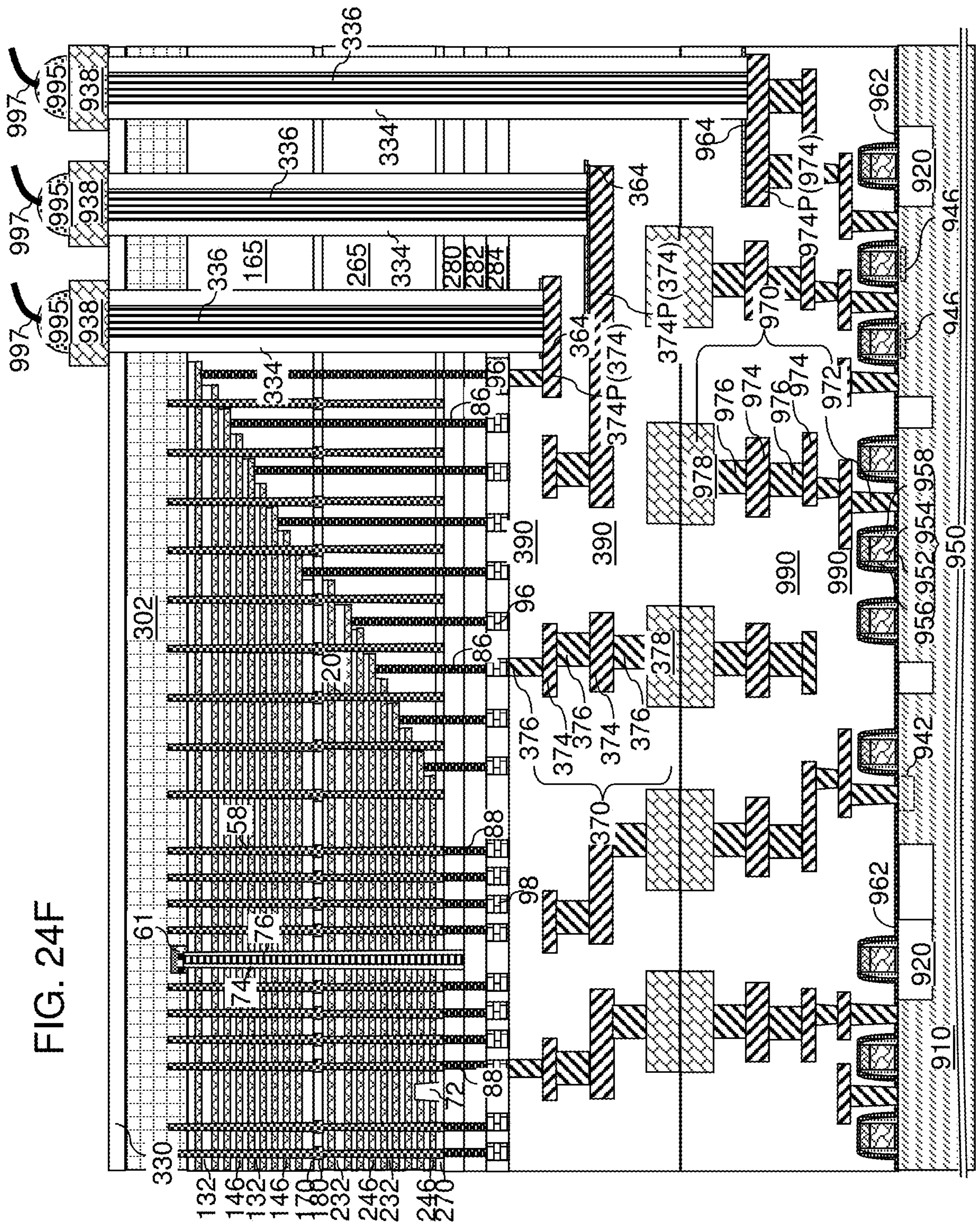

FIG. 24F is a vertical cross-sectional view of a fourth configuration of the second exemplary structure according to an embodiment of the present disclosure.

Figure 25A:
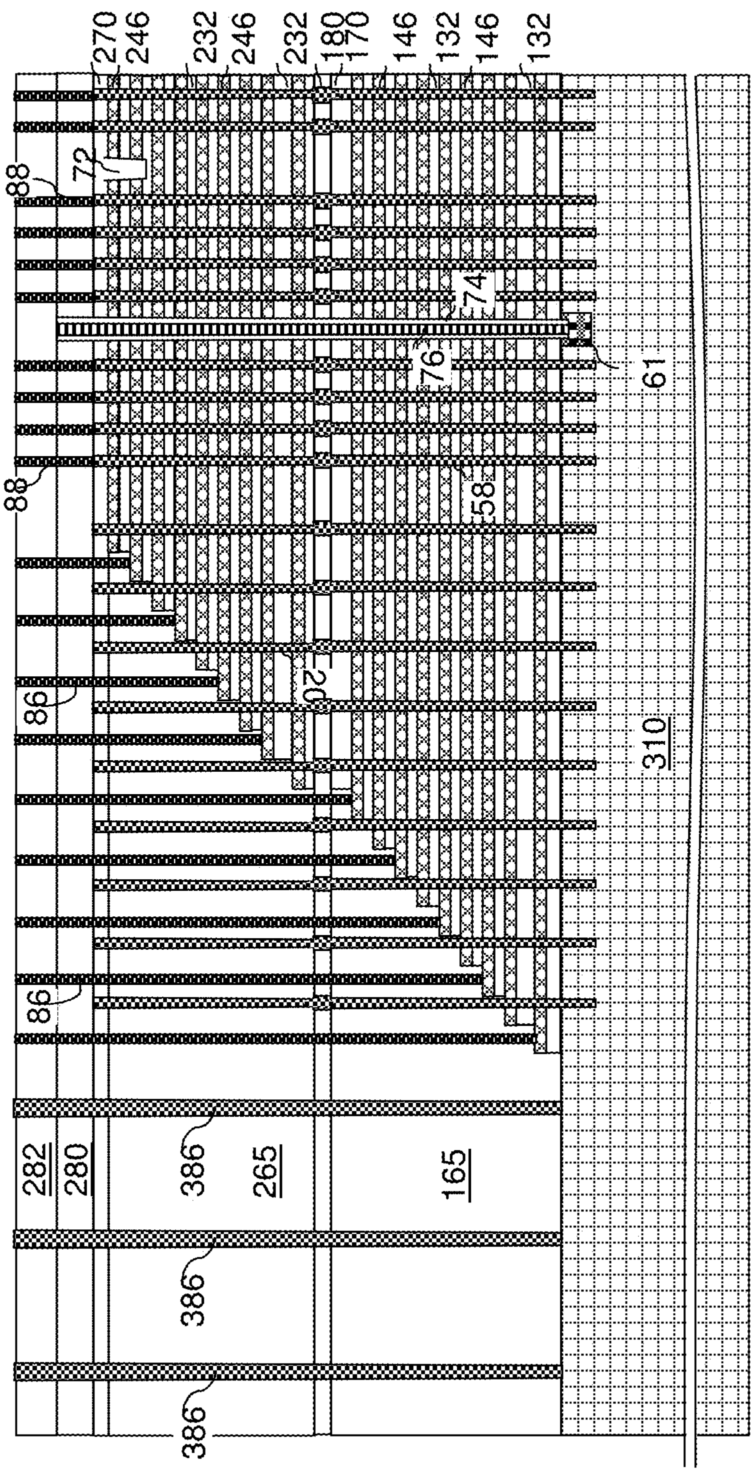

FIG. 25A is a vertical cross-sectional view of an exemplary in-process memory die after formation of through-dielectric external connection via structures according to an embodiment of the present disclosure.

Figure 25B:
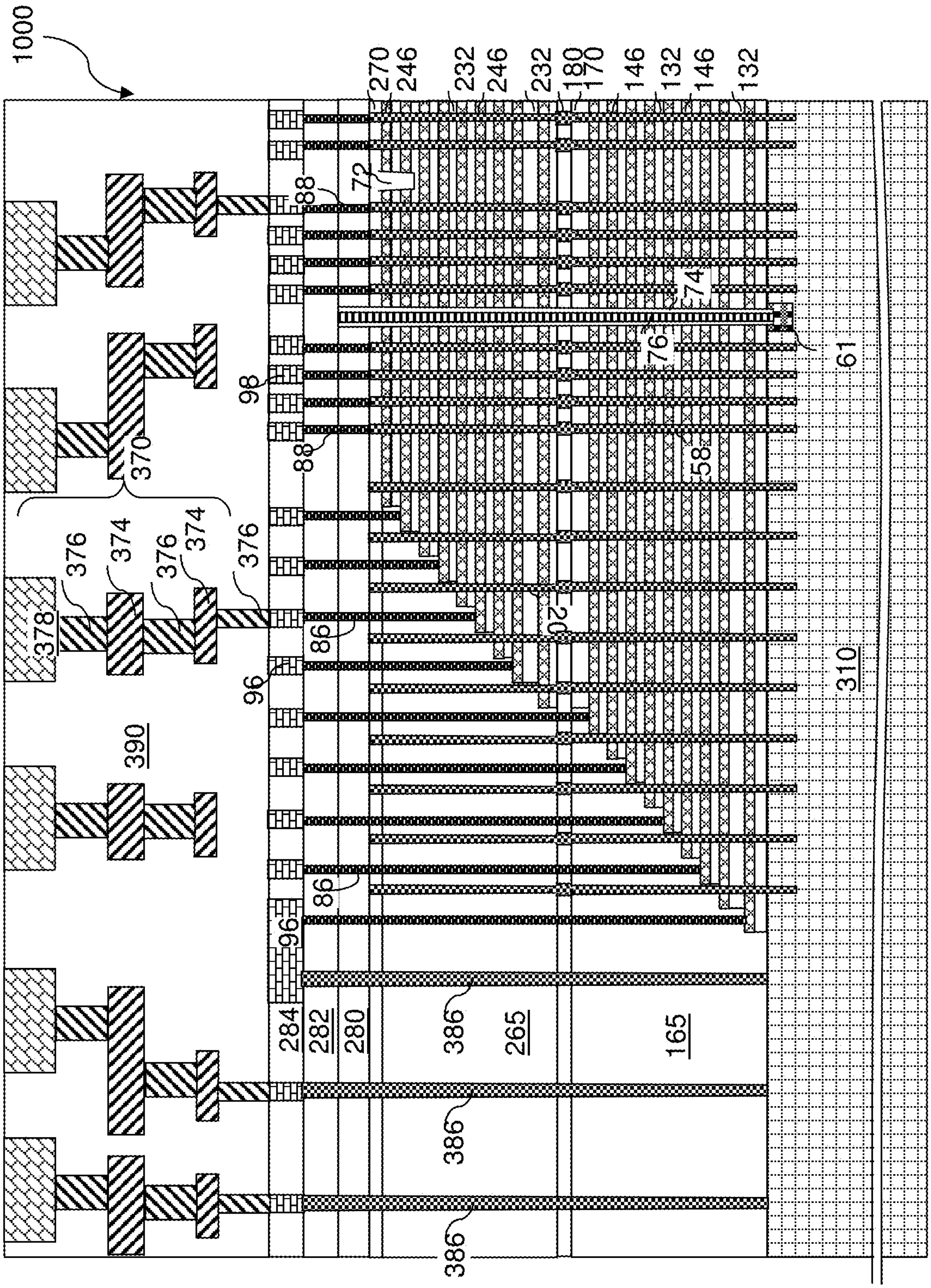

FIG. 25B is a vertical cross-sectional view of a first exemplary memory die according to an embodiment of the present disclosure.

FIGS. 25C-25F are sequential vertical cross-sectional views of a first configuration of the third exemplary structure during formation of a bonded assembly including through-dielectric external connection via structures, external bonding pads, solder balls, and bonding wires according to an embodiment of the present disclosure.

Figure 25C:
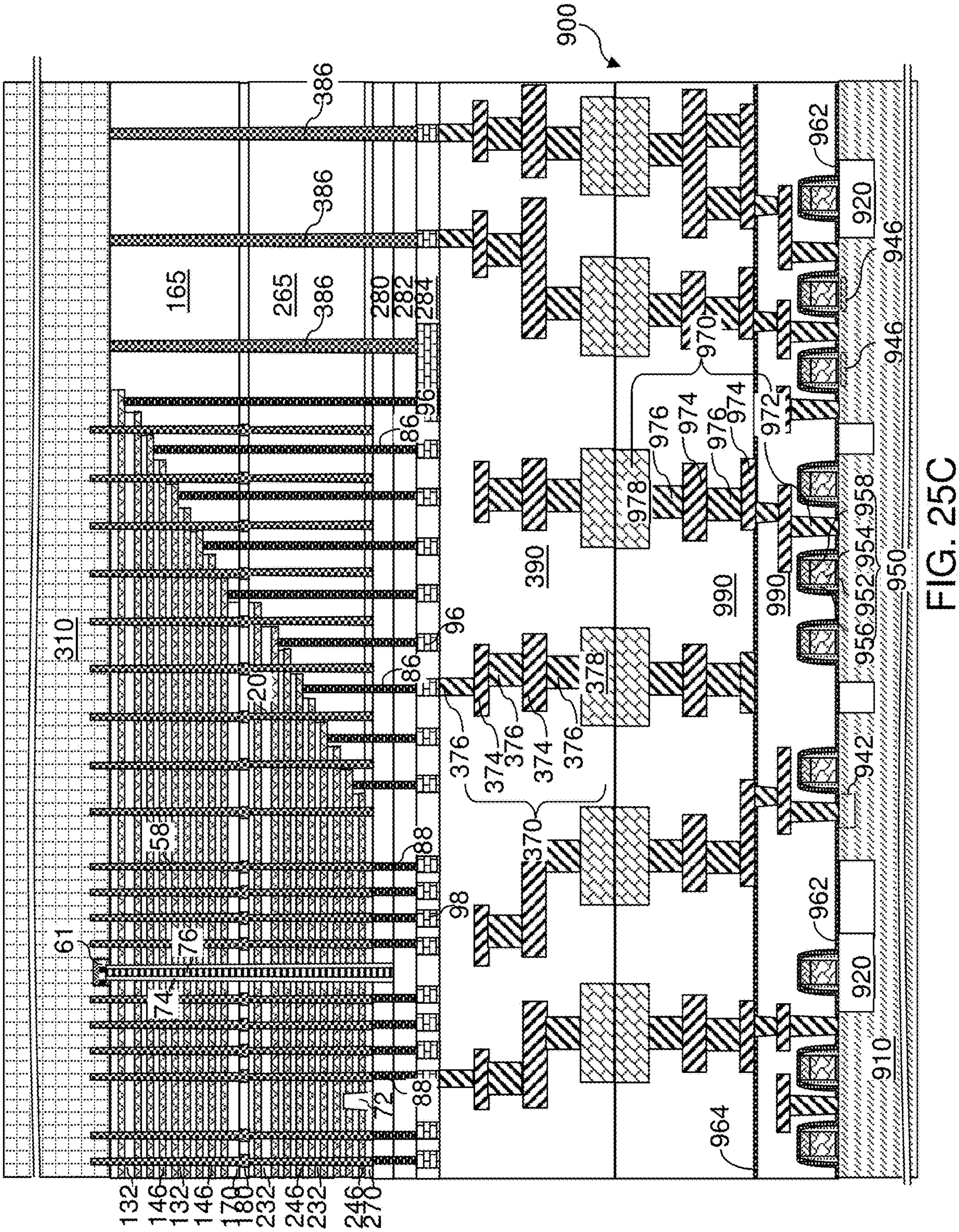
Figure 25D:
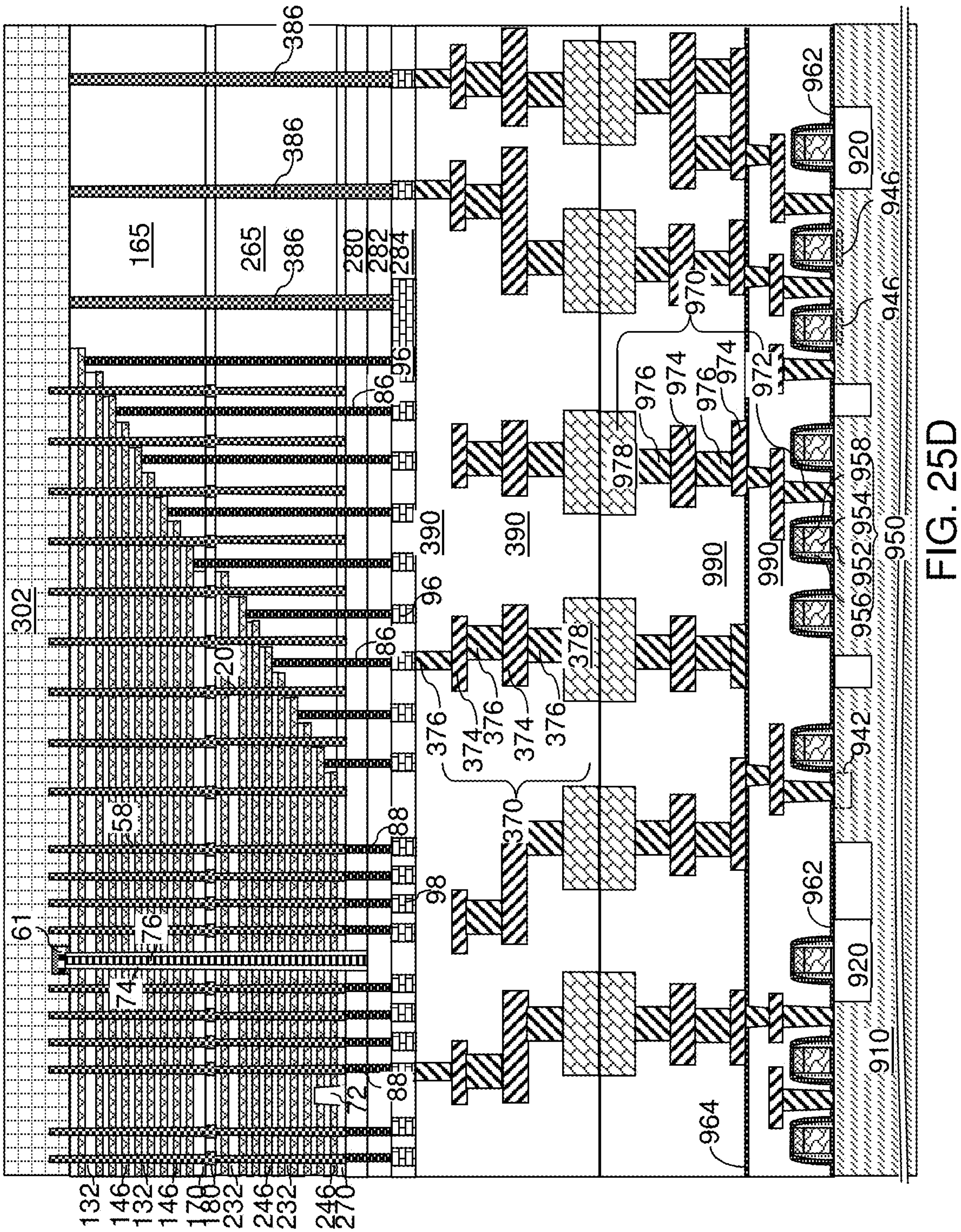
Figure 25E:
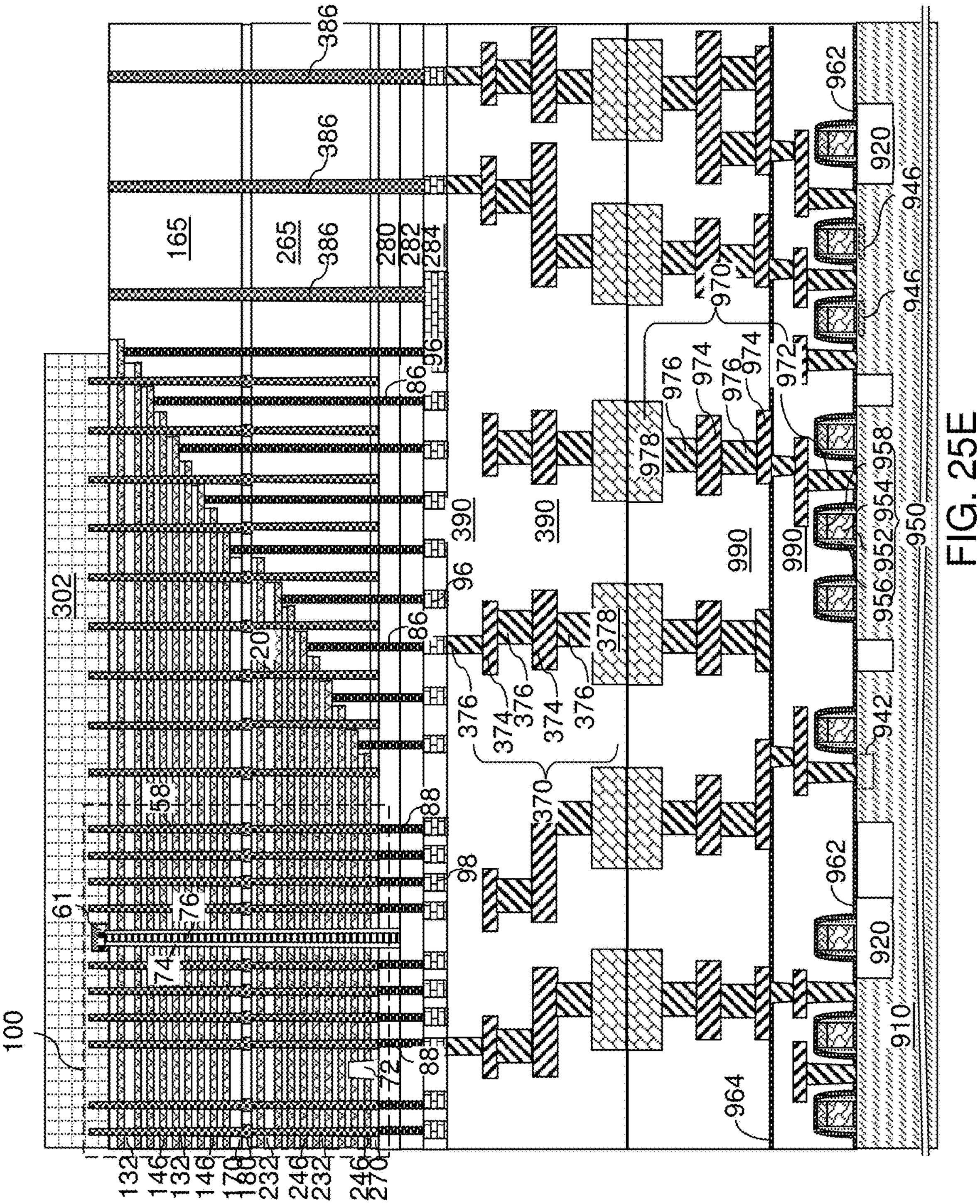
Figure 25F:
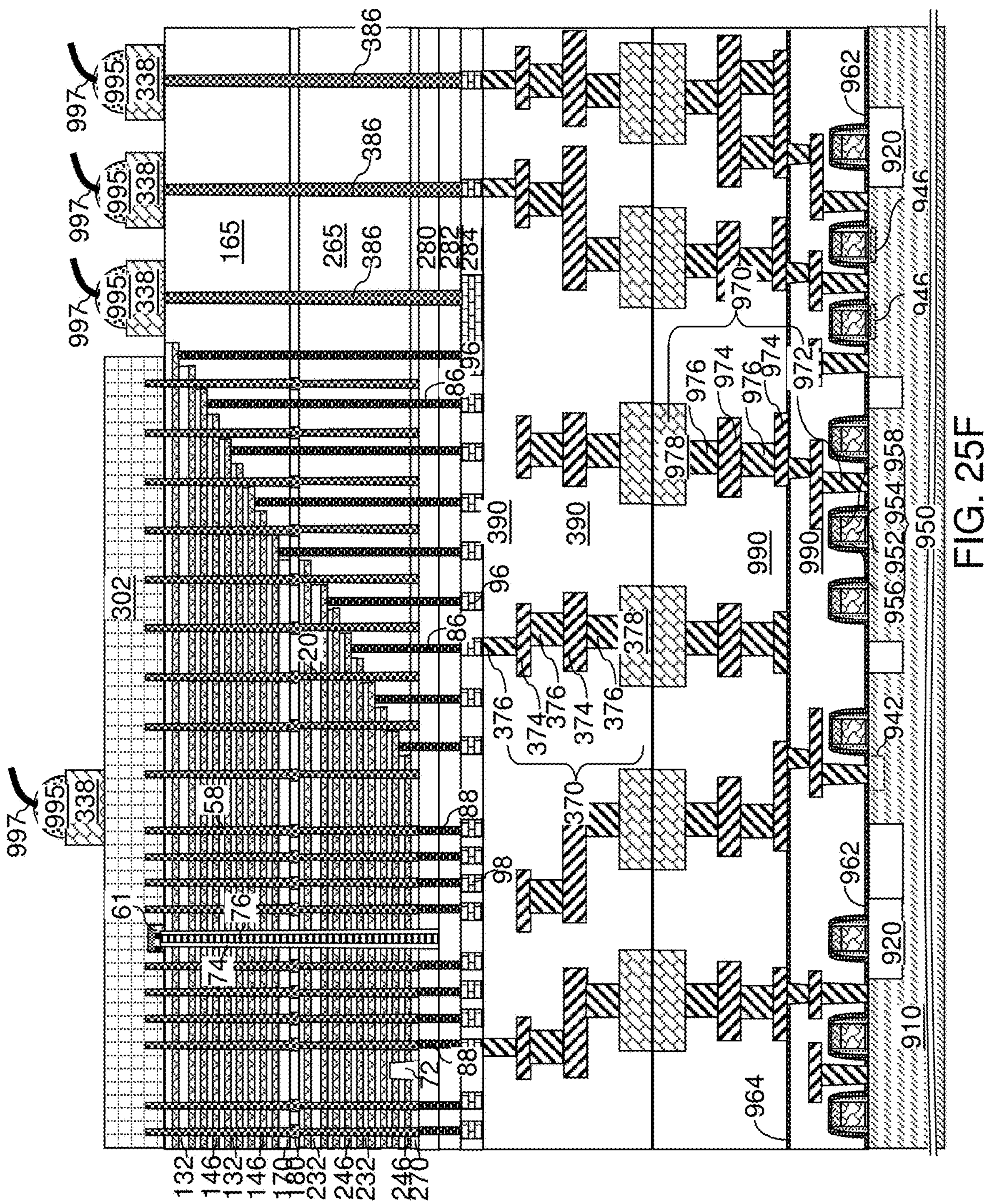
Figure 25G:
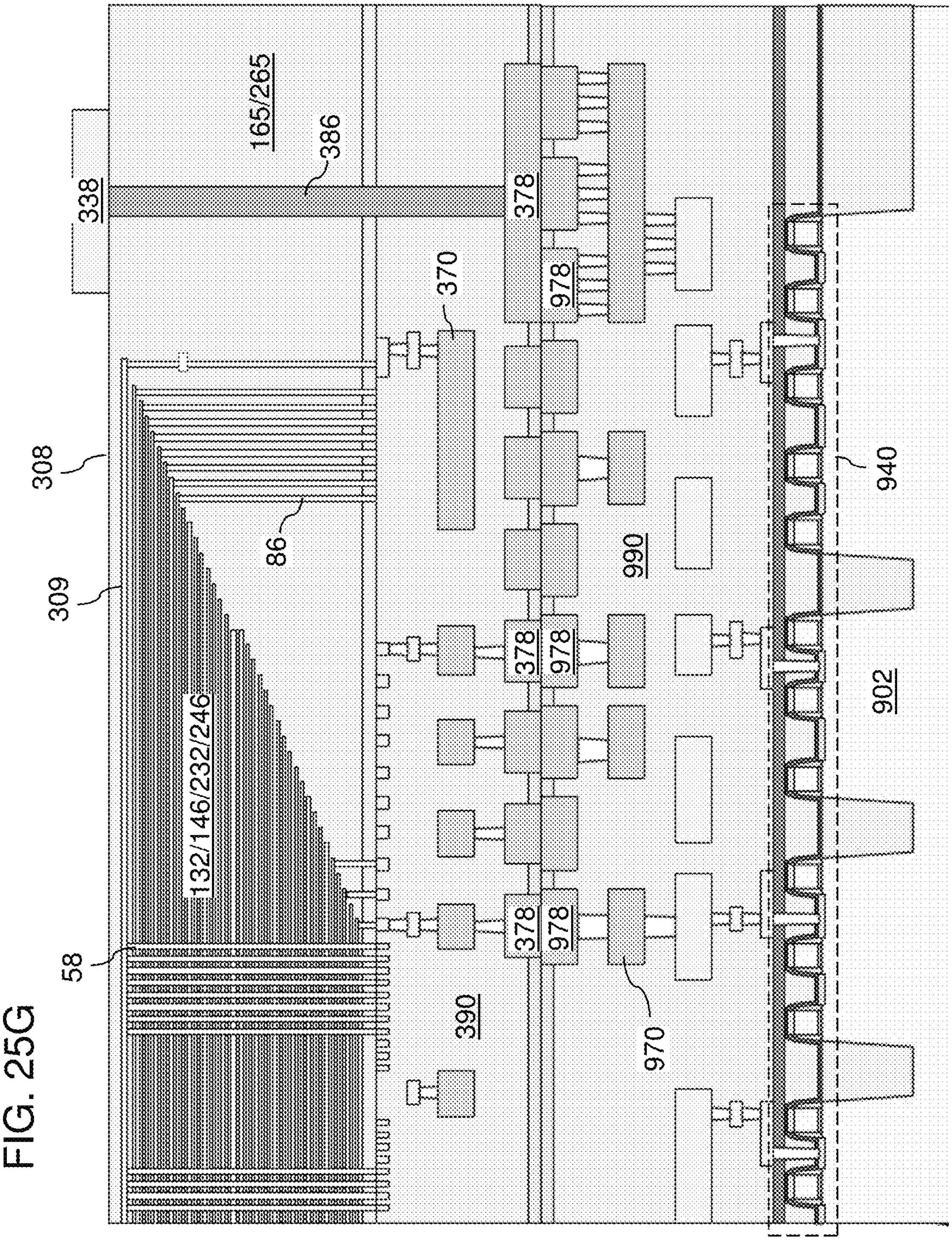

FIG. 25G is an alternative embodiment of the first configuration of the third exemplary structure according to an embodiment of the present disclosure.

Figure 26A:
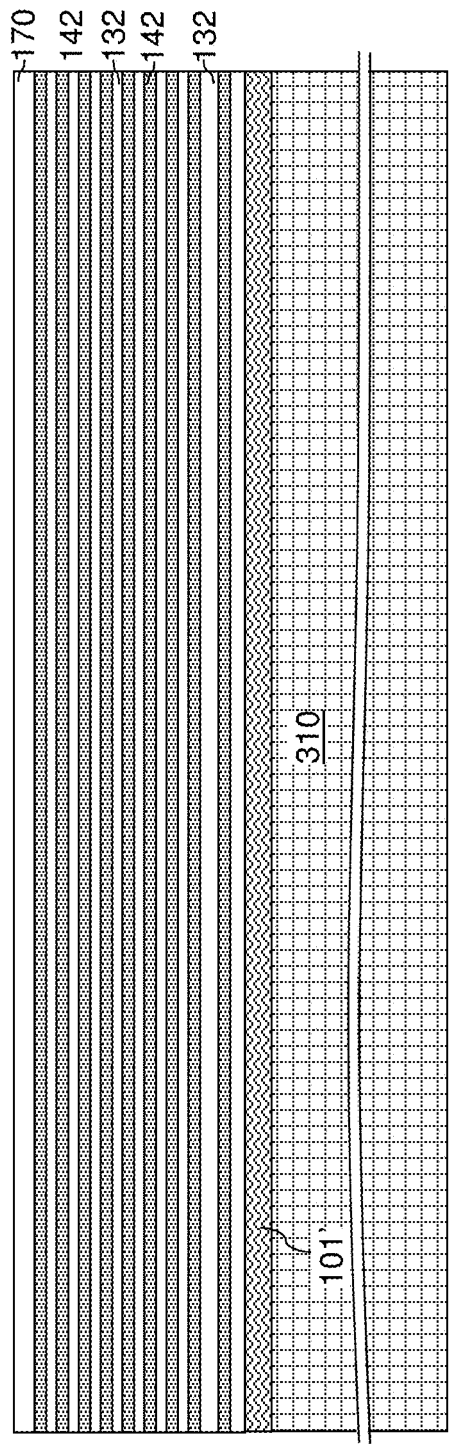

FIG. 26A is a vertical cross-sectional view of a second exemplary in-process memory die after formation of a first alternating stack of first insulating layers and first spacer material layers according to an embodiment of the present disclosure.

Figure 26B:
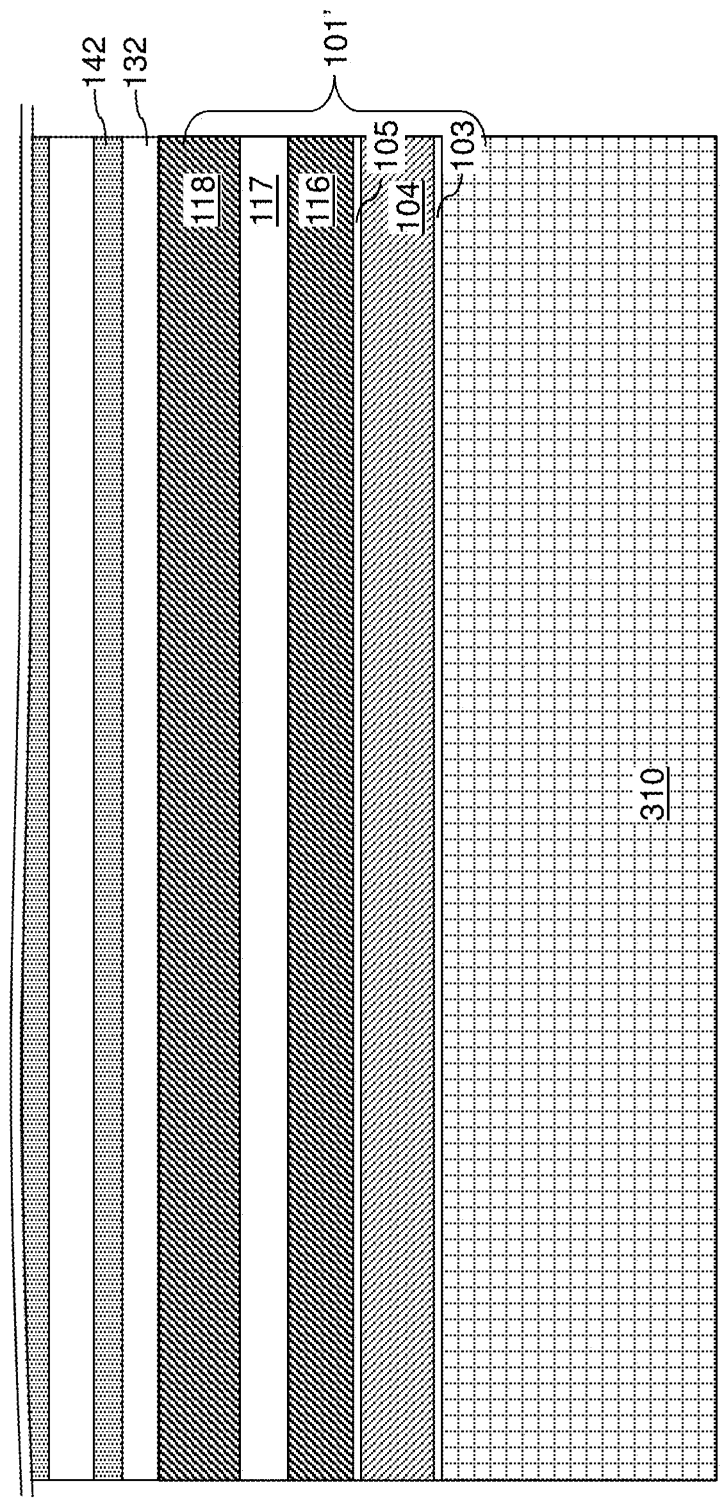

FIG. 26B is a magnified vertical cross-sectional view of a region of the second exemplary in-process memory die of FIG. 26A.

FIGS. 27A-27D are sequential vertical cross-sectional view of a memory opening of the second exemplary in-process memory die during formation of a memory opening fill structure according to an embodiment of the present disclosure.

Figure 28:
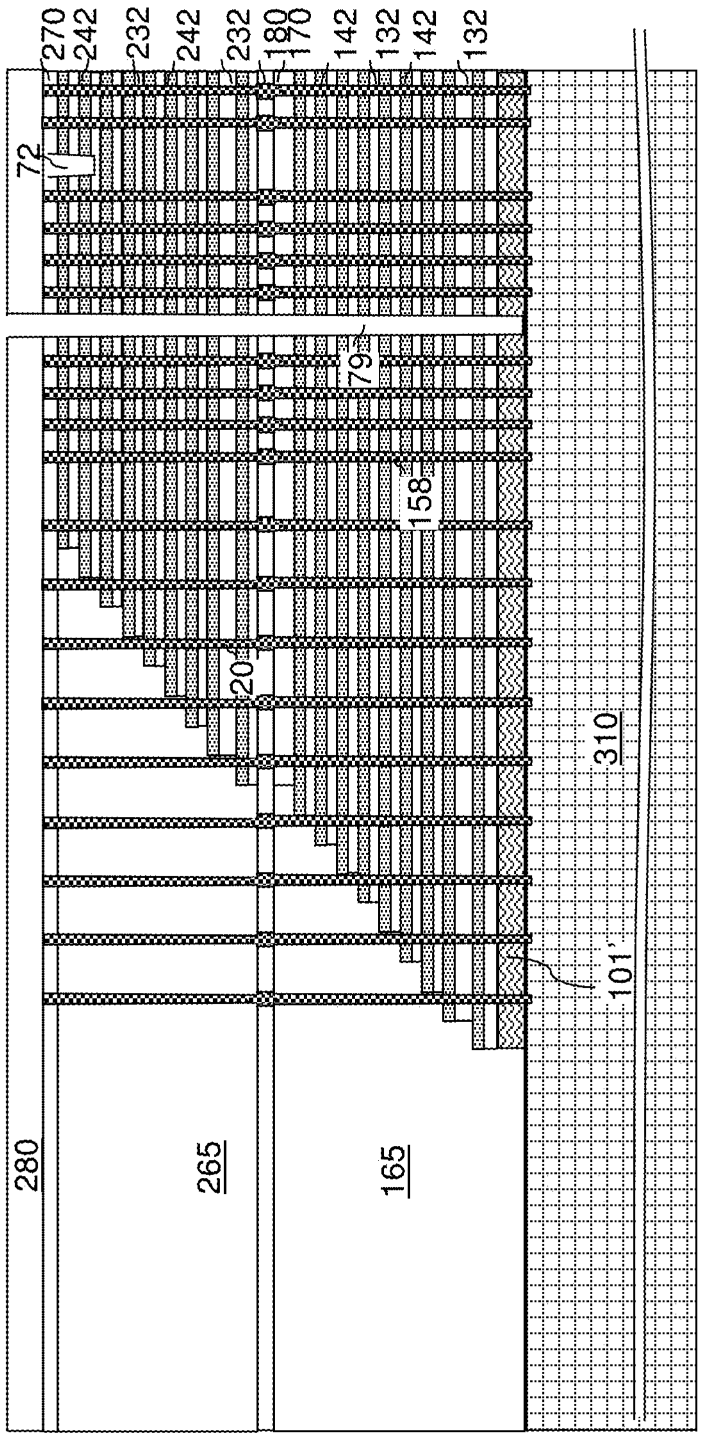

FIG. 28 is a vertical cross-sectional view of the second exemplary in-process memory die after formation of backside trenches according to an embodiment of the present disclosure.

FIGS. 29A-29E are sequential vertical cross-sectional views of a region of the second exemplary in-process memory die that includes two memory opening fill structures and a backside trench during replacement of in-process source-level material layers with source-level material layers according to an embodiment of the present disclosure.

Figure 30:
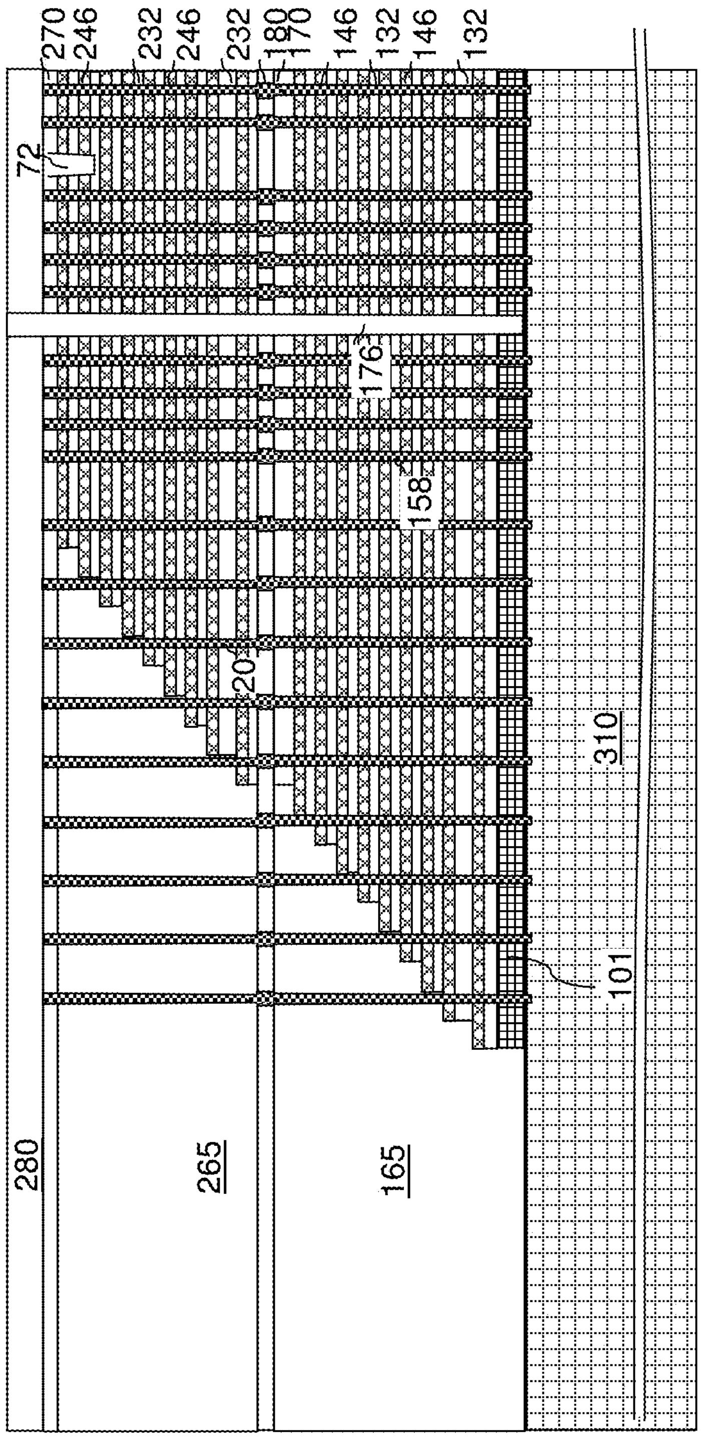

FIG. 30 is a vertical cross-sectional view of the second exemplary in-process memory die after formation of dielectric wall structures according to an embodiment of the present disclosure.

Figure 31:
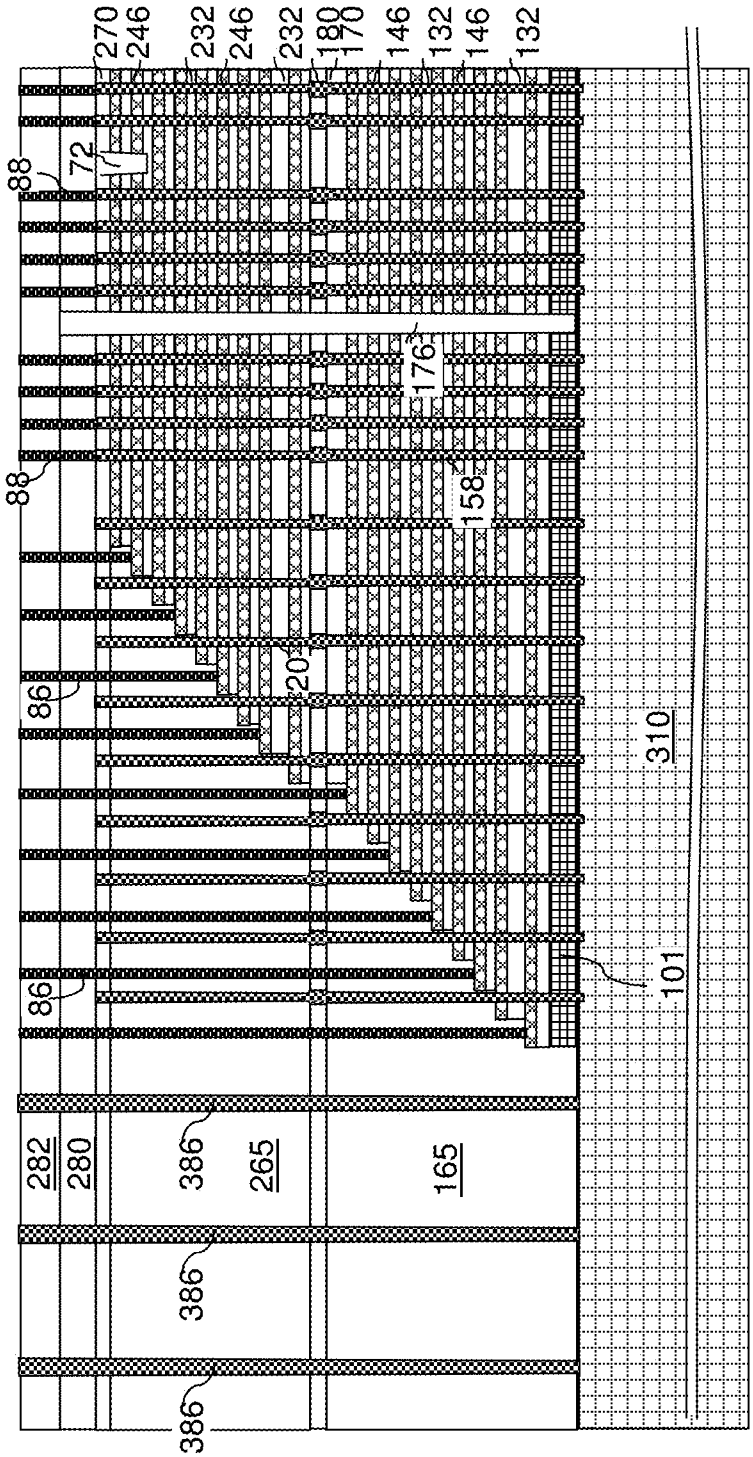

FIG. 31 is a vertical cross-sectional view of the second exemplary in-process memory die after formation of through-dielectric external connection via structures according to an embodiment of the present disclosure.

Figure 32:
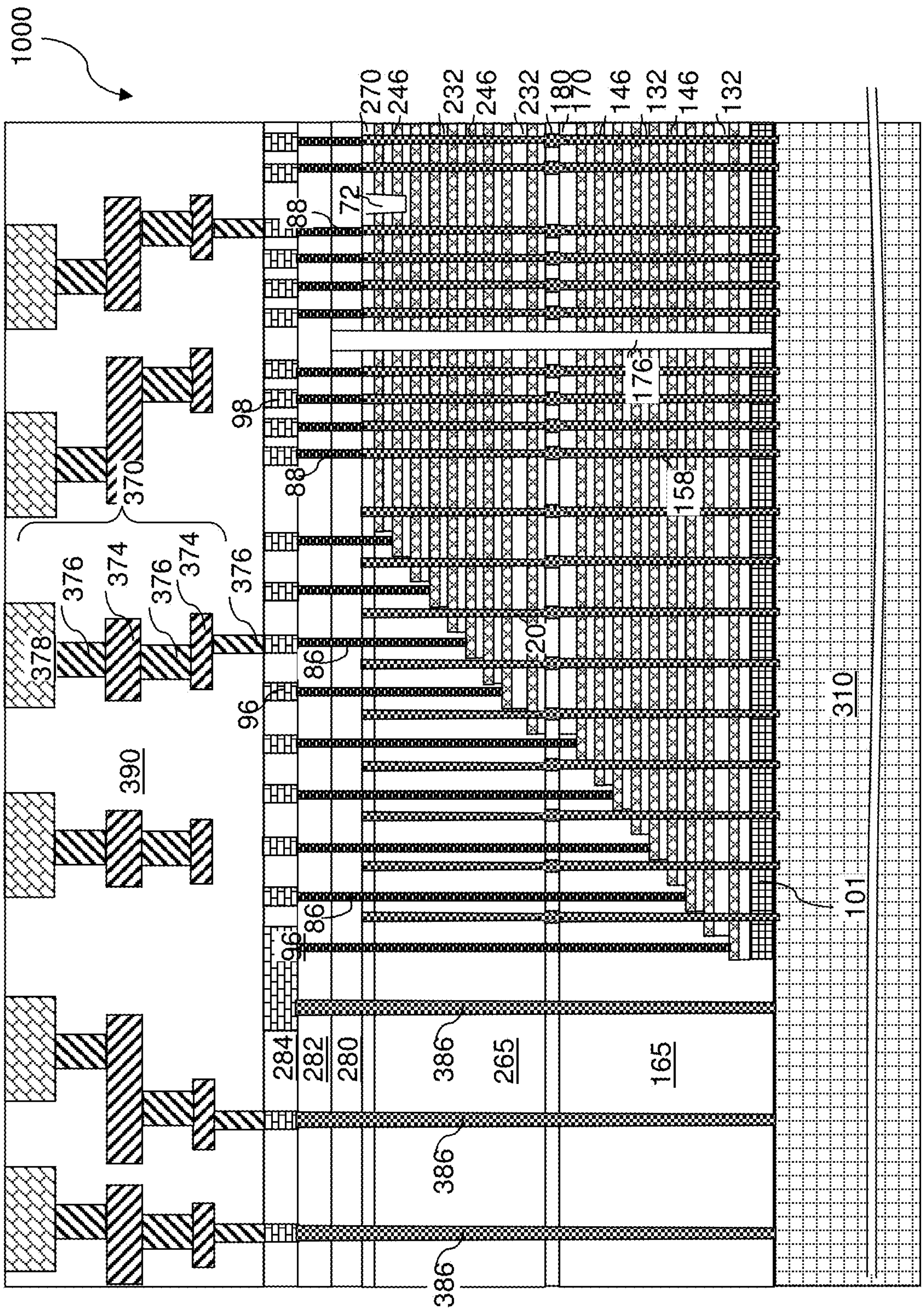

FIG. 32 is a vertical cross-sectional view of a second exemplary memory die according to an embodiment of the present disclosure.

FIGS. 33A-33D are sequential vertical cross-sectional views of a second configuration of the third exemplary structure during formation of a bonded assembly including through-dielectric external connection via structures, external bonding pads, solder balls, and bonding wires according to an embodiment of the present disclosure.

DETAILED DESCRIPTION

As discussed above, the various embodiments of the present disclosure are directed to three-dimensional memory devices. A support (i.e., driver) circuitry is provided to perform write, read, and erase operations of the memory cells in the vertical NAND strings. Typically, complementary metal oxide semiconductor (CMOS) devices are formed on a same substrate as the three-dimensional memory device. However, degradation of CMOS devices due to collateral thermal cycling and hydrogen diffusion during manufacture of the three-dimensional memory device can place a severe constraint on performance of the support circuitry including the CMOS devices. Various embodiments provide bonded structure that incorporates a high-performance support circuitry on a different substrate than the three-dimensional memory array followed by bonding the substrates to each other. The embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming, i.e., a smallest unit on which a programming operation can be performed.

Figure 1:
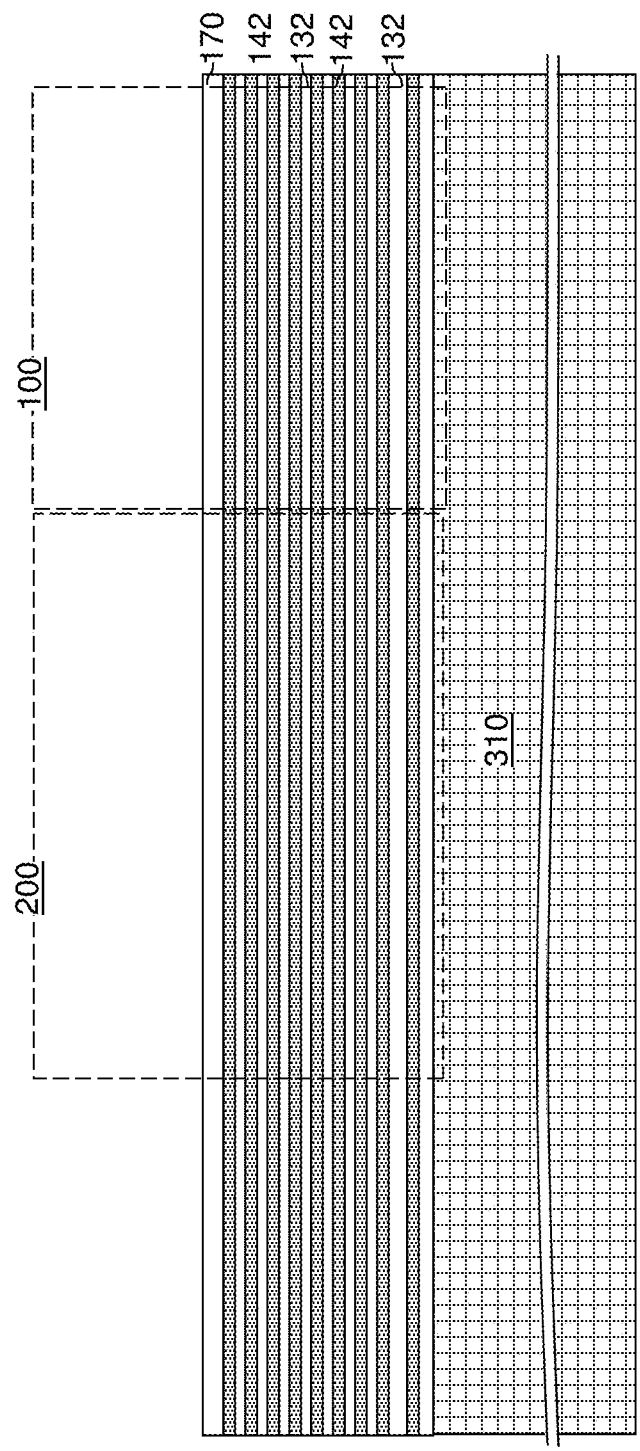
FIG. 1 is a vertical cross-sectional view of a first exemplary structure after formation of a first alternating stack of first insulating layers and first spacer material layers according to an embodiment of the present disclosure.

Referring to FIG. 1, a first exemplary structure according to a first embodiment of the present disclosure is illustrated. The first exemplary structure includes a substrate, which is herein referred to as a memory-side substrate 310. The memory-side substrate 310 may be a semiconductor substrate, an insulating substrate, or a conductive substrate. In one embodiment, a commercially available silicon wafer may be used for the memory-side substrate 310.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, in other embodiments the spacer material layers are formed as electrically conductive layers, thereby obviating the need to perform replacement processes.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the memory-side substrate 310. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be used.

Figure 2:
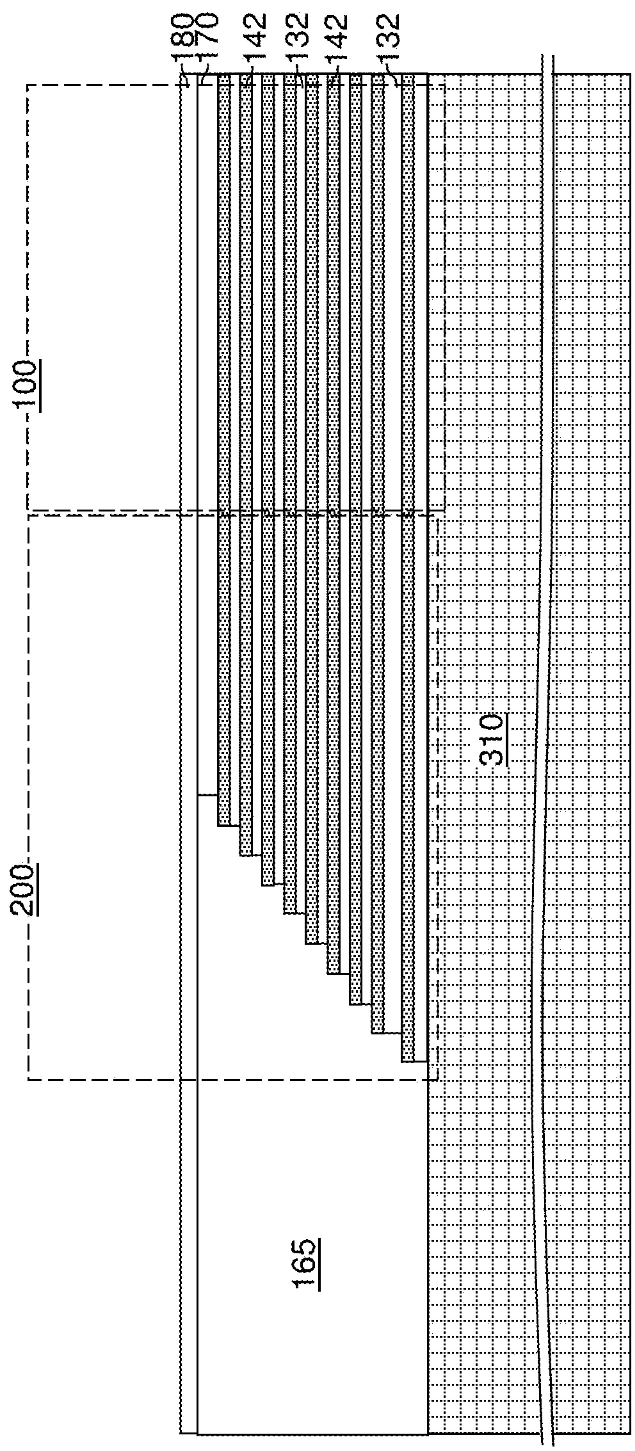
FIG. 2 is a vertical cross-sectional view of the first exemplary structure after formation of a first-tier staircase region, a first stepped dielectric material portion, and an inter-tier dielectric layer according to an embodiment of the present disclosure.

Referring to FIG. 2, the first insulating cap layer 170 and the first alternating stack (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 3A:
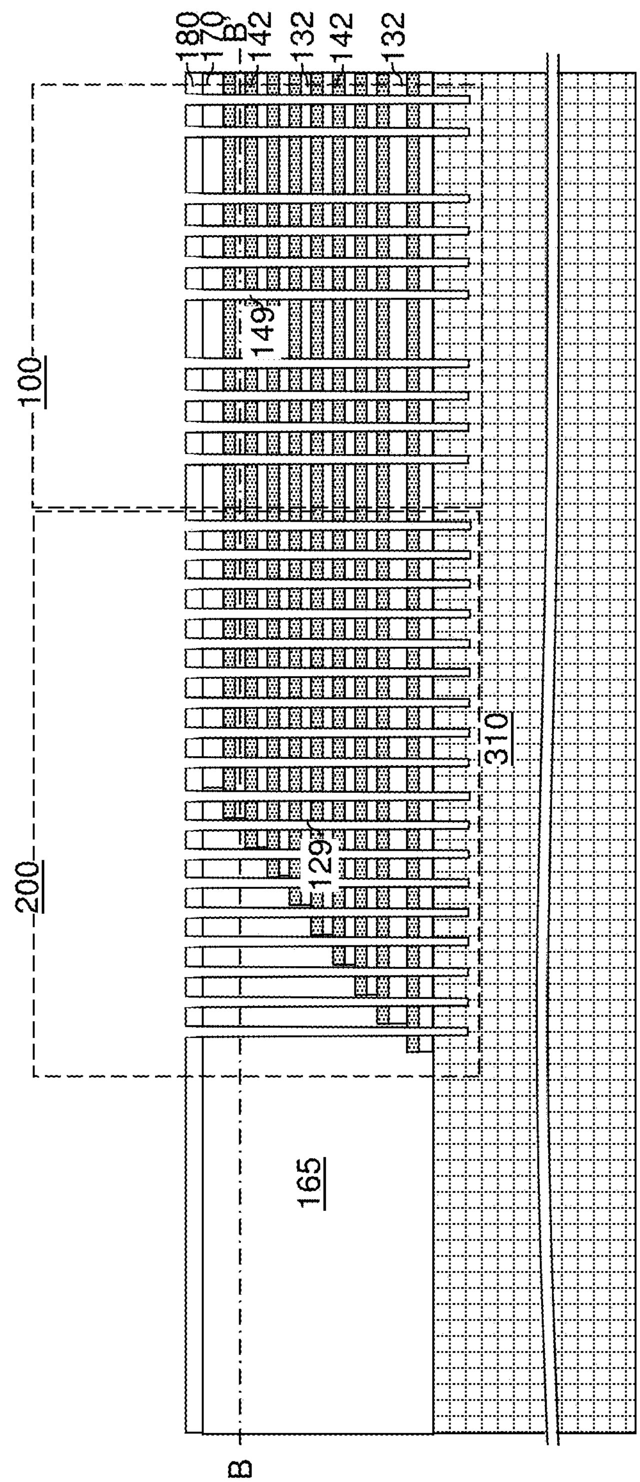
FIG. 3A is a vertical cross-sectional view of the first exemplary structure after formation of first-tier memory openings and first-tier support openings according to an embodiment of the present disclosure.
Figure 3B:
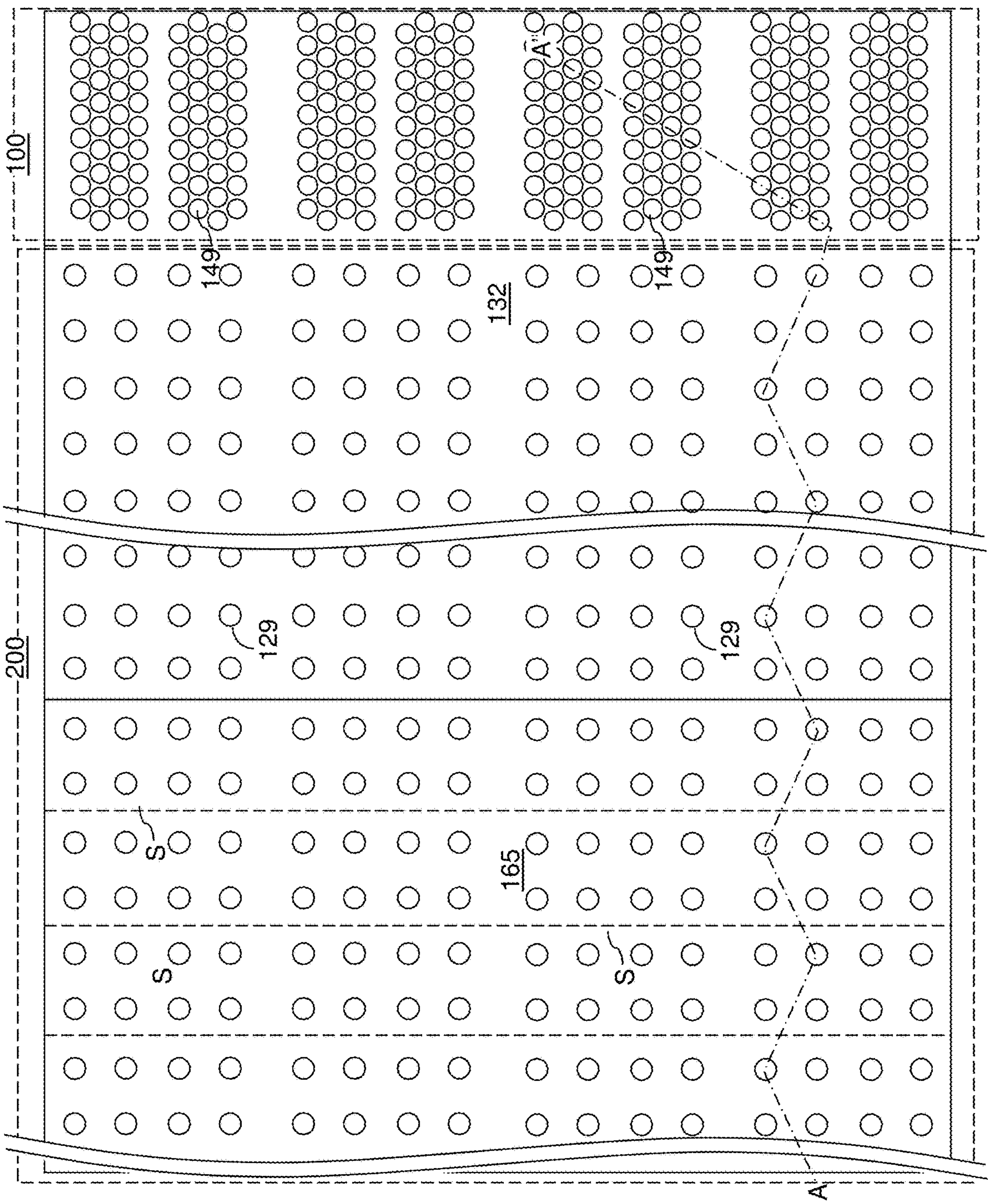
FIG. 3B is a horizontal cross-sectional view of the first exemplary structure of FIG. 4A. The hinged vertical plane A-A' corresponds to the plane of the vertical cross-sectional view of FIG. 3A.

Referring to FIGS. 3A and 3B, various first-tier openings (149, 129) can be formed through the inter-tier dielectric layer 180 and the first-tier structure (132, 142, 170, 165) and into the memory-side substrate 310. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the memory-side substrate 310 by a first anisotropic etch process to form the various first-tier openings (149, 129) concurrently, i.e., during the first isotropic etch process. The various first-tier openings (149, 129) can include first-tier memory openings 149 and first-tier support openings 129. Locations of steps S in the first alternating stack (132, 142) are illustrated as dotted lines in FIG. 3B.

The first-tier memory openings 149 are openings that are formed in the memory array region 100 through each layer within the first alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

In one embodiment, the first anisotropic etch process can include an initial step in which the materials of the first alternating stack (132, 142) are etched during the material of the first stepped dielectric material portion 165. The chemistry of the initial etch step can alternate to optimize etching of the first and second materials in the first alternating stack (132, 142) while providing a comparable average etch rate to the material of the first stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second alternating stack (to be subsequently formed prior to formation of the second-tier memory openings).

Figure 4:
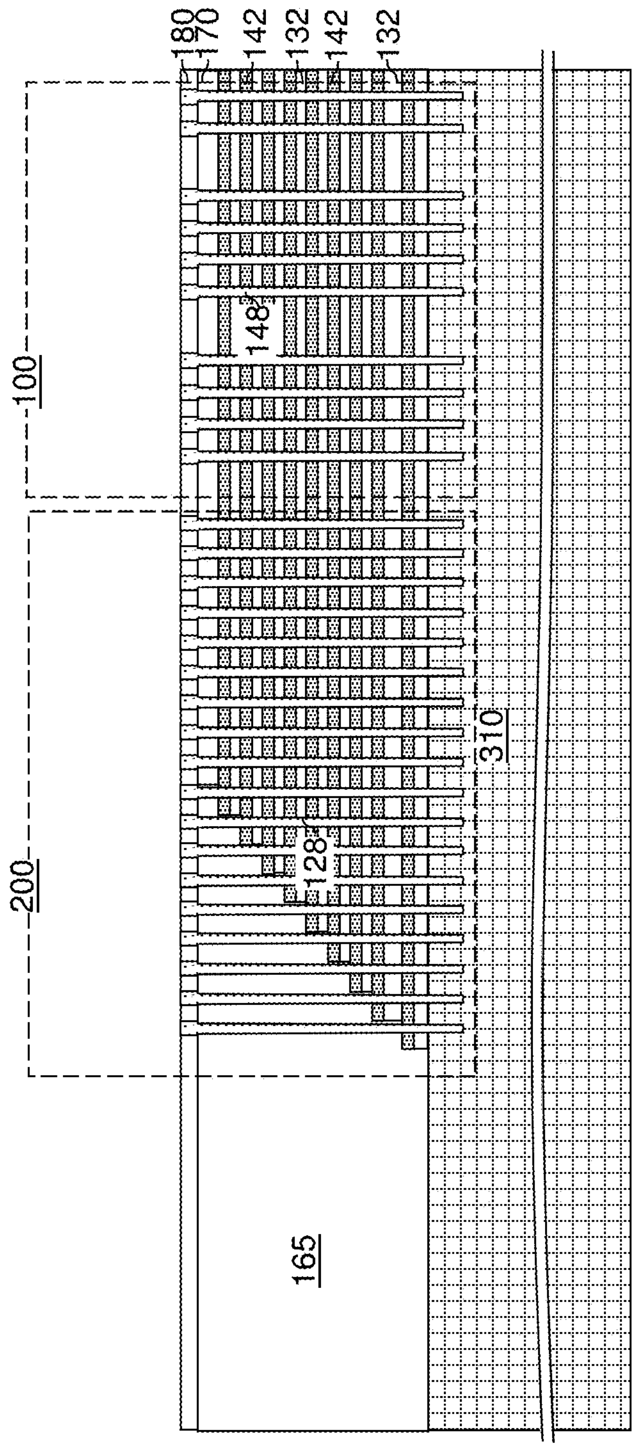
FIG. 4 is a vertical cross-sectional view of the first exemplary structure after formation of various sacrificial fill structures according to an embodiment of the present disclosure.

Referring to FIG. 4, sacrificial first-tier opening fill portions (148, 128) can be formed in the various first-tier openings (149, 129). For example, a sacrificial first-tier fill material is deposited concurrently in each of the first-tier openings (149, 129). The sacrificial first-tier fill material includes a material that can be subsequently removed selective to the materials of the first insulating layers 132 and the first sacrificial material layers 142.

In one embodiment, the sacrificial first-tier fill material can include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial material can be removed from above the topmost layer of the first alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 5:
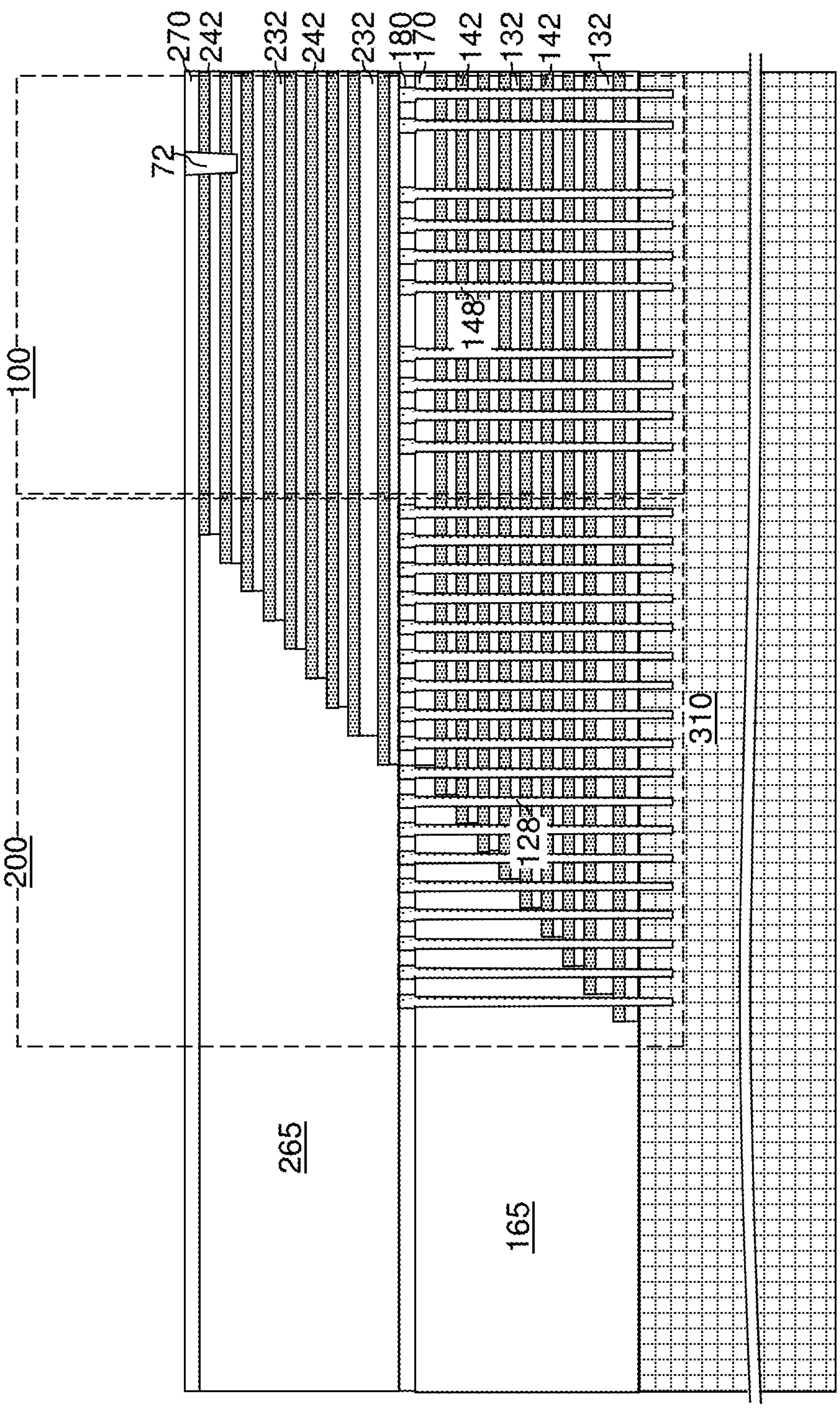
FIG. 5 is a vertical cross-sectional view of the first exemplary structure after formation of a second alternating stack of second insulating layers and second spacer material layers, second stepped surfaces, and a second stepped dielectric material portion according to an embodiment of the present disclosure.

Referring to FIG. 5, a second-tier structure can be formed over the first-tier structure (132, 142, 170, 148). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second alternating stack (232, 242) can have a uniform thickness that is substantially invariant within each respective second sacrificial material layer 242.

Second stepped surfaces in the second stepped area can be formed in the staircase region 200 using a same set of processing steps as the processing steps used to form the first stepped surfaces in the first stepped area with suitable adjustment to the pattern of at least one masking layer. A second stepped dielectric material portion 265 can be formed over the second stepped surfaces in the staircase region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the memory-side substrate 310, and at least one stepped dielectric material portion (165, 265) can be formed over the staircase regions on the at least one alternating stack (132, 142, 232, 242).

Optionally, drain-select-level isolation structures 72 can be formed through a subset of layers in an upper portion of the second alternating stack (232, 242). The second sacrificial material layers 242 that are cut by the select-drain-level isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 6A:
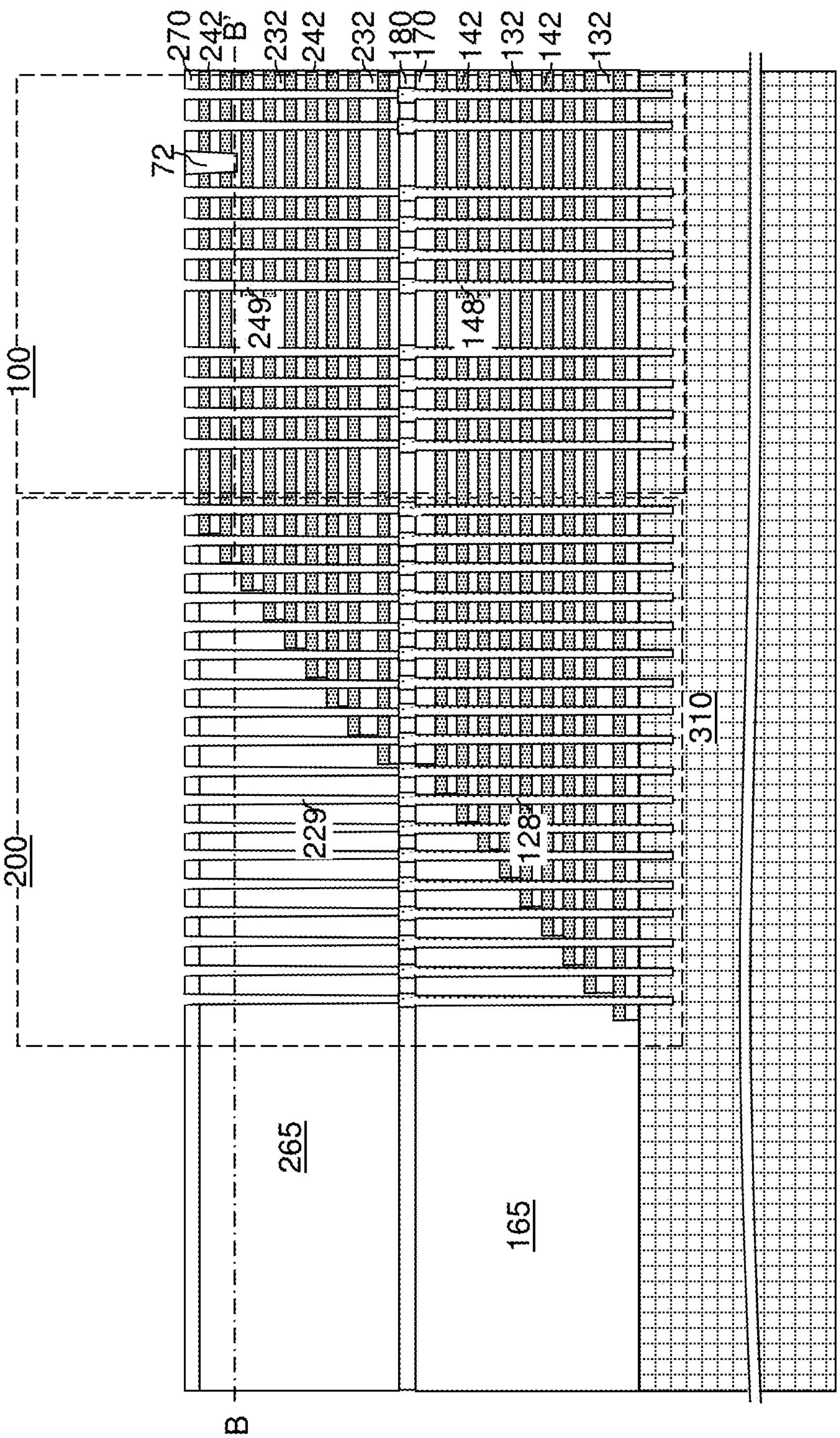
FIG. 6A is a vertical cross-sectional view of the first exemplary structure after formation of second-tier memory openings and second-tier support openings according to an embodiment of the present disclosure.
Figure 6B:
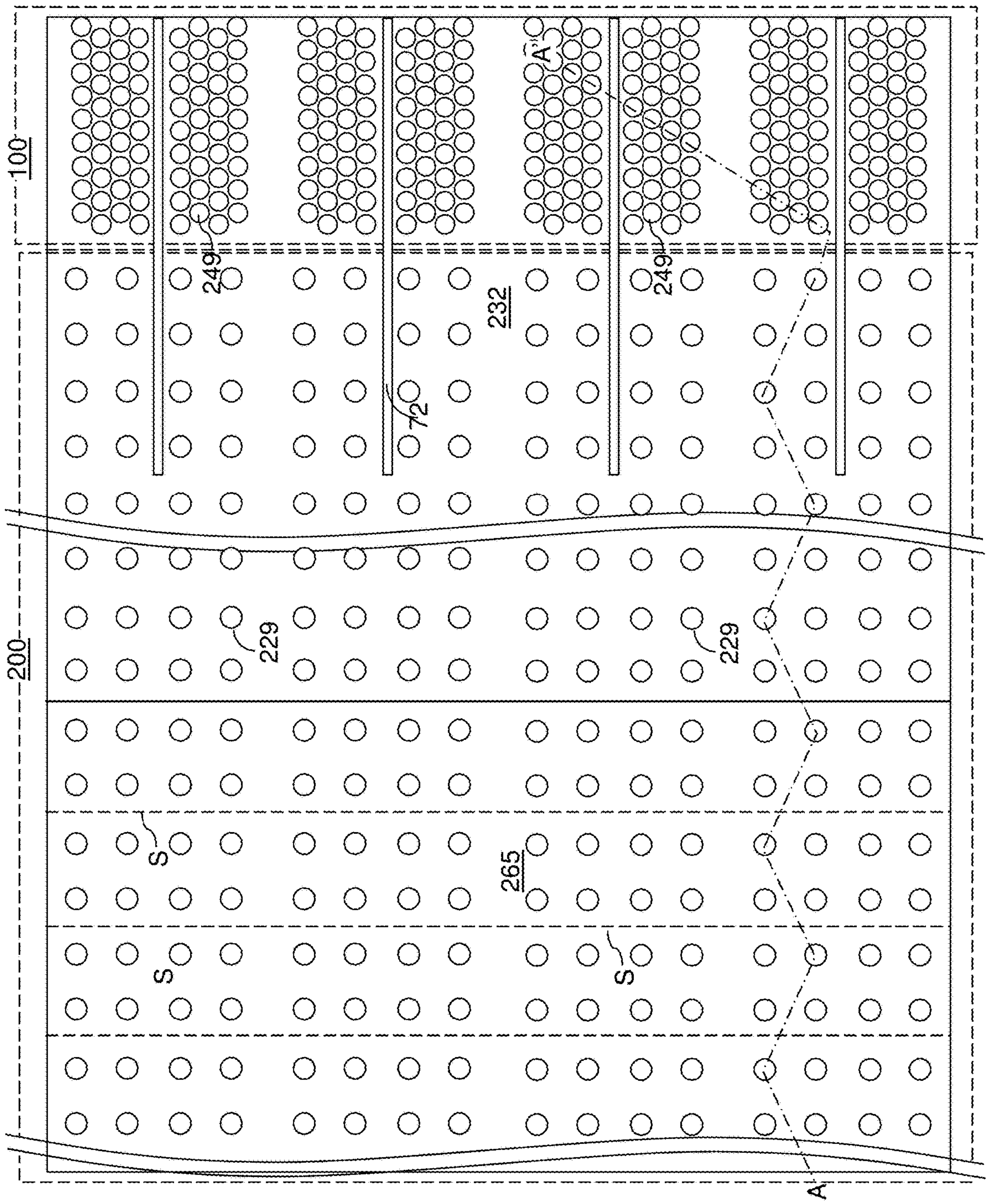
FIG. 6B is a horizontal cross-sectional of the first exemplary structure along the horizontal plane B-B' of FIG. 6A. The hinged vertical plane A-A' corresponds to the plane of the vertical cross-sectional view of FIG. 6A.

Referring to FIGS. 6A and 6B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 can be formed through a horizontal surface within the second stepped surfaces, which include the interfacial surfaces between the second alternating stack (232, 242) and the second stepped dielectric material portion 265. Locations of steps S in the first alternating stack (132, 142) and the second alternating stack (232, 242) are illustrated as dotted lines in FIG. 6B.

The second anisotropic etch process can include an etch step in which the materials of the second alternating stack (232, 242) are etched during the material of the second stepped dielectric material portion 265. The chemistry of the etch step can alternate to optimize etching of the materials in the second alternating stack (232, 242) while providing a comparable average etch rate to the material of the second stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset, and/or may be located entirely within, a periphery of a top surface of an underlying sacrificial first-tier opening fill portion (148, 128). The photoresist layer can be subsequently removed, for example, by ashing.

Figure 7:
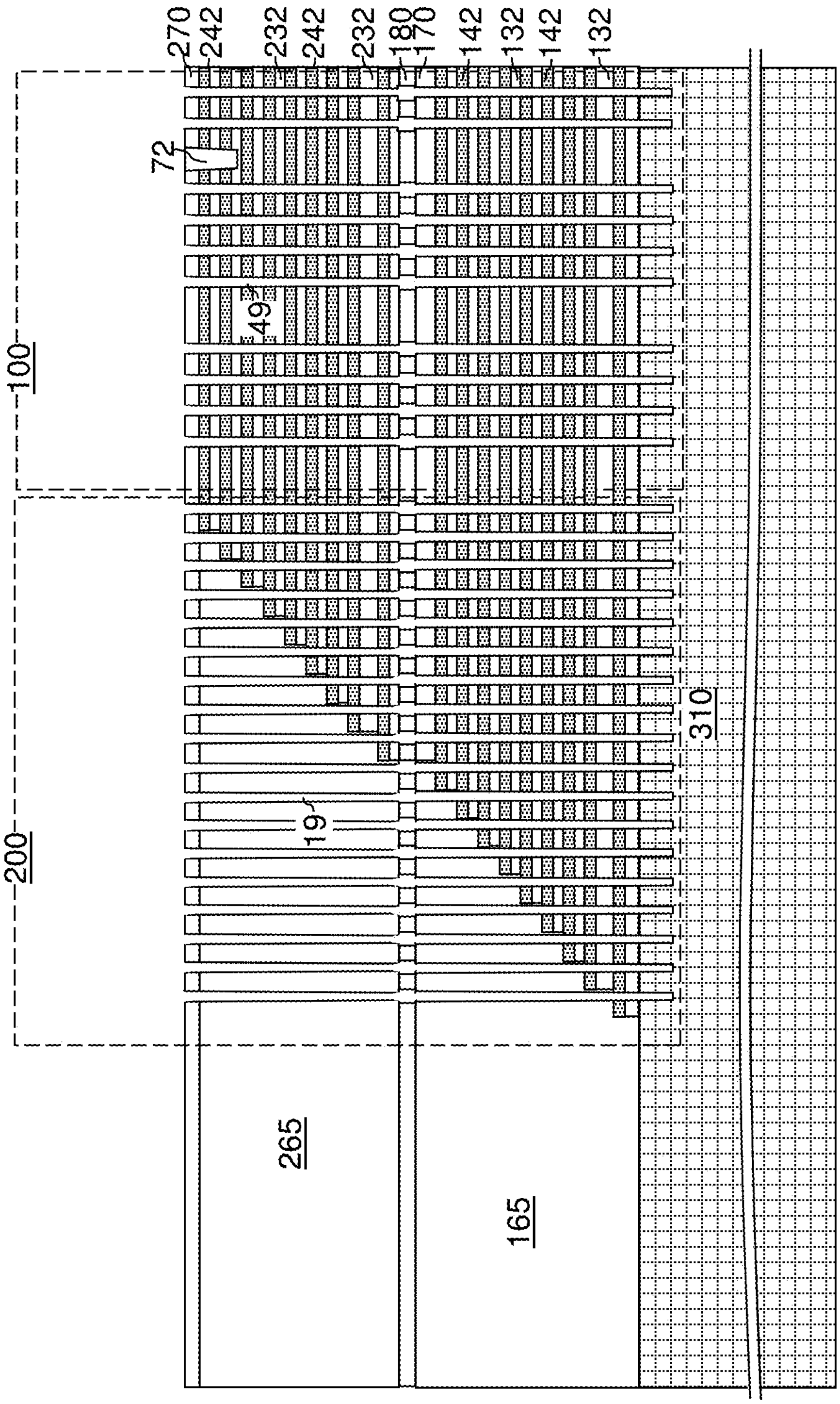
FIG. 7 is a vertical cross-sectional view of the first exemplary structure after formation of inter-tier memory openings and inter-tier support openings according to an embodiment of the present disclosure.

Referring to FIG. 7, the sacrificial first-tier fill material of the sacrificial first-tier opening fill portions (148, 128) can be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 8A-8D provide sequential cross-sectional views of a memory opening 49 during formation of a memory opening fill structure. The same structural change occurs in each of the memory openings 49 and the support openings 19.

Figure 8B:
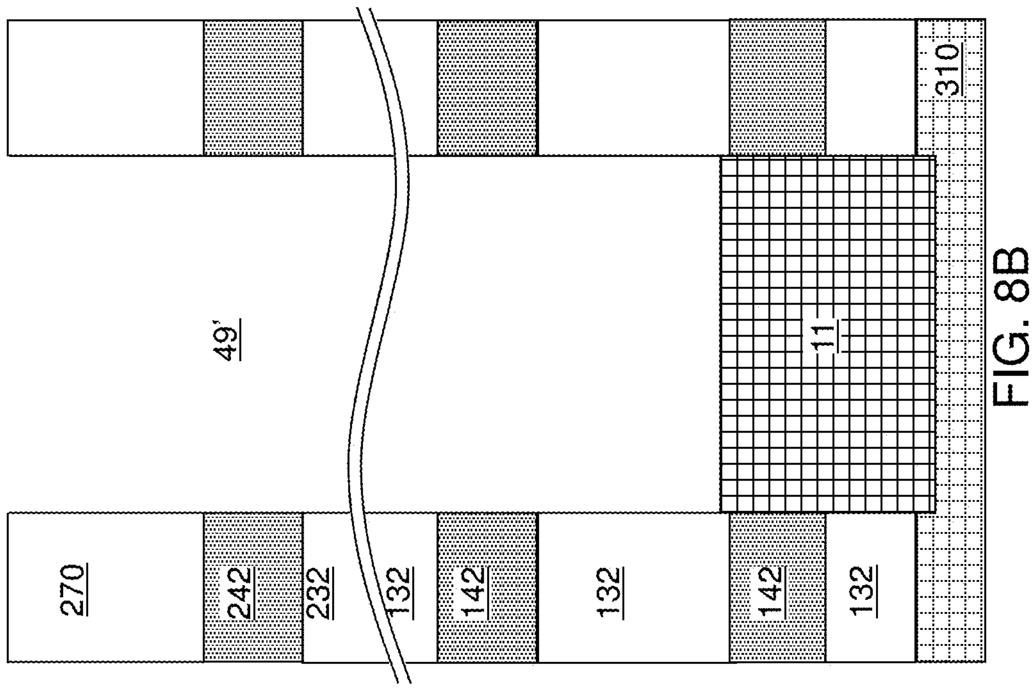
FIGS. 8A-8H illustrate sequential vertical cross-sectional views of a memory opening during formation of a memory opening fill structure according to an embodiment of the present disclosure.
Figure 8A:
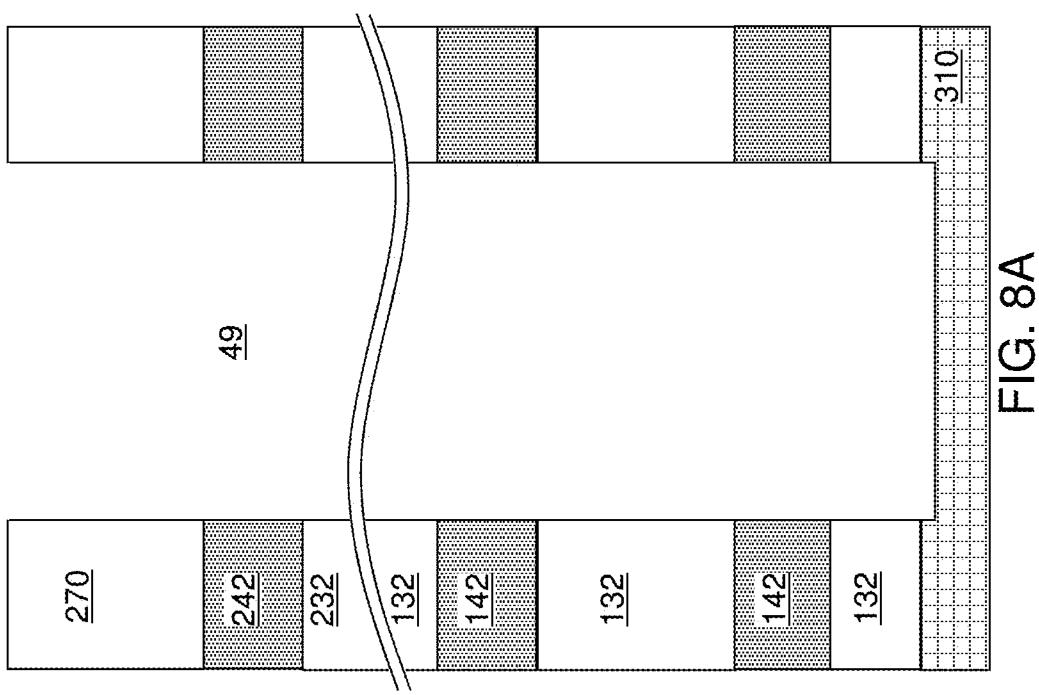

Referring to FIG. 8A, a memory opening 49 in the first exemplary device structure of FIG. 7 is illustrated. The memory opening 49 extends through the first-tier structure and the second-tier structure, and into an upper portion of the memory-side substrate 310. At this processing step, each support opening 19 can extend through the second stepped dielectric material portion 265 and optionally through the first stepped dielectric material portion 165, through a subset of layers in the alternating stacks {(132, 142), (232, 242)}, and down to the memory-side substrate 310. The recess depth of the bottom surface of each memory opening with respect to the top surface of the memory-side substrate 310 can be in a range from 0 nm to 30 nm, although greater recess depths can also be used. Optionally, the sacrificial material layers (142, 242) can be laterally recessed partially to form lateral recesses (not shown), for example, by an isotropic etch.

Referring to FIG. 8B, an optional pedestal channel portion (e.g., an epitaxial pedestal) 11 can be formed at the bottom portion of each memory opening 49 and each support openings 19, for example, by selective epitaxy. The pedestal channel portion 11 can be a portion of a transistor channel that extends between a source region to be subsequently formed in the memory-side substrate 310 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the memory-side substrate 310 that the pedestal channel portion contacts.

Figure 8D:
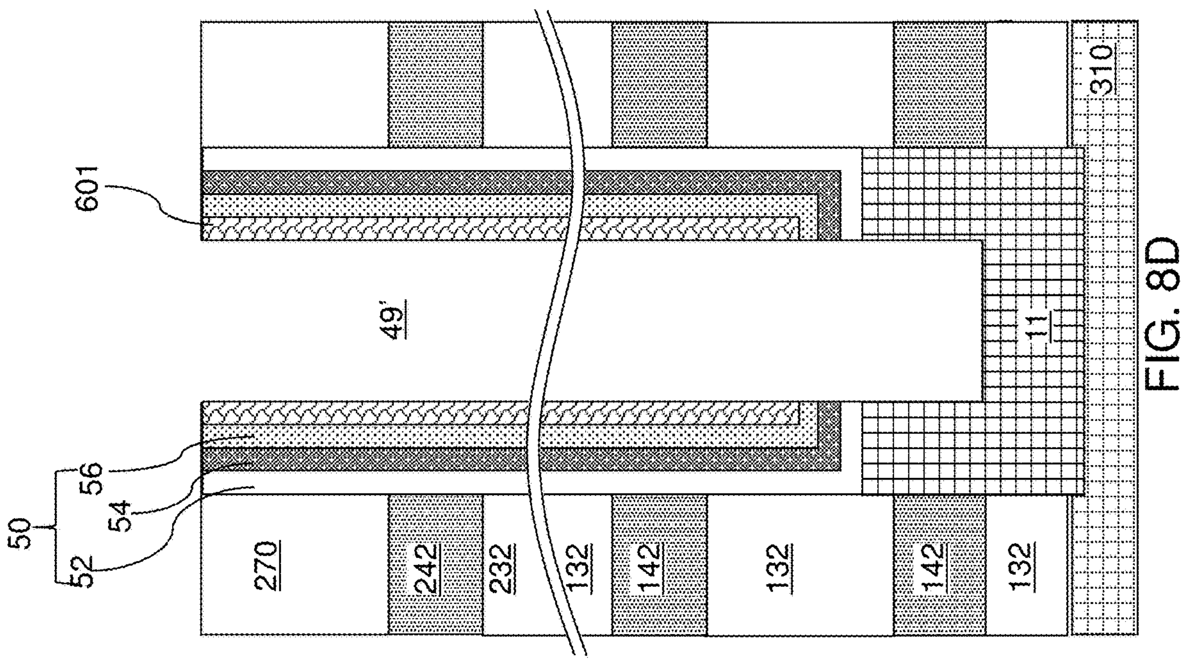
Figure 8C:
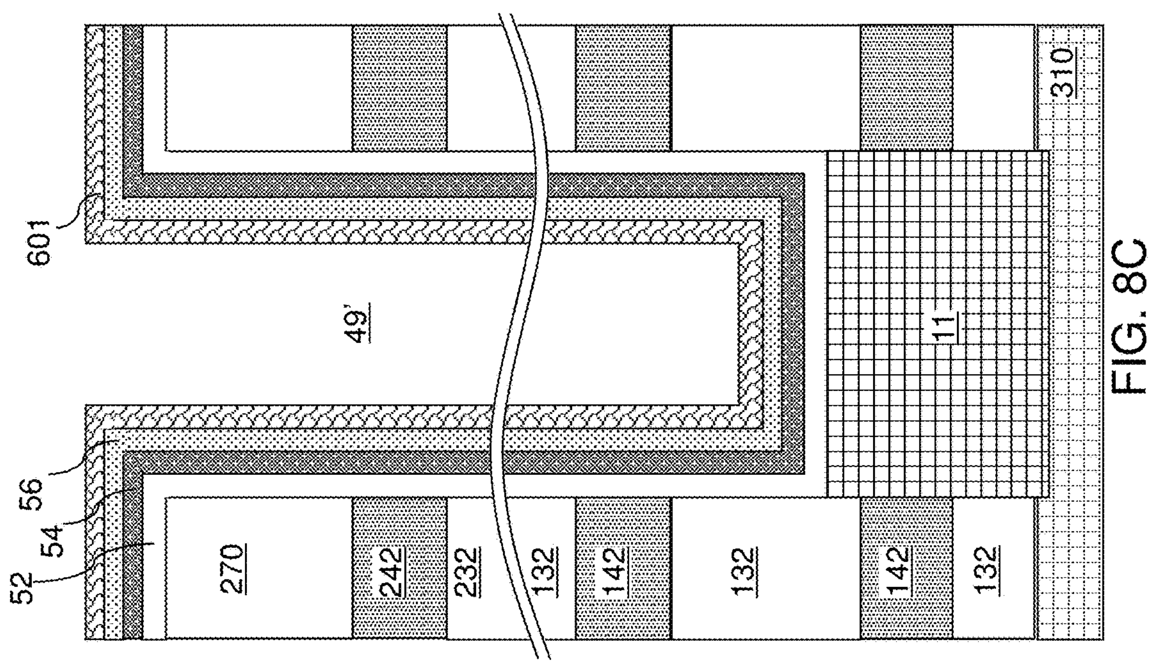

Referring to FIG. 8C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 8D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the memory-side substrate 310 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the memory-side substrate 310 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 8F:
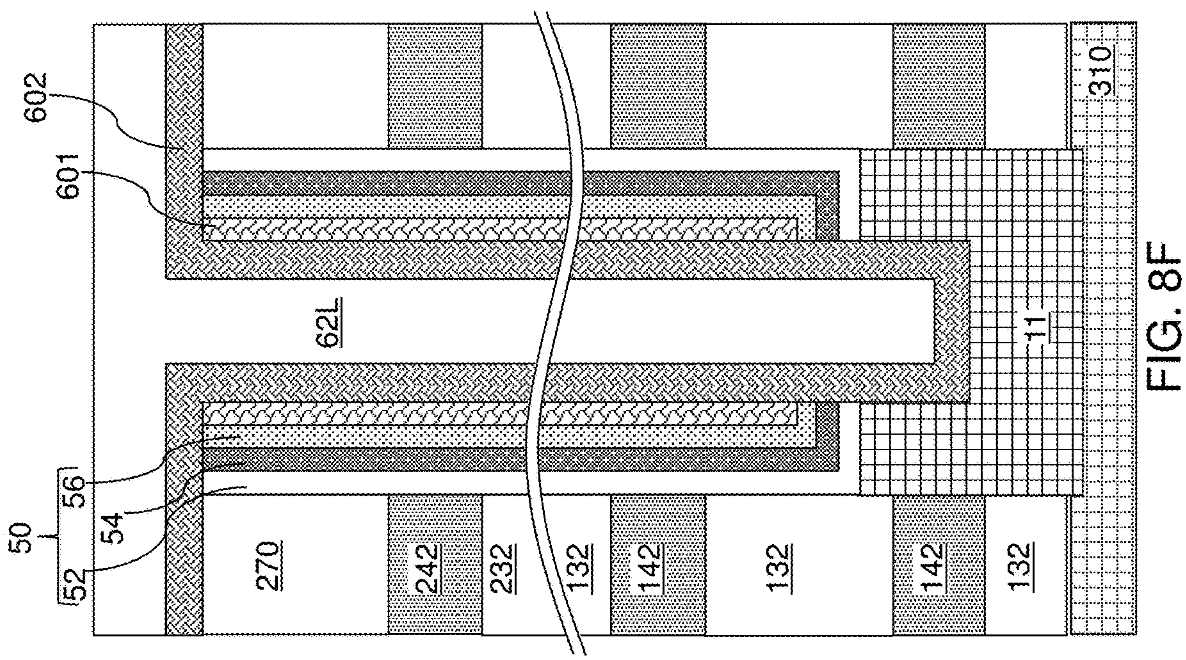
Figure 8E:
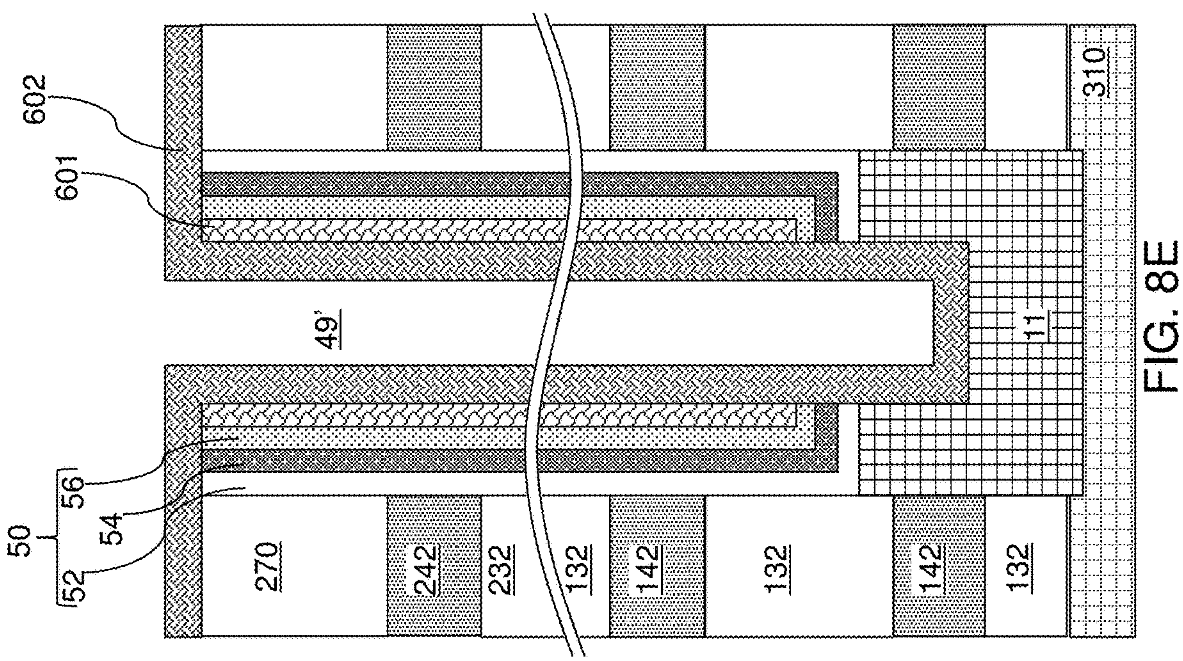

Referring to FIG. 8E, a second semiconductor channel layer 602 can be deposited directly on the semiconductor surface of the pedestal channel portion 11 or the memory-side substrate 310 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 8F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 8H:
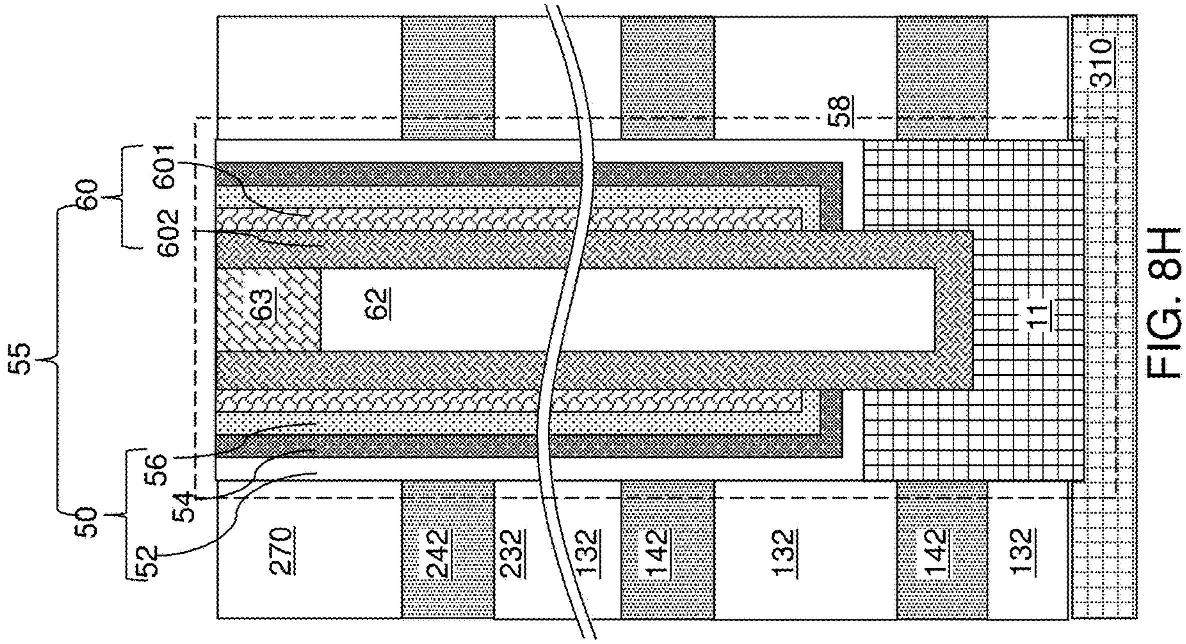
Figure 8G:
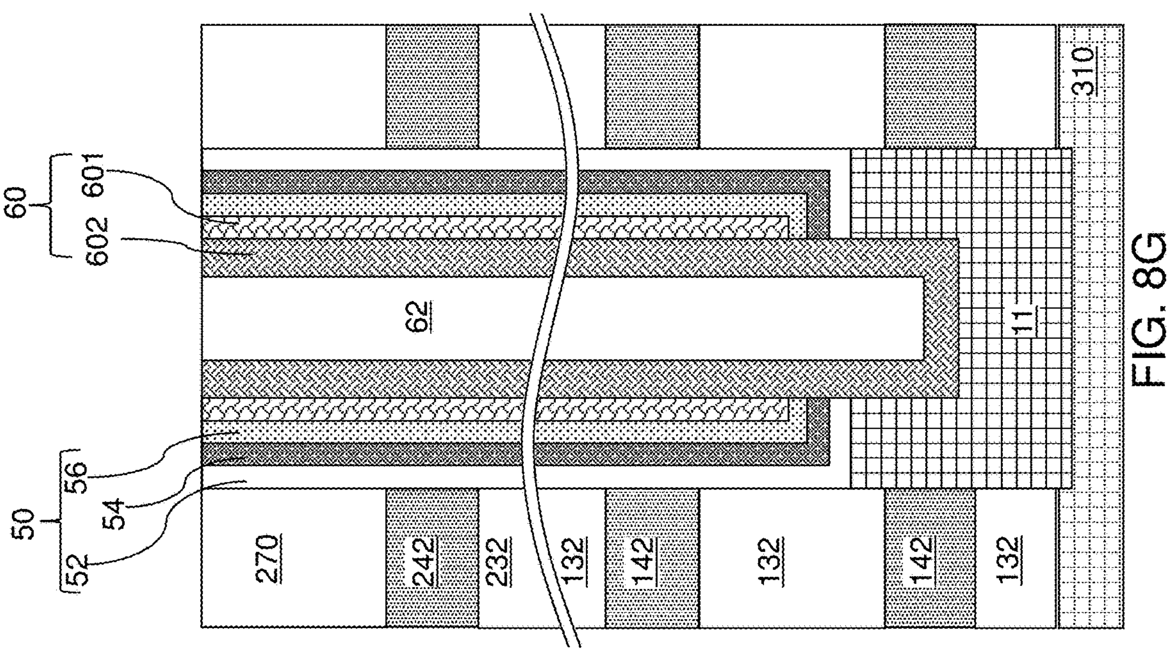

Referring to FIG. 8G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 8H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recess region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure. Each memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52.

Figure 9A:
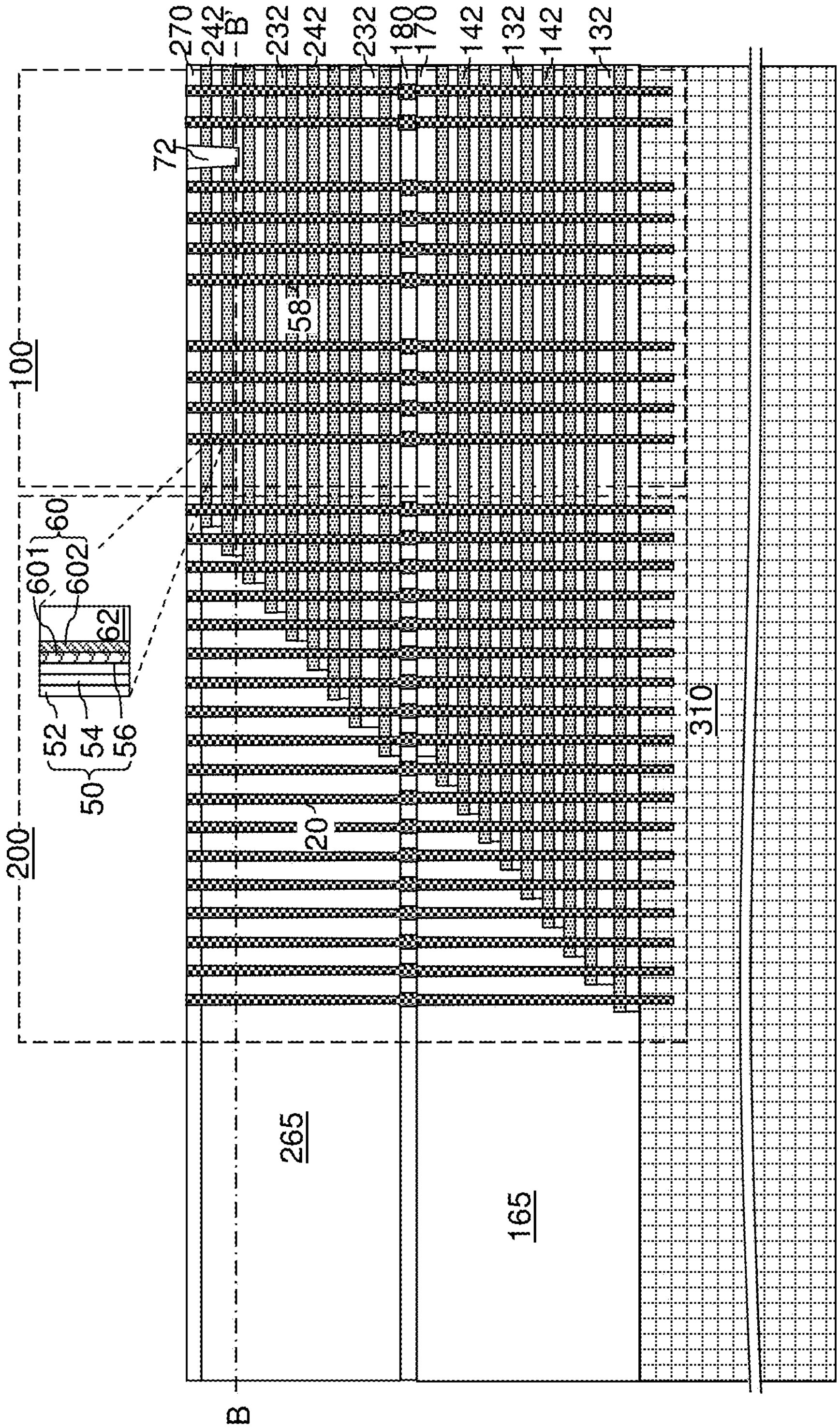
FIG. 9A is a vertical cross-sectional view of the first exemplary structure after formation of memory opening fill structures and support pillar structures according to an embodiment of the present disclosure.
Figure 9B:
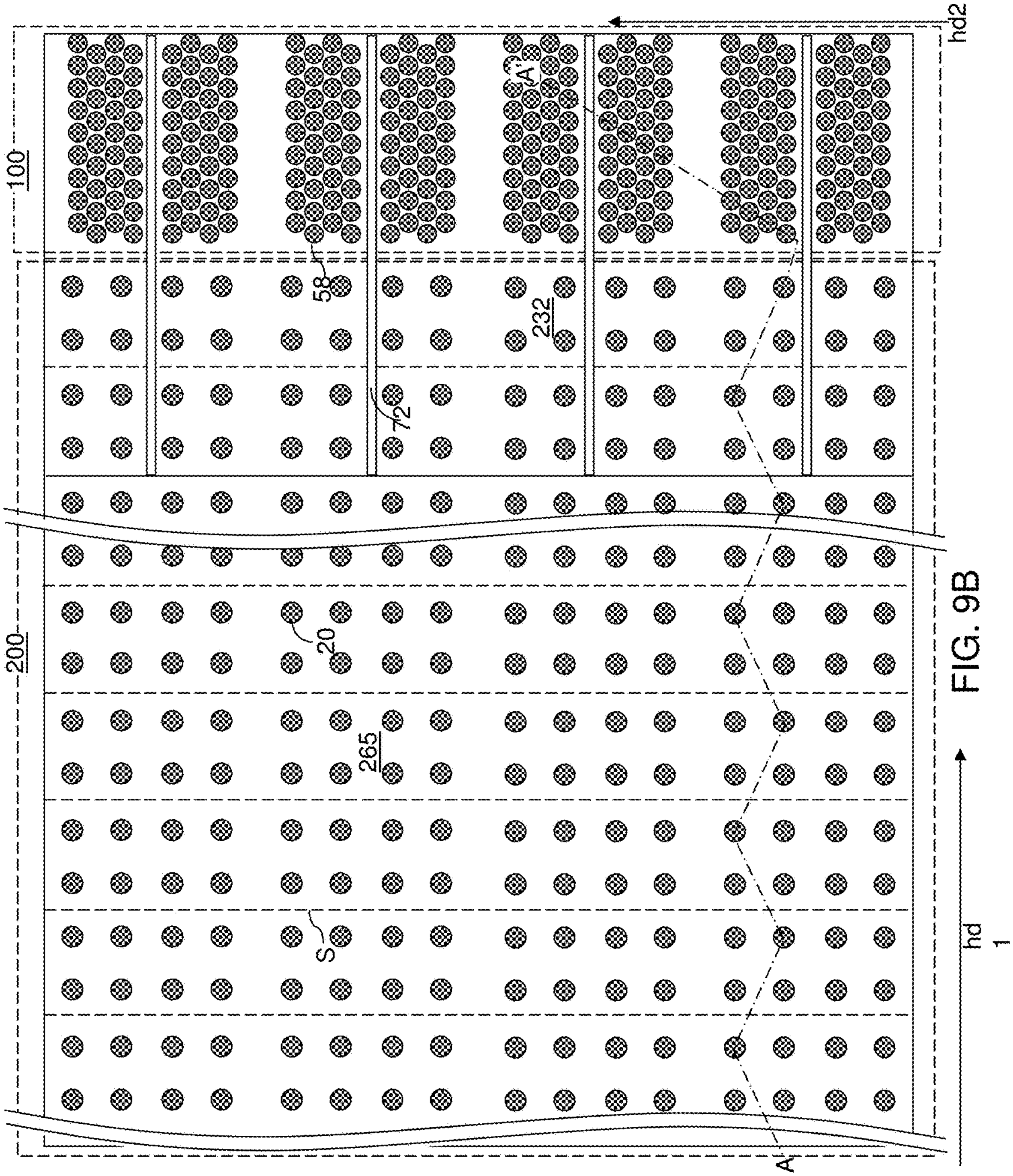
FIG. 9B is a horizontal cross-sectional view of the first exemplary structure along the horizontal plane B-B' of FIG.

Referring to FIGS. 9A and 9B, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIG. 7. An instance of the support pillar structure 20 can be formed within each support opening 19 of the structure of FIG. 7. The support pillar structures 20 are formed in the support openings 19 during formation of the memory opening fill structures 58. Each support pillar structure 20 can have a same set of components as a memory opening fill structure 58. While the present disclosure is described using the illustrated configuration for the memory stack structure, the methods of various embodiments can be applied to alternative memory stack structures including different layer stacks or structures for the memory film 50 and/or for the vertical semiconductor channel 60.

Referring to FIGS. 10A and 10B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer can be applied over the first contact level dielectric layer 280 and can be lithographically patterned to form elongated openings that extend along the first horizontal direction hd1 between clusters of memory opening fill structures 58. Backside trenches 79 can be formed by transferring the pattern in the photoresist layer through the first contact level dielectric layer 280, the second-tier structure (232, 242, 270, 265, 72), and the first-tier structure (132, 142, 170, 165), and into the memory-side substrate 310. Portions of the first contact level dielectric layer 280, the second-tier structure (232, 242, 270, 265, 72), the first-tier structure (132, 142, 170, 165), and the memory-side substrate 310 that underlie the openings in the photoresist layer can be removed to form the backside trenches 79. In one embodiment, the backside trenches 79 can be formed between clusters of memory stack structures 55. The clusters of the memory stack structures 55 can be laterally spaced apart along the second horizontal direction hd2 by the backside trenches 79.

Figure 12B:
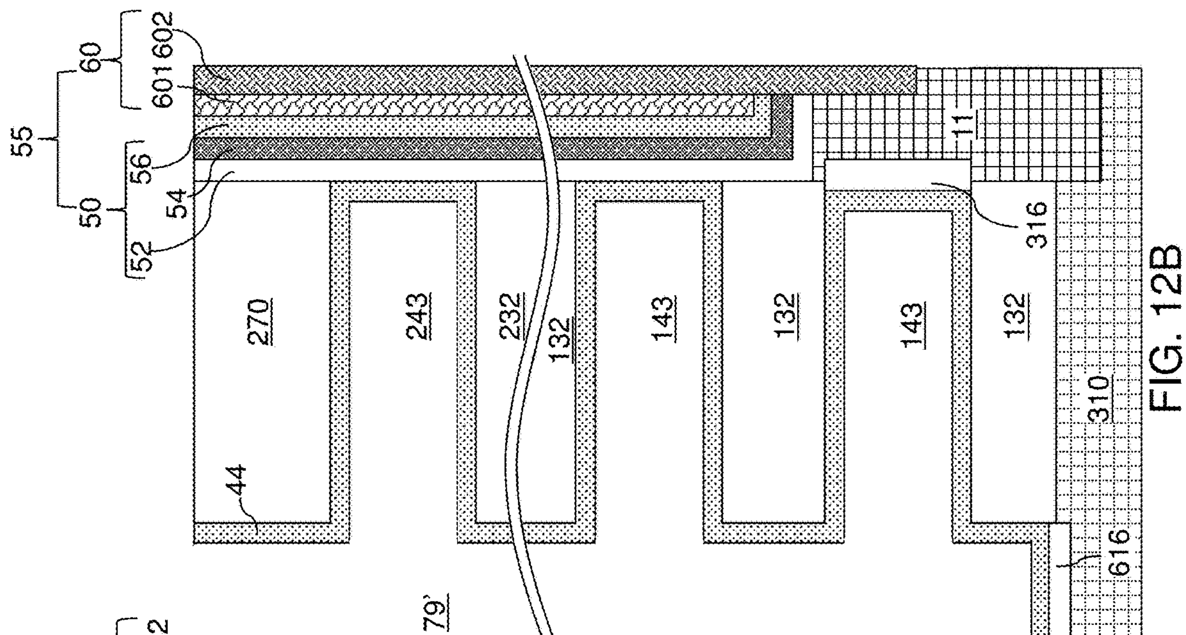
Figure 12A:
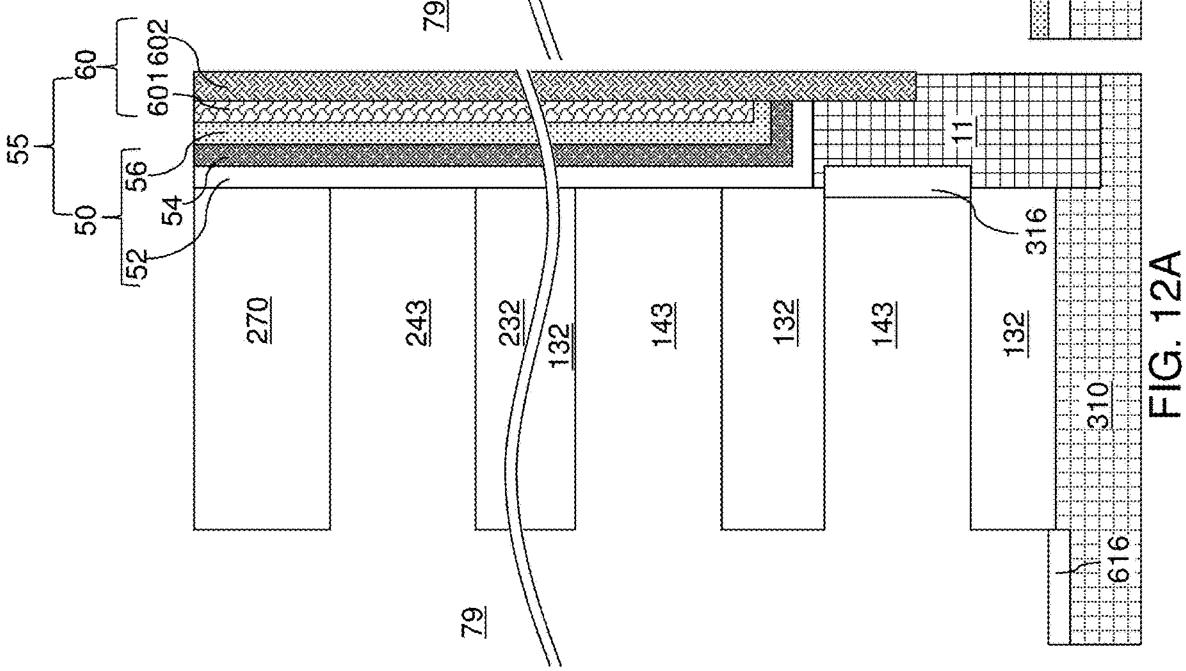

Referring to FIGS. 11 and 12A, the sacrificial material layers (142, 242) are can be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 can be introduced into the backside trenches 79, for example, using an isotropic etch process. For example, the sacrificial material layers (142, 242) can include silicon nitride, the materials of the insulating layers (132, 232), the first and second insulating cap layers (170, 270), the stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trench 79. For example, if the sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the memory-side substrate 310. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Physically exposed surface portions of the optional pedestal channel portions 11 and the memory-side substrate 310 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 316, and to convert each physically exposed surface portion of the memory-side substrate 310 into a planar dielectric portion 616.

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses (143, 243). In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses (143, 243) and on a sidewall of the backside trench 79. The backside blocking dielectric layer 44 can be formed directly on horizontal surfaces of the insulating layers (132, 232) and sidewalls of the memory stack structures 55 within the backside recesses (143, 243). If the backside blocking dielectric layer 44 is formed, formation of the tubular dielectric spacers 316 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers (132, 232), the portions of the sidewall surfaces of the memory stack structures 55 that are physically exposed to the backside recesses (143, 243), and a top surface of the planar dielectric portion. A backside cavity 79' is present within the portion of each backside trench 79 that is not filled with the backside blocking dielectric layer 44.

Figures 12C, 12D:
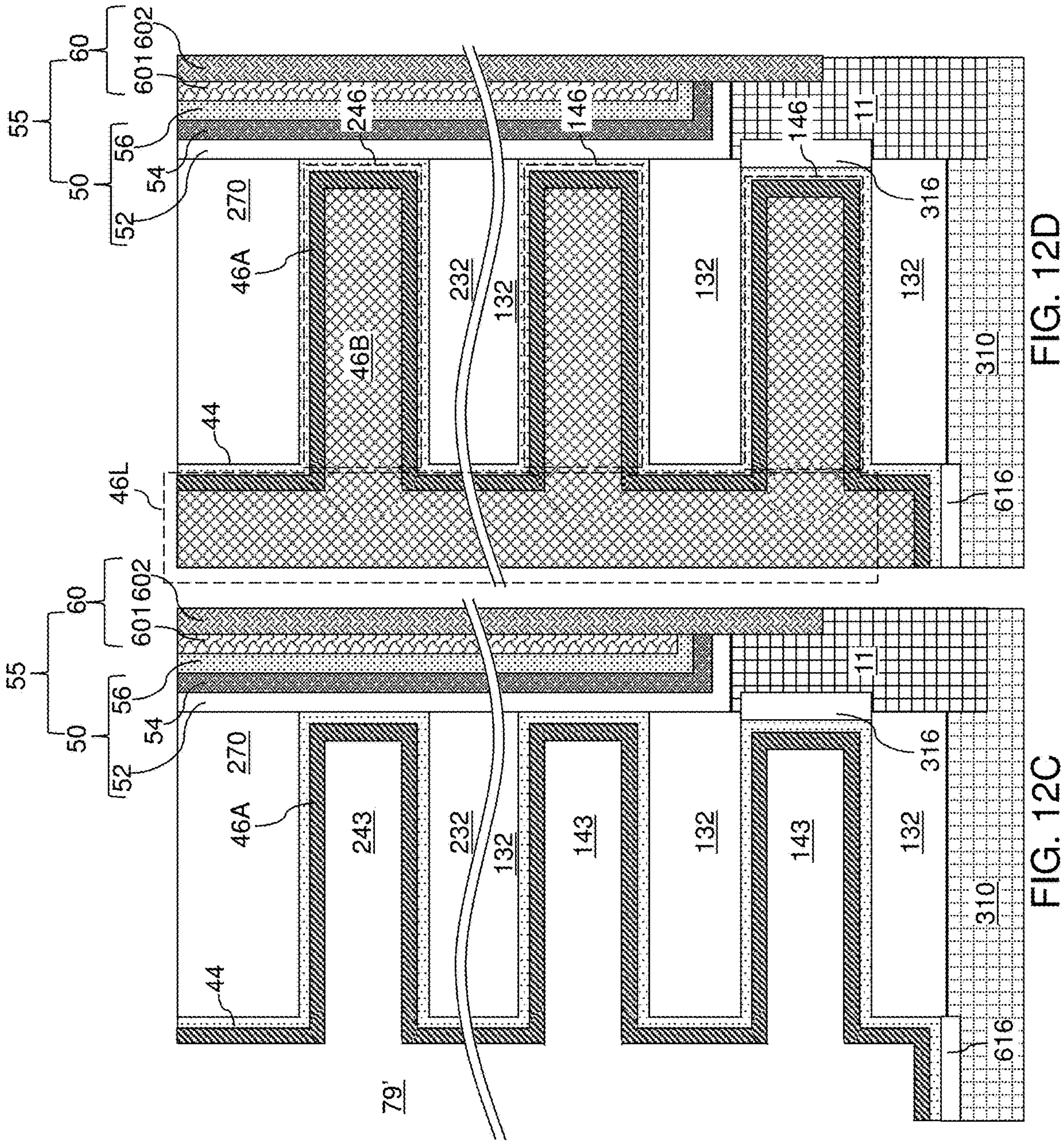

Referring to FIG. 12C, a metallic barrier layer 46A can be deposited in the backside recesses (143, 243). The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Referring to FIG. 12D, a metal fill material is deposited in the plurality of backside recesses (143, 243), on the sidewalls of the at least one the backside trench 79, and over the top surface of the first contact level dielectric layer 280 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers (132, 232) and the memory stack structures 55 by the metallic barrier layer 46A, which is a metallic barrier layer that blocks diffusion of fluorine atoms therethrough.

A plurality of electrically conductive layers (146, 246) can be formed in the plurality of backside recesses (143, 243), and a continuous metallic material layer 46L can be formed on the sidewalls of each backside trench 79 and over the first contact level dielectric layer 280. Each electrically conductive layer (146, 246) includes a portion of the metallic barrier layer 46A and a portion of the metallic fill material layer 46B that are located between a vertically neighboring pair of dielectric material layers such as a pair of insulating layers (132, 232). The continuous metallic material layer 46L includes a continuous portion of the metallic barrier layer 46A and a continuous portion of the metallic fill material layer 46B that are located in the backside trenches 79 or above the first contact level dielectric layer 280.

Each sacrificial material layer (142, 242) can be replaced with an electrically conductive layer (146, 246). A backside cavity 79' is present in the portion of each backside trench 79 that is not filled with the backside blocking dielectric layer 44 and the continuous metallic material layer 46L. A tubular dielectric spacer 316 laterally surrounds a pedestal channel portion 11. A bottommost electrically conductive layer (146, 246) laterally surrounds each tubular dielectric spacer 316 upon formation of the electrically conductive layers (146, 246).

Figure 12E:
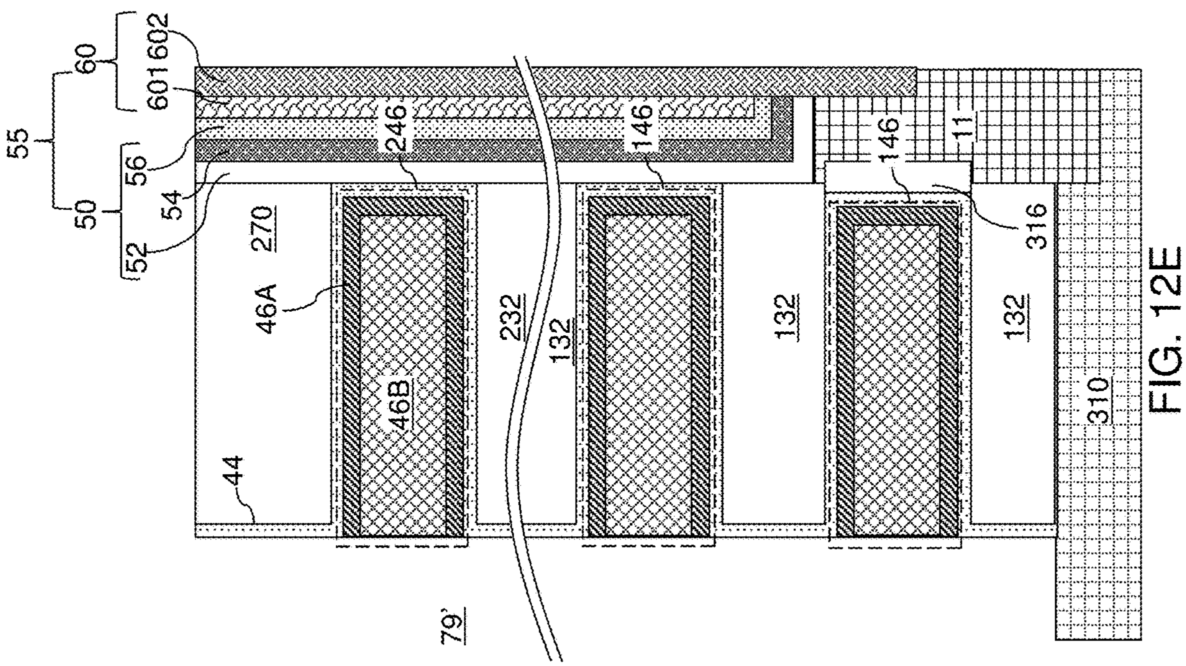

Referring to FIGS. 12E and 13, the deposited metallic material of the continuous electrically conductive material layer 46L is etched back from the sidewalls of each backside trench 79 and from above the first contact level dielectric layer 280, for example, by an isotropic wet etch, an anisotropic dry etch, or a combination thereof. Each remaining portion of the deposited metallic material in the backside recesses (143, 243) constitutes an electrically conductive layer (146, 246). Each electrically conductive layer (146, 246) can be a conductive line structure. Thus, the sacrificial material layers (242, 242) are replaced with the electrically conductive layers (146, 246).

Each electrically conductive layer (146, 246) can function as a combination of a plurality of control gate electrodes located at a same level and a word line electrically interconnecting, i.e., electrically connecting, the plurality of control gate electrodes located at the same level. The plurality of control gate electrodes within each electrically conductive layer (146, 246) are the control gate electrodes for the vertical memory devices including the memory stack structures 55. In other words, each electrically conductive layer (146, 246) can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiments, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layers (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The memory-level assembly is located over the memory-side substrate 310. The memory-level assembly includes at least one alternating stack (132, 146, 232, 246) and memory stack structures 55 vertically extending through the at least one alternating stack (132, 146, 232, 246).

Referring to FIGS. 14A-14C, an insulating material layer can be formed in the backside trenches 79 and over the first contact level dielectric layer 280 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers (146, 246). If a backside blocking dielectric layer 44 is not used, the insulating material layer can be formed directly on sidewalls of the insulating layers (132, 232) and directly on sidewalls of the electrically conductive layers (146, 246).

An anisotropic etch is performed to remove horizontal portions of the insulating material layer from above the first contact level dielectric layer 280 and at the bottom of each backside trench 79. Each remaining portion of the insulating material layer constitutes an insulating spacer 74. A backside cavity 79' is present within a volume surrounded by each insulating spacer 74. A top surface of the memory-side substrate 310 can be physically exposed at the bottom of each backside trench 79.

A source region 61 can be formed at a surface portion of the memory-side substrate 310 under each backside cavity 79' by implantation of electrical dopants into physically exposed surface portions of the memory-side substrate 310. Each source region 61 is formed in a surface portion of the memory-side substrate 310 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the memory-side substrate 310 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer (146, 246) provided upon formation of the electrically conductive layers (146, 246) within the alternating stacks {(132, 146), (232, 246)} can comprise a select gate electrode for the field effect transistors. Each source region 61 is formed in an upper portion of the memory-side substrate 310. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be used. The conductive fill material portion can include a metal or a metallic alloy. For example, the conductive fill material portion can include W, Cu, Al, Co, Ru, Ni, an alloy thereof, or a stack thereof.

The at least one conductive material can be planarized using the first contact level dielectric layer 280 overlying the alternating stacks {(132, 146), (232, 246)} as a stopping layer. If chemical mechanical planarization (CMP) process is used, the first contact level dielectric layer 280 can be used as a CMP stopping layer. Each remaining continuous portion of the at least one conductive material in the backside trenches 79 constitutes a backside contact via structure 76. The backside contact via structure 76 extends through the alternating stacks {(132, 146), (232, 246)}, and contacts a top surface of the source region 61

Referring to FIGS. 15A and 15B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be used.

A photoresist layer can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) can be used as etch stop structures. Drain contact via cavities can be formed over each drain region 63, and staircase-region contact via cavities can be formed over each electrically conductive layer (146. 246) at the stepped surfaces underlying the first and second stepped dielectric material portions (165, 265). The photoresist layer can be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 can include drain select level contact via structures that contact a subset of the second electrically conductive layers 246 that function as drain select level gate electrodes. Further, the staircase-region contact via structures 86 can include word line contact via structures that contact electrically conductive layers (146, 246) that underlie the drain select level gate electrodes and function as word lines for the memory stack structures 55.

Referring to FIG. 16, a bit-line-level dielectric layer 284 can be formed over the contact level dielectric layers (280, 282), and bit-line-level metal interconnect structures (98, 96) can be formed in the bit-line-level dielectric layer 284. The bit-line-level metal interconnect structures (98, 96) include bit lines 98 that are electrically connected to a respective subset of the drain regions 63 through a respective subset of the drain contact via structures 88. The bit-line-level metal interconnect structures (98, 96) include interconnection line structures 96, which are electrically connected to at least one of the staircase-region contact via structures 86 or other via structures.

Memory-side interconnect-level dielectric layers 390 can be formed over the bit-line-level dielectric layer 284 and the bit-line-level metal interconnect structures (98, 96). Various memory-side metal interconnect structures 370 can be formed in the memory-side interconnect-level dielectric layers 390 to provide electrical connections to the bit lines 98 and the interconnection line structures 96. The memory-side metal interconnect structures 370 can be include interconnect-level metal line structures 374 and interconnect-level metal via structures 376. Memory-side bonding pads 378 can be formed in, or on, an uppermost layer of the memory-side interconnect-level dielectric layers 390. The memory-side bonding pads 378 can include copper bonding pads for copper-to-copper bonding or an underbump metallurgy (UBM) stack pads that can be bonded to other UBM stack pads through solder balls. The first exemplary structure constitutes a memory die 1000, which includes a three-dimensional memory arrays and memory-side bonding pads 378 that may include copper bonding pads or UBM stack pads. The memory-side bonding pads 378 are die-to-die bonding pads that provide bonding of the memory die 1000 to another die.

Referring to FIG. 17, a logic die 900 to be subsequently incorporated into the first exemplary structure is illustrated. The logic die 900 includes a peripheral circuitry 940 that includes various semiconductor devices for operation of three-dimensional memory arrays in the memory die 1000. In particular, the peripheral circuitry can include a word line driver that drives the electrically conductive layers (146, 246) within the memory die 1000, a bit line driver that drives the bit lines 98 in the memory die 1000, a word line decoder circuitry that decodes the addresses for the electrically conductive layers (146, 246), a bit line decoder circuitry that decodes the addresses for the bit lines 98, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 55 in the memory die 1000. The logic die 900 can include a logic-die substrate 910, which can be a semiconductor substrate. The logic-die substrate 910 can include a semiconductor wafer or a semiconductor material layer. The logic-die substrate 910 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 920 can be formed in an upper portion of the logic-die substrate 910 to provide electrical isolation between semiconductor devices of the sense amplifier circuitry. The various semiconductor devices can include field effect transistors, which include respective transistor active regions 942 (i.e., source regions and drain regions), a channel 946, and a gate structure 950. The field effect transistors may be arranged in a CMOS configuration. Each gate structure 950 can include, for example, a gate dielectric 952, a gate electrode 954, a dielectric gate spacer 956 and a gate cap dielectric 958. For example, the semiconductor devices can include word line drivers for electrically biasing word lines of the memory die 1000, which comprise the electrically conductive layers (146, 246).

Dielectric material layers are formed over the semiconductor devices, which are herein referred to as logic-side interconnect-level dielectric layers 990. Optionally, a dielectric liner 962 (such as a silicon nitride liner) can be formed to apply mechanical stress to the various field effect transistors and/or to prevent diffusion of hydrogen or impurities from the logic-side interconnect-level dielectric layers 990 into the semiconductor devices. Logic-side metal interconnect structures 970 are included within the logic-side interconnect-level dielectric layers 990. The logic-side metal interconnect structures 970 can include various device contact via structures 972 (e.g., source and drain electrodes which contact the respective source and drain nodes of the device or gate electrode contacts), interconnect-level metal line structures 974, interconnect-level metal via structures 976, and logic-side bonding pads 978, which may include copper bonding pads or UBM stack pads. The logic-side bonding pads 978 are die-to-die bonding pads that provide bonding of the logic die 900 to the memory die 1000.

In one embodiment, one of the levels for the logic-side metal interconnect structures 970 can include at least one metallic material for forming external bonding pads. The at least one metallic material can include, for example, aluminum or an underbump metallurgy stack. The at least one metallic material for forming external bonding pads can be patterned into intermediate metal interconnect structures 975 that function as components of the logic-side metal interconnect structures 970 and external bonding pads 985 that are subsequently used to bond a bonding wire thereupon. In one embodiment, a level of interconnect-level metal line structures 974 can be replaced with a combination of the intermediate metal interconnect structures 975 and the external bonding pads 985.

In one embodiment, the at least one metallic material can include, and/or consist essentially of, aluminum. In another embodiment, the at least one metallic material can include, and/or consist essentially of, a UBM layer stack and an optional copper layer located on top of the UBM stack. The UBM layer stack can contain at least two metallic barrier material layers, such as two, three, or four metallic barrier material layers. The UBM layer stack can include a material on which a solder material portion can be subsequently formed. In case the solder material portions to be subsequently used include gold, the UBM layer can include a stack of a titanium-tungsten layer and a gold layer, or a stack of titanium layer and a gold layer. In case the solder material portions to be subsequently used include a lead-tin alloy or a tin-silver-copper alloy, the UBM layer stack can include a stack of a titanium layer and a copper layer; a titanium-tungsten layer and a copper layer; an aluminum layer, a nickel-vanadium layer, and a copper layer; or a chromium layer, a chromium-copper layer, and a copper layer.

In one embodiment, a logic-side etch stop dielectric layer 964 can be formed as a component of the logic-side interconnect-level dielectric layers 990 before formation of the intermediate metal interconnect structures 975 and the external bonding pads 985 within the logic-side interconnect-level dielectric layers 990. The logic-side etch stop dielectric layer 964 includes a dielectric material that is different from the predominant component materials (such as silicon oxide or organosilicate glass) of the logic-side interconnect-level dielectric layers 990, and provides a higher etch resistance than the predominant component material of the logic-side interconnect-level dielectric layers 990. As used herein, predominant component materials refer to the set of the least number of materials that collectively provide more than 50% of the total volume of the logic-side interconnect-level dielectric layers 990. In an illustrative example, if 45% of the total volume of the logic-side interconnect-level dielectric layers 990 is filled with organosilicate glass, 35% of the total volume of the logic-side interconnect-level dielectric layers 990 is filled with a doped silicate glass, and if 15% of the total volume of the logic-side interconnect-level dielectric layers 990 is filled with undoped silicate glass, the predominant component materials include organosilicate glass and doped silicate glass. In one embodiment, the logic-side etch stop dielectric layer 964 can include dielectric metal oxide (such as aluminum oxide) or silicon nitride. The thickness of the logic-side etch stop dielectric layer 964 can be in a range from 5 nm to 100 nm, although lesser and greater thicknesses can also be used. The logic-side etch stop dielectric layer 964 can contact bottom surfaces of the aluminum portions or the UBM layer stacks of the external bonding pads 985.

Referring to FIG. 18A, the memory die 1000 and the logic die 900 are positioned such that the logic-side bonding structures 978 of the logic die 900 face the memory-side bonding pads 378 of the memory die 1000. In one embodiment, the memory die 1000 and the logic die 900 can be designed such that the pattern of the logic-side bonding pads 978 of the logic die 900 mirrors the pattern of the memory-side bonding pads 378 of the memory die 1000. The memory die 1000 and the logic die 900 can be bonded to each other by metal-to-metal bonding such as copper-to-copper bonding.

In the case of metal-to-metal bonding, facing pairs of a memory-side bonding pad 378 of the memory die 1000 and a logic-side bonding structure 978 of the logic die 900 can be brought into direct contact with each other, and can be subjected to an elevated temperature to induce material diffusion across the interfaces between adjoined pairs of die-to-die bonding pads (378, 978). The interdiffusion of the metallic material can induce bonding between each adjoined pairs of die-to-die bonding pads (378, 978). In addition, the logic-side interconnect-level dielectric layers 990 and the memory-side interconnect-level dielectric layers 390 can include a dielectric material (such as a silicate glass material) that can be bonded to each other. In this case, physically exposed surfaces of the logic-side interconnect-level dielectric layers 990 and the memory-side interconnect-level dielectric layers 390 can be brought to direct contact with each other and can be subjected to thermal annealing to provide additional bonding.

Each of the memory die 1000 and the logic die 900 is a semiconductor die. The side of each semiconductor die that is bonded to the other semiconductor die is herein referred to as a proximal side, and the opposite side of each semiconductor die is herein referred to as a distal side. In other words, the reference for determining a proximal side and a distal side of each semiconductor die is the interface between the two semiconductor dies.

Referring to FIG. 18B, the logic-side substrate 910 can be thinned from the backside, for example, by grinding to provide a thinned logic-side substrate 902, which is a semiconductor substrate. The thinned logic-side substrate 902 can have a thickness in a range from 1 μm to 100 μm, such as from 3 μm to 30 μm, although lesser and greater thicknesses can also be used.

Referring to FIG. 18C, a photoresist layer 977 can be applied over the backside of the thinned logic-side substrate 902, and lithographically patterned to form at least one opening therein. Each of the at least one opening in the patterned photoresist layer 977 can overlie a respective one of the external bonding pads 985. In one embodiment, each opening in the patterned photoresist layer 977 may have a greater area than the total area of at least one underlying external bonding pad 985. An anisotropic etch process can be used to form recess regions RR. The anisotropic etch process sequentially etches the materials of the thinned logic-side substrate 902 and the distal portions of the logic-side interconnect-level dielectric layers 990. The logic-side etch stop dielectric layer 964 can be used to prevent overetch through the level of the external bonding pads 985. The terminal step of the anisotropic etch process can include an etch step that etches physically exposed portions of the logic-side etch stop dielectric layer 964 selective to the material of the external bonding pads 985. Each recess region RR can vertically extend from the distal planar surface of the logic die 900 through the thinned logic-side substrate 902, through the proximal planar surface of the thinned logic-side substrate 902, through distal portions of the logic-side interconnect-level dielectric layers 990, through the logic-side etch stop dielectric layer 964, and down to a distal planar surface of each external bonding pad 985. A horizontal surface of one of the logic-side interconnect-level dielectric layers 990 can be physically exposed at the bottom of each recess region RR.

An external bonding pad 985 is provided at the bottom of each recess region RR. Each external bonding pad 985 can be located in a physically exposed one of the logic-side interconnect-level dielectric layers 990. The external bonding pads 985 can be initially formed within the logic-side interconnect-level dielectric layers 990 during formation of the logic-side interconnect-level dielectric layers 990, and can be physically exposed after bonding of the memory die 1000 and the logic die 900 and the anisotropic etch process that forms the recess regions RR. A planar horizontal surface of each external bonding pad 985 can be physically exposed after formation of the recess regions RR. The patterned photoresist layer 977 can be subsequently removed, for example, by ashing.

Referring to FIGS. 18D and 18E, a solder ball 995 can be attached to each external bonding pad 985. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 985 and a corresponding array of solder balls 995 can be formed within each recess region RR. A single recess region RR or an array of recess regions RR may be formed. The bottom surfaces of the recess regions RR can be recessed relative to the distal planar surface of the thinned logic-side substrate 902 by a recess distance in a range from 1 micron to 150 microns, such as from 3 microns to 50 microns, although lesser and greater recess distances can also be used. In one embodiment, each combination of an external bonding pad 985 and a solder ball 995 can be located entirely within a first horizontal plane HP1 including a proximal horizontal surface of the memory-side substrate 310 and a second horizontal plane HP2 including a proximal horizontal surface of the thinned logic-side substrate 902. A bonding wire 997 can be bonded to each solder ball 995.

Referring to FIG. 18F, a first alternative configuration of the first exemplary structure of FIGS. 18D and 18E is illustrated. In this case, interconnect-level metal line structures 974 can be formed within logic-side interconnect-level dielectric layers 990 at the processing steps of FIG. 17 in lieu of the intermediate metal interconnect structures 975 and the external bonding pads 985. In this case, a subset of the interconnect-level metal line structures 974 is formed in lieu of the external bonding pads 985. The processing steps of FIGS. 18A-18C are subsequently performed. The subset of the interconnect-level metal line structures 974 are physically exposed at the bottom of each recess region RR. A metallic bonding pad material such as aluminum or a UBM layer stack can be deposited by an anisotropic deposition process or an isotropic deposition process, and can be patterned by forming discrete photoresist material portions to cover regions of physically exposed portions of the interconnect-level metal line structures 974 at the bottom of the recess regions, and by a subsequent etch process that removes unmasked portions of the metallic bonding pad material. Remaining portions of the metallic bonding pad material underneath the discrete photoresist material portions constitute external bonding pads 985.

An external bonding pad 985 is provided at the bottom of each recess region RR. Each external bonding pad 985 can be located on a physically exposed one of the memory-side interconnect-level dielectric layers 390. The external bonding pads 985 can be formed after bonding of the memory die 1000 and the logic die 900 and after the anisotropic etch process that forms the recess regions RR. The discrete photoresist material portions can be subsequently removed, for example, by ashing.

A solder ball 995 can be attached to each external bonding pad 985. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 985 and a corresponding array of solder balls 995 can be formed within each recess region RR. A single recess region RR or an array of recess regions RR may be formed. The bottom surfaces of the recess regions RR can be recessed relative to the distal planar surface of the thinned logic-side substrate 902 by a recess distance in a range from 2 micron to 150 microns, such as from 3 microns to 50 microns, although lesser and greater recess distances can also be used. In one embodiment, each combination of an external bonding pad 985 and a solder ball 995 can be located entirely within a first horizontal plane HP1 including a proximal horizontal surface of the memory-side substrate 310 and a second horizontal plane HP2 including a proximal horizontal surface of the thinned logic-side substrate 902. A bonding wire 997 can be bonded to each solder ball 995.

Referring to FIG. 18G, a second alternative configuration of the first exemplary structure of FIGS. 18D and 18E is illustrated. Via cavities may be formed through the logic-side interconnect-level dielectric layers 990 such that a back side of a respective logic-side bonding pad 978 is physically exposed at the bottom of each via cavity. At least one bonding pad material (such as an underbump metallurgy (UBM) layer stack) may be deposited in the via cavities and may be subsequently patterned to form external bonding pads 1085. A solder ball and a bonding wire can be subsequently attached to each external bonding pad 1085. In this embodiment, the external bonding pad 1085 is formed directly on the logic-side bonding pad (e.g., copper pad) 978.

In an alternative configuration to any of the embodiments described above, the memory die may optionally contain a silicon-on-insulator type substrate, such as a substrate 301 and a semiconductor material layer 309 that is electrically isolated from the substrate 301 by an insulating layer 308. The semiconductor material layer 309 overlies a top surface of the substrate 301 instead of a memory-side substrate 310, as shown in FIG. 18G. In this alternative configuration, bottom ends of vertical semiconductor channels can be electrically connected to the semiconductor material layer 309.

Referring to FIG. 19A, a second configuration of the first exemplary structure is illustrated, which can be derived from the first configuration of the first exemplary structure illustrated in FIG. 18C by omitting the terminal step of the anisotropic etch process. In this case, a top surface of the logic-side etch stop dielectric layer 964 can be physically exposed at the bottom of each of the recess regions RR. The photoresist layer 977 can be subsequently removed, for example, by ashing.

Referring to FIG. 19B, a conformal dielectric material layer 992 can be deposited on the distal planar surface and the sidewall of the thinned logic-side substrate 902, the sidewall(s) of the logic-side interconnect-level dielectric layers 990, and over the logic-side etch stop dielectric layer 964. For example, the conformal dielectric material layer 992 can include silicon oxide and/or silicon nitride that can provide passivation of the logic die 900 from the distal side. Another photoresist layer 979 can be applied over the conformal dielectric material layer 992, and can be lithographically patterned to form openings over areas of the external bonding pads 985. An etch process can be performed to etch through physically exposed regions of the conformal dielectric material layer 992 and the logic-side etch stop dielectric layer 964. Planar distal planar surfaces of the external bonding pads 985 are physically exposed underneath each opening in the photoresist layer 979. The photoresist layer 979 can be subsequently removed, for example, by ashing.

Referring to FIG. 19C, a solder ball 995 can be attached to each external bonding pad 985. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 985 and a corresponding array of solder balls 995 can be formed within each recess region RR. A single recess region RR or an array of recess regions RR may be formed. The bottom surfaces of the recess regions RR can be recessed relative to the distal planar surface of the thinned logic-side substrate 902 by a recess distance in a range from 1 micron to 150 microns, such as from 3 microns to 50 microns, although lesser and greater recess distances can also be used. In one embodiment, each combination of an external bonding pad 985 and a solder ball 995 can be located entirely within a first horizontal plane HP1 including a proximal horizontal surface of the memory-side substrate 310 and a second horizontal plane HP2 including a proximal horizontal surface of the thinned logic-side substrate 902. A bonding wire 997 can be bonded to each solder ball 995.

Referring to FIG. 20A, a configuration of the first exemplary structure is illustrated after formation of a memory die 1000. The memory die 1000 of FIG. 16 can be modified such that one of the levels for the memory-side metal interconnect structures 370 includes at least one metallic material for forming external bonding pads. The at least one metallic material can include, for example, aluminum or an underbump metallurgy stack, which can be any of the underbump metallurgy stacks described above. The at least one metallic material for forming external bonding pads can be patterned into intermediate metal interconnect structures 375 that function as components of the memory-side metal interconnect structures 370 and external bonding pads 385 that are subsequently used to bond a bonding wire thereupon. In one embodiment, a level of interconnect-level metal line structures 374 can be replaced with a combination of the intermediate metal interconnect structures 375 and the external bonding pads 385.

In one embodiment, a memory-side etch stop dielectric layer 364 can be formed as a component of the logic-side interconnect-level dielectric layers 990 after formation of the intermediate metal interconnect structures 375 and the external bonding pads 385 within the memory-side interconnect-level dielectric layers 390. The memory-side etch stop dielectric layer 364 includes a dielectric material that is different from the predominant component materials (such as silicon oxide or organosilicate glass) of the memory-side interconnect-level dielectric layers 390, and provides a higher etch resistance than the predominant component material of the memory-side interconnect-level dielectric layers 390. In one embodiment, the memory-side etch stop dielectric layer 364 can include dielectric metal oxide (such as aluminum oxide) or silicon nitride. The thickness of the memory-side etch stop dielectric layer 364 can be in a range from 5 nm to 100 nm, although lesser and greater thicknesses can also be used. The memory-side etch stop dielectric layer 364 can contact bottom surfaces of the aluminum portions or the UBM layer stacks of the external bonding pads 385. The external bonding pads 385 are more distal from the memory-side substrate 310 than the memory-side bonding pads 378 are from the memory-side substrate 310.

Referring to FIG. 20B, a logic die 900 to be subsequently bonded with the memory die 1000 of FIG. 20A is illustrated. The logic die 900 includes a peripheral circuitry like the logic die of FIG. 17. The logic die 900 can include a logic-die substrate 910, which can be a semiconductor substrate. The logic-die substrate 910 can include a semiconductor wafer or a semiconductor material layer. The logic die 900 of FIG. 20B can be derived from the logic die 900 of FIG. 17 by forming interconnect-level metal line structures 974 in lieu of the combination of the intermediate metal interconnect structures 975 and the external bonding pads 385. The memory die 1000 of FIG. 20A and the logic die 900 of FIG. 20B can be designed such that the pattern of the logic-side bonding pads 978 of the logic die 900 mirrors the pattern of the memory-side bonding pads 378 of the memory die 1000.

Referring to FIG. 20C, the memory die 1000 of FIG. 20A and the logic die 900 of FIG. 20B can be bonded to each other by metal-to-metal bonding such as copper-to-copper bonding.

Referring to FIG. 20D, the logic-side substrate 910 can be thinned from the backside, for example, by grinding to provide a thinned logic-side substrate 902, which is a semiconductor substrate. The thinned logic-side substrate 902 can have a thickness in a range from 1 μm to 100 μm, such as from 3 μm to 30 μm, although lesser and greater thicknesses can also be used.

Referring to FIG. 20E, a photoresist layer 977 can be applied over the backside of the thinned logic-side substrate 902, and lithographically patterned to form at least one opening therein. Each of the at least one opening in the patterned photoresist layer 977 can overlie a respective one of the external bonding pads 385. In one embodiment, each opening in the patterned photoresist layer 977 may have a greater area than the total area of at least one underlying external bonding pad 385. An anisotropic etch process can be used to form recess regions RR. The anisotropic etch process sequentially etches the materials of the thinned logic-side substrate 902, the logic-side interconnect-level dielectric layers 990, the proximal portions of the memory-side interconnect-level dielectric layers 390, and the physically exposed portions of the memory-side etch stop dielectric layer 364. The memory-side etch stop dielectric layer 364 can be used to prevent overetch through the level of the external bonding pads 385. The terminal step of the anisotropic etch process can include an etch step that etches physically exposed portions of the memory-side etch stop dielectric layer 364 selective to the material of the external bonding pads 385. Each recess region RR vertically extends underneath a respective opening in the patterned photoresist layer 977 from the distal planar surface of the logic die 900 through the thinned logic-side substrate 902, through the proximal planar surface of the thinned logic-side substrate 902, through the entire thickness of the logic-side interconnect-level dielectric layers 990, through the interface between the logic die 900 and the memory die 1000, through proximal portions of the memory-side interconnect-level dielectric layers 390, through the memory-side etch stop dielectric layer 364, and down to a proximal planar surface of each external bonding pad 385. A horizontal surface of one of the logic-side interconnect-level dielectric layers 990 can be physically exposed at the bottom of each recess region RR.

An external bonding pad 385 is provided at the bottom of each recess region RR. Each external bonding pad 385 can be located in a physically exposed one of the memory-side interconnect-level dielectric layers 390. The external bonding pads 385 can be initially formed within the memory-side interconnect-level dielectric layers 390 during formation of the memory-side interconnect-level dielectric layers 390, and can be physically exposed after bonding of the memory die 1000 and the logic die 900 and the anisotropic etch process that forms the recess regions RR. A planar horizontal surface of each external bonding pad 385 can be physically exposed after formation of the recess regions RR. The patterned photoresist layer 977 can be subsequently removed, for example, by ashing.

Referring to FIGS. 20F and 20G, a solder ball 995 can be attached to each external bonding pad 385. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 385 and a corresponding array of solder balls 995 can be formed within each recess region RR. A single recess region RR or an array of recess regions RR may be formed. The bottom surfaces of the recess regions RR can be recessed relative to the distal planar surface of the thinned logic-side substrate 902 by a recess distance in a range from 2 micron to 150 microns, such as from 3 microns to 50 microns, although lesser and greater recess distances can also be used. In one embodiment, each combination of an external bonding pad 385 and a solder ball 995 can be located entirely within a first horizontal plane HP1 including a proximal horizontal surface of the memory-side substrate 310 and a second horizontal plane HP2 including a proximal horizontal surface of the thinned logic-side substrate 902. A bonding wire 997 can be bonded to each solder ball 995.

Referring to FIG. 20H, a fourth configuration of the first exemplary structure is illustrated. In this case, interconnect-level metal line structures 374 can be formed within memory-side interconnect-level dielectric layers 390 at the processing steps of FIG. 20A in lieu of the intermediate metal interconnect structures 375 and the external bonding pads 385. In this case, a subset of the interconnect-level metal line structures 974 is formed in the fourth configuration of the first exemplary structure in lieu of the external bonding pads 385 in FIG. 20A. The processing steps of FIGS. 20C-20E are subsequently performed. The subset of the interconnect-level metal line structures 374 are physically exposed at the bottom of each recess region RR. A metallic bonding pad material such as aluminum or a UBM layer stack can be deposited by an anisotropic deposition process or an isotropic deposition process, and can be patterned by forming discrete photoresist material portions to cover regions of physically exposed portions of the interconnect-level metal line structures 974 at the bottom of the recess regions, and by a subsequent etch process that removes unmasked portions of the metallic bonding pad material. Remaining portions of the metallic bonding pad material underneath the discrete photoresist material portions constitute external bonding pads 385.

An external bonding pad 385 is provided at the bottom of each recess region RR. Each external bonding pad 385 can be located on a physically exposed one of the logic-side interconnect-level dielectric layers 990. The external bonding pads 385 can be formed after bonding of the memory die 1000 and the logic die 900 and after the anisotropic etch process that forms the recess regions RR. The discrete photoresist material portions can be subsequently removed, for example, by ashing.

A solder ball 995 can be attached to each external bonding pad 385. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 385 and a corresponding array of solder balls 995 can be formed within each recess region RR. A single recess region RR or an array of recess regions RR may be formed. The bottom surfaces of the recess regions RR can be recessed relative to the distal planar surface of the thinned logic-side substrate 902 by a recess distance in a range from 1 micron to 150 microns, such as from 3 microns to 50 microns, although lesser and greater recess distances can also be used. In one embodiment, each combination of an external bonding pad 385 and a solder ball 995 can be located entirely within a first horizontal plane HP1 including a proximal horizontal surface of the memory-side substrate 310 and a second horizontal plane HP2 including a proximal horizontal surface of the thinned logic-side substrate 902. A bonding wire 997 can be bonded to each solder ball 995.

Referring to FIG. 21A, a configuration of the first exemplary structure can be derived from the first exemplary structure of FIG. 16 including the memory die 1000 by forming a combination of intermediate metal interconnect structures 375 and external bonding pads 385 in lieu of a level of interconnect-level metal line structures 374. In this case, one of the levels for the memory-side metal interconnect structures 370 can include at least one metallic material for forming external bonding pads. The at least one metallic material can include, for example, aluminum or an under-bump metallurgy (UBM) layer stack. The at least one metallic material for forming external bonding pads can be patterned into the intermediate metal interconnect structures 375 that function as components of the memory-side metal interconnect structures 370 and external bonding pads 385 that are subsequently used to bond a bonding wire thereupon. Thus, a level of interconnect-level metal line structures 374 can be replaced with a combination of the intermediate metal interconnect structures 375 and the external bonding pads 385.

In one embodiment, the at least one metallic material can include, and/or consist essentially of, aluminum. In another embodiment, the at least one metallic material can include, and/or consist essentially of, a UBM layer stack and an optional copper layer located on top of the UBM stack. The UBM layer stack can contain at least two metallic barrier material layers, such as two, three, or four metallic barrier material layers. The UBM layer stack can include a material on which a solder material portion can be subsequently formed. In case the solder material portions to be subsequently used include gold, the UBM layer can include a stack of a titanium-tungsten layer and a gold layer, or a stack of titanium layer and a gold layer. In case the solder material portions to be subsequently used include a lead-tin alloy or a tin-silver-copper alloy, the UBM layer stack can include a stack of a titanium layer and a copper layer; a titanium-tungsten layer and a copper layer; an aluminum layer, a nickel-vanadium layer, and a copper layer; or a chromium layer, a chromium-copper layer, and a copper layer.

In one embodiment, a memory-side etch stop dielectric layer 364 can be formed as a component of the memory-side interconnect-level dielectric layers 390 before formation of the intermediate metal interconnect structures 375 and the external bonding pads 385 within the memory-side interconnect-level dielectric layers 390. The memory-side etch stop dielectric layer 364 includes a dielectric material that is different from the predominant component materials (such as silicon oxide or organosilicate glass) of the memory-side interconnect-level dielectric layers 390, and provides a higher etch resistance than the predominant component material of the memory-side interconnect-level dielectric layers 390. In one embodiment, the memory-side etch stop dielectric layer 364 can include dielectric metal oxide (such as aluminum oxide) or silicon nitride. The thickness of the memory-side etch stop dielectric layer 364 can be in a range from 5 nm to 100 nm, although lesser and greater thicknesses can also be used. The memory-side etch stop dielectric layer 364 can contact bottom surfaces of the aluminum portions or the UBM layer stacks of the external bonding pads 385.

Referring to FIG. 21B, a logic die 900 is provided, which can be derived from the logic die 900 of FIG. 17 by replacing the combination of the intermediate metal interconnect structures 975 and the external bonding pads 985 with interconnect-level metal line structures 974. The logic-side etch stop dielectric layer 964 of FIG. 17 may be omitted in the logic die 900 of FIG. 21. The memory die 1000 of FIG. 21A and the logic die 900 of FIG. 21B can be designed such that the pattern of the logic-side bonding pads 978 of the logic die 900 mirrors the pattern of the memory-side bonding pads 378 of the memory die 1000.

Referring to FIG. 21C, the memory die 1000 of FIG. 21A and the logic die 900 of FIG. 21B can be bonded to each other by metal-to-metal bonding such as copper-to-copper bonding.

Referring to FIG. 21D, the memory-side substrate 310 can be thinned from the backside, for example, by grinding to provide a thinned memory-side substrate 302, which is a semiconductor substrate. The thinned memory-side substrate 302 can have a thickness in a range from 1 μm to 100 μm, such as from 3 μm to 30 μm, although lesser and greater thicknesses can also be used.

Referring to FIG. 20E, a photoresist layer 977 can be applied over the backside of the thinned memory-side substrate 302, and lithographically patterned to form at least one opening therein. Each of the at least one opening in the patterned photoresist layer 977 can overlie a respective one of the external bonding pads 385. In one embodiment, each opening in the patterned photoresist layer 977 may have a greater area than the total area of at least one underlying external bonding pad 385. An anisotropic etch process can be used to form recess regions RR. The anisotropic etch process sequentially etches the materials of the thinned memory-side substrate 302 and distal portions of the memory-side interconnect-level dielectric layers 390, and the physically exposed portions of the memory-side etch stop dielectric layer 364. The memory-side etch stop dielectric layer 364 can be used to prevent overetch through the level of the external bonding pads 385. The terminal step of the anisotropic etch process can include an etch step that etches physically exposed portions of the memory-side etch stop dielectric layer 364 selective to the material of the external bonding pads 385. Each recess region RR vertically extends underneath a respective opening in the patterned photoresist layer 977 from the distal planar surface of the memory die 1000 through the thinned memory-side substrate 302, through the proximal planar surface of the thinned memory-side substrate 302, through the distal portion of the memory-side interconnect-level dielectric layers 390, through the memory-side etch stop dielectric layer 364, and down to a distal planar surface of each external bonding pad 385. A horizontal surface of one of the memory-side interconnect-level dielectric layers 390 can be physically exposed at the bottom of each recess region RR.

An external bonding pad 385 is provided at the bottom of each recess region RR. Each external bonding pad 385 can be located in a physically exposed one of the memory-side interconnect-level dielectric layers 390. The external bonding pads 385 can be initially formed within the memory-side interconnect-level dielectric layers 390 during formation of the memory-side interconnect-level dielectric layers 390, and can be physically exposed after bonding of the memory die 1000 and the logic die 900 and the anisotropic etch process that forms the recess regions RR. A planar horizontal surface of each external bonding pad 385 can be physically exposed after formation of the recess regions RR. The patterned photoresist layer 977 can be subsequently removed, for example, by ashing.

Referring to FIG. 21F, a solder ball 995 can be attached to each external bonding pad 385. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 385 and a corresponding array of solder balls 995 can be formed within each recess region RR. A single recess region RR or an array of recess regions RR may be formed. The bottom surfaces of the recess regions RR can be recessed relative to the distal planar surface of the thinned memory-side substrate 302 by a recess distance in a range from 2 micron to 150 microns, such as from 3 microns to 50 microns, although lesser and greater recess distances can also be used. In one embodiment, each combination of an external bonding pad 385 and a solder ball 995 can be located entirely within a first horizontal plane HP1 including a proximal horizontal surface of the logic-side substrate 910 and a second horizontal plane HP2 including a proximal horizontal surface of the thinned memory-side substrate 302. A bonding wire 997 can be bonded to each solder ball 995.

Referring to FIG. 21G, an alternative embodiment of the fifth configuration of the first exemplary structure is illustrated. In this case, interconnect-level metal line structures 374 can be formed within memory-side interconnect-level dielectric layers 390 at the processing steps of FIG. 21A in lieu of the intermediate metal interconnect structures 375 and the external bonding pads 385. In this case, a subset of the interconnect-level metal line structures 374 is formed in the alternative embodiment of the fifth configuration of the first exemplary structure in lieu of the external bonding pads 385 in FIG. 21A. The processing steps of FIGS. 21C-21E are subsequently performed. The subset of the interconnect-level metal line structures 374 are physically exposed at the bottom of each recess region RR. A metallic bonding pad material such as aluminum or a UBM layer stack can be deposited by an anisotropic deposition process or an isotropic deposition process, and can be patterned by forming discrete photoresist material portions to cover regions of physically exposed portions of the interconnect-level metal line structures 374 at the bottom of the recess regions, and by a subsequent etch process that removes unmasked portions of the metallic bonding pad material. Remaining portions of the metallic bonding pad material underneath the discrete photoresist material portions constitute external bonding pads 385.

An external bonding pad 385 is provided at the bottom of each recess region RR. Each external bonding pad 385 can be located on a physically exposed one of the memory-side interconnect-level dielectric layers 390. The external bonding pads 385 can be formed after bonding of the memory die 1000 and the logic die 900 and after the anisotropic etch process that forms the recess regions RR. The discrete photoresist material portions can be subsequently removed, for example, by ashing.

A solder ball 995 can be attached to each external bonding pad 385. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 385 and a corresponding array of solder balls 995 can be formed within each recess region RR. A single recess region RR or an array of recess regions RR may be formed. The bottom surfaces of the recess regions RR can be recessed relative to the distal planar surface of the thinned memory-side substrate 302 by a recess distance in a range from 1 micron to 150 microns, such as from 3 microns to 50 microns, although lesser and greater recess distances can also be used. In one embodiment, each combination of an external bonding pad 385 and a solder ball 995 can be located entirely within a first horizontal plane HP1 including a proximal horizontal surface of the logic-side substrate 910 and a second horizontal plane HP2 including a proximal horizontal surface of the thinned memory-side substrate 302. A bonding wire 997 can be bonded to each solder ball 995.

Referring to FIG. 21H, a sixth configuration of the first embodiment is illustrated. In this configuration, memory-side bonding pads 378 are provided within the area of the recess regions RR, and via cavities can be formed within the recess regions RR in areas that overlie the memory-side bonding pads 378. The via cavities can vertically extend to the backside surface of a respective one of the memory-side bonding pads 378. At least one bonding pad material (such as an underbump metallurgy (UBM) layer stack) may be deposited in the via cavities and may be subsequently patterned to form external bonding pads 1385. A solder ball and a bonding wire can be subsequently attached to each external bonding pad 1385. In this embodiment, the external bonding pad 1385 is formed directly on the memory-side bonding pad (e.g., copper pad) 378.

In any of alternative embodiments that use the silicon-on-insulator type substrate shown in FIG. 18G, the substrate 301 may be removed completely to expose the insulating layer 308, as shown in FIG. 21H.

Referring to FIG. 22A, a seventh configuration of the exemplary structure includes a memory die 1000, which can be the same as the memory die 1000 of FIG. 16.

Referring to FIG. 22B, a logic die 900 to be bonded to the memory die 1000 of FIG. 22A is illustrated. The logic die of FIG. 22B can be derived from the logic die 900 of FIG. 17 by forming the logic-side etch stop dielectric layer 964 prior to formation of the combination of the intermediate metal interconnect structures 975 and the external bonding pads 985. The thickness of the memory-side etch stop dielectric layer 364 can be in a range from 5 nm to 100 nm, although lesser and greater thicknesses can also be used. The logic-side etch stop dielectric layer 964 can contact top surfaces of the aluminum portions or the UBM layer stacks of the external bonding pads 985.

Referring to FIG. 22C, the memory die 1000 of FIG. 20A and the logic die 900 of FIG. 20B can be bonded to each other by metal-to-metal bonding such as copper-to-copper bonding.

Referring to FIG. 21D, the memory-side substrate 310 can be thinned from the backside, for example, by grinding to provide a thinned memory-side substrate 302, which is a semiconductor substrate. The thinned memory-side substrate 302 can have a thickness in a range from 1 μm to 100 μm, such as from 3 μm to 30 μm, although lesser and greater thicknesses can also be used.

Referring to FIG. 22E, a photoresist layer 977 can be applied over the backside of the thinned memory-side substrate 302, and lithographically patterned to form at least one opening therein. Each of the at least one opening in the patterned photoresist layer 977 can overlie a respective one of the external bonding pads 985. In one embodiment, each opening in the patterned photoresist layer 977 may have a greater area than the total area of at least one underlying external bonding pad 985. An anisotropic etch process can be used to form recess regions RR. The anisotropic etch process sequentially etches the materials of the thinned memory-side substrate 302, the memory-side interconnect-level dielectric layers 390, the proximal portions of the logic-side interconnect-level dielectric layers 990, and the physically exposed portions of the logic-side etch stop dielectric layer 964. The logic-side etch stop dielectric layer 964 can be used to prevent overetch through the level of the external bonding pads 985. The terminal step of the anisotropic etch process can include an etch step that etches physically exposed portions of the logic-side etch stop dielectric layer 964 selective to the material of the external bonding pads 985. Each recess region RR vertically extends underneath a respective opening in the patterned photoresist layer 977 from the distal planar surface of the memory die 1000 through the thinned memory-side substrate 302, through the proximal planar surface of the thinned memory-side substrate 302, through the entire thickness of the memory-side interconnect-level dielectric layers 390, through the interface between the memory die 1000 and the logic die 900, through proximal portions of the memory-side interconnect-level dielectric layers 390, through the logic-side etch stop dielectric layer 964, and down to a proximal planar surface of each external bonding pad 985. A horizontal surface of one of the memory-side interconnect-level dielectric layers 390 can be physically exposed at the bottom of each recess region RR.

An external bonding pad 985 is provided at the bottom of each recess region RR. Each external bonding pad 985 can be located in a physically exposed one of the logic-side interconnect-level dielectric layers 990. The external bonding pads 985 can be initially formed within the logic-side interconnect-level dielectric layers 990 during formation of the logic-side interconnect-level dielectric layers 990, and can be physically exposed after bonding of the memory die 1000 and the logic die 900 and the anisotropic etch process that forms the recess regions RR. A planar horizontal surface of each external bonding pad 985 can be physically exposed after formation of the recess regions RR. The patterned photoresist layer 977 can be subsequently removed, for example, by ashing.

Referring to FIG. 22F, a solder ball 995 can be attached to each external bonding pad 985. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 985 and a corresponding array of solder balls 995 can be formed within each recess region RR. A single recess region RR or an array of recess regions RR may be formed. The bottom surfaces of the recess regions RR can be recessed relative to the distal planar surface of the thinned memory-side substrate 302 by a recess distance in a range from 2 micron to 150 microns, such as from 3 microns to 50 microns, although lesser and greater recess distances can also be used. In one embodiment, each combination of an external bonding pad 985 and a solder ball 995 can be located entirely within a first horizontal plane HP1 including a proximal horizontal surface of the memory-side substrate 310 and a second horizontal plane HP2 including a proximal horizontal surface of the thinned memory-side substrate 302. A bonding wire 997 can be bonded to each solder ball 995.

Referring to FIG. 22G, an eighth configuration of the first exemplary structure is illustrated. In this case, interconnect-level metal line structures 974 can be formed within logic-side interconnect-level dielectric layers 990 at the processing steps of FIG. 22B in lieu of the intermediate metal interconnect structures 975 and the external bonding pads 985. In this case, a subset of the interconnect-level metal line structures 974 is formed in the eighth configuration of the first exemplary structure in lieu of the external bonding pads 985 in FIG. 22B. The processing steps of FIGS. 22C-22E are subsequently performed. The subset of the interconnect-level metal line structures 374 are physically exposed at the bottom of each recess region RR. A metallic bonding pad material such as aluminum or a UBM layer stack can be deposited by an anisotropic deposition process or an isotropic deposition process, and can be patterned by forming discrete photoresist material portions to cover regions of physically exposed portions of the interconnect-level metal line structures 974 at the bottom of the recess regions, and by a subsequent etch process that removes unmasked portions of the metallic bonding pad material. Remaining portions of the metallic bonding pad material underneath the discrete photoresist material portions constitute external bonding pads 985.

An external bonding pad 985 is provided at the bottom of each recess region RR. Each external bonding pad 985 can be located on a physically exposed one of the logic-side interconnect-level dielectric layers 990. The external bonding pads 985 can be formed after bonding of the memory die 1000 and the logic die 900 and after the anisotropic etch process that forms the recess regions RR. The discrete photoresist material portions can be subsequently removed, for example, by ashing.

A solder ball 995 can be attached to each external bonding pad 985. The solder balls 995 can be applied to the bottom of each recess region RR using a solder material dispensation tool. In one embodiment, the recess regions RR can be arranged as a one-dimensional periodic array or as a two-dimensional periodic array. Alternatively, an array of external bonding pads 985 and a corresponding array of solder balls 995 can be formed within each recess region RR. A single recess region RR or an array of recess regions RR may be formed. The bottom surfaces of the recess regions RR can be recessed relative to the distal planar surface of the thinned memory-side substrate 302 by a recess distance in a range from 2 micron to 150 microns, such as from 3 microns to 50 microns, although lesser and greater recess distances can also be used. In one embodiment, each combination of an external bonding pad 985 and a solder ball 995 can be located entirely within a first horizontal plane HP1 including a proximal horizontal surface of the logic-side substrate 910 and a second horizontal plane HP2 including a proximal horizontal surface of the thinned memory-side substrate 302. A bonding wire 997 can be bonded to each solder ball 995.

Generally, a first semiconductor die and a second semiconductor die are provided, which include a memory die 1000 and a logic die 900. In one embodiment, the memory die 1000 can be the first semiconductor die and the logic die 900 can be the second semiconductor die. In another embodiment, the logic die 900 can be the first semiconductor die and the memory die 1000 can be the second semiconductor die. The first semiconductor die comprises a first substrate including a first distal planar surface and a first proximal planar surface, first semiconductor devices (which may include a three-dimensional memory array or a peripheral circuitry) located on, or over, the first proximal planar surface of the first substrate, first interconnect-level dielectric layers (which may be memory-side interconnect-level dielectric layers 390 or logic-side interconnect-level dielectric layers 990) including first metal interconnect structures (which may be memory-side metal interconnect structures 370 or logic-side metal interconnect structures 970) that are electrically connected to the first semiconductor devices, and first die-to-die bonding pads (which may be memory-side bonding pads 378 or logic-side bonding pads 978) located at a surface portion of the first interconnect-level dielectric layers and electrically connected to the first metal interconnect structures. The second semiconductor die comprises a second substrate including a second distal planar surface and a second proximal planar surface, second semiconductor devices (which may include a three-dimensional memory array or a peripheral circuitry) located on, or over, the second proximal planar surface of the second substrate, second interconnect-level dielectric layers (which may be memory-side interconnect-level dielectric layers 390 or logic-side interconnect-level dielectric layers 990) including second metal interconnect structures (which may be memory-side metal interconnect structures 370 or logic-side metal interconnect structures 970) that are electrically connected to the second semiconductor devices, and second die-to-die bonding pads (which may be memory-side bonding pads 378 or logic-side bonding pads 978) located at a surface portion of the second interconnect-level dielectric layers and electrically connected to the second metal interconnect structures.

The second die-to-die bonding pads can be to the first die-to-die bonding pads to provide die-to-die bonding between the first semiconductor die and the second semiconductor die. In one embodiment, the second die-to-die bonding pads can be bonded to the first die-to-die bonding pads by copper-to-copper bonding. At least one recess region RR can be formed by removing material portions within volumes vertically extending from the second distal planar surface through the second substrate and to the second proximal planar surface, to provide a physically exposed horizontal surface of one of the first interconnect-level dielectric layers and the second interconnect-level dielectric layers. One of the first semiconductor die and the second semiconductor die comprises a memory die 1000 including a three-dimensional array of memory elements, another of the first semiconductor die and the second semiconductor die comprises a logic die 900 including a peripheral circuitry configured to operate the three-dimensional array of memory elements.

In one embodiment, the first substrate and the second substrate comprise semiconductor substrates, the memory die 1000 comprises a set of word lines for the three-dimensional array of memory elements and a set of bit lines for the three-dimensional array of memory elements, and the peripheral circuitry is configured to drive at least one set among the set of word lines and the set of bit lines.

In one embodiment, the physically exposed horizontal surface is a horizontal surface of one of the second interconnect-level dielectric layers.

In one embodiment, an external bonding pad (385 or 985) can be located on, or in, the one of the first interconnect-level dielectric layers and the second interconnect-level dielectric layers. The external bonding pad (385 or 985) can be formed within the one of the first interconnect-level dielectric layers and the second interconnect-level dielectric layers during formation of the first metal interconnect structures or during formation of the second metal interconnect structures. A planar horizontal surface of the external bonding pad is physically exposed after formation of the recess region RR. A solder ball to a surface of the external bonding pad (385 or 985).

Referring to all drawings of configurations related to the first exemplary structure and according to various embodiments, a bonded assembly is provided, which comprises: a first semiconductor die (900 or 1000) comprising a first substrate including a first distal planar surface and a first proximal planar surface, first semiconductor devices located on, or over, the first proximal planar surface of the first substrate, first interconnect-level dielectric layers (990 or 390) including first metal interconnect structures (970 or 370) that are electrically connected to the first semiconductor devices, and first die-to-die bonding pads (978 or 378) located at a surface portion of the first interconnect-level dielectric layers (990 or 390) and electrically connected to the first metal interconnect structures (970 or 370); and a second semiconductor die (1000 or 900) comprising a second substrate including a second distal planar surface and a second proximal planar surface, second semiconductor devices located on, or over, the second proximal planar surface of the second substrate, second interconnect-level dielectric layers (390 or 990) including second metal interconnect structures (370 or 970) that are electrically connected to the second semiconductor devices, and second die-to-die bonding pads (378 or 978) located at a surface portion of the second interconnect-level dielectric layers and electrically connected to the second metal interconnect structures. The second die-to-die bonding pads (378 or 978) are bonded to the first die-to-die bonding pads (978 or 378) to provide die-to-die bonding between the first semiconductor die and the second semiconductor die. An external bonding pad (385 or 985) located on, or in, one of the first interconnect-level dielectric layers (990 or 390) and the second interconnect-level dielectric layers (390 or 990) that has a physically exposed horizontal surface. The external bonding pad is located entirely within a first horizontal plane HP1 including the first proximal planar surface of the first substrate (910 or 310) and a second horizontal plane HP2 including the second proximal planar surface of the second substrate (302 or 902).

In one embodiment, a solder ball 995 is bonded to the external bonding pad (385 or 985). In one embodiment, the second die-to-die bonding pads (378 or 978) are bonded to the first die-to-die bonding pads (978 or 378) by copper-to-copper bonding.

In one embodiment, a recess region RR including a void can be provided. The recess region RR vertically extends from the second distal planar surface, through the second proximal planar surface, and to the physically exposed horizontal surface.

In one embodiment, the recess region RR comprises at least one vertical or substantially vertical sidewall that continuously extends from the second distal planar surface to the physically exposed horizontal surface and to a surface of the external bonding pad (385 or 985).

In one embodiment, the external bonding pad (385 or 985) is located directly on, or is included within, one of the second interconnect-level dielectric layers (390 or 990) in the second semiconductor die, and the physically exposed horizontal surface comprises a horizontal surface of one of the second interconnect-level dielectric layers (390 or 990).

In one embodiment, the external bonding pad (385 or 985) is located directly on, or is included within, one of the first interconnect-level dielectric layers (990 or 390) in the first semiconductor die, and the physically exposed horizontal surface comprises a horizontal surface of one of the first interconnect-level dielectric layers (990 or 390).

In one embodiment, an edge of an interface between the first semiconductor die (900 or 1000) and the second semiconductor die (1000 or 900) can be physically exposed to the recess region RR.

In one embodiment, one of the first semiconductor die and the second semiconductor die comprises a memory die 1000 including a three-dimensional array of memory elements, and another of the first semiconductor die and the second semiconductor die comprises a logic die 900 including a peripheral circuitry configured to operate the three-dimensional array of memory elements.

In one embodiment, the first substrate and the second substrate comprise semiconductor substrates, the memory die 1000 comprises a set of word lines for the three-dimensional array of memory elements and a set of bit lines 98 for the three-dimensional array of memory elements, and the peripheral circuitry is configured to drive at least one set among the set of word lines and the set of bit lines 98.

In one embodiment, the memory die 1000 comprises an alternating stack of insulating layers (132, 232) and electrically conductive layers (146, 246), and a two-dimensional array of memory stack structures 55 that extend through the alternating stack {(132, 146), (232, 246)}. Each of the memory stack structures 55 comprises a respective vertical stack of memory elements located adjacent to a respective vertical semiconductor channel 60, the two-dimensional array of memory stack structures 55 constitutes the three-dimensional array of memory elements, the bit lines 98 are connected to a respective subset of the vertical semiconductor channels 60, and the electrically conductive layers (146, 246) comprise the word lines.

Referring to FIG. 23A, a second exemplary structure including a memory die 1000 is provided. The memory die 1000 of FIG. 23A can be derived from the memory die 1000 of FIG. 16 by forming a subset of the interconnect-level metal line structures 374 in the shape of memory-side via landing pads 374P. The memory-side via landing pads 374P can have a rectangular, circular, or oval horizontal cross-sectional shapes, and can have a maximum lateral dimension in a range from 1 micron to 60 microns such as from 3 microns to 30 microns, although lesser and greater maximum lateral dimensions can also be used. In addition, patterned memory-side etch stop dielectric layers 364 can be formed on the top surface of each of the memory-side via landing pads 374P. Each patterned memory-side etch stop dielectric layer 364 includes a dielectric material that is different from the predominant component materials (such as silicon oxide or organosilicate glass) of the memory-side interconnect-level dielectric layers 390, and provides a higher etch resistance than the predominant component material of the memory-side interconnect-level dielectric layers 390. In one embodiment, each memory-side etch stop dielectric layer 364 can include dielectric metal oxide (such as aluminum oxide) or silicon nitride. The thickness of each memory-side etch stop dielectric layer 364 can be in a range from 5 nm to 100 nm, although lesser and greater thicknesses can also be used. Each memory-side etch stop dielectric layer 364 can be patterned such that patterned portions of the memory-side etch stop dielectric layers 364 are located within each area in which connection via cavity is to be subsequently formed.

Referring to FIG. 23B, a logic die 900 to be bonded to the memory die 1000 of FIG. 23A is illustrated. The logic die 900 of FIG. 23B can be derived from the logic die of FIG. 20B by forming a subset of the interconnect-level metal line structures 974 in the shape of logic-side via landing pads 974P. The logic-side via landing pads 974P can have a rectangular, circular, or oval horizontal cross-sectional shapes, and can have a maximum lateral dimension in a range from 1 micron to 60 microns such as from 9 microns to 90 microns, although lesser and greater maximum lateral dimensions can also be used. In addition, each of the logic-side via landing pads 974P can be formed on the top surface of a respective patterned logic-side etch stop dielectric layer 964. Each patterned logic-side etch stop dielectric layer 964 includes a dielectric material that is different from the predominant component materials (such as silicon oxide or organosilicate glass) of the logic-side interconnect-level dielectric layers 990, and provides a higher etch resistance than the predominant component material of the logic-side interconnect-level dielectric layers 990. In one embodiment, each logic-side etch stop dielectric layer 964 can include dielectric metal oxide (such as aluminum oxide) or silicon nitride. The thickness of each logic-side etch stop dielectric layer 964 can be in a range from 5 nm to 100 nm, although lesser and greater thicknesses can also be used. Each logic-side etch stop dielectric layer 964 can be patterned such that patterned portions of the logic-side etch stop dielectric layers 964 are located within each area in which connection via cavity is to be subsequently formed. The memory die 1000 of FIG. 23A and the logic die 900 of FIG. 23B can be designed such that the pattern of the logic-side bonding pads 978 of the logic die 900 mirrors the pattern of the memory-side bonding pads 378 of the memory die 1000.

Referring to FIG. 23C, the memory die 1000 of FIG. 23A and the logic die 900 of FIG. 23B can be bonded to each other by metal-to-metal bonding such as copper-to-copper bonding. Subsequently, the logic-side substrate 910 can be thinned from the backside, for example, by grinding to provide a thinned logic-side substrate 902, which is a semiconductor substrate. The thinned logic-side substrate 902 can have a thickness in a range from 1 μm to 100 μm, such as from 3 μm to 30 μm, although lesser and greater thicknesses can also be used. A planar dielectric isolation layer 930 can be formed on the distal planar surface of the thinned logic-side substrate 902. The planar dielectric isolation layer 930 includes an insulating material such as silicon oxide, silicon nitride, and/or a dielectric metal oxide. For example, the planar dielectric isolation layer 930 can include silicon nitride that can suppress ingress of moisture or contaminants from the ambient into the thinned logic-side substrate 902. The thickness of the planar dielectric isolation layer 930 can be in a range from 10 nm to 500 nm, although lesser and greater thicknesses can also be used.

Referring to FIG. 23D, a photoresist layer 977 can be applied over the planar dielectric isolation layer 930 above the planar distal planar surface of the thinned logic-side substrate 902, and lithographically patterned to form a plurality of openings therein. Each opening in the patterned photoresist layer 977 can be formed entirely within the area of a respective one of the logic-side via landing pads 974P and the memory-side via landing pads 374P. In one embodiment, the pattern of the discrete openings in the photoresist layer 977 can match the general pattern of the logic-side via landing pads 974P and the memory-side via landing pads 374P with a scaling factor less than 1 such that each opening in the patterned photoresist layer 977 has a lesser area than the underlying one of the logic-side via landing pads 974P and the memory-side via landing pads 374P. In one embodiment, the area of each discrete opening in the photoresist layer 977 can be entirely within the area of a respective underlying one of the logic-side via landing pads 974P and the memory-side via landing pads 374P in a plan view, i.e., in a view along a vertical direction. In one embodiment, the array of the logic-side via landing pads 974P and the memory-side via landing pads 374P and the discrete openings in the photoresist layer 977 can be arranged as a periodic one-dimensional array. In one embodiment, the array of the logic-side via landing pads 974P and the memory-side via landing pads 374P and the discrete openings in the photoresist layer 977 can be arranged as a periodic two-dimensional array.

An anisotropic etch process can be performed to etch through portions of the thinned logic-side substrate 902, the logic-side interconnect level dielectric layers 990, and proximal portions of the memory-side interconnect-level dielectric layers 390 using the patterned photoresist layer 977 as an etch mask. The anisotropic etch process can include a first etch step that etches the material of the thinned logic-side substrate 902 selective to the dielectric materials of the logic-side interconnect-level dielectric layers 990, and a second etch step that etches the materials of the logic-side interconnect-level dielectric layers 990 and the memory-side interconnect-level dielectric layers 390 selective to the material of the logic-side etch stop dielectric layer(s) 964 and the memory-side etch stop dielectric layer(s) 364. Each etch stop dielectric layer (364 or 964) other than the etch stop dielectric layer that contacts most distal ones of the memory-side via landing pads 374P (as measured from the horizontal plane including the distal planar surface of the thinned logic-side substrate 902) can be patterned during formation of the logic-side interconnect-level dielectric layers 990 or during formation of the memory-side interconnect-level dielectric layers 390 to ensure that each connection via cavity 935 formed by the first and second steps of the anisotropic etch process reaches a respective one of the etch stop dielectric layers (364, 964) without being prematurely stopped by an intervening etch stop dielectric layer (364 or 964).

The anisotropic etch process includes a third step that etches through physically exposed portions of the etch stop dielectric layers (364, 964) to expose a center portion of the logic-side via landing pads 974P and the memory-side via landing pads 374P. Optionally, the third step of the anisotropic etch process may be replaced with an isotropic etch process such as a wet etch process that etches the materials of the etch stop material layers (364, 964) selective to the material of the via landing pads (974P, 374P) and the interconnect-level dielectric layers (990, 390). The patterned photoresist layer 977 can be removed, for example, by ashing. A suitable cleaning process may be subsequently performed.

The connection via cavities 935 include first connection via cavities 935A that extend through the thinned logic-side substrate 902, the logic-side interconnect-level dielectric layers 990, and proximal portions of the memory-side interconnect-level dielectric layers 390 to a proximal planar surface of a respective one of the memory-side via landing pads 374P, and second connection via cavities 935B that extend through the thinned logic-side substrate 902 and the distal portion of the logic-side interconnect-level dielectric layers 990 to a distal planar surface of a respective one of the logic-side via landing pads 974P. Each first connection via cavity 935A includes at least one straight sidewall that extends through the thinned logic-side substrate 902, the logic-side interconnect-level dielectric layers 990, and proximal portions of the memory-side interconnect-level dielectric layers 390 to a proximal planar surface of a respective one of the memory-side via landing pads 374P. Each second connection via cavity 935B extends through the thinned logic-side substrate 902 and the distal portion of the logic-side interconnect-level dielectric layers 990 to a distal planar surface of a respective one of the logic-side via landing pads 974P.

The memory-side via landing pads 374P can be formed at multiple levels within the memory-side interconnect-level dielectric layers 390. In this case, the first connection via cavities 935A can include multiple subsets of first connection via cavities 935A that extend to proximal planar surfaces of the memory-side via landing pads 374P located at different depths. Likewise, the logic-side via landing pads 974P can be formed at multiple levels within the logic-side interconnect-level dielectric layers 990. In this case, the second connection via cavities 935B can include multiple subsets of second connection via cavities 935B that extend to distal planar surfaces of the logic-side via landing pads 974P located at different depths.

Each connection via cavity 935 includes at least one straight sidewall. Each straight sidewall of the connection via cavities 935 can be vertical or substantially vertical, i.e., straight with a taper angle less than 5 degrees with respect to the vertical direction. The maximum lateral dimension (such as a diameter, a major axis, or a diagonal of a rectangular shape) of each connection via cavity 935 can be in a range from 3 microns to 30 microns, such as from 6 microns to 15 microns although lesser and greater maximum lateral dimensions can also be used.

Referring to FIG. 23E, a continuous dielectric material layer can be deposited by a conformal deposition process at a periphery of each connection via cavity 935 and over the thinned logic-side substrate 902. The continuous dielectric material layer can include silicon oxide, silicon nitride, and/or a dielectric metal oxide such as aluminum oxide. The thickness of the continuous dielectric material layer can be in a range from 10 nm to 200 nm, such as from 20 nm to 100 nm, although lesser and greater thicknesses can also be used. An anisotropic etch process can be performed to remove horizontal portions of the continuous dielectric material layer. A tubular insulating spacer 934 can be formed at a periphery of each connection via cavity 935 by a respective remaining portion of the continuous dielectric material layer after the anisotropic etch process. A top surface of a via landing pad (974P or 374P), which can be a distal planar surface of a logic-side via landing pad 974P or a proximal planar surface of a memory-side via landing pad 374P, is physically exposed at the bottom of each unfilled portion of the connection via cavities 935.

At least one conductive material can be deposited in remaining volumes of the connection via cavities 935. The at least one conductive material can include, for example, a conductive metallic nitride liner material such as TiN, TaN, and/or WN and at least one conductive fill material such as W, Cu, Mo, and/or heavily doped polysilicon. Excess portions of the at least one conductive material can be removed from above the horizontal plane including the distal planar surface of the thinned logic-side substrate 902 by a planarization process. The planarization process can use chemical mechanical planarization (CMP) and/or a recess etch. The planarization process may be selective to the semiconductor material of the thinned logic-side substrate 902. Each remaining portion of the at least one conductive material in the connection via cavities 935 constitutes a conductive pillar structure 936.

The conductive pillar structures 936 include first conductive pillar structures 936A extending through the thinned logic-side substrate 902, the logic-side interconnect-level dielectric layers 990, and the proximal portions of the memory-side interconnect-level dielectric layers 390 and contacting a proximal planar surface of a memory-side via landing pad 374P, and second conductive pillar structures 936B extending through the thinned logic-side substrate 902 and distal portions of the logic-side interconnect-level dielectric layers 990 and contacting a distal side of a logic-side via landing pad 974P. Each contiguous combination of a first conductive pillar structure 936A and a tubular insulating spacer 934 constitutes a first laterally-insulated external connection via structure (936A, 934), and each continuous combination of a second conductive pillar structure 936B and a tubular insulating spacer 934 constitutes a second laterally-insulated external connection via structure (936B, 934).

Each first laterally-insulated external connection via structure (936A, 934) contacts a proximal planar surface of a respective memory-side via landing pad 374P. In case the memory-side via landing pads 374P are located at multiple levels of the memory-side interconnect-level dielectric layers 390, multiple types of first laterally-insulated external connection via structures (936A, 934) having different heights can be formed. Each second laterally-insulated external connection via structure (936B, 934) contacts a distal planar surface of a respective logic-side via landing pad 974P. In case the logic-side via landing pads 974P are located at multiple levels of the logic-side interconnect-level dielectric layers 990, multiple types of second laterally-insulated external connection via structures (936A, 934) having different heights can be formed.

A metallic bonding pad material such as aluminum or a UBM layer stack can be deposited by an anisotropic deposition process or an isotropic deposition process, and can be subsequently patterned to form external bonding pads 938. For example, discrete photoresist material portions can be formed over the deposited metallic bonding pad material to cover discrete areas of the metallic bonding pad material that cover the laterally-insulated external connection via structure (936, 934). An etch process can be performed to remove unmasked portions of the metallic bonding pad material. Remaining portions of the metallic bonding pad material underneath the discrete photoresist material portions constitute the external bonding pads 938.

A solder ball 995 can be attached to each external bonding pad 938. The solder balls 995 can be applied to the external bonding pads 938 using a solder material dispensation tool. In one embodiment, the laterally-insulated external connection via structure (936, 934) and the external bonding pads 938 can be arranged as a one-dimensional periodic array or as a two-dimensional periodic array. A bonding wire 997 can be bonded to each solder ball 995.

Referring to FIG. 23F, a second configuration of the second exemplary structure is illustrated, in which an electrical connection to a node within the periphery circuitry on the thinned logic-side substrate is provided using a generally U-shaped conductive path that includes a first conductive pillar structure 936A in a first laterally-insulated external connection via structure (936A, 934), a memory-side via landing pad 374P, one or more of the memory-side metal interconnect structures 370, a pair of a logic-side bonding pad 978 and a memory-side bonding pad 378, and one or more of the logic-side metal interconnect structures 970.

Referring to FIG. 23G, an alternative second configuration of the second exemplary structure can be derived from the second exemplary structure by forming via cavities extending through the thinned logic-side substrate 902 and the logic-side interconnect-level dielectric layers 990 to the backside of a respective one of the logic-side bonding pad 978. Laterally-insulated external connection via structure (936, 934) can be formed in the via cavities. The conductive pillar structures 936 can function as conductive paths between the logic-side bonding pads 978 and the backside of the logic die. An external bonding pad 938 can be formed on each of the conductive pillar structures 938. In this embodiment, the conductive pillar structures 936 are formed directly on the logic-side bonding pads 978.

Referring to FIG. 24A, a memory die 1000 is provided, which can be derived from the memory die 1000 of FIG. 23A by forming each of the memory-side via landing pads 374P on a top surface of a respective patterned memory-side etch stop dielectric layer 364. Each patterned memory-side etch stop dielectric layer 364 can include the same dielectric material as the patterned memory-side etch stop dielectric layers 364 of FIG. 23A.

Referring to FIG. 24B, a logic die 900 to be bonded to the memory die 1000 of FIG. 24A is illustrated. The logic die 900 of FIG. 24B can be derived from the logic die of FIG. 23B by forming each patterned logic-side etch stop dielectric layer 964 on a top surface of a respective one of the logic-side via landing pads 974P. Each patterned logic-side etch stop dielectric layer 964 can include the same dielectric material as the patterned logic-side etch stop dielectric layers 964 of FIG. 23A. The memory die 1000 of FIG. 24A and the logic die 900 of FIG. 24B can be designed such that the pattern of the logic-side bonding pads 978 of the logic die 900 mirrors the pattern of the memory-side bonding pads 378 of the memory die 1000.

Referring to FIG. 24C, the memory die 1000 of FIG. 24A and the logic die 900 of FIG. 24B can be bonded to each other by metal-to-metal bonding such as copper-to-copper bonding. Subsequently, the memory-side substrate 310 can be thinned from the backside, for example, by grinding to provide a thinned memory-side substrate 302, which is a semiconductor substrate. The thinned memory-side substrate 302 can have a thickness in a range from 1 μm to 100 μm, such as from 3 μm to 30 μm, although lesser and greater thicknesses can also be used. A planar dielectric isolation layer 330 can be formed on the distal planar surface of the thinned memory-side substrate 302. The planar dielectric isolation layer 330 includes an insulating material such as silicon oxide, silicon nitride, and/or a dielectric metal oxide. For example, the planar dielectric isolation layer 330 can include silicon nitride that can suppress ingress of moisture or contaminants from the ambient into the thinned memory-side substrate 302. The thickness of the planar dielectric isolation layer 330 can be in a range from 10 nm to 500 nm, although lesser and greater thicknesses can also be used.

Referring to FIG. 24D, a photoresist layer 977 can be applied over the planar dielectric isolation layer 330 above the planar distal planar surface of the thinned memory-side substrate 302, and lithographically patterned to form a plurality of openings therein. Each opening in the patterned photoresist layer 977 can be formed entirely within the area of a respective one of the logic-side via landing pads 974P and the memory-side via landing pads 374P. In one embodiment, the pattern of the discrete openings in the photoresist layer 977 can match the general pattern of the logic-side via landing pads 974P and the memory-side via landing pads 374P with a scaling factor less than 1 such that each opening in the patterned photoresist layer 977 has a lesser area than the underlying one of the logic-side via landing pads 974P and the memory-side via landing pads 374P. In one embodiment, the area of each discrete opening in the photoresist layer 977 can be entirely within the area of a respective underlying one of the logic-side via landing pads 974P and the memory-side via landing pads 374P in a plan view, i.e., in a view along a vertical direction. In one embodiment, the array of the logic-side via landing pads 974P and the memory-side via landing pads 374P and the discrete openings in the photoresist layer 977 can be arranged as a periodic one-dimensional array. In one embodiment, the array of the logic-side via landing pads 974P and the memory-side via landing pads 374P and the discrete openings in the photoresist layer 977 can be arranged as a periodic two-dimensional array.

An anisotropic etch process can be performed to etch through portions of the thinned memory-side substrate 302, the memory-side interconnect level dielectric layers 390, and proximal portions of the logic-side interconnect-level dielectric layers 990 using the patterned photoresist layer 977 as an etch mask. The anisotropic etch process can include a first etch step that etches the material of the thinned memory-side substrate 302 selective to the dielectric materials of the memory-side interconnect-level dielectric layers 390, and a second etch step that etches the materials of the memory-side interconnect-level dielectric layers 390 and the logic-side interconnect-level dielectric layers 990 selective to the material of the logic-side etch stop dielectric layer(s) 964 and the memory-side etch stop dielectric layer(s) 364. Each etch stop dielectric layer (364 or 964) other than the etch stop dielectric layer that contacts most distal ones of the logic-side via landing pads 974P (as measured from the horizontal plane including the distal planar surface of the thinned memory-side substrate 302) can be patterned during formation of the logic-side interconnect-level dielectric layers 990 or during formation of the memory-side interconnect-level dielectric layers 390 to ensure that each connection via cavity 335 formed by the first and second steps of the anisotropic etch process reaches a respective one of the etch stop dielectric layers (364, 964) without being prematurely stopped by an intervening etch stop dielectric layer (364 or 964).

The anisotropic etch process includes a third step that etches through physically exposed portions of the etch stop dielectric layers (364, 964) to expose a center portion of the logic-side via landing pads 974P and the memory-side via landing pads 374P. Optionally, the third step of the anisotropic etch process may be replaced with an isotropic etch process such as a wet etch process that etches the materials of the etch stop material layers (364, 964) selective to the material of the via landing pads (974P, 374P) and the interconnect-level dielectric layers (990, 390). The patterned photoresist layer 977 can be removed, for example, by ashing. A suitable cleaning process may be subsequently performed.

The connection via cavities 335 include first connection via cavities 335A that extend through the thinned memory-side substrate 302, the memory-side interconnect-level dielectric layers 390, and proximal portions of the logic-side interconnect-level dielectric layers 990 to a proximal planar surface of a respective one of the logic-side via landing pads 974P, and second connection via cavities 335B that extend through the thinned memory-side substrate 302 and the distal portion of the memory-side interconnect-level dielectric layers 390 to a distal planar surface of a respective one of the memory-side via landing pads 374P. Each first connection via cavity 335A includes at least one straight sidewall that extends through the thinned memory-side substrate 302, the memory-side interconnect-level dielectric layers 390, and proximal portions of the logic-side interconnect-level dielectric layers 990 to a proximal planar surface of a respective one of the logic-side via landing pads 974P. Each second connection via cavity 335B extends through the thinned memory-side substrate 302 and the distal portion of the memory-side interconnect-level dielectric layers 390 to a distal planar surface of a respective one of the memory-side via landing pads 374P.

The logic-side via landing pads 974P can be formed at multiple levels within the logic-side interconnect-level dielectric layers 990. In this case, the first connection via cavities 335A can include multiple subsets of first connection via cavities 335A that extend to proximal planar surfaces of the logic-side via landing pads 974P located at different depths. Likewise, the memory-side via landing pads 374P can be formed at multiple levels within the memory-side interconnect-level dielectric layers 390. In this case, the second connection via cavities 335B can include multiple subsets of second connection via cavities 335B that extend to distal planar surfaces of the memory-side via landing pads 374P located at different depths.

Each connection via cavity 335 includes at least one straight sidewall. Each straight sidewall of the connection via cavities 335 can be vertical or substantially vertical, i.e., straight with a taper angle less than 5 degrees with respect to the vertical direction. The maximum lateral dimension (such as a diameter, a major axis, or a diagonal of a rectangular shape) of each connection via cavity 335 can be in a range from 3 microns to 30 microns, such as from 6 microns to 15 microns although lesser and greater maximum lateral dimensions can also be used.

Referring to FIG. 23E, a continuous dielectric material layer can be deposited by a conformal deposition process at a periphery of each connection via cavity 335 and over the thinned memory-side substrate 302. The continuous dielectric material layer can include silicon oxide, silicon nitride, and/or a dielectric metal oxide such as aluminum oxide. The thickness of the continuous dielectric material layer can be in a range from 10 nm to 200 nm, such as from 20 nm to 100 nm, although lesser and greater thicknesses can also be used.

An anisotropic etch process can be performed to remove horizontal portions of the continuous dielectric material layer. A tubular insulating spacer 334 can be formed at a periphery of each connection via cavity 335 by a respective remaining portion of the continuous dielectric material layer after the anisotropic etch process. A top surface of a via landing pad (374P or 974P), which can be a distal planar surface of a memory-side via landing pad 374P or a proximal planar surface of a logic-side via landing pad 974P, is physically exposed at the bottom of each unfilled portion of the connection via cavities 335.

At least one conductive material can be deposited in remaining volumes of the connection via cavities 335. The at least one conductive material can include, for example, a conductive metallic nitride liner material such as TiN, TaN, and/or WN and at least one conductive fill material such as W, Cu, Mo, and/or heavily doped polysilicon. Excess portions of the at least one conductive material can be removed from above the horizontal plane including the distal planar surface of the thinned memory-side substrate 302 by a planarization process. The planarization process can use chemical mechanical planarization (CMP) and/or a recess etch. The planarization process may be selective to the semiconductor material of the thinned memory-side substrate 302. Each remaining portion of the at least one conductive material in the connection via cavities 335 constitutes a conductive pillar structure 336.

The conductive pillar structures 336 include first conductive pillar structures 336A extending through the thinned memory-side substrate 302, the memory-side interconnect-level dielectric layers 390, and the proximal portions of the logic-side interconnect-level dielectric layers 990 and contacting a proximal planar surface of a logic-side via landing pad 974P, and second conductive pillar structures 336B extending through the thinned memory-side substrate 302 and distal portions of the memory-side interconnect-level dielectric layers 390 and contacting a distal side of a memory-side via landing pad 374P. Each contiguous combination of a first conductive pillar structure 336A and a tubular insulating spacer 334 constitutes a first laterally-insulated external connection via structure (336A, 334), and each continuous combination of a second conductive pillar structure 336B and a tubular insulating spacer 334 constitutes a second laterally-insulated external connection via structure (336B, 334).

Each first laterally-insulated external connection via structure (336A, 334) contacts a proximal planar surface of a respective logic-side via landing pad 974P. In case the logic-side via landing pads 974P are located at multiple levels of the logic-side interconnect-level dielectric layers 990, multiple types of first laterally-insulated external connection via structures (336A, 334) having different heights can be formed. Each second laterally-insulated external connection via structure (336B, 334) contacts a distal planar surface of a respective memory-side via landing pad 374P. In case the memory-side via landing pads 374P are located at multiple levels of the memory-side interconnect-level dielectric layers 390, multiple types of second laterally-insulated external connection via structures (336A, 334) having different heights can be formed.

A metallic bonding pad material such as aluminum or a UBM layer stack can be deposited by an anisotropic deposition process or an isotropic deposition process, and can be subsequently patterned to form external bonding pads 938. For example, discrete photoresist material portions can be formed over the deposited metallic bonding pad material to cover discrete areas of the metallic bonding pad material that cover the laterally-insulated external connection via structure (336, 334). An etch process can be performed to remove unmasked portions of the metallic bonding pad material. Remaining portions of the metallic bonding pad material underneath the discrete photoresist material portions constitute the external bonding pads 338.

A solder ball 995 can be attached to each external bonding pad 938. The solder balls 995 can be applied to the external bonding pads 938 using a solder material dispensation tool. In one embodiment, the laterally-insulated external connection via structure (336, 334) and the external bonding pads 938 can be arranged as a one-dimensional periodic array or as a two-dimensional periodic array. A bonding wire 997 can be bonded to each solder ball 995.

Generally, a first semiconductor die and a second semiconductor die are provided, which include a memory die 1000 and a logic die 900. In one embodiment, the memory die 1000 can be the first semiconductor die and the logic die 900 can be the second semiconductor die. In another embodiment, the logic die 900 can be the first semiconductor die and the memory die 1000 can be the second semiconductor die. The first semiconductor die comprises a first substrate including a first distal planar surface and a first proximal planar surface, first semiconductor devices (which may include a three-dimensional memory array or a peripheral circuitry) located on, or over, the first proximal planar surface of the first substrate, first interconnect-level dielectric layers (which may be memory-side interconnect-level dielectric layers 390 or logic-side interconnect-level dielectric layers 990) including first metal interconnect structures (which may be memory-side metal interconnect structures 370 or logic-side metal interconnect structures 970) that are electrically connected to the first semiconductor devices, and first die-to-die bonding pads (which may be memory-side bonding pads 378 or logic-side bonding pads 978) located at a surface portion of the first interconnect-level dielectric layers and electrically connected to the first metal interconnect structures. The second semiconductor die comprises a second substrate including a second distal planar surface and a second proximal planar surface, second semiconductor devices (which may include a three-dimensional memory array or a peripheral circuitry) located on, or over, the second proximal planar surface of the second substrate, second interconnect-level dielectric layers (which may be memory-side interconnect-level dielectric layers 390 or logic-side interconnect-level dielectric layers 990) including second metal interconnect structures (which may be memory-side metal interconnect structures 370 or logic-side metal interconnect structures 970) that are electrically connected to the second semiconductor devices, and second die-to-die bonding pads (which may be memory-side bonding pads 378 or logic-side bonding pads 978) located at a surface portion of the second interconnect-level dielectric layers and electrically connected to the second metal interconnect structures. The second die-to-die bonding pads are bonded to the first die-to-die bonding pads to provide die-to-die bonding between the first semiconductor die and the second semiconductor die. In one embodiment, the second die-to-die bonding pads are bonded to the first die-to-die bonding pads by copper-to-copper bonding.

A first connection via cavity (935A or 335A) is formed through the second substrate (902 or 302), the second interconnect-level dielectric layers (990 or 390), a horizontal plane including an interface between the first semiconductor die and the second semiconductor die, and a subset of layers within the first interconnect-level dielectric layers (390 or 990). One of the first metal interconnect structures (974P or 374P) is physically exposed at a bottom of the first connection via cavity (935A or 335A). A second connection via cavity (935B or 335B) is formed through the second substrate (902 or 302) and a subset of layers within the second interconnect-level dielectric layers (990 or 390). One of the second metal interconnect structures (374P or 974P) is physically exposed at a bottom of the second connection via cavity (935B or 335B). A third connection via cavity (935A or 335A) can be formed through the second substrate (902 or 302), the second interconnect-level dielectric layers (990 or 390), the horizontal plane including the interface between the first semiconductor die and the second semiconductor die, and another subset of layers within the first interconnect-level dielectric layers (390 or 990), and to an additional one of the first metal interconnect structures (974P or 374P) that is located at a different vertical distance from the interface between the first semiconductor die and the second semiconductor die than the one of the first metal interconnect structures (974P or 374P) is from the interface between the first semiconductor die and the second semiconductor die.

In one embodiment, the first interconnect-level dielectric layers (390 or 990) comprise a patterned first etch stop dielectric layer (364 or 964) contacting a surface of the one of the first metal interconnect structures (974P or 374P), and the second interconnect-level dielectric layers (990 or 390) comprise a patterned second etch stop dielectric layer (964 or 364) contacting a surface of the one of the second metal interconnect structures (374P or 974P), and the first connection via cavity (935A or 335A), the second connection via cavity (935B or 335B), and the third connection via cavity (935A or 335A) are formed by a same anisotropic etch process that includes a first etch step that etches through the second substrate (902 or 302), a second etch step that etches portions of the second interconnect-level dielectric layers 390 and the first interconnect-level dielectric layers 990 selective to materials of the patterned second etch stop dielectric layer (364 or 964) and the patterned first etch stop dielectric layer (964 or 364), and a third etch step that etches through the patterned second etch stop dielectric layer (364 or 964) and the patterned first etch stop dielectric layer (364 or 964).

A first laterally-insulated external connection via structure {(936A, 934), (336A, 334)} is formed in the first connection via cavity (935A, 335A) on the one of the first metal interconnect structures (374P, 974P), a second laterally-insulated external connection via structure {(936B, 934), (336B, 334)} is formed in the second connection via cavity (935B, 335B) on the one of the second metal interconnect structures (974P, 374P), and a third laterally-insulated external connection via structure {(936A, 934), (336A, 334)} is formed in the third connection via cavity (935A, 335A) on an additional one of the first metal interconnect structures (374P, 974P).

Each laterally-insulated external connection via structure {(936, 934), (336, 334)} can be simultaneously formed by conformally depositing a continuous dielectric material layer at a periphery of the connection via cavities (935, 335) and over the second substrate (902, 302), forming a tubular insulating spacer (934, 334) within each connection via cavity (935, 335) by anisotropically etching the continuous dielectric material layer, and forming a conductive pillar structure (936, 336) within a remaining volume of each connection via cavity (935, 335) inside the tubular insulating spacers (934, 334).

A first external bonding pad (938, 338) can be formed on the first laterally-insulated external connection via structure {(936A, 934), (336A, 334)}, a second external bonding pad (938, 338) can be formed on the second laterally-insulated external connection via structure {(936B, 934), (336B, 334)}, and a third external bonding pad (938, 338) can be formed on the third laterally-insulated external connection via structure {(936A, 934), (336A, 334)}. A solder ball 995 can be attached to a surface of each external bonding pad (938, 338).

Referring to all drawings of configurations related to the second exemplary structure and according to various embodiments, a bonded assembly is provided, which comprises: a first semiconductor die (1000 or 900) comprising a first substrate (310 or 910) including a first distal planar surface and a first proximal planar surface, first semiconductor devices (which may include a three-dimensional memory array or a peripheral circuitry) located on, or over, the first proximal planar surface of the first substrate, first interconnect-level dielectric layers (which may be memory-side interconnect-level dielectric layers 390 or logic-side interconnect-level dielectric layers 990) including first metal interconnect structures (which may be memory-side metal interconnect structures 370 or logic-side metal interconnect structures 970) that are electrically connected to the first semiconductor devices, and first die-to-die bonding pads (which may be memory-side bonding pads 378 or logic-side bonding pads 978) located at a surface portion of the first interconnect-level dielectric layers and electrically connected to the first metal interconnect structures, and a second semiconductor die (900 or 1000) comprising a second substrate (902 or 302) including a second distal planar surface and a second proximal planar surface, second semiconductor devices (which may include a peripheral circuitry or a three-dimensional memory array) located on, or over, the second proximal planar surface of the second substrate, second interconnect-level dielectric layers (which may be memory-side interconnect-level dielectric layers 390 or logic-side interconnect-level dielectric layers 990) including second metal interconnect structures (which may be memory-side metal interconnect structures 370 or logic-side metal interconnect structures 970) that are electrically connected to the second semiconductor devices, and second die-to-die bonding pads (which may be memory-side bonding pads 378 or logic-side bonding pads 978) located at a surface portion of the second interconnect-level dielectric layers and electrically connected to the second metal interconnect structures. The second die-to-die bonding pads are bonded to the first die-to-die bonding pads to provide die-to-die bonding between the first semiconductor die and the second semiconductor die. A first external bonding pad (938, 338) is located on, or over, the second distal planar surface of the second substrate (902, 302). A first laterally-insulated external connection via structure {(936A, 934), (336A, 334)} vertically extends at least from the second distal planar surface of the second substrate (902, 302), through the second substrate (902, 302), the second interconnect-level dielectric layers (990 or 390), a horizontal plane including an interface between the first semiconductor die and the second semiconductor die, and a subset of layers within the first interconnect-level dielectric layers (390 or 990), and to one of the first metal interconnect structures (374P or 974P) and contacts the first external bonding pad (938, 338). The bonded assembly can include a solder ball 995 bonded to the first external bonding pad (938, 338). In one embodiment, the second die-to-die bonding pads are bonded to the first die-to-die bonding pads by copper-to-copper bonding.

In one embodiment, the bonded assembly can comprise a second external bonding pad (938, 338) located on, or over, the second distal planar surface of the second substrate, and a second laterally-insulated external connection via structure {(936B, 934), (336B, 334)} vertically extending at least from the second distal planar surface of the second substrate (902, 302), through the second substrate (902, 302) and a subset of layers within the second interconnect-level dielectric layers (902, 302), and to one of the second metal interconnect structures (370 or 970), and contacting the second external bonding pad (938, 338).

In one embodiment, the bonded assembly comprises a third external bonding pad (938, 338) located on, or over, the second distal planar surface of the second substrate (902, 302), and a third laterally-insulated external connection via structure {(936A, 934), (336A, 334)} contacting the third external bonding pad (938, 338) and vertically extending at least from the second distal planar surface of the second substrate (902, 302), through the second substrate (902, 302), the second interconnect-level dielectric layers (990 or 390), the horizontal plane including the interface between the first semiconductor die and the second semiconductor die, and another subset of layers within the first interconnect-level dielectric layers (390 or 990), and to an additional one of the first metal interconnect structures (374P or 974P) that is located at a different vertical distance from the interface between the first semiconductor die and the second semiconductor die than the one of the first metal interconnect structures (374P or 974P) is from the interface between the first semiconductor die and the second semiconductor die.

In one embodiment, the bonded assembly comprises a first etch stop dielectric layer (364 or 964) contacting a surface of the one of the first metal interconnect structures (374P or 974P) and laterally surrounding an end portion of the first laterally-insulated external connection via structure {(936A, 934), (336A, 334)}, and a second etch stop dielectric layer (964 or 364) contacting a surface of the one of the second metal interconnect structures (974P or 374P) and laterally surrounding an end portion of the second laterally-insulated external connection via structure {(936A, 934), (336A, 334)}.

In one embodiment, each laterally-insulated external connection via structure {(936, 934), (336, 334)} comprises a tubular insulating spacer (934, 334) contacting sidewalls of the second substrate (902, 302), the second interconnect-level dielectric layers (990 or 390), and the subset of layers within the first interconnect-level dielectric layers (390 or 990), and a conductive pillar structure (936, 336) laterally surrounded by the tubular insulating spacer (934, 334) and contacting a planar surface of the one of the first metal interconnect structures (374P or 974P).

A planar dielectric isolation layer (930, 330) can be located on the second distal planar surface of the second substrate (902, 302) and can contact a planar surface of each external bonding pad (938, 338).

In one embodiment, one of the first semiconductor die and the second semiconductor die comprises a memory die 1000 including a three-dimensional array of memory elements, and another of the first semiconductor die and the second semiconductor die comprises a logic die 900 including a peripheral circuitry configured to operate the three-dimensional array of memory elements.

In one embodiment, the first substrate and the second substrate comprise semiconductor substrates, the memory die 1000 comprises a set of word lines for the three-dimensional array of memory elements and a set of bit lines 98 for the three-dimensional array of memory elements, and the peripheral circuitry is configured to drive at least one set among the set of word lines and the set of bit lines 98.

In one embodiment, the memory die 1000 comprises an alternating stack of insulating layers (132, 232) and electrically conductive layers (146, 246), and a two-dimensional array of memory stack structures 55 that extend through the alternating stack {(132, 146), (232, 246)}. Each of the memory stack structures 55 comprises a respective vertical stack of memory elements located adjacent to a respective vertical semiconductor channel 60, the two-dimensional array of memory stack structures 55 constitutes the three-dimensional array of memory elements, the bit lines 98 are connected to a respective subset of the vertical semiconductor channels 60, and the electrically conductive layers (146, 246) comprise the word lines.

Referring to FIG. 25A, a third exemplary structure is illustrated, which includes an exemplary in-process memory die. The in-process memory die of FIG. 25A can be derived from the exemplary structure of FIGS. 15A and 15B by forming through-dielectric external connection via structures 386 through the stepped dielectric material portions (165, 265). Specifically, a photoresist layer (not shown) can be applied over the second contact level dielectric layer 282 and lithographically patterned to form openings within areas of the interface between the first stepped dielectric material portion 165 and the memory-side substrate 310. An anisotropic etch process is performed to form via cavities extending through the first and second contact level dielectric layers (280, 282) and the first and second stepped dielectric material portions (165, 265). A terminal portion of the anisotropic etch process can use the memory-side substrate 310 as an etch stop structure. The photoresist layer can be subsequently removed, for example, by ashing.

At least one conductive material can be deposited in the via cavities and over the first and second contact level dielectric layers (280, 282). Excess portions of the at least one conductive material can be removed from above the horizontal plane including the top surface of the second contact level dielectric layer 282. Remaining portions of the at least one conductive material in the via cavities constitute through-dielectric external connection via structures 386. In one embodiment, the at least one conductive material can be simultaneously deposited in the via cavities extending to the top surface of the memory-side substrate 310 and in the via cavities for forming the drain contact via structures 88 and the staircase-region contact via structures 86. In this case, the through-dielectric external connection via structures 386 can include the same conductive material as the drain contact via structures 88 and the staircase-region contact via structures 86. Alternatively, the at least one conductive material can be deposited in the via cavities extending to the top surface of the memory-side substrate 310 before, or after, formation of the drain contact via structures 88 and the staircase-region contact via structures 86.

Referring to FIG. 25B, the processing steps of FIG. 16 can be performed. A bit-line-level dielectric layer 284 can be formed over the contact level dielectric layers (280, 282), and bit-line-level metal interconnect structures (98, 96) can be formed in the bit-line-level dielectric layer 284. The bit-line-level metal interconnect structures (98, 96) include bit lines 98 that are electrically connected to a respective subset of the drain regions 63 through a respective subset of the drain contact via structures 88. The bit-line-level metal interconnect structures (98, 96) include interconnection line structures 96, which are electrically connected to at least one of the staircase-region contact via structures 86 or other via structures.

Memory-side interconnect-level dielectric layers 390 can be formed over the bit-line-level dielectric layer 284 and the bit-line-level metal interconnect structures (98, 96). Various memory-side metal interconnect structures 370 can be formed in the memory-side interconnect-level dielectric layers 390 to provide electrical connections to the bit lines 98 and the interconnection line structures 96. The memory-side metal interconnect structures 370 can be include interconnect-level metal line structures 374 and interconnect-level metal via structures 376. Memory-side bonding pads 378 can be formed in, or on, an uppermost layer of the memory-side interconnect-level dielectric layers 390. The memory-side bonding pads 378 are die-to-die bonding pads that provide bonding of the memory die 1000 to another die. In one embodiment, a subset of the memory-side interconnect-level dielectric layers 390 and the memory-side bonding pads 378 are formed over the through-dielectric external connection via structures 386. A subset of the memory-side bonding pads 378 can be electrically connected to the through-dielectric external connection via structures 386.

The third exemplary structure includes a memory die 1000. The memory die 1000 includes a memory-side substrate 310, an alternating stack of insulating layers (132, 232) and electrically conductive layers (146, 246) that has stepped surfaces and is located on the memory-side substrate 310, memory stack structures 55 vertically extending through the alternating stack {(132, 146), (232, 246)}, a stepped dielectric material portion (165 and/or 265) contacting the stepped surface of the alternating stack {(132, 146), (232, 246)}, a through-dielectric external connection via structure 386 vertically extending through the stepped dielectric material portion (165 and/or 265), memory-side metal interconnect structures 370 included in memory-side interconnect-level dielectric layers 390, and memory-side bonding pads 378. The memory stack structures 55 can comprise a three-dimensional array of memory elements.

The memory die 1000 can comprise a set of word lines (comprising the electrically conductive layers (146, 246)) for the three-dimensional array of memory elements and a set of bit lines 98 for the three-dimensional array of memory elements. Each of the memory stack structures 55 can comprise a respective vertical semiconductor channel 60 including a distal end that is electrically connected to a surface portion of the memory-side substrate 310 directly or through a respective pedestal channel portion 11 (as illustrated in FIG. 8H).

Referring to FIG. 25C, a logic die 900 such as the logic die 900 of FIG. 20 B is provided. The logic die 900 comprises a logic-side substrate, which is a semiconductor substrate. The logic die 900 comprises semiconductor devices located on the semiconductor substrate and including a peripheral circuitry configurated to control operation of the memory stack structures 55 within the memory die 1000, logic-side metal interconnect structures 970 included in logic-side interconnect-level dielectric layers 990, and logic-side bonding pads 978. Specifically, the logic die 900 includes a peripheral circuitry that is configured to drive at least one set among the set of word lines (comprising the electrically conductive layers (146, 246)) and the set of bit lines 98 in the memory die 1000. In one embodiment, the memory die 1000 and the logic die 900 can be designed such that the pattern of the logic-side bonding pads 978 of the logic die 900 mirrors the pattern of the memory-side bonding pads 378 of the memory die 1000.

The memory die 1000 and the logic die 900 can be bonded to each other by metal-to-metal bonding such as copper-to-copper bonding. The memory-side bonding pads 378 can be bonded to the logic-side bonding pads 978 to form a die-to-die bonding interface between the memory die 1000 and the logic die 900. The bit lines 98 are connected to a respective subset of the vertical semiconductor channels 60, and are connected to bit line drivers within the peripheral circuitry through first electrically conductive paths including a first bonded subset of the memory-side bonding pads 378 and the logic-side bonding pads 978. The electrically conductive layers (146, 246) comprise the word lines, and are connected to word line drivers within the peripheral circuitry through second electrically conductive paths including a second bonded subset of the memory-side bonding pads 378 and the logic-side bonding pads 978.

Referring to FIG. 25D, the memory-side substrate 310 can be thinned from the backside, for example, by grinding a backside portion of the memory-side substrate 310 to provide a thinned memory-side substrate 302, which is a semiconductor material layer that functions as a source contact layer for the vertical semiconductor channels 60. The source semiconductor layer is electrically connected to distal ends (i.e., ends located at opposite sides of the drain regions 63) of the vertical semiconductor channels 60. The thinned memory-side substrate 302 can have a thickness in a range from 100 nm to 100 μm, such as from 3 μm to 30 μm, although lesser and greater thicknesses can also be used. Optionally, ion implantation may be performed into the thinned memory-side substrate 302 to provide suitable doping to the source layer.

Referring to FIG. 25E, a distal planar surface of each through-dielectric external connection via structure 386 can be physically exposed by removing at least a portion of the thinned memory-side substrate 302. For example, a photoresist layer (not shown) can be applied over the backside of the thinned memory-side substrate 302, and lithographically patterned to over memory array regions 100 without covering areas of the interface between the first stepped dielectric material portion 165 and the thinned memory-side substrate 302. Areas of the staircase region may, or may not, be covered by the patterned photoresist layer. An anisotropic etch that etches the material of the thinned memory-side substrate 302 selective to the material of the first stepped-dielectric material portion 165 and the through-dielectric external connection via structures 386 can be performed using the photoresist layer as an etch mask. The thinned memory-side substrate 302 is patterned by the anisotropic etch. Distal surfaces of the through-dielectric external connection via structures 386 are physically exposed. In one embodiment, the distal surface of the through-dielectric external connection via structures 386 may be coplanar with a distal planar surface of the first stepped dielectric material portion 165.

Referring to FIG. 25F, a metallic bonding pad material such as aluminum or a UBM layer stack can be deposited by an anisotropic deposition process or an isotropic deposition process, and can be subsequently patterned to form external bonding pads 338. For example, discrete photoresist material portions can be formed over the deposited metallic bonding pad material to cover discrete areas of the metallic bonding pad material that cover the through-dielectric external connection via structures 386 and a portion of the thinned memory-side substrate 302, which is a source contact layer. An etch process can be performed to remove unmasked portions of the metallic bonding pad material. Remaining portions of the metallic bonding pad material underneath the discrete photoresist material portions constitute the external bonding pads 338.

A solder ball 995 can be attached to each external bonding pad 338. The solder balls 995 can be applied to the external bonding pads 338 using a solder material dispensation tool. In one embodiment, the through-dielectric external connection via structures 386 and the external bonding pads 938 can be arranged as a one-dimensional periodic array or as a two-dimensional periodic array. A bonding wire 997 can be bonded to each solder ball 995.

Generally, an external bonding pad 338 can be formed on the distal planar surface of each through-dielectric external connection via structure 386. Each through-dielectric external connection via structure 386 contacts sidewalls of dielectric material portions such as the stepped dielectric material portions (165, 265) and the first and second contact level dielectric layers (280, 282). In one embodiment, the entire sidewall of each through-dielectric external connection via structure 386 can contact only dielectric surfaces.

In one embodiment, the memory die 1000 comprises a source contact layer (comprising the thinned memory-side substrate 302) electrically connected to distal ends of the vertical semiconductor channels 60 after physically exposing the distal planar surface of the through-dielectric external connection via structures 386. In one embodiment, each of the memory stack structures 55 comprises a respective vertical semiconductor channel 60 including a distal end that is electrically connected to a source contact layer embodied as the thinned memory-side substrate 302. The thinned memory-side substrate 302 is a remaining portion of the memory-side substrate 310 after removal of a distal portion of the memory-side substrate 310. In this case, the source contact layer comprises a remaining portion of the doped semiconductor material portion provided within the memory-side substrate 310.

Generally, the external bonding pads 338 can be formed by deposition and patterning of a conductive material on the distal planar surface of the through-dielectric external connection via structures 386 and a first planar horizontal surface, i.e., a distal planar surface, of a stepped dielectric material portion 165. A solder ball 995 can be bonded to each external bonding pad 338. An additional external bonding pad 338 can be formed on a distal planar surface of the source semiconductor layer.

Referring to FIG. 25G, an alternative configuration of the third exemplary structure can be derived from the third exemplary structure. If a silicon-on-insulator type substrate is used, then the memory-side substrate 301 may be completely removed to expose the insulating layers 308. In this case, bottom ends of vertical semiconductor channels can be electrically connected to the semiconductor material layer 309. The substrate 301 can be removed after bonding the memory die to the logic die, for example, by grinding, polishing, isotropic etching, and/or anisotropic etching. Via cavities may be formed through the retro-stepped dielectric material portions (165, 265) and the memory-side interconnect-level dielectric layers 390 such that a back side of a respective memory-side bonding pad 378 is physically exposed at the bottom of each via cavity. Through-dielectric external connection via structures 386 can be formed in the via cavities. The through-dielectric external connection via structures 386 can function as conductive paths between the memory-side bonding pads 378 and the backside of the memory die. An external bonding pad 338 can be formed on each of the through-dielectric external connection via structures 386. In this embodiment, the through-dielectric external connection via structures 386 can be formed directly on the memory-side bonding pads 378.

Referring to FIGS. 26A and 26B, another in-process memory die is illustrated, which can be used for another configuration of the third exemplary structure. The in-process memory die of FIGS. 26A and 26B can be derived from the first exemplary structure of FIG. 1 by forming in-process source-level material layers 101' between the memory-side substrate 310 and the first alternating stack (132, 142).

The in-process source-level material layers 101' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower sacrificial liner 103, a source-level sacrificial layer 104, an upper sacrificial liner 105, an upper source-level material layer 116, a source-level insulating layer 117, and an optional source-select-level conductive layer 118.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The upper source-level material layer 116 can include a doped semiconductor material such as doped polysilicon or doped amorphous silicon. The conductivity type of the upper source-level material layer 116 can be the opposite of the conductivity of vertical semiconductor channels to be subsequently formed. For example, if the vertical semiconductor channels to be subsequently formed have a doping of a first conductivity type, the upper source-level material layer 116 have a doping of a second conductivity type that is the opposite of the first conductivity type. The thickness of the upper source-level material layer 116 can be in a range from 10 nm to 300 nm, such as from 20 nm to 150 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a doped semiconductor material, such as doped polysilicon or doped amorphous silicon that can be subsequently converted into doped polysilicon by an anneal process. The thickness of the optional sourceselect-level conductive layer 118 can be in a range from 30 nm to 200 nm, such as from 60 nm to 100 nm, although lesser and greater thicknesses can also be used.

Subsequently, the processing steps of FIGS. 2-7 can be performed to form memory openings 49 and support openings 19. Processing steps illustrated in FIGS. 27A-27D can be performed to form a memory opening fill structure 58 within each memory opening 49 and to form a support pillar structure 20 within each support openings 19.

Figure 27B:
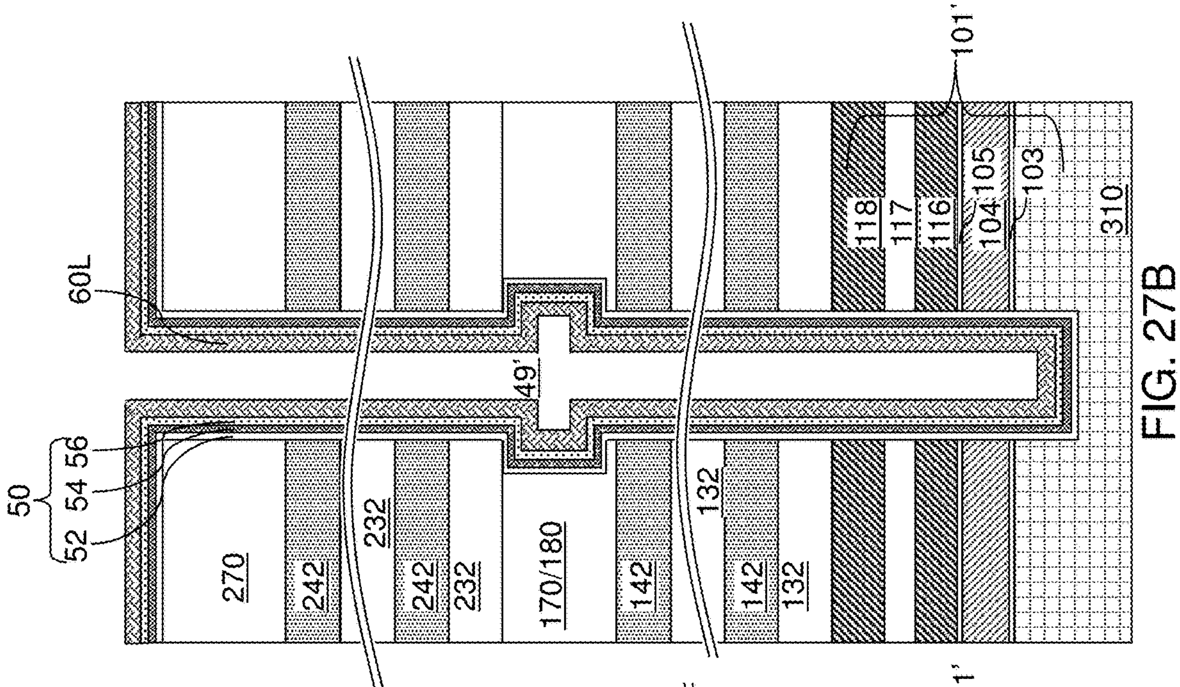
Figure 27A:
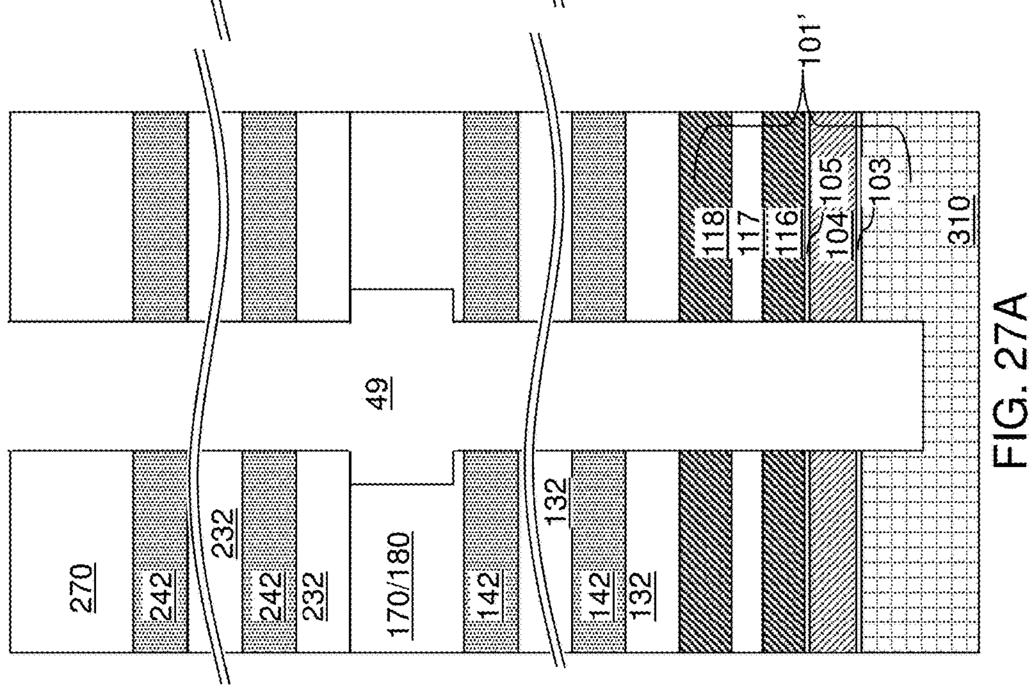

Referring to FIG. 27A, a memory opening 49 in the third exemplary device structure of FIGS. 26A and 26B is illustrated. The memory opening 49 extends through the first-tier structure and the second-tier structure.

Referring to FIG. 27B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Figure 27D:
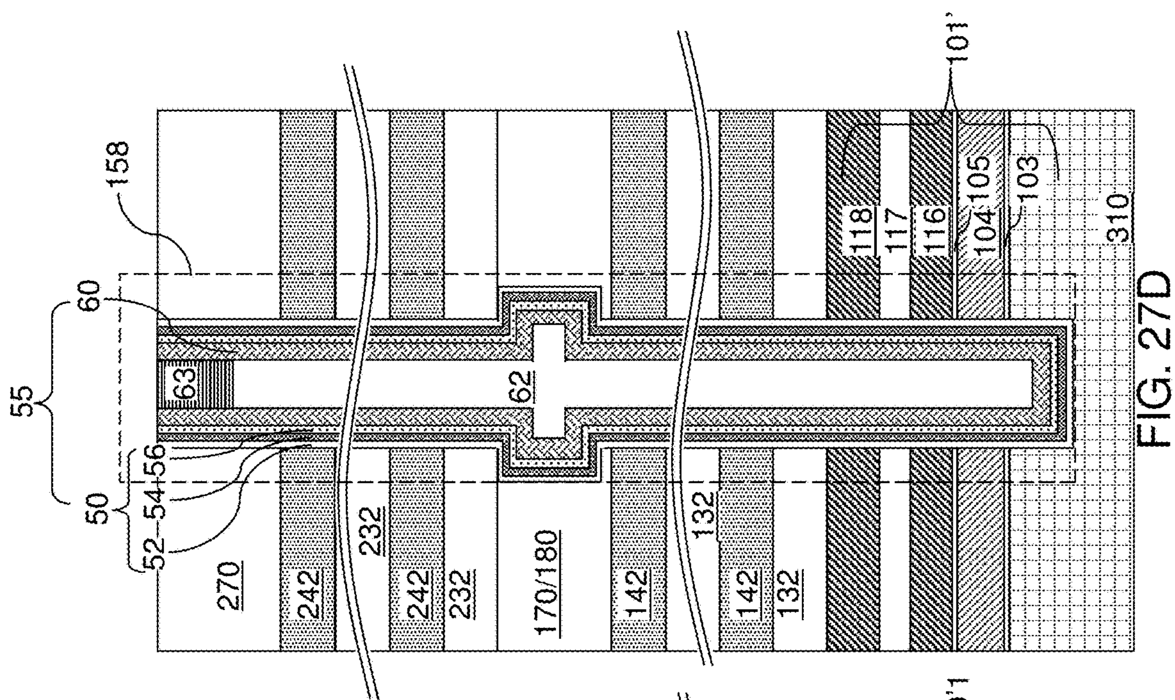
Figure 27C:
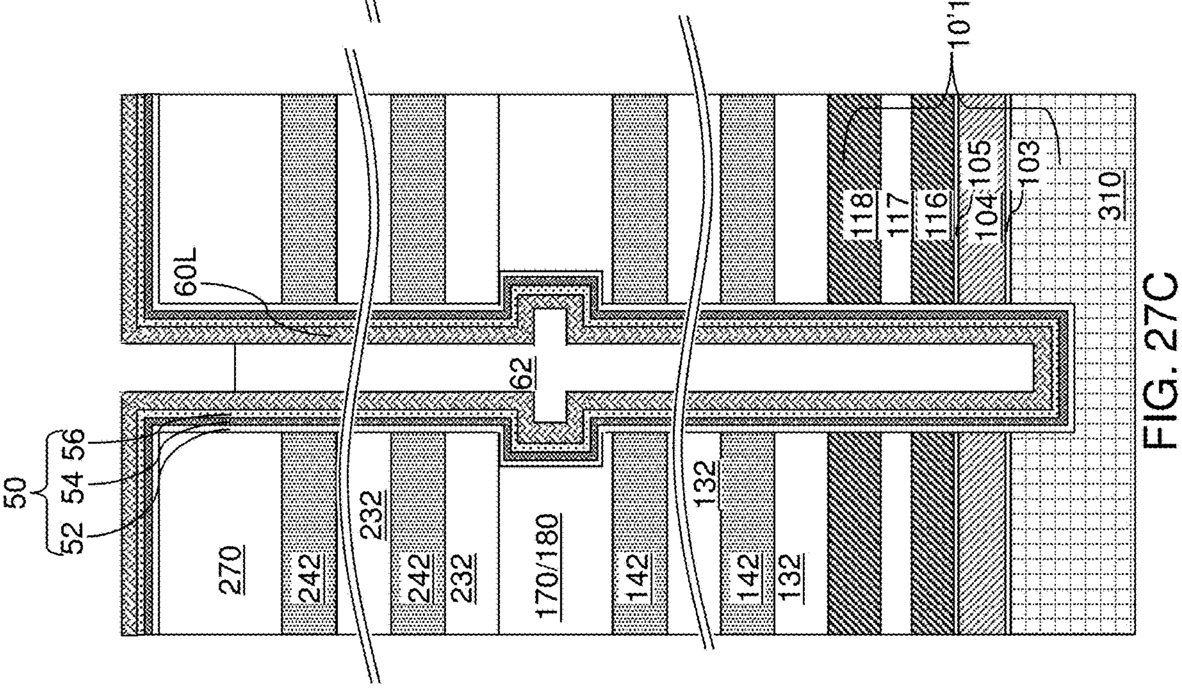

Referring to FIG. 27C, in case the memory cavity 49' in each memory opening is not completely filled by the semiconductor channel material layer 60L, a dielectric core layer can be deposited in the memory cavity 49' to fill any remaining portion of the memory cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 27D, a doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 158. The in-process source-level material layers 101', the first-tier structure (132, 142, 170, 165), the second-tier structure (232, 242, 270, 265, 72), the inter-tier dielectric layer 180, and the memory opening fill structures 158 collectively constitute a memory-level assembly.

Referring to FIG. 28, a first contact level dielectric layer 280 and backside trenches 79 can be formed by performing the processing steps of FIGS. 10A and 10B. The backside trenches can vertically extend through the in-process source-level material layers 101', the first-tier structure (132, 142, 170, 165), the second-tier structure (232, 242, 270, 265, 72), the inter-tier dielectric layer 180, and into a top portion of the memory-side substrate 310.

Figure 29A:
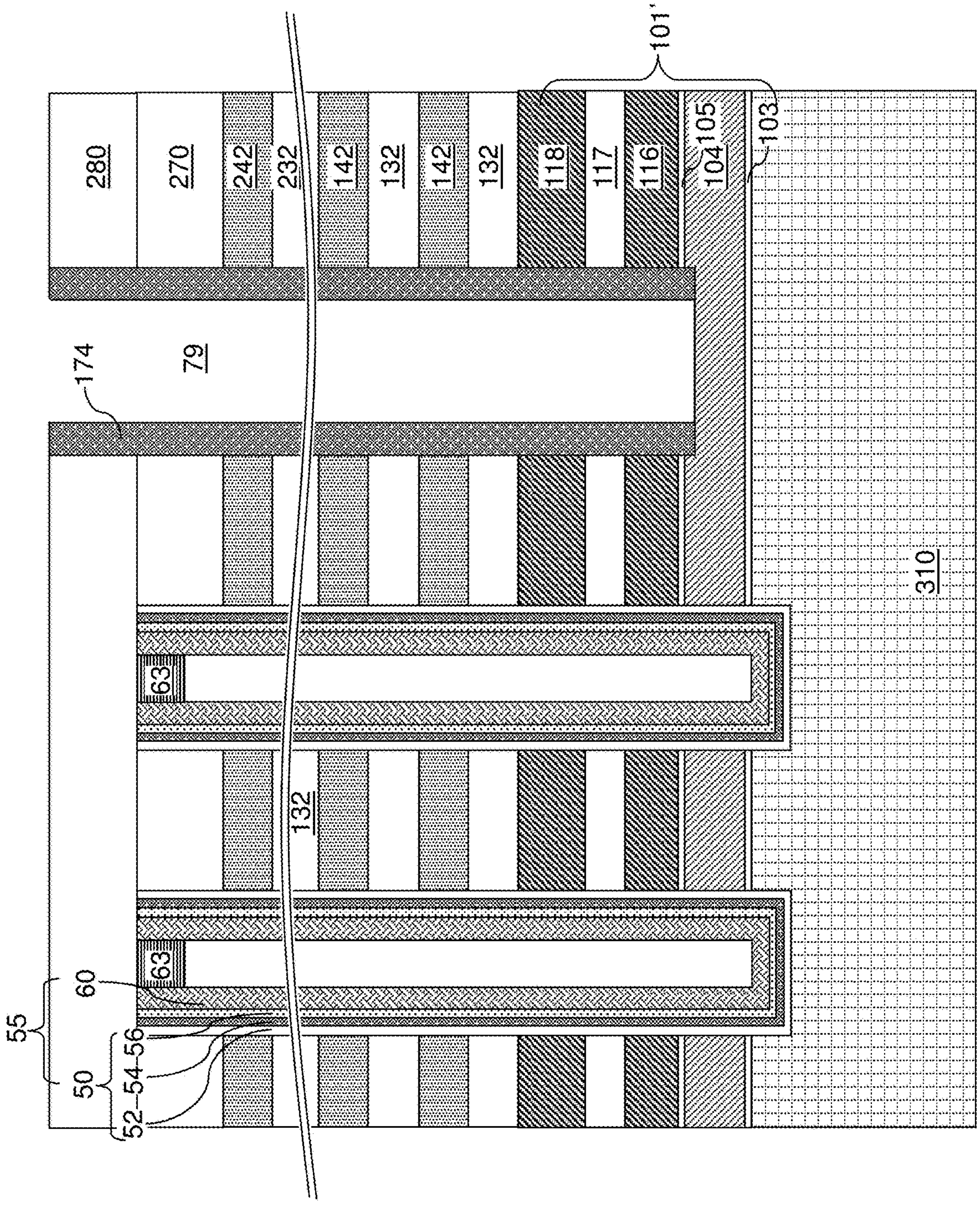

Referring to FIG. 29A, a backside trench spacer 174 can be formed on sidewalls of each backside trench 79. For example, a conformal spacer material layer can be deposited in the backside trenches 79 and over the first contact level dielectric layer 280, and can be anisotropically etched to form the backside trench spacers 174. The backside trench spacers 174 include a material that is different from the material of the source-level sacrificial layer 104. For example, the backside trench spacers 174 can include silicon nitride.

Figure 29B:
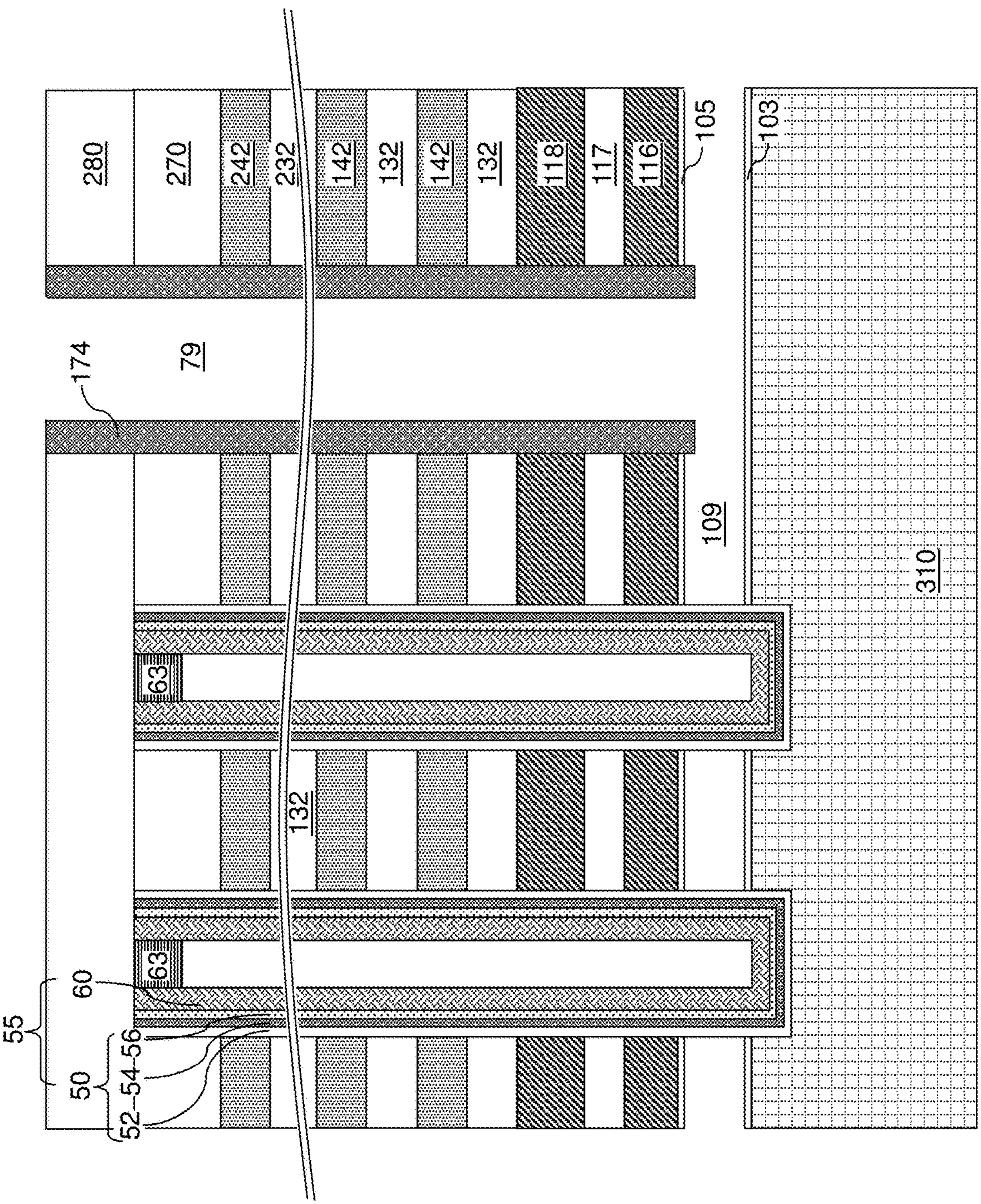

Referring to FIG. 29B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 174 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 174 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the doped semiconductor material of the upper source-level semiconductor layer 116 and the memory-side substrate 310. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the memory-side substrate 310 is physically exposed upon formation of the source cavity 109 and/or the backside trench spacers 174, collateral etching of the upper source-level semiconductor layer 116 and/or the memory-side substrate 310 is minimal, and the structural change to the exemplary structure caused by accidental physical exposure of the surfaces of the upper source-level semiconductor layer 116 and/or the memory-side substrate 310 during manufacturing steps do not result in device failures. Each of the memory opening fill structures 158 is physically exposed to the source cavity 109. Specifically, each of the memory opening fill structures 158 includes a sidewall and a bottom surface that are physically exposed to the source cavity 109.

Figure 29C:
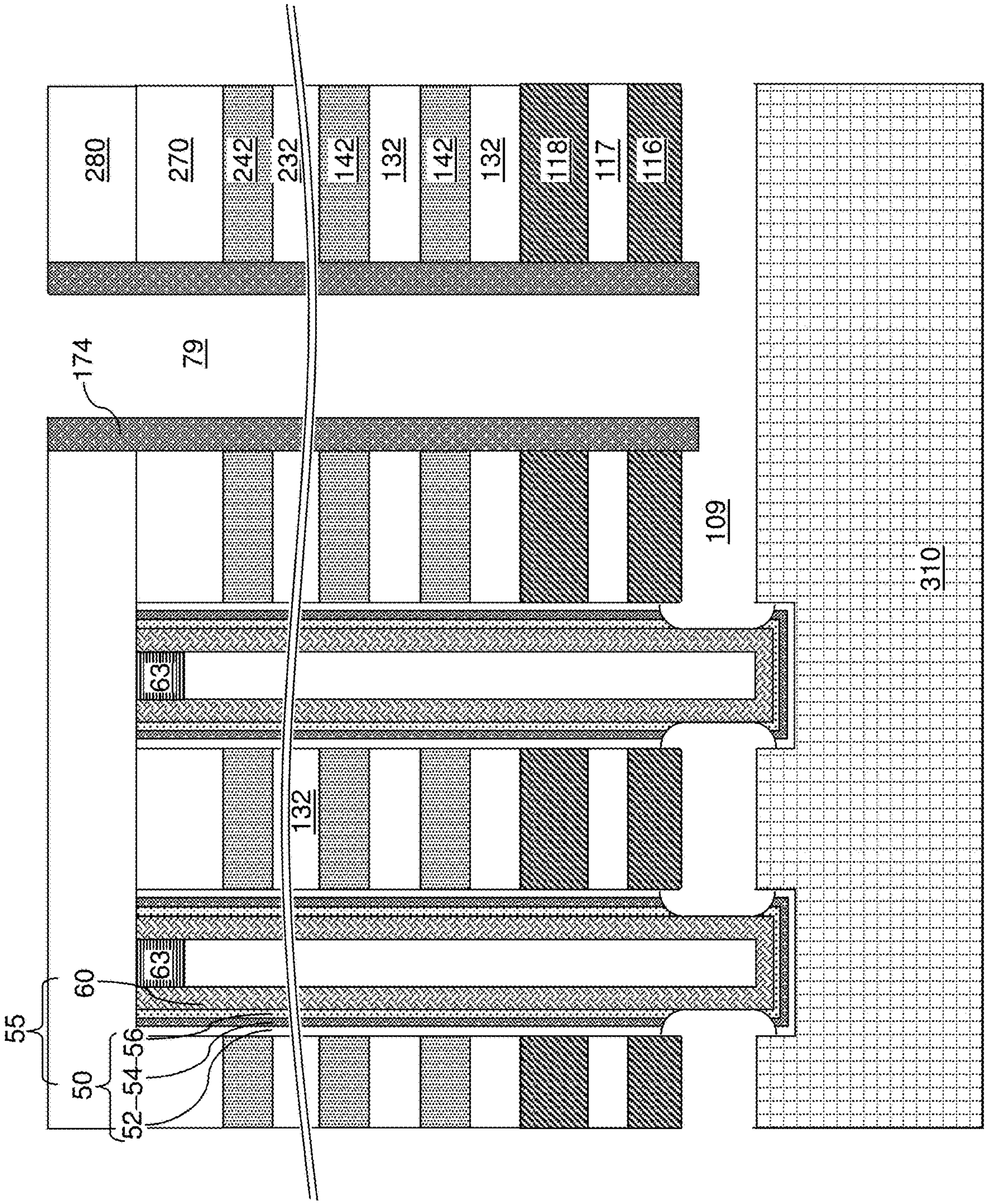

Referring to FIG. 29C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the memory-side substrate 310 and a bottom surface of the upper source-level semiconductor layer 116 can be physically exposed to the source cavity 109. The source cavity 109 is formed by isotropically etching the source-level sacrificial layer 104 and a bottom portion of each of the memory films 50 selective to at least one source-level semiconductor layer (such as the memory-side substrate 310 and the upper source-level semiconductor layer 116) and the vertical semiconductor channels 60.

Figure 29D:
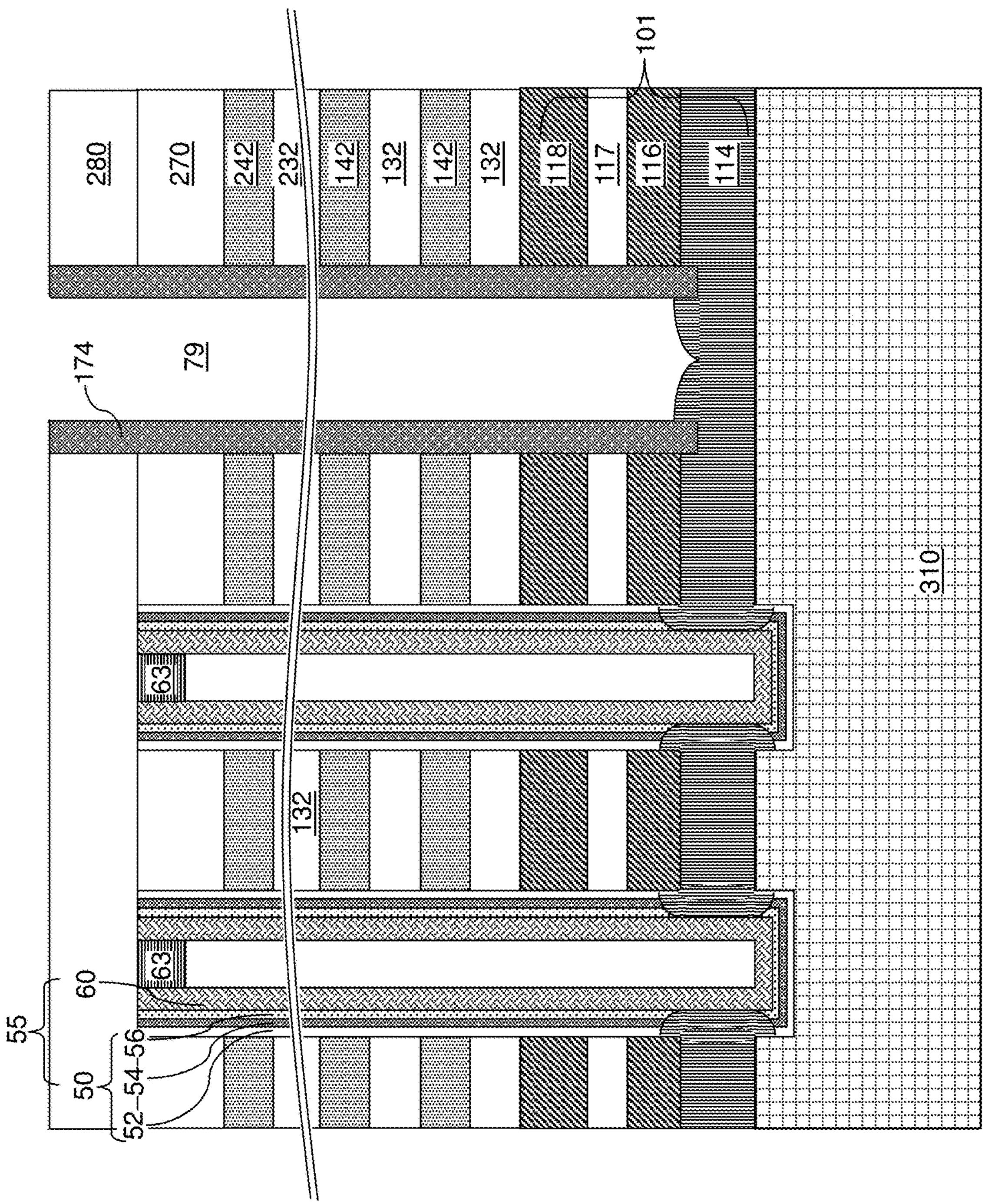

Referring to FIG. 29D, a semiconductor material having a doping of the second conductivity type can be deposited on the physically exposed semiconductor surfaces around the source cavity 109. The physically exposed semiconductor surfaces include bottom portions of outer sidewalls of the vertical semiconductor channels 60, a bottom surface of the upper source-level semiconductor layer 116, and a top surface of the memory-side substrate 310.

In one embodiment, the doped semiconductor material of the second conductivity type can be deposited on the physically exposed semiconductor surfaces around the source cavity 109 by a selective semiconductor deposition process. A semiconductor precursor gas, an etchant, and an n-type dopant precursor gas can be flowed concurrently into a process chamber including the exemplary structure during the selective semiconductor deposition process. For example, the semiconductor precursor gas can include silane, disilane, or dichlorosilane, the etchant gas can include gaseous hydrogen chloride, and the n-type dopant precursor gas such as phosphine, arsine, or stibine. In this case, the selective semiconductor deposition process grows an n-doped semiconductor material from physically exposed semiconductor surfaces around the source cavity 109. The deposited n-doped semiconductor material forms a source contact layer 114, which can contact sidewalls of the vertical semiconductor channels 60. The atomic concentration of the n-type dopants in the deposited semiconductor material can be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed can consist essentially of semiconductor atoms and n-type dopant atoms. Alternatively, at least one non-selective n-doped semiconductor material deposition process can be used to form the source contact layer 114. Optionally, one or more etch back processes may be used in combination with a plurality of selective or non-selective deposition processes to provide a seamless and/or voidless source contact layer 114.

The duration of the selective semiconductor deposition process can be selected such that the source cavity 109 is filled with the source contact layer 114, and the source contact layer 114 contacts bottom end portions of inner sidewalls of the backside trench spacers 174. In one embodiment, the source contact layer 114 can be formed by selectively depositing a doped semiconductor material from semiconductor surfaces around the source cavity 109. In one embodiment, the doped semiconductor material can include doped polysilicon. Thus, the source-level sacrificial layer 104 can be replaced with the source contact layer 114.

The layer stack including the source contact layer 114 and the upper source-level semiconductor layer 116 constitutes a buried source layer (114, 116). The set of layers including the buried source layer (114, 116), the source-level insulating layer 117, and the source-select-level conductive layer 118 constitutes source-level material layers 101, which replaces the in-process source-level material layers 101'.

Figure 29E:
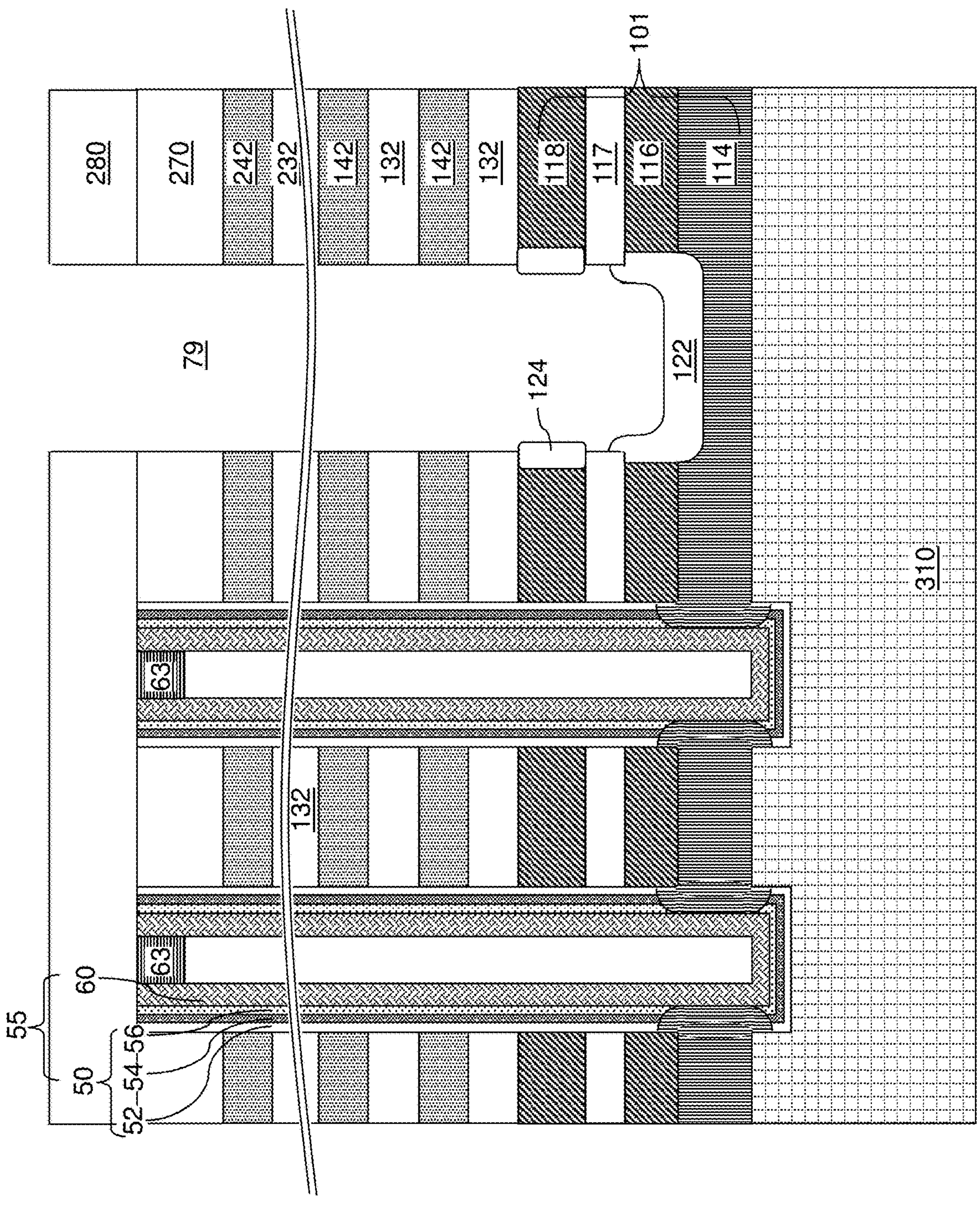

Referring to FIG. 29E, the backside trench spacers 174 can be removed selective to the insulating layers (132, 232), the first and second insulating cap layers (170, 270), the first contact level dielectric layer 280, and the source contact layer 114 using an isotropic etch process. For example, if the backside trench spacers 174 include silicon nitride, a wet etch process using hot phosphoric acid can be performed to remove the backside trench spacers 174. In one embodiment, the isotropic etch process that removes the backside trench spacers 174 can be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process can be performed to convert physically exposed surface portions of semiconductor materials into dielectric semiconductor oxide portions. For example, surfaces portions of the source contact layer 114 and the upper source-level material layer 116 can be converted into dielectric semiconductor oxide plates 122, and surface portions of the source-select-level conductive layer 118 can be converted into annular dielectric semiconductor oxide spacers 124.

Referring to FIG. 30, the processing steps of FIGS. 11, 12A-12E, and 13 can be performed to replace the sacrificial material layers (142, 242) with electrically conductive layers (146, 246). First electrically conductive layers 146 replace first sacrificial material layers 142, and second electrically conductive layers 246 replace second sacrificial material layers 242. A dielectric material is deposited in the backside trenches 79 to form dielectric wall structures 176. Each of the dielectric wall structures 176 can laterally extend along the first horizontal direction hd1 and can vertically extend through each layer of an alternating stack of the insulating layers (132, 232) and the electrically conductive layers (146, 246). Each dielectric wall structure 176 can contact sidewalls of the first and second insulating cap layers (170, 270).

Referring to FIG. 31, a second contact level dielectric layer 282, drain contact via structures 88, and staircase-region contact via structures 86 can be formed by performing the processing steps of FIGS. 15A and 15B. The processing steps of FIG. 25A can be performed to form through-dielectric external connection via structures 386 through the stepped dielectric material portions (165, 265).

Referring to FIG. 32, the processing steps of FIG. 25B can be performed to form a bit-line-level dielectric layer 284, bit-line-level metal interconnect structures (98, 96), memory-side interconnect-level dielectric layers 390, various memory-side metal interconnect structures 370, and memory-side bonding pads 378.

The third exemplary structure includes a memory die 1000. The memory die 1000 includes a memory-side substrate 310, an alternating stack of insulating layers (132, 232) and electrically conductive layers (146, 246) that has stepped surfaces and is located on the memory-side substrate 310, memory stack structures 55 vertically extending through the alternating stack {(132, 146), (232, 246)}, a stepped dielectric material portion (165 and/or 265) contacting the stepped surface of the alternating stack {(132, 146), (232, 246)}, a through-dielectric external connection via structure 386 vertically extending through the stepped dielectric material portion (165 and/or 265), memory-side metal interconnect structures 370 included in memory-side interconnect-level dielectric layers 390, and memory-side bonding pads 378. The memory stack structures 55 can comprise a three-dimensional array of memory elements.

The memory die 1000 can comprise a set of word lines (comprising the electrically conductive layers (146, 246)) for the three-dimensional array of memory elements and a set of bit lines 98 for the three-dimensional array of memory elements. Each of the memory stack structures 55 can comprise a respective vertical semiconductor channel 60 including a distal end that is electrically connected to a surface portion of the memory-side substrate 310 directly or through a respective pedestal channel portion 11 (as illustrated in FIG. 8H).

Figure 33A:
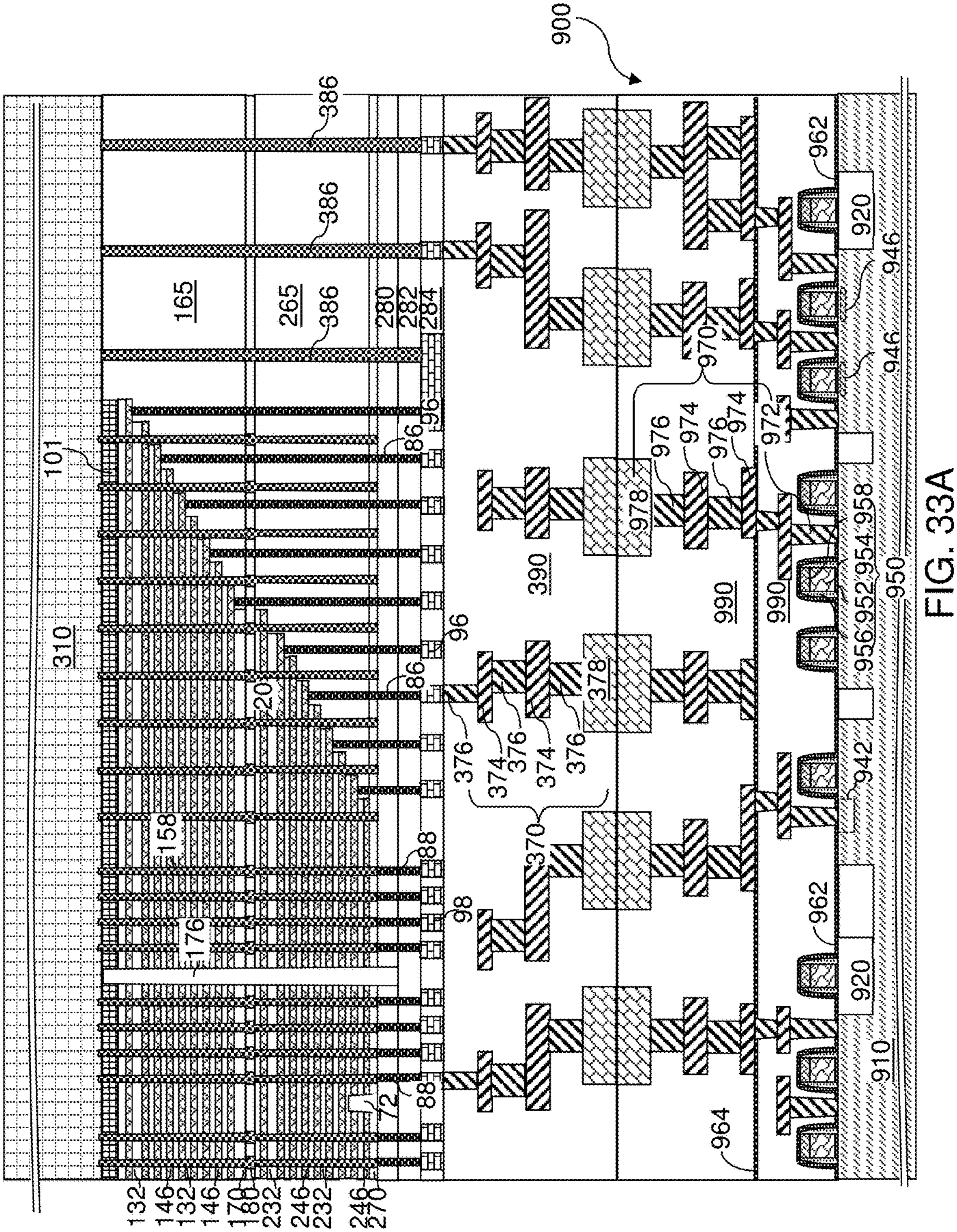

Referring to FIG. 33A, a logic die 900 such as the logic die 900 of FIG. 20 B is provided. The logic die 900 comprises a logic-side substrate, which is a semiconductor substrate. The logic die 900 comprises semiconductor devices located on the semiconductor substrate and including a peripheral circuitry configurated to control operation of the memory stack structures 55 within the memory die 1000, logic-side metal interconnect structures 970 included in logic-side interconnect-level dielectric layers 990, and logic-side bonding pads 978. Specifically, the logic die 900 includes a peripheral circuitry that is configured to drive at least one set among the set of word lines (comprising the electrically conductive layers (146, 246)) and the set of bit lines 98 in the memory die 1000. In one embodiment, the memory die 1000 and the logic die 900 can be designed such that the pattern of the logic-side bonding pads 978 of the logic die 900 mirrors the pattern of the memory-side bonding pads 378 of the memory die 1000.

The memory die 1000 and the logic die 900 can be bonded to each other by metal-to-metal bonding such as copper-to-copper bonding. The memory-side bonding pads 378 can be bonded to the logic-side bonding pads 978 to form a die-to-die bonding interface between the memory die 1000 and the logic die 900. The bit lines 98 are connected to a respective subset of the vertical semiconductor channels 60, and are connected to bit line drivers within the peripheral circuitry through first electrically conductive paths including a first bonded subset of the memory-side bonding pads 378 and the logic-side bonding pads 978. The electrically conductive layers (146, 246) comprise the word lines, and are connected to word line drivers within the peripheral circuitry through second electrically conductive paths including a second bonded subset of the memory-side bonding pads 378 and the logic-side bonding pads 978. The memory die 1000 comprises source-level material layers 101 located between the memory-side substrate 310 and the alternating stack {(132, 146), (232, 246)}. The source-level material layers comprise a source contact layer 114 in contact with sidewalls of the vertical semiconductor channels 60. The source contact layer 114 comprises a doped semiconductor material portion provided between the memory-side substrate 310 and the alternating stack {(132, 146), (232, 246)}.

Figure 33B:
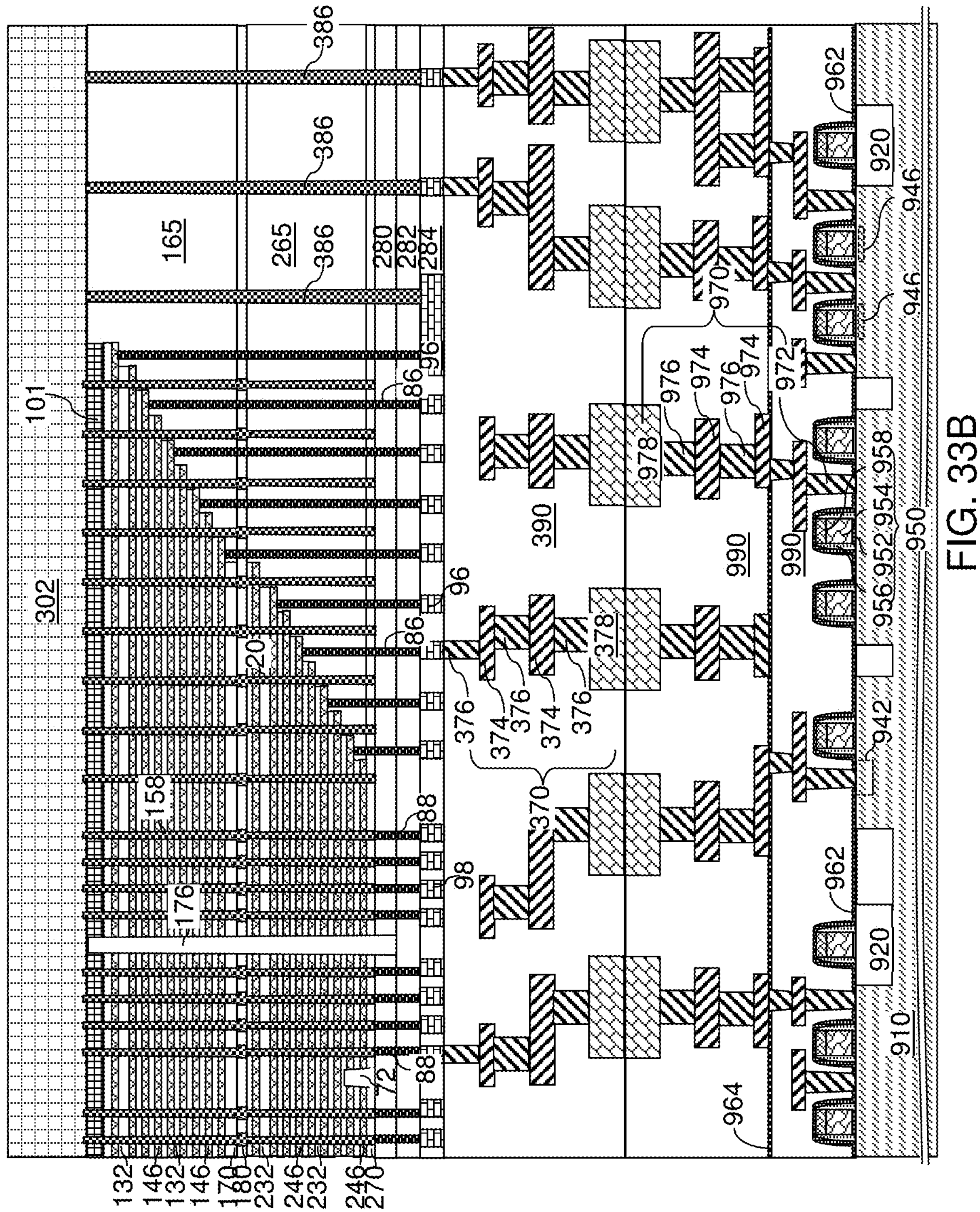

Referring to FIG. 33B, the memory-side substrate 310 can be thinned from the backside, for example, by grinding. A backside portion of the memory-side substrate 310 to provide a thinned memory-side substrate 302, which is a semiconductor material layer that functions as a source contact layer for the vertical semiconductor channels 60. The source semiconductor layer is electrically connected to distal ends (i.e., ends located at opposite sides of the drain regions 63) of the vertical semiconductor channels 60. The thinned memory-side substrate 302 can have a thickness in a range from 100 nm to 100 μm, such as from 3 μm to 30 μm, although lesser and greater thicknesses can also be used. Optionally, ion implantation may be performed into the thinned memory-side substrate 302 to provide suitable doping to the source layer.

Figure 33C:
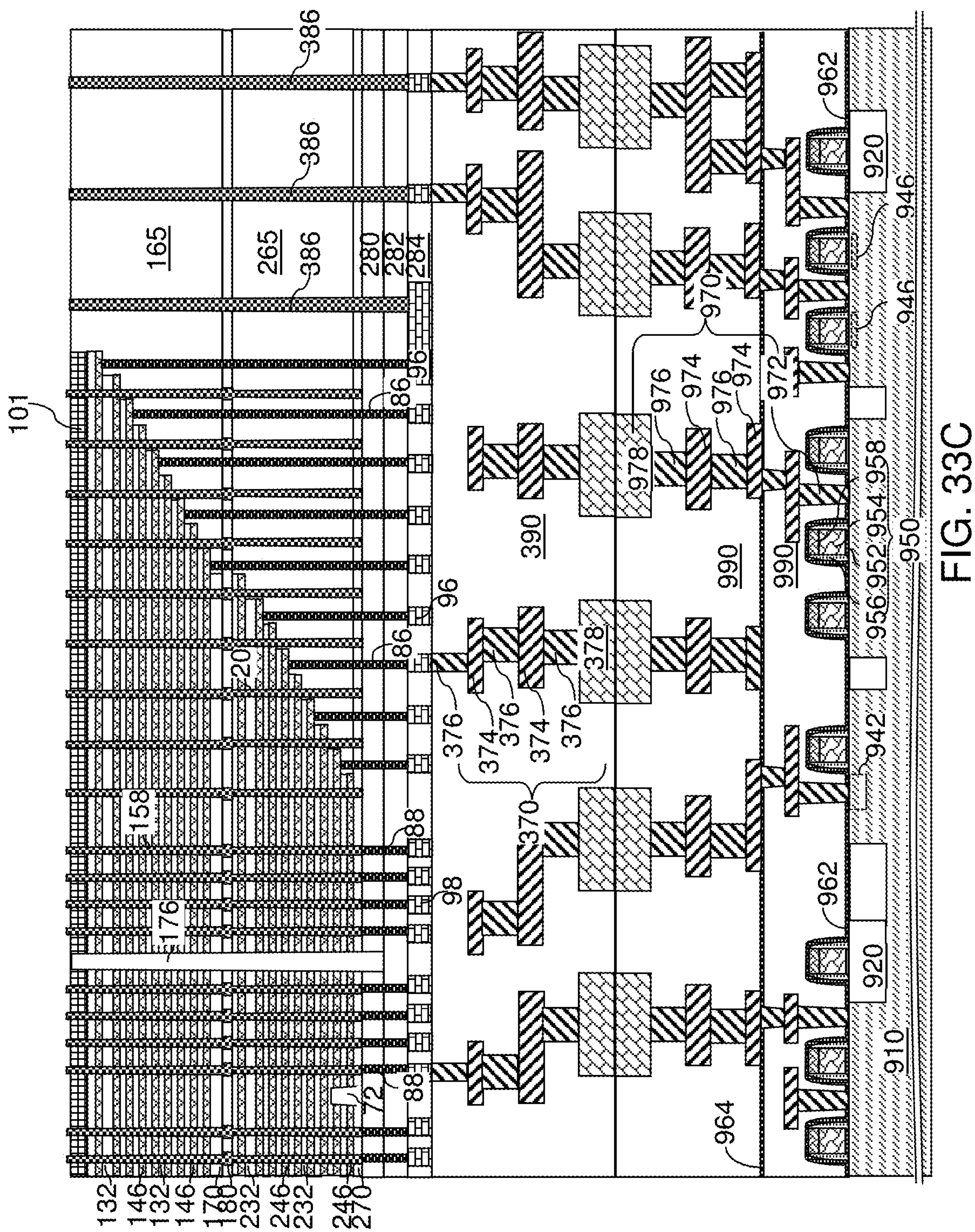

Referring to FIG. 33C, the thinned memory-side substrate 302 can be removed by an etch process selective to the material of the first stepped dielectric material portion 165 and the through-dielectric external connection via structures 386. In one embodiment, an anisotropic etch process can be performed using the first stepped dielectric material portion 165 as an end point detection layer. The thinned memory-side substrate 302 can be removed to physically expose a horizontal surface of the source-level material layers 101. For example, a distal surface of the source contact layer 114 can be physically exposed after removal of the thinned memory-side substrate 302.

The entirety of the memory-side substrate 310 is removed to physically expose a planar surface of the source-level material layers 101 after the memory-side bonding pads 378 are bonded to the logic-side bonding pads 978. The source-level material layers 101 include a source contact layer 114.

Figure 33D:
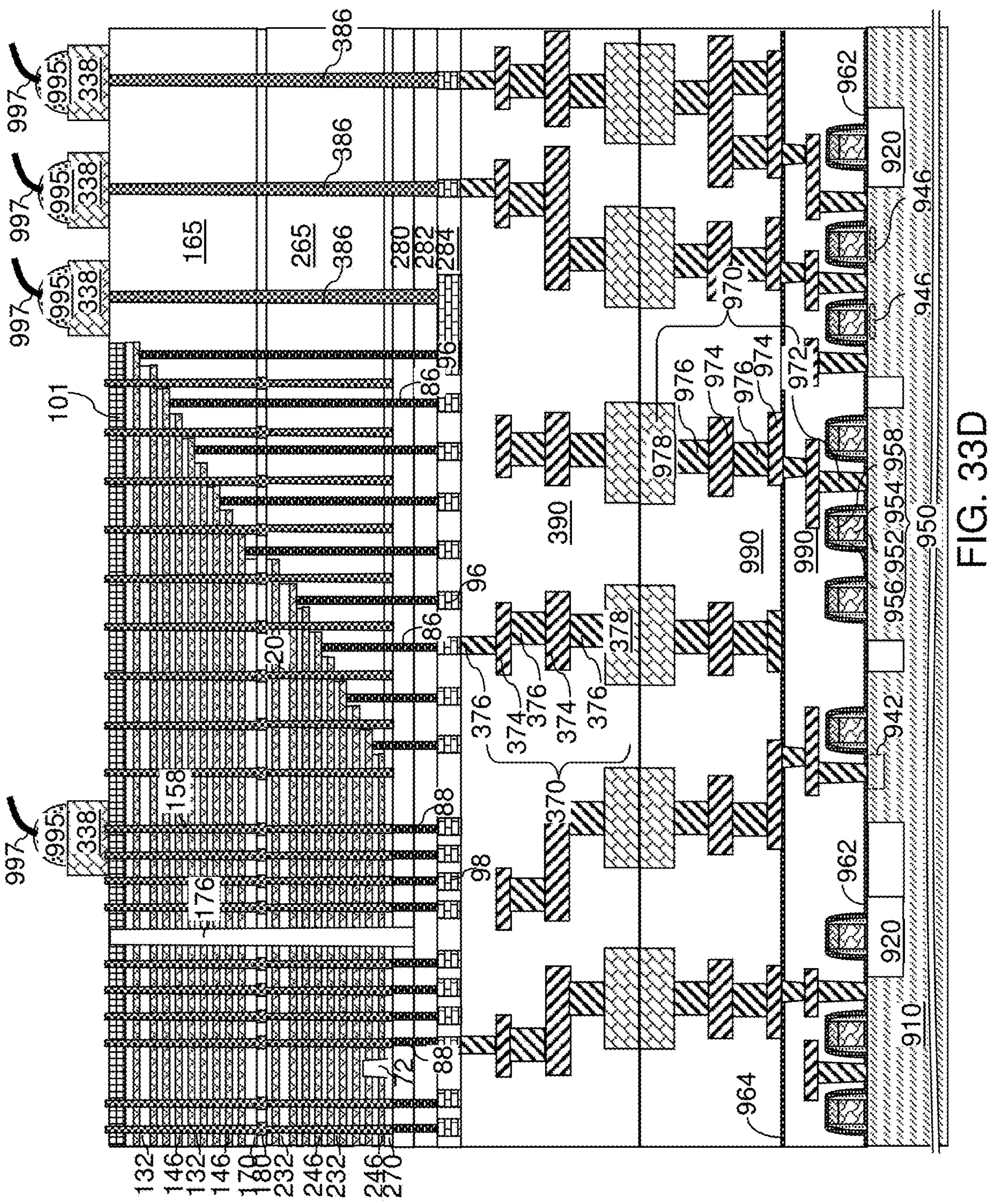

Referring to FIG. 33D, a metallic bonding pad material such as aluminum or a UBM layer stack can be deposited by an anisotropic deposition process or an isotropic deposition process on the distal planar surface of the first stepped dielectric material portion 165 and the source-level material layers 101 (such as a distal surface of the source contact layer 114), and can be subsequently patterned to form external bonding pads 338. For example, discrete photoresist material portions can be formed over the deposited metallic bonding pad material to cover discrete areas of the metallic bonding pad material that cover the through-dielectric external connection via structures 386 and a portion of the source contact layer 114. An etch process can be performed to remove unmasked portions of the metallic bonding pad material. Remaining portions of the metallic bonding pad material underneath the discrete photoresist material portions constitute the external bonding pads 338.

A solder ball 995 can be attached to each external bonding pad 338. The solder balls 995 can be applied to the external bonding pads 338 using a solder material dispensation tool. In one embodiment, the through-dielectric external connection via structures 386 and the external bonding pads 338 can be arranged as a one-dimensional periodic array or as a two-dimensional periodic array. A bonding wire 997 can be bonded to each solder ball 995.

Generally, an external bonding pad 338 can be formed on the distal planar surface of each through-dielectric external connection via structure 386. Each through-dielectric external connection via structure 386 contacts sidewalls of dielectric material portions such as the stepped dielectric material portions (165, 265) and the first and second contact level dielectric layers (280, 282). In one embodiment, the entire sidewall of each through-dielectric external connection via structure 386 can contact only dielectric surfaces.

In one embodiment, the memory die 1000 comprises a source contact layer 114 electrically connected to distal ends of the vertical semiconductor channels 60 after physically exposing the distal planar surface of the through-dielectric external connection via structures 386. In one embodiment, each of the memory stack structures 55 comprises a respective vertical semiconductor channel 60 including a distal end that is electrically connected to the source semiconductor layer 114.

Generally, the external bonding pads 338 can be formed by deposition and patterning of a conductive material on the distal planar surface of the through-dielectric external connection via structures 386 and a first planar horizontal surface, i.e., a distal planar surface, of a stepped dielectric material portion 165. A solder ball 995 can be bonded to each external bonding pad 338. An additional external bonding pad 338 can be formed on a distal planar surface of the source semiconductor layer.

Referring to all drawings related to the third exemplary structure and according to various embodiments of the present disclosure, a bonded assembly comprising: a memory die 1000 comprising an alternating stack of insulating layers (132, 232) and electrically conductive layers (146, 246) that has stepped surfaces, memory stack structures 55 vertically extending through the alternating stack {(132, 146), (232, 246)}, a stepped dielectric material portion 165 contacting the stepped surface of the alternating stack {(132, 146), (232, 246)}, a through-dielectric external connection via structure 386 vertically extending through the stepped dielectric material portion; memory-side metal interconnect structures 370 included in memory-side interconnect-level dielectric layers 390, and memory-side bonding pads 378; a logic die 900 comprising a semiconductor substrate (910 or 902), semiconductor devices located on the semiconductor substrate (910 or 902) and including a peripheral circuitry configurated to control operation of the memory stack structures 55 within the memory die, logic-side metal interconnect structures 970 included in logic-side interconnect-level dielectric layers 990, and logic-side bonding pads 978 that are bonded to the memory-side bonding pads 378 of the memory die 1000 at a die-to-die bonding interface; and an external bonding pad 338 located on a surface of the stepped dielectric material portion 165 and contacting a distal planar surface of the through-dielectric external connection via structure 386.

In one embodiment, the distal planar surface of the through-dielectric external connection via structure 386 is within a horizontal plane including a first planar horizontal surface of the stepped dielectric material portion 165.

In one embodiment, the through-dielectric external connection via structure 386 comprises a proximal planar surface that contacts one of the memory-side metal interconnect structures 370; and the proximal planar surface is vertically spaced from a horizontal plane including the die-to-die bonding interface by a lesser vertical separation distance than the memory stack structures 55 are from the horizontal plane including the die-to-die bonding interface.

In one embodiment, a solder ball 995 can be bonded to each external bonding pad 338.

In one embodiment, the logic-side bonding pads are bonded to the memory-side bonding pads by copper-to-copper bonding.

In one embodiment, each of the memory stack structures 55 comprises a respective vertical semiconductor channel 60 including a proximal end and a distal end that is vertically spaced from a horizontal plane including the die-to-die bonding interface by a greater vertical distance than the proximal end is from the horizontal plane including the die-to-die bonding interface; and a source semiconductor layer (114 or 302) is located on the alternating stack {(132, 146), (232, 246)}, and is electrically connected to the distal ends of the vertical semiconductor channels 60.

In one embodiment, the distal planar surface of the through-dielectric external connection via structure 386 is located within a horizontal plane including a planar surface of the source semiconductor layer (114 or 302) that is parallel to the horizontal plane including the die-to-die bonding interface.

In one embodiment, the source semiconductor layer, comprising a thinned memory-side substrate 302, is electrically connected to the distal ends of the vertical semiconductor channels 60 through direct contacts between the source semiconductor layer (114, 302) and horizontal planar surfaces of the distal ends of the vertical semiconductor channels 60 (in case pedestal channel portions 11 are not present), or through pedestal channel portions 11 directly contacting the source semiconductor layer (114, 302) and horizontal planar surfaces of the distal ends of the vertical semiconductor channels 60.

In one embodiment, the source contact layer is electrically connected to the distal ends of the vertical semiconductor channels 60 through direct contact between cylindrical sidewall surfaces of the distal ends of the vertical semiconductor channels 60 and the source semiconductor layer 114.

In one embodiment, an additional external bonding pad 338 can be located on a distal planar surface of the source semiconductor layer (302, 114).

In one embodiment, the memory stack structures 55 comprise a three-dimensional array of memory elements; the memory die 1000 comprises a set of word lines for the three-dimensional array of memory elements and a set of bit lines 98 for the three-dimensional array of memory elements; and the peripheral circuitry is configured to drive at least one set among the set of word lines and the set of bit lines 98.

In one embodiment, the bit lines 98 are connected to a respective subset of the vertical semiconductor channels 60, and are connected to bit line drivers within the peripheral circuitry through first electrically conductive paths including a first bonded subset of the memory-side bonding pads 378 and the logic-side bonding pads 978; and the electrically conductive layers (146, 246) comprise the word lines, and are connected to word line drivers within the peripheral circuitry through second electrically conductive paths including a second bonded subset of the memory-side bonding pads 378 and the logic-side bonding pads 978.

Various embodiments include bonded semiconductor structures and methods of making such structures suitable for three dimensional memory devices that are less expensive to manufacture than conventional structures and methods, providing manufacturing cost savings.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising:

a memory die comprising an alternating stack of insulating layers and electrically conductive layers that has stepped surfaces, memory stack structures vertically extending through the alternating stack, a stepped dielectric material portion contacting the stepped surface of the alternating stack, a through-dielectric external connection via structure vertically extending through the stepped dielectric material portion; memory-side metal interconnect structures included in memory-side interconnect-level dielectric layers, and memory-side bonding pads;

a logic die comprising a semiconductor substrate, semiconductor devices located on the semiconductor substrate and including a peripheral circuitry configurated to control operation of the memory stack structures within the memory die, logic-side metal interconnect structures included in logic-side interconnect-level dielectric layers, and logic-side bonding pads that are bonded to the memory-side bonding pads of the memory die at a die-to-die bonding interface; and an external bonding pad located on a surface of the stepped dielectric material portion and contacting a distal planar surface of the through-dielectric external connection via structure, wherein:

the distal planar surface of the through-dielectric external connection via structure is within a horizontal plane including a first planar horizontal surface of the stepped dielectric material portion;

the through-dielectric external connection via structure comprises a proximal planar surface that contacts one of the memory-side metal interconnect structures; and the proximal planar surface is vertically spaced from a horizontal plane including the die-to-die bonding interface by a lesser vertical separation distance than the memory stack structures are from the horizontal plane including the die-to-die bonding interface.

2. The bonded assembly of claim 1, further comprising a solder ball bonded to the external bonding pad.

3. The bonded assembly of claim 1, wherein the logic-side bonding pads are bonded to the memory-side bonding pads by copper-to-copper bonding.

4. The bonded assembly of claim 1, wherein:

each of the memory stack structures comprises a respective vertical semiconductor channel including a proximal end and a distal end that is vertically spaced from a horizontal plane including the die-to-die bonding interface by a greater vertical distance than the proximal end is from the horizontal plane including the die-to-die bonding interface; and a source semiconductor layer is located on the alternating stack, and is electrically connected to the distal ends of the vertical semiconductor channels.

5. The bonded assembly of claim 4, wherein the distal planar surface of the through-dielectric external connection via structure is located within a horizontal plane including a planar surface of the source semiconductor layer that is parallel to the horizontal plane including the die-to-die bonding interface.

6. The bonded assembly of claim 4, wherein the source semiconductor layer is electrically connected to the distal ends of the vertical semiconductor channels through:

direct contacts between the source semiconductor layer and horizontal planar surfaces of the distal ends of the vertical semiconductor channels; or pedestal channel portions directly contacting the source semiconductor layer and horizontal planar surfaces of the distal ends of the vertical semiconductor channels.

7. The bonded assembly of claim 4, wherein the source contact layer is electrically connected to the distal ends of the vertical semiconductor channels through direct contact between cylindrical sidewall surfaces of the distal ends of the vertical semiconductor channels and the source semiconductor layer.

8. The bonded assembly of claim 4, further comprising an additional external bonding pad located on a distal planar surface of the source semiconductor layer.

9. The bonded assembly of claim 1, wherein:

the memory stack structures comprise a three-dimensional array of memory elements;

the memory die comprises a set of word lines for the three-dimensional array of memory elements and a set of bit lines for the three-dimensional array of memory elements; and the peripheral circuitry is configured to drive at least one set among the set of word lines and the set of bit lines.

10. The bonded assembly of claim 9, wherein:

the bit lines are connected to a respective subset of the vertical semiconductor channels, and are connected to bit line drivers within the peripheral circuitry through first electrically conductive paths including a first bonded subset of the memory-side bonding pads and the logic-side bonding pads; and the electrically conductive layers comprise the word lines, and are connected to word line drivers within the peripheral circuitry through second electrically conductive paths including a second bonded subset of the memory-side bonding pads and the logic-side bonding pads.

11. A bonded assembly comprising:

a memory die comprising an alternating stack of insulating layers and electrically conductive layers that has stepped surfaces, memory stack structures vertically extending through the alternating stack, a stepped dielectric material portion contacting the stepped surface of the alternating stack, a through-dielectric external connection via structure vertically extending through the stepped dielectric material portion; memory-side metal interconnect structures included in memory-side interconnect-level dielectric layers, and memory-side bonding pads;

a logic die comprising a semiconductor substrate, semiconductor devices located on the semiconductor substrate and including a peripheral circuitry configurated to control operation of the memory stack structures within the memory die, logic-side metal interconnect structures included in logic-side interconnect-level dielectric layers, and logic-side bonding pads that are bonded to the memory-side bonding pads of the memory die at a die-to-die bonding interface; and an external bonding pad located on a surface of the stepped dielectric material portion and contacting a distal planar surface of the through-dielectric external connection via structure, wherein:

each of the memory stack structures comprises a respective vertical semiconductor channel including a proximal end and a distal end that is vertically spaced from a horizontal plane including the die-to-die bonding interface by a greater vertical distance than the proximal end is from the horizontal plane including the die-to-die bonding interface; and a source semiconductor layer is located on the alternating stack, and is electrically connected to the distal ends of the vertical semiconductor channels.

12. The bonded assembly of claim 11, wherein the proximal planar surface of the through-dielectric external connection via structure is located within a horizontal plane including a planar surface of the source semiconductor layer that is parallel to the horizontal plane including the die-to-die bonding interface.

13. The bonded assembly of claim 11, wherein the source semiconductor layer is electrically connected to the distal ends of the vertical semiconductor channels through:

direct contacts between the source semiconductor layer and horizontal planar surfaces of the distal ends of the vertical semiconductor channels; or pedestal channel portions directly contacting the source semiconductor layer and horizontal planar surfaces of the distal ends of the vertical semiconductor channels.

14. The bonded assembly of claim 11, wherein the source contact layer is electrically connected to the distal ends of the vertical semiconductor channels through direct contact between cylindrical sidewall surfaces of the distal ends of the vertical semiconductor channels and the source semiconductor layer.

15. The bonded assembly of claim 11, further comprising an additional external bonding pad located on a distal planar surface of the source semiconductor layer.

* * * * *